United States Patent [19]
Tran et al.

[11] Patent Number: 6,014,734
[45] Date of Patent: Jan. 11, 2000

[54] SUPERSCALAR MICROPROCESSOR CONFIGURED TO PREDICT RETURN ADDRESSES FROM A RETURN STACK STORAGE

[75] Inventors: Thang M. Tran; Rupaka Mahalingaiah, both of Austin, Tex.

[73] Assignee: Advanced Micro Devices, Inc., Sunnyvale, Calif.

[21] Appl. No.: 09/153,770

[22] Filed: Sep. 15, 1998

Related U.S. Application Data

[63] Continuation of application No. 08/570,242, Dec. 11, 1995, Pat. No. 5,864,707.

[51] Int. Cl.$^7$ .................................................. G06F 9/38
[52] U.S. Cl. ........................... 712/23; 712/243; 712/228; 712/229
[58] Field of Search .................................. 712/229, 230, 712/233, 240, 237, 243, 210, 206, 217, 216, 43

[56] References Cited

U.S. PATENT DOCUMENTS

| | | |
|---|---|---|
| 4,044,338 | 8/1977 | Wolf . |
| 4,453,212 | 6/1984 | Gaither et al. . |
| 4,504,927 | 3/1985 | Callan . |
| 4,807,115 | 2/1989 | Torng . |
| 4,858,105 | 8/1989 | Kuriyama et al. . |

(List continued on next page.)

FOREIGN PATENT DOCUMENTS

| | | |
|---|---|---|
| 0259095 | 3/1988 | European Pat. Off. . |
| 0381471 | 8/1990 | European Pat. Off. . |
| 0459232 | 12/1991 | European Pat. Off. . |
| 649084 | 4/1995 | European Pat. Off. . |
| 2263985 | 8/1993 | United Kingdom . |
| 2263987 | 8/1993 | United Kingdom . |
| 2281422 | 3/1995 | United Kingdom . |
| 2287111 | 9/1995 | United Kingdom . |

OTHER PUBLICATIONS

IBM Technical Disclosure Bulletin, "Subroutine Call/Return Stack," Apr. 30, 1988, vol. 30, No. 11, pp. 221–225.

IBM Technical Disclosure Bulletin, "Highly Accuratte Subroutine Stack Prediction Mechanism," Mar. 10, 1986, vol. 28, No. 10, pp. 4635–4637.

Intel, "Chapter 2; Microprocessor Architecture Overview," pp. 2–1 through 2–4.

Michael Slater, "AMD'S K5 Designed to Outrun Pentium," Microprocessor Report, vol. 8, No. 14, Oct. 24, 1994, 7 pages.

Sebastian Rupley and John Clyman, "P6: The Next Step?," PC Magazine, Sep. 12, 1995, 16 pages.

Tom R. Halfhill, "AMD K6 Takes On Intel P6," BYTE, Jan. 1996, 4 pages.

(List continued on next page.)

*Primary Examiner*—Larry D. Donaghue
*Attorney, Agent, or Firm*—Conley, Rose & Tayon; Lawrence J. Merkel; B. Noel Kivlin

[57] ABSTRACT

A microprocessor is provided which is configured to predict return addresses for return instructions according to a return stack storage included therein. The return stack storage is a stack structure configured to store return addresses associated with previously detected call instructions. Return addresses may be predicted for return instructions early in the instruction processing pipeline of the microprocessor. In one embodiment, the return stack storage additionally stores a call tag and a return tag with each return address. The call tag and return tag respectively identify call and return instructions associated with the return address. These tags may be compared to a branch tag conveyed to the return prediction unit upon detection of a branch misprediction. The results of the comparisons may be used to adjust the contents of the return stack storage with respect to the misprediction. The microprocessor may continue to predict return addresses correctly following a mispredicted branch instruction.

22 Claims, 45 Drawing Sheets

U.S. PATENT DOCUMENTS

| | | |
|---|---|---|
| 5,136,697 | 8/1992 | Johnson . |
| 5,179,673 | 1/1993 | Steely, Jr. et al. . |
| 5,222,220 | 6/1993 | Mehta . |
| 5,226,126 | 7/1993 | McFarland et al. . |
| 5,226,130 | 7/1993 | Favor et al. . |
| 5,274,817 | 12/1993 | Stahl . |
| 5,313,634 | 5/1994 | Eickemeyer et al. . |
| 5,339,422 | 8/1994 | Brender et al. . |
| 5,355,459 | 10/1994 | Matsuo et al. . |
| 5,454,087 | 9/1995 | Narita et al. . |
| 5,526,498 | 6/1996 | Matsuo et al. . |
| 5,564,118 | 10/1996 | Steely, Jr. et al. . |
| 5,574,871 | 11/1996 | Hoyt et al. . |
| 5,584,001 | 12/1996 | Hoyt et al. . |
| 5,604,877 | 2/1997 | Hoyt et al. . |
| 5,606,682 | 2/1997 | McGarity . |
| 5,623,614 | 4/1997 | Van Dyke et al. . |
| 5,649,225 | 7/1997 | White et al. . |
| 5,655,098 | 8/1997 | Witt et al. . |
| 5,778,423 | 7/1998 | Sites et al. ............................... 711/118 |

OTHER PUBLICATIONS

Dialog, Microprocessor Report, Oct. 24, 1994, p. 107.

Yeh, et al., "Branch History Table Indexing To Prevent Pipeline Bubbles In Wide–Issue Superscalar Processors," 1993.

Tomasula, R.M., "An Efficient Algorithm for Exploiting Multiple Arithmetic Units," IBM Journal, Jan. 1967, pp. 25–33.

Dialog, Microprocessor Report, Oct. 24, 1994, pp. 1–7.

Short Microprocessors and Programmable Logic pp. 194–201, 1987.

| Return PC | Call Tag | Ret. Tag | CV | RV | CRV | IXL | IStart |
|---|---|---|---|---|---|---|---|
| ... | | | | | | | |

Return Stack Storage
252A

FIG. 2A

|   |   |   |   |   |   |
|---|---|---|---|---|---|
|   |   |   |   |   |   |
|   |   |   |   |   |   |
|   |   |   |   |   |   |
|   |   |   |   |   |   |
|   |   |   |   |   |   |
| C | O | - | 1 | 0 | 0 |
| B | O | - | 1 | 0 | 1 |
| A | O | - | 1 | 0 | 1 |

Pointer → (444)
Return Stack Storage 252
442
440

FIG. 4B

|   |   |   |   |   |   |
|---|---|---|---|---|---|
|   |   |   |   |   |   |
|   |   |   |   |   |   |
|   |   |   |   |   |   |
|   |   |   |   |   |   |
| D | 3 | - | 1 | 0 | 0 |
| C | O | 2 | 1 | 1 | 0 |
| B | O | - | 1 | 0 | 1 |
| A | O | - | 1 | 0 | 1 |

446
Pointer →
444
Return Stack Storage 252
442
440

FIG. 4C

| | | | | | |
|---|---|---|---|---|---|
| | | | | | |
| F | 7 | - | 1 | 0 | 0 |
| E | 6 | - | 1 | 0 | 0 |
| D | 3 | 5 | 1 | 1 | 0 |
| C | 0 | 2 | 1 | 1 | 0 |
| B | 0 | - | 1 | 0 | 1 |
| A | 0 | - | 1 | 0 | 1 |

Pointer → 448 (F row), 446, 444
450, Return Stack Storage 252, 442, 440

FIG. 4D

| | | | | | |
|---|---|---|---|---|---|
| G | 11 | - | 1 | 0 | 0 |
| F | 7 | 8 | 1 | 1 | 0 |
| E | 6 | 9 | 1 | 1 | 0 |
| D | 3 | 5 | 1 | 1 | 0 |
| C | 0 | 2 | 1 | 1 | 0 |
| B | 0 | 10 | 1 | 1 | 1 |
| A | 0 | - | 1 | 0 | 1 |

Pointer → 452, 450, 448, 446, 444
Return Stack Storage 252, 442, 440

FIG. 4E

CV-CALL VALID BIT
RV-RETURN VALID          IXC-INT NOT CALL
CRV-RETIRED CALL INST.   ISTART-START OF INT

| BIT TYPE | #OF BITS | COMMENTS |
|---|---|---|
| V | 1 | Entry Valid Bit |
| LD | 1 | Load instruction in entry |
| ST | 1 | Store instruction in entry |
| DTAG | 5 | ROB tag associated with instruction |
| LA | 32 | Linear Address |
| LV | 1 | Linear Address Valid Bit |
| DATA | 32 | Store Data |
| DV | 1 | Store Data Valid Bit |
| AC | 1 | Entry was picked for an access in prev. cycle |
| SZ | 2 | Data Operand Size |
| M | 1 | Entry missed in DCACHE for an earlier access |
| M2 | 1 | Entry missed in DCACHE for an earlier MA2 |
| NF | 1 | No Forwarding |
| S | 1 | Serialize |
| D | 1 | Dependant |
| MA | 1 | Misaligned LA |
| INSLS | 11 | Bits from decode/microcode for seg. loads, etc |
| MISC | N | Control bits |

FIG. 41

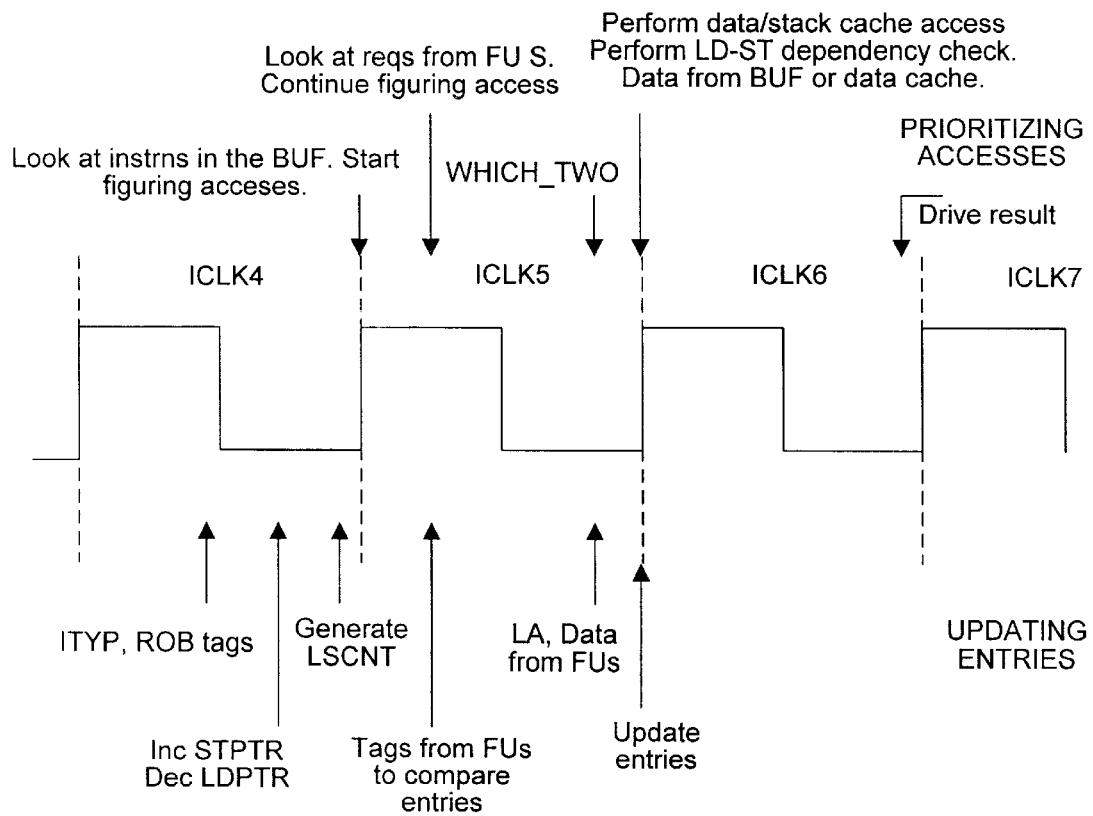

FIG. 42

Eight possible combinations

Way predict(7:0)=10000000====>Way 7 predicted
War predict(7:0)=01000000====>Way 6 predicted
Way predict(7:0)=00100000====>Way 5 predicted
Way predict(7:0)=00010000====>Way 4 predicted
Way predict(7:0)=00001000====>Way 3 predicted
Way predict(7:0)=00000100====>Way 2 predicted
Way predict(7:0)=00000010====>Way 1 predicted
Way predict(7:0)=00000001====>Way 0 predicted

SUPERSCALAR MICROPROCESSOR CONFIGURED TO PREDICT RETURN ADDRESSES FROM A RETURN STACK STORAGE

This application is a continuation of U.S. patent application Ser. No. 08/570,242, filed on Dec. 11, 1995, now U.S. Pat. No. 5,864,707.

BACKGROUND OF THE INVENTION

1. Field of the Invention

This invention is related to the field of microprocessors and, more particularly, to speculative return address prediction mechanisms for predicting the address of a return instruction within microprocessors.

2. Description of the Relevant Art

Superscalar microprocessors achieve high performance by executing multiple instructions concurrently and by choosing the shortest possible clock cycle consistent with the design. As used herein, the term "clock cycle" refers to an interval of time in which the various stages of the instruction processing pipelines complete their tasks. Instructions and computed values are captured by memory elements (such as registers or arrays) according to a clock signal defining the clock cycle. For example, a memory element may capture a value according to the rising or falling edge of the clock signal.

Many superscalar microprocessor manufacturers design their microprocessors in accordance with the x86 microprocessor architecture. The x86 microprocessor architecture is widely accepted in the computer industry, and therefore a large body of software exists which runs only on microprocessors embodying this architecture. Microprocessors designed in accordance with the x86 architecture advantageously retain compatibility with this body of software. As will be appreciated by those skilled in the art, the x86 architecture includes a "stack" area in memory. The stack is useful for passing information between a program and a subroutine called by that program, among other things. A subroutine performs a function that a program requires, and then returns to the instruction following the call to the subroutine. Therefore, a subroutine may be called from multiple places within a program to perform its function. A "subroutine call instruction" or, more briefly, a "call instruction" is an instruction used to call a subroutine. The address of the instruction subsequent to the call instruction is saved in a storage location. The address of the instruction subsequent to the call instruction is referred to as the "return address". The instruction which causes program execution to resume at the return address is a "return instruction".

In the x86 architecture, the ESP register points to the address in memory which currently forms the top of the stack. A stack structure is a Last-In, First-Out (LIFO) structure in which values are placed on the stack in a certain order and are removed from the stack in the reverse order. Therefore, the top of the stack contains the last item placed on the stack. The action of placing a value on the stack is known as a "push", and requesting that a push be performed is a "push command". The action of removing a value from the stack is referred to as a "pop", and requesting that a pop be performed is a "pop command". When a push command is performed, the ESP register is decremented by the size (in bytes) of the value specified by the push command. The value is then stored at the address pointed to by the decremented ESP register value. When a pop command is performed, a number of bytes specified by the pop command are copied from the top of the stack to a destination specified by the pop command, and then the ESP register is incremented by the number of bytes.

An example of the use of push and pop commands in the x86 microprocessor architecture are the subroutine call and return instructions, as mentioned above. In the x86 microprocessor architecture, a typical subroutine call involves pushing the operands for the subroutine onto the stack, then pushing the return address onto the stack. The subroutine is called and executes, accessing any operands it may need by indexing into the stack. After completing execution, the subroutine pops the next instruction address from the top of the stack and causes that address to be fetched by the microprocessor.

The x86 microprocessor architecture, similar to other microprocessor architectures, contains branch instructions. A branch instruction is an instruction which causes the next instruction to be fetched from one of at least two possible addresses. One address is the address immediately following the branch instruction. This address is referred to as the "next sequential address". The second address is specified by the branch instruction, and is referred to as the "branch target address" or simply the "target address". Branch instructions typically select between the target address and the next sequential address based on a particular condition flag which is set by a previously executed instruction.

Since the next instruction to be executed after the branch instruction is not known until the branch instruction executes, superscalar microprocessors either stall instruction fetching until the branch instruction executes (reducing performance) or predict which address the branch instruction will select when executed. When the prediction method is chosen, the resulting superscalar microprocessor may speculatively fetch and execute instructions residing at the predicted address. If the prediction is incorrect, or "mispredicted" (as determined when the branch instruction executes), then the instructions following the branch instruction are discarded from the instruction processing pipeline and the correct instructions are fetched. Branch instructions are typically predicted when that branch instruction is decoded or when instructions are fetched, depending on the branch prediction scheme and the configuration of the microprocessor. Subroutine call and return instructions may be considered to be branches which always select the target address.

A particularly difficult type of branch instruction to predict in the x86 microprocessor architecture is the RET instruction (the return instruction defined for the x86 microprocessor architecture). The return instruction is a pop command, as described above. This type of branch instruction is difficult to predict because the target address (or return address) is not readily available when the instruction is decoded, unlike some other branch instructions. Instead, the return address is stored on the stack in a location that will be indicated by the value in the ESP register when the return instruction is executed. The value of the ESP register at the time the return instruction is decoded and the value of the ESP register at the time the return instruction is executed may differ. For similar reasons, the return address may be difficult to predict in other microprocessor architectures as well.

Return address prediction is further complicated by the use of "fake return" instructions. Return instructions are normally used in conjunction with the CALL instruction. The CALL instruction is another special type of branch instruction which causes the address of the instruction immediately following the call to be pushed onto the stack, and then instructions are fetched from an address specified by the CALL instruction (i.e. the CALL instruction is the subroutine call instruction defined for the x86 microprocessor architecture). The CALL instruction is therefore a push command, as described above, as well as a branch instruction. The instruction address placed on the stack by the CALL instruction is the address intended to be used by the return instruction as the return address. The CALL instruction can therefore be used to call a subroutine in a program, and the subroutine typically ends with a return instruction which causes instruction execution to resume at the instruction immediately following the CALL instruction.

"Fake return" instructions are return instructions which are executed when a return address other than a return address provided by a CALL instruction is at the top of the stack. This address may be placed on the stack by executing a PUSH instruction, for example. A mechanism for predicting the target address of a return instruction is desired.

SUMMARY OF THE INVENTION

The problems outlined above are in large part solved by a microprocessor in accordance with the present invention. The present microprocessor employs a return prediction unit configured to predict return addresses for return instructions according to a return stack storage included therein. The return stack storage is a stack structure configured to store return addresses associated with previously detected call instructions. Advantageously, return addresses may be predicted for return instructions early in the instruction processing pipeline of the microprocessor. Instructions residing at the target of the return instruction may be fetched more quickly than was previously achievable using conventional superscalar microprocessors. Performance may be increased according to the decreased time between execution of the return instruction and execution of the instructions stored at the return address.

In one embodiment, the return stack storage additionally stores a call tag and a return tag with each return address. The call tag and return tag respectively identify call and return instructions associated with the return address. These tags may be compared to a branch tag conveyed to the return prediction unit upon detection of a branch misprediction. The results of the comparisons may be used to adjust the contents of the return stack storage with respect to the misprediction. Advantageously, the return prediction unit recovers from mispredicted branches. In other words, the return prediction unit may continue to predict return addresses correctly following a mispredicted branch instruction. Because mispredicted branch recovery is often an important feature of superscalar microprocessors, performance may be increased by recovering the return prediction unit.

Broadly speaking, the present invention contemplates a superscalar microprocessor comprising a branch prediction unit and a return prediction unit. The branch prediction unit is configured to predict branch instructions taken or not taken, wherein branch instructions include call instructions and return instructions. Coupled to recieve an indication of the call instructions and the return instructions from the branch prediction unit, the return prediction unit is configured to store return addresses corresponding to the call instructions in a return stack structure. Furthermore, the return prediction unit is configured to predict a return address corresponding to one of the return instructions from the stored return addresses.

The present invention further contemplates a computer system, comprising a microprocessor coupled to a main memory. The microprocessor includes a return prediction structure configured to predict a return address of a return instruction from a plurality of stored return addresses. The stored return addresses comprise return addresses corresponding to previously fetched call instructions. The main memory is configured to store instructions for execution by the microprocessor and further configured to store data for manipulation by the microprocessor.

BRIEF DESCRIPTION OF THE DRAWINGS

Other objects and advantages of the invention will become apparent upon reading the following detailed description and upon reference to the accompanying drawings in which:

FIG. 2A is a diagram of another embodiment of a return stack storage which may be included in the return prediction unit shown in FIG. 2.

FIG. 4B shows the contents of the return address storage shown in FIG. 2 prior to executing the instruction stream shown in FIG. 4A.

FIG. 4C shows the contents of the return address storage shown in FIG. 2 after the execution of several instructions from the exemplary instruction stream shown in FIG. 4A.

FIG. 4D shows the contents of the return address storage shown in FIG. 2 after the execution of several more instructions from the exemplary instruction stream shown in FIG. 4A.

FIG. 4E shows the contents of the return address storage shown in FIG. 2 after completing execution of the exemplary instruction stream shown in FIG. 4A.

Figure 1:
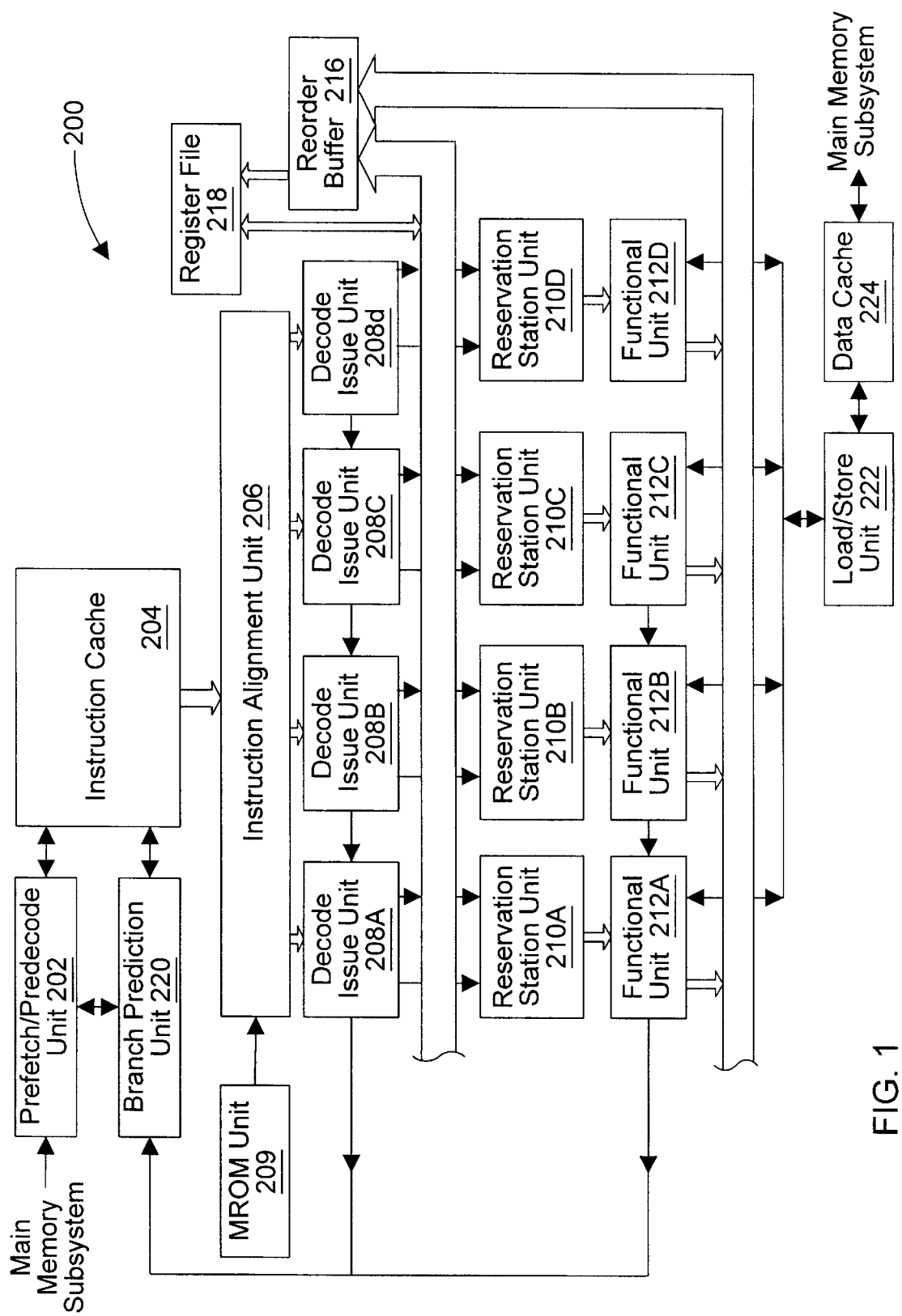
FIG. 1 is a block diagram of one embodiment of a superscalar microprocessor including an instruction cache and a branch prediction unit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a block diagram of one embodiment of a superscalar microprocessor 200 in accordance with the present invention is shown. As illustrated in the embodiment of FIG. 1, superscalar microprocessor 200 includes a prefetch/predecode unit 202 and a branch prediction unit 220 coupled to an instruction cache 204. An instruction alignment unit 206 is coupled between instruction cache 204 and a plurality of decode units 208A–208D (referred to collectively as decode units 208). Each decode unit 208A–208D is coupled to respective reservation station units 210A–210D (referred to collectively as reservation stations 210), and each reservation station 210A–210D is coupled to a respective functional unit 212A–212D (referred to collectively as functional units 212). Decode units 208, reservation stations 210, and functional units 212 are further coupled to a reorder buffer 216, a register file 218 and a load/store unit 222. A data cache 224 is finally shown coupled to load/store unit 222, and an MROM unit 209 is shown coupled to instruction alignment unit 206.

Generally speaking, instruction cache 204 is a high speed cache memory provided to temporarily store instructions prior to their dispatch to decode units 208. In one embodiment, instruction cache 204 is configured to cache up to 32 kilobytes of instruction code organized in lines of 16 bytes each (where each byte consists of 8 bits). During operation, instruction code is provided to instruction cache 204 by prefetching code from a main memory (not shown) through prefetch/predecode unit 202. It is noted that instruction cache 204 could be implemented in a set-associative, a fully-associative, or a direct-mapped configuration.

Prefetch/predecode unit 202 is provided to prefetch instruction code from the main memory for storage within instruction cache 204. In one embodiment, prefetch/predecode unit 202 is configured to burst 64-bit wide code from the main memory into instruction cache 204. It is understood that a variety of specific code prefetching techniques and algorithms may be employed by prefetch/predecode unit 202.

As prefetch/predecode unit 202 fetches instructions from the main memory, it generates three predecode bits associated with each byte of instruction code: a start bit, an end bit, and a "functional" bit. The predecode bits form tags indicative of the boundaries of each instruction. The predecode tags may also convey additional information such as whether a given instruction can be decoded directly by decode units 208 or whether the instruction must be executed by invoking a microcode procedure controlled by MROM unit 209, as will be described in greater detail below.

Table 1 indicates one encoding of the predecode tags. As indicated within the table, if a given byte is the first byte of an instruction, the start bit for that byte is set. If the byte is the last byte of an instruction, the end bit for that byte is set. If a particular instruction cannot be directly decoded by the decode units 208, the functional bit associated with the first byte of the instruction is set. On the other hand, if the instruction can be directly decoded by the decode units 208, the functional bit associated with the first byte of the instruction is cleared. The functional bit for the second byte of a particular instruction is cleared if the opcode is the first byte, and is set if the opcode is the second byte. It is noted that in situations where the opcode is the second byte, the first byte is a prefix byte. The functional bit values for instruction byte numbers 3–8 indicate whether the byte is a MODRM or an SIB byte, or whether the byte contains displacement or immediate data.

TABLE 1

Encoding of Start, End and Functional Bits

| Instr. Byte Number | Start Bit Value | End Bit Value | Functional Bit Value | Meaning |
| --- | --- | --- | --- | --- |
| 1 | 1 | X | 0 | Fast decode |
| 1 | 1 | X | 1 | MROM instr. |
| 2 | 0 | X | 0 | Opcode is first byte |
| 2 | 0 | X | 1 | Opcode is this byte, first byte is prefix |
| 3–8 | 0 | X | 0 | Mod R/M or SIB byte |
| 3–8 | 0 | X | 1 | Displacement or immediate data; the second functional bit set in bytes 3–8 indicates immediate data |
| 1–8 | X | 0 | X | Not last byte of instruction |
| 1–8 | X | 1 | X | Last byte of instruction |

As stated previously, in one embodiment certain instructions within the x86 instruction set may be directly decoded by decode unit 208. These instructions are referred to as "fast path" instructions. The remaining instructions of the x86 instruction set are referred to as "MROM instructions". MROM instructions are executed by invoking MROM unit 209. More specifically, when an MROM instruction is encountered, MROM unit 209 parses and serializes the instruction into a subset of defined fast path instructions to effectuate a desired operation. A listing of exemplary x86 instructions categorized as fast path instructions as well as a description of the manner of handling both fast path and MROM instructions will be provided further below.

Instruction alignment unit 206 is provided to channel variable byte length instructions from instruction cache 204 to fixed issue positions formed by decode units 208A–208D. In one embodiment, instruction alignment unit 206 independently and in parallel selects instructions from three groups of instruction bytes provided by instruction cache 204 and arranges these bytes into three groups of preliminary issue positions. Each group of issue positions is associated with one of the three groups of instruction bytes. The preliminary issue positions are then merged together to form the final issue positions, each of which is coupled to one of decode units 208.

Before proceeding with a detailed description of the return address prediction mechanism employed within microprocessor 200, general aspects regarding other subsystems employed within the exemplary superscalar microprocessor 200 of FIG. 1 will be described. For the embodiment of FIG. 1, each of the decode units 208 includes decoding circuitry for decoding the predetermined fast path instructions referred to above. In addition, each decode unit 208A–208D routes displacement and immediate data to a corresponding reservation station unit 210A–210D. Output signals from the decode units 208 include bit-encoded execution instructions for the functional units 212 as well as operand address information, immediate data and/or displacement data.

The superscalar microprocessor of FIG. 1 supports out of order execution, and thus employs reorder buffer 216 to keep track of the original program sequence for register read and write operations, to implement register renaming, to allow for speculative instruction execution and branch misprediction recovery, and to facilitate precise exceptions. As will be appreciated by those of skill in the art, a temporary storage location within reorder buffer 216 is reserved upon decode of an instruction that involves the update of a register to thereby store speculative register states. Reorder buffer 216 may be implemented in a first-in-first-out configuration wherein speculative results move to the "bottom" of the buffer as they are validated and written to the register file, thus making room for new entries at the "top" of the buffer. Other specific configurations of reorder buffer 216 are also possible, as will be described further below. If a branch prediction is incorrect, the results of speculatively-executed instructions along the mispredicted path can be invalidated in the buffer before they are written to register file 218.

The bit-encoded execution instructions and immediate data provided at the outputs of decode units 208A–208D are routed directly to respective reservation station units 210A–210D. In one embodiment, each reservation station unit 210A–210D is capable of holding instruction information (i.e., bit encoded execution bits as well as operand values, operand tags and/or immediate data) for up to three pending instructions awaiting issue to the corresponding functional unit. It is noted that for the embodiment of FIG. 1, each decode unit 208A–208D is associated with a dedicated reservation station unit 210A–210D, and that each reservation station unit 210A–210D is similarly associated with a dedicated functional unit 212A–212D. Accordingly, four dedicated "issue positions" are formed by decode units 208, reservation station units 210 and functional units 212. Instructions aligned and dispatched to issue position 0 through decode unit 208A are passed to reservation station unit 210A and subsequently to functional unit 212A for execution. Similarly, instructions aligned and dispatched to decode unit 208B are passed to reservation station unit 210B and into functional unit 212B, and so on.

Upon decode of a particular instruction, if a required operand is a register location, register address information is routed to reorder buffer 216 and register file 218 simultaneously. Those of skill in the art will appreciate that the x86 register file includes eight 32 bit real registers (i.e., typically referred to as EAX, EBX, ECX, EDX, EBP, ESI, EDI and ESP). Reorder buffer 216 contains temporary storage locations for results which change the contents of these registers to thereby allow out of order execution. A temporary storage location of reorder buffer 216 is reserved for each instruction which, upon decode, is determined to modify the contents of one of the real registers. Therefore, at various points during execution of a particular program, reorder buffer 216 may have one or more locations which contain the speculatively executed contents of a given register. If following decode of a given instruction it is determined that reorder buffer 216 has a previous location or locations assigned to a register used as an operand in the given instruction, the reorder buffer 216 forwards to the corresponding reservation station either: 1) the value in the most recently assigned location, or 2) a tag for the most recently assigned location if the value has not yet been produced by the functional unit that will eventually execute the previous instruction. If the reorder buffer has a location reserved for a given register, the operand value (or tag) is provided from reorder buffer 216 rather than from register file 218. If there is no location reserved for a required register in reorder buffer 216, the value is taken directly from register file 218. If the operand corresponds to a memory location, the operand value is provided to the reservation station unit through load/store unit 222.

Details regarding suitable reorder buffer implementations may be found within the Publication "Superscalar Microprocessor Design" by Mike Johnson, Prentice-Hall, Englewood Cliffs, N.J., 1991, and within the co-pending, commonly assigned patent application entitled "High Performance Superscalar Microprocessor", Ser. No. 08/146,382, filed Oct. 29, 1993 by Witt, et al., abandoned and continued in application Ser. No. 08/501,243 filed Jul. 10, 1995, now U.S. Pat. No. 5,651,125. These documents are incorporated herein by reference in their entirety.

Reservation station units 210A–210D are provided to temporarily store instruction information to be speculatively executed by the corresponding functional units 212A–212D. As stated previously, each reservation station unit 210A–210D may store instruction information for up to three pending instructions. Each of the four reservation stations 210A–210D contain locations to store bit-encoded execution instructions to be speculatively executed by the corresponding functional unit and the values of operands. If a particular operand is not available, a tag for that operand is provided from reorder buffer 216 and is stored within the corresponding reservation station until the result has been generated (i.e., by completion of the execution of a previous instruction). It is noted that when an instruction is executed by one of the functional units 212A–212D, the result of that instruction is passed directly to any reservation station units 210A–210D that are waiting for that result at the same time the result is passed to update reorder buffer 216 (this technique is commonly referred to as "result forwarding"). Instructions are issued to functional units for execution after the values of any required operand(s) are made available. That is, if an operand associated with a pending instruction within one of the reservation station units 210A–210D has been tagged with a location of a previous result value within reorder buffer 216 which corresponds to an instruction which modifies the required operand, the instruction is not issued to the corresponding functional unit 212 until the operand result for the previous instruction has been obtained. Accordingly, the order in which instructions are executed may not be the same as the order of the original program instruction sequence. Reorder buffer 216 ensures that data coherency is maintained in situations where read-after-write dependencies occur.

In one embodiment, each of the functional units 212 is configured to perform integer arithmetic operations of addition and subtraction, as well as shifts, rotates, logical operations, and branch operations. It is noted that a floating point unit (not shown) may also be employed to accommodate floating point operations.

Each of the functional units 212 also provides information regarding the execution of conditional branch instructions to the branch prediction unit 220. If a branch prediction was incorrect, branch prediction unit 220 flushes instructions subsequent to the mispredicted branch that have entered the instruction processing pipeline, and causes prefetch/predecode unit 202 to fetch the required instructions from instruction cache 204 or main memory. It is noted that in such situations, results of instructions in the original program sequence which occur after the mispredicted branch instruction are discarded, including those which were speculatively executed and temporarily stored in load/store unit 222 and reorder buffer 216. Exemplary configurations of suitable branch prediction mechanisms are well known.

Results produced by functional units 212 are sent to the reorder buffer 216 if a register value is being updated, and to the load/store unit 222 if the contents of a memory location is changed. If the result is to be stored in a register, the reorder buffer 216 stores the result in the location reserved for the value of the register when the instruction was decoded. As stated previously, results are also broadcast to reservation station units 210A–210D where pending instructions may be waiting for the results of previous instruction executions to obtain the required operand values.

Generally speaking, load/store unit 222 provides an interface between functional units 212A–212D and data cache 224. In one embodiment, load/store unit 222 is configured with a load/store buffer with eight storage locations for data and address information for pending loads or stores. Decode units 208 arbitrate for access to the load/store unit 222. When the buffer is full, a decode unit must wait until the load/store unit 222 has room for the pending load or store request information. The load/store unit 222 also performs dependency checking for load instructions against pending store instructions to ensure that data coherency is maintained.

Data cache 224 is a high speed cache memory provided to temporarily store data being transferred between load/store unit 222 and the main memory subsystem. In one embodiment, data cache 224 has a capacity of storing up to sixteen kilobytes of data. It is understood that data cache 224 may be implemented in a variety of specific memory configurations, including a set associative configuration.

Figure 2:
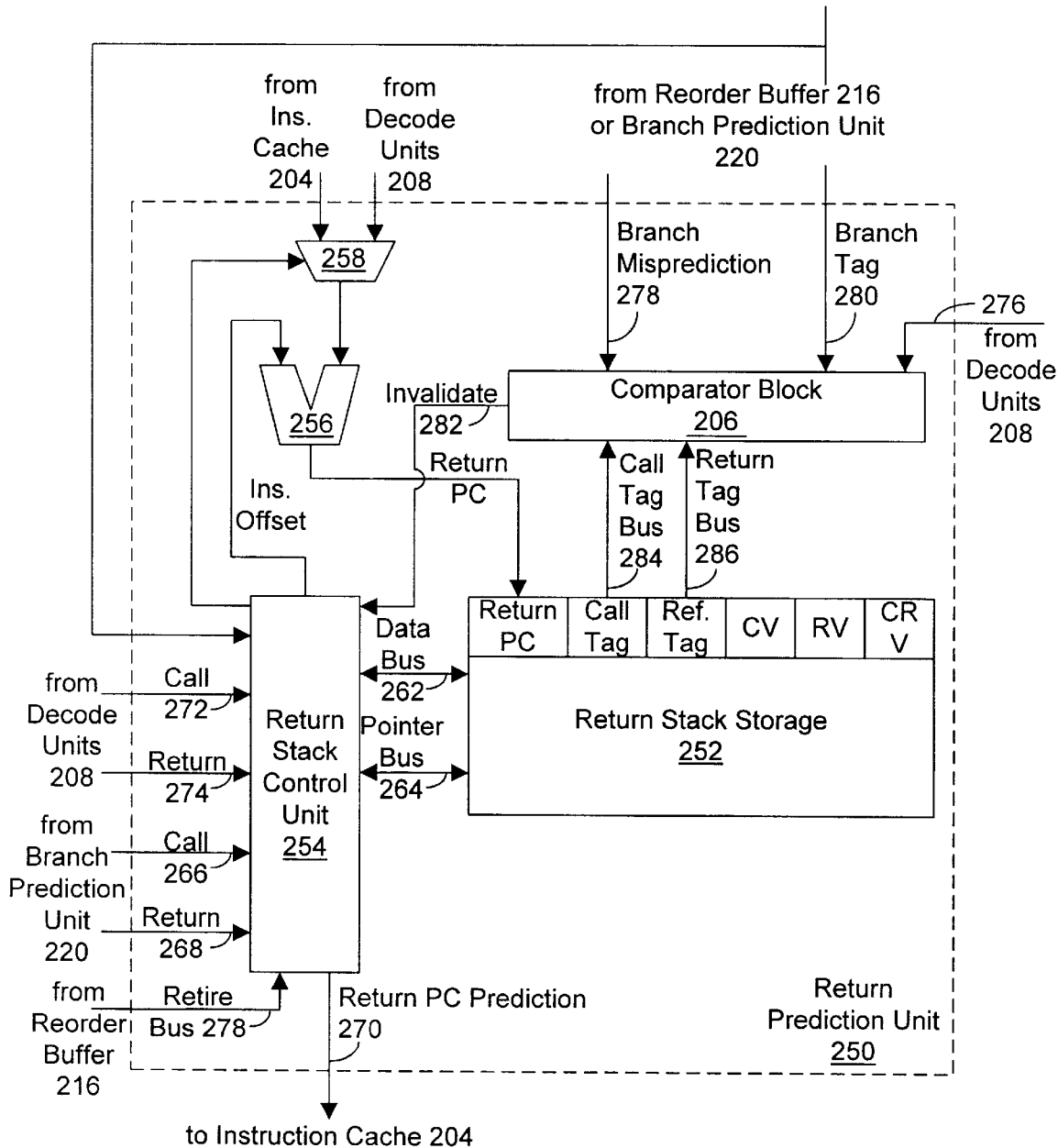
FIG. 2 is a block diagram of one embodiment of a return prediction unit which may be included within the instruction cache or the branch prediction unit shown in FIG. 1.

Turning now to FIG. 2, one embodiment of a return prediction unit 250 is shown. In one embodiment of microprocessor 200, return prediction unit 250 is included within instruction cache 204. In another embodiment of microprocessor 200, return prediction unit 250 is included within branch prediction unit 220. Generally speaking, return prediction unit 250 is configured to provide return address predictions for return instructions. In embodiments of microprocessor 200 employing the x86 microprocessor architecture, return instructions include the RET instruction and the IRET instruction. Return prediction unit 250 stacks return addresses associated with call instructions within a return stack storage 252, and predicts the return address associated with a return instructions based on the recorded return addresses. Additionally, return prediction unit 250 is configured to recover from mispredicted branches and call instructions for which the target is mispredicted. Following detection of the mispredicted instruction, return stack storage 252 accurately reflects call and return instructions detected prior to the mispredicted instruction and has discarded call and return instructions subsequent to the mispredicted instruction. When a return instruction is mispredicted by return prediction unit 250 (e.g. a fake return has been encountered), entries within return stack storage 252 are invalidated. Advantageously, return addresses may be predicted early in the instruction processing pipeline of microprocessor 200. It is noted that in embodiments of microprocessor 200 employing the x86 microprocessor architecture, call instructions include the CALL instruction and the INT instruction.

In one embodiment, return stack storage 252 includes several fields within each entry (or storage location). It is noted that return stack storage 252 may employ multiple registers as its storage locations, or the storage locations may be rows of a storage array. In one embodiment, return stack storage 252 includes eight entries. Each entry includes a return program counter (or return PC), a call tag, a return tag, and several valid bits. The return PC is the return address associated with the call instruction represented by the return stack entry. The CV valid bit indicates, when set, that a call instruction has been detected. The CV valid bit serves to indicate that the entry includes valid information. For example, if the CV bit is set, then the return PC and call tag are valid. The RV valid bit indicates, when set, that the entry has been used as a prediction for a return instruction. The RV valid bit further indicates that the return tag is valid. The CRV valid bit indicates, when set, that the call instruction associated with this entry has been retired by reorder buffer 216.

The call and return tags are branch tags associated with the respective call and return instruction represented by a particular entry. It is noted that branch prediction unit 220 assigns a branch tag to each branch, call, and return instruction. A branch tag is a number indicative of the order of a particular predicted branch instruction with respect to other predicted branch instructions. The branch tags associated with two such instructions may be compared to determine which of the two instructions is first in program order. In one embodiment, the branch tag associated with a particular instruction is conveyed with each instruction through the instruction processing pipelines of microprocessor 200.

Each non-branch instruction receives the branch tag associated with the most recently predicted branch when that instruction is dispatched. In one specific embodiment, the branch tag comprises four bits. If all branch tags are assigned to outstanding branch instructions, and another branch instruction is detected, then the instruction processing pipeline of microprocessor 200 is stalled until a branch tag becomes available.

A branch tag becomes available in a number of ways. If a branch instruction is detected as mispredicted, the branch tag associated with that instruction and subsequent branch tags become available. Subsequent branch tags become available because instructions subsequent to a mispredicted branch are flushed (or deleted) from the instruction processing pipeline. If a branch instruction is retired by reorder buffer 216, then the branch tag associated with that instruction becomes available. As used herein, the term "mispredicted branch" refers to a branch, call, or return instruction for which the target address has been mispredicted. A branch may be mispredicted because the speculatively generated target address is incorrect. Additionally, a branch may be mispredicted because it was predicted to be taken (i.e. the next instruction to be executed resides at the target address) and the branch is found to be not taken. Alternatively, a branch may be mispredicted because it was predicted to be not taken (i.e. the next instruction to be executed resides in memory contiguous to the branch instruction) and the branch is found to be taken.

Return prediction unit 250 further includes a return stack control unit 254, an adder circuit 256, a multiplexor 258, and a comparator block 260. Return stack control unit 254 is configured to control the storage of data within return stack storage 252. Adder circuit 256 and multiplexor 258 are configured to generate a return PC for a particular entry during a clock cycle in which the entry is being allocated to a particular call instruction. Comparator block 260 is used to recover from mispredicted branch instructions.

Return stack control unit 254 is coupled to return stack storage 252 via a data bus 262 and a pointer bus 264. Data bus 262 allows the reading and writing of data into each of the storage locations (or entries) within return stack storage 252. Control signals conveyed along with the data upon data bus 262 indicate a read or write operation as well as which entry or entries is selected. Pointer bus 264 conveys a pointer indicative of the "top" of return stack storage 252. The top of return stack storage 252 is the entry within return stack storage 252 which contains the most recently allocated call instruction data. The entry above the entry indicated by return pointer 264 does not contain valid data.

Additionally, return stack control unit 254 receives a plurality of buses from other units within microprocessor 200. A call bus 266 and a return bus 268 convey call and return signals from branch prediction unit 220. The call and return signals are indicative, when asserted, of a call and return instruction (respectively) detected by branch prediction unit 220. In one embodiment, branch prediction unit 220 employs a branch prediction structure similar to that described within the commonly assigned, co-pending patent application entitled: "A Way Prediction Unit and Method for Operating Same", Ser. No. 08/420,666, filed Apr. 12, 1995 by Tran, et al., abandoned and continued in application Ser. No. 08/838,680 filed Apr. 9, 1997, now U.S. Pat. No. 5,848,433. This patent application is incorporated herein by reference in its entirety. Call and return instructions are stored as predicted branches within the branch prediction structure, along with an indication that the instruction is a call or return instruction. The branch prediction structure includes a plurality of storage locations indexed by the instruction fetch address. Branches and call instructions are detected according to information stored in each entry and predicted according to that information. If a call instruction is detected within a set of instructions fetched by instruction cache 204, then the call signal is asserted to return prediction unit 250. Similarly, if a return instruction is detected within a set of instructions fetched by instruction cache 204, then the return signal is asserted to return prediction unit 250.

Upon receipt of the asserted call signal from branch prediction unit 220, return stack control unit 254 allocates an entry to the call instruction. The allocated entry is determined according to the pointer on pointer bus 264, and the entry becomes the top of the stack (i.e. the pointer indicates that the allocated entry is the top of the stack). The return PC is calculated by adder circuit 256 from the offset of the call instruction within the fetched line (the offset is transferred to return stack control unit 254 from branch prediction unit 220 upon call bus 266) and from the address being fetched (transferred to multiplexor 258 from instruction cache 204). Multiplexor 258 is controlled by return stack control unit 254, and selects the address conveyed by instruction cache 204 in this case. The return PC is stored into the allocated entry within return stack storage 252, along with the call tag assigned by branch prediction unit 220 (conveyed upon call bus 266). Additionally, the CV bit is set.

Upon receipt of the asserted return signal from branch prediction unit 220 (along with an associated return tag), return stack control unit 254 predicts a return address for the return instruction. The return address is predicted to be the return PC stored within the entry nearest to the top of the return stack (as indicated by the pointer upon pointer bus 264) for which the RV bit is not yet set. The RV bit is indicative that the associated return PC has been used as a return address prediction during a previous clock cycle. Therefore, the return PC is already associated with a previous return instruction if the RV bit is set. The selected return PC is conveyed upon return PC prediction bus 270 to instruction cache 204 for use in fetching subsequent instructions. It is noted that if no storage locations within return stack storage 252 meet the above mentioned criteria, then no prediction is made for that return instruction. It is further noted that, in one embodiment, either a call or a return instruction is indicated by branch prediction unit 220 upon call bus 266 and return bus 268 during a given clock cycle.

It is noted that the branch prediction structure within branch prediction unit 220 is a speculative structure which may not store an indication of a particular call or return instruction. An indication of whether or not a particular call or return instruction was detected by branch prediction unit 220 is conveyed with each call and return instruction through the instruction processing pipeline of microprocessor 200. When a decode unit 208 decodes a call or return instruction and the associated indication signifies that the instruction was not detected by branch prediction unit 220, then the decode unit asserts a call signal upon a decode call bus 272 or a decode return bus 274 to return prediction unit 250. During a clock cycle in which these signals are asserted, the instruction fetching portion of the instruction processing pipeline within instruction cache 204 and instruction alignment unit 206 is stalled.

When decode units 208 decode a call or return instruction not detected by branch prediction unit 220, return stack control unit 254 performs two actions concurrently. First, the call or return instruction is treated similar to a mispredicted branch (described below) having a branch tag equal to the branch tag carried by the instruction. It is noted that this branch tag is actually associated with a predicted branch instruction prior to the instruction in this case, since the call or return instruction was not detected during the fetch stage of the instruction processing pipeline. The branch tag is conveyed to comparator block 260 upon a decode branch tag bus 276. Additionally, the call or return instruction is allocated a storage location similar to the above discussion for call and return instructions detected by branch prediction unit 220. The call or return tag in this case is one greater than the branch tag conveyed by decode units 208. Additionally, multiplexor 258 is directed to accept the PC address from decode units 208 in the case of a call instruction. The instruction offset is calculated according to the particular decode unit 208 which decodes the call or return instruction. The offset is conveyed by that decode unit to return stack control unit 254.

During a clock cycle in which reorder buffer 216 retires a call or return instruction, the associated call or return tag is transferred to return stack control unit 254 upon retire bus 278. Upon receipt of a retired call instruction indication, the CRV bit is set in the associated storage location (identified by a call tag equal to the tag sent by reorder buffer 216). Upon receipt of a retired return instruction indication, the associated storage location (identified by a return tag equal to the tag sent by reorder buffer 216) is deleted from return stack storage 252. In one embodiment, the contents of storage locations within return stack 252 between the storage location indicated by pointer bus 264 and the storage location identified by the return tag are copied to the next lower storage location. In other words, storage locations between the storage location indicated by pointer bus and the storage location identified by the return tag are shifted down by one location. The storage location identified by the return tag is thereby overwritten by another entry and therefore is deleted from return stack storage 252.

Because microprocessor 200 is configured to speculatively execute instructions out-of-order, branch mispredictions may indicate that portions of return stack 252 are storing incorrect information. When a branch instruction is mispredicted, then information associated with instructions within the instruction processing pipeline which are subsequent to the mispredicted branch may be incorrect. As noted above, the instructions subsequent to the mispredicted branch are flushed from the pipeline. Return stack storage 252 is purged of information related to the flushed instructions.

In order to recover the contents of return stack storage 252 upon detection of a mispredicted branch, comparator block 260 is included within return prediction unit 250. A misprediction signal upon branch misprediction conductor 278 indicates that a mispredicted branch has been detected. In one embodiment, branch prediction unit 220 conveys the misprediction signal. In another embodiment, reorder buffer 216 conveys the misprediction signal. In still another embodiment, the functional unit 212 which detects the branch misprediction conveys the misprediction signal. Upon receipt of the branch misprediction signal, comparator block 260 compares the call and return tags stored within return stack storage 252 to the branch tag conveyed upon branch tag bus 280. If a particular call or return tag is found to be subsequent to the branch tag in program order, then an associated invalidate signal is asserted upon invalidate bus 282 to return stack control unit 254. Invalidate bus 282 includes an invalidate signal for each call tag and return tag within return stack storage 252, and the signal may be asserted according to a matching comparison between the associated call or return tag and a branch tag from branch tag bus 280 or 276. It is noted that call tags and return tags stored within return stack storage 252 are conveyed to comparator block 260 upon call tag bus 284 and return tag bus 286, respectively.

Upon receipt of an asserted invalidate signal, the associated CV or RV bit within return stack storage 252 is reset. In this manner, call and return instructions subsequent to the mispredicted branch are removed from return stack storage 252. Once a call instruction is retired by reorder buffer 216, the associated call tag is invalid. Therefore, if an invalidate signal is asserted for a call instruction for which the CRV bit is set, then the CV bit is left unmodified. Additionally, storage entries for which the call instruction have been invalidated no longer store valid information. Similar to removing entries for which the return instruction has been retired, the storage locations are shifted and the pointer value adjusted to delete the invalid entries from return stack storage 252.

It is noted that call and return instructions for which the target address is mispredicted are treated as mispredicted branch instructions for purposes of this discussion. It is further noted that a mispredicted address for a return instruction may be indicative of a fake return instruction. Although conditions other than the existence of a fake return instruction may be the cause of the misprediction, it is difficult to distinguish the various conditions within return prediction unit 250. Therefore, the entire return stack is invalidated when a mispredicted return instruction is detected. Additionally, if the contents of instruction cache 204 are invalidated, then the return stack is invalidated. Instruction cache 204 may be invalidated due to a task switch, for example. The contents of return stack storage 252 may be invalid for the new task, and therefore the return stack is invalidated.

Return stack storage 252 includes a finite number of entries, and may therefore become full before any entries are deleted. When a call instruction is detected and return stack storage 252 is full of valid entries, then the entry stored at the "bottom" of the stack (i.e. the entry allocated prior to other entries within the stack) is deleted. In one embodiment, the pointer upon pointer bus 254 wraps around to the bottom storage location within return stack storage 252 and allocates that location to the newly detected call instruction. In another embodiment, all storage locations within return stack storage 252 are shifted down one location (similar to when an entry is deleted due to return instruction retirement) and the top storage location is allocated to the new return instruction. The pointer upon pointer bus 264 is unmodified for this embodiment.

It is noted that certain instruction within various microprocessor architectures may generate an "exception". An exception causes program execution to jump to an exception handling routine, similar to an interrupt. If an instruction generates an exception, the branch tag conveyed with the instruction is used as a mispredicted branch tag, and the return stack is recovered according to the mispredicted branch recovery sequence noted above. It is further noted that, when multiple call and/or return instructions are detected simultaneously by decode units 208, return stack control unit 254 is configured to select the first instruction detected in program order. The other call and/or return instructions will be purged from the instruction processing pipeline due to the first instructions being detected. It is still further noted that the above discussion describes signals as being "asserted". A signal may be defined as being asserted when it conveys a value indicative of a particular piece of information. A particular signal may be defined to be asserted when it conveys a binary one value or, alternatively, when it conveys a binary zero value. A second embodiment of return prediction unit 250 is contemplated in which call and return instructions are detected in decode units 208 but not in branch prediction unit 220. For this embodiment, functionality is similar to the above description with the exception of detection of call and return instructions in branch prediction unit 220. Additionally, an embodiment is contemplated in which call, return and branch tags may be tags from reorder buffer 216 indicative of the position within reorder buffer 216 storing the associated instruction.

Turning now to FIG. 2A, another embodiment of return stack storage 252 (return stack storage 252A) is shown. The return PC, call tag, and return tag are included, as well as the CV, RV, and CRV bits similar to return stack storage 252 shown in FIG. 2. Additionally, return stack storage 252A includes an IXC bit and a ISTART bit. The IXC bit is set if the call tag is associated with an INT instruction, and is cleared if the call tag is associated with a CALL instruction. When a prediction is made by return prediction unit 250 for an IRET instruction, the storage location nearest the top of return stack storage 252A in which the RV bit is clear and the IXC bit is set is used as the prediction. Similarly, when a prediction is made by return prediction unit 250 for a RET instruction, the storage location nearest the top of return stack storage 252A in which both the RV and IXC bits are clear is used as the prediction. In this manner, CALL-RET pairs may be separated from INT-IRET pairs.

It is noted that the IRET instruction is not only used in conjunction with the interrupt instruction. Additionally, the IRET instruction is used to return from asynchronous interrupts. For example, microprocessor 200 may include an interrupt pin which may be asserted by external hardware to interrupt microprocessor 200. An interrupt service routine is executed by microprocessor 200 in response to the interrupt, often ending in an IRET instruction to cause microprocessor 200 to return to the interrupted instruction sequence. Because of this alternative usage of the IRET instruction, IRET has a higher probability of being mispredicted than the RET instruction. It may be performance limiting to invalidate the entire return stack upon a mispredicted IRET instruction. The ISTART bit is set when microprocessor 200 enters an interrupt service routine. If the interrupt service routine is entered due to an asynchronous interrupt, then an entry is allocated with the program count value of the instruction interrupted as the return PC and the ISTART bit is set. If the interrupt service routine is entered due to an INT instruction, the ISTART bit is set when the INT instruction allocates an entry. If an IRET instruction is mispredicted, the entries within return stack storage 252A between the top entry and the entry nearest the top for which the ISTART bit is set are invalidated. In this manner, only the portion of return stack storage 252A which is associated with the interrupt service routine may be invalidated.

Figure 3:
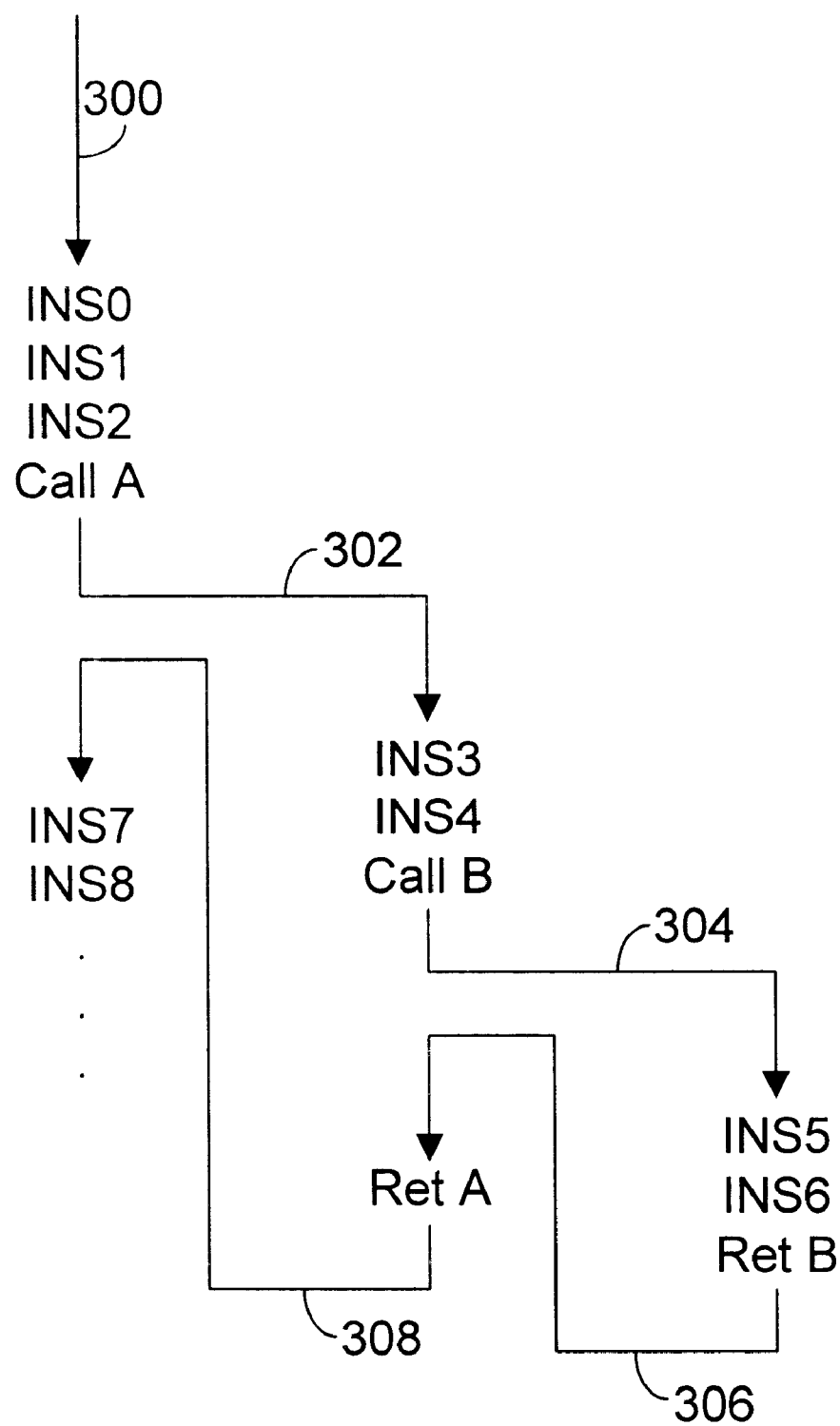
FIG. 3 is a diagram of instructions, including call and return instructions, illustrating instruction flow according to call and return instructions.

Turning now to FIG. 3, an exemplary instruction sequence is shown to further highlight the operation of return prediction unit 250 in predicting addresses. In the following discussion, for brevity, it is assumed that no fake return instructions are used. It is noted that instructions labeled INS0 through INS8 represent instructions which are not branch, Call, or Ret instructions. Beginning at arrow 300, an instruction stream of contiguous instructions labeled INS0 through INS2 are executed, and then a call instruction Call A is encountered. Instruction execution transfers to an address specified by Call A (arrow 302), and a set of contiguous instructions labeled INS3 through INS4 are executed. A second call instruction Call B is encountered, causing instruction execution to transfer to yet another address specified by the Call B instruction (arrow 304). A third set of contiguous instructions labeled INS5 through INS6 are executed, and a return instruction Ret B is encountered.

Ret B is the first return instruction encountered, and so is defined to return to the instruction in memory immediately following the most recently executed call instruction (Call B, arrow 306). In other words, Ret B fetches an instruction stored in memory locations contiguous to the memory locations storing the Call B instruction. The instruction Ret A is immediately following Call B in this example, and is the second return instruction encountered in the example. Therefore, Ret A is defined to return to the second most recently executed call instruction (Call A, arrow 308). Immediately following the Call A instruction in memory is the instruction INS7, and instructions continue to be executed from that point forward. Return instructions are paired with call instructions in a last-in, first-out (LIFO) manner. The last call instruction to be executed is the first to be paired with a return instruction, etc. It is noted that return stack storage 252 is well suited to the LIFO manner in which call and return instructions are associated.

If the exemplary instruction sequence shown in FIG. 3 is executed by a superscalar microprocessor, then performance may be gained by predicting the return address of the Ret B and Ret A instructions. During a clock cycle, Call A is fetched and the return address is placed within return prediction unit 250. During a later clock cycle, Call B is fetched and the return address is placed within return prediction unit 250 as well. The Call B entry is at the top of the return stack storage 252 (as defined by the pointer upon pointer bus 264), and the Call A entry is second from the top. When Ret B is fetched, the entry nearest the top of return stack storage 252 which has not been used as a return address prediction is used as the prediction address (as noted above). In this example, the entry chosen is the top entry, since no return address predictions have yet been made. Therefore, the return address for Ret B is predicted to be the address following Call B.

During a subsequent clock cycle, prior to the Ret B instruction retiring, the Ret A instruction is fetched. The return address prediction is again made according to the top entry which has not been used as a prediction. Although Call B is still the top entry of the return stack storage (since Ret B has yet to be retired), that entry has been used as a return address prediction. Therefore, the second from the top entry is used. The address of the instruction immediately following Call A is used as the return address prediction for Ret A. In both cases, the correct return address is predicted.

Figure 4A:
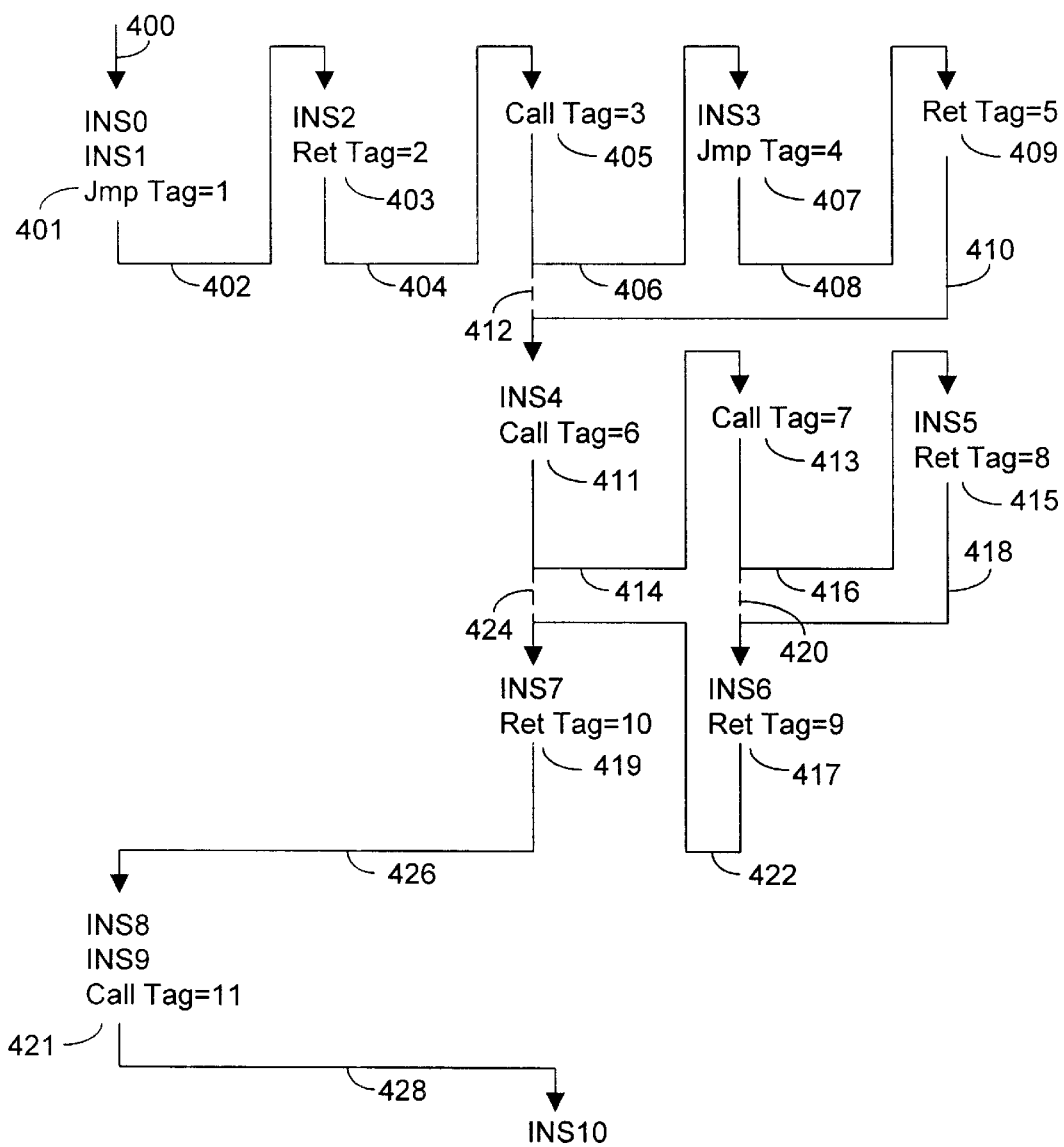
FIG. 4A is an exemplary instruction stream used to illustrate the function of the present return prediction unit.

Turning now to FIG. 4A, a second exemplary instruction sequence is shown. This instruction sequence is used to illustrate the dynamics of the present return stack structure in more detail. Beginning at arrow 400, an instruction stream including instructions INS0 through INS1 are executed. Instructions INS0 through INS9, similar to FIG. 3, represent instructions which are not branch, Call, or Ret instructions. Following INS1 is a branch instruction Jmp, with a branch tag of one. In this example, decimal numbers are used for branch tags. However, many other numbering schemes may be used for branch tags. The Jmp instruction is predicted taken, and so instruction execution begins at the target of the Jmp instruction (arrow 402).

At the target of the Jmp instruction is an instruction INS2 followed by a Ret instruction. The Ret instruction is assigned the next available branch tag, which in the exemplary numbering scheme shown is a branch tag value of two. Instruction execution then begins at the predicted target of the Ret instruction (arrow 404). The remainder of the instruction stream is similar, following consecutively through arrows 406, 408, 410, 414, 416, 418, 422, 426, and 428. Branch, Call, and Ret instructions are assigned consecutive branch tags as shown in FIG. 4A. Each instruction is numbered for reference in FIGS. 4B through 4E below. It is noted that Ret instruction 409 returns to the instruction subsequent to Call instruction 405. This relationship is shown by dotted line 412. Similarly, Ret instruction 415 returns to the instruction subsequent to Call instruction 413 (line 420) and Ret instruction 417 returns to the instruction subsequent to Call instruction 411 (line 424).

Turning now to FIG. 4B, the state of return stack storage 252 prior to the execution of INS0 is shown (i.e. the state of the return stack storage at arrow 400 shown in FIG. 4A). Three valid entries are shown (reference numbers 440, 442, and 444), with return addresses A, B, and C (respectively). In this example, letters are used as exemplary return addresses for brevity. A return address is in fact a multi-bit number. In one embodiment, a return address comprises 32 bits. A call tag of zero is stored in each entry, although the entries storing return addresses A and B have their respective CRV bits set, and so the respective call tags are no longer valid for those instructions. Each entry has its CV bit set, indicating that the entries are valid. None of the RV bits are set, and so entries 440, 442, and 444 have not yet been used as return address predictions. Each entry includes a dash in the return tag field to indicate that the return tags are not valid. The pointer upon pointer bus 362 is shown pointing to the third entry of return stack storage 252. Third entry 444 is the current top of the valid entries within return stack storage 252.

Turning now to FIG. 4C, the contents of return stack storage 252 are shown at the time of fetching Jmp instruction 407 (i.e. at arrow 406 in FIG. 4A). A fourth entry has been added from the state shown in FIG. 4B (return address D, call tag of three, reference number 446). Additionally, entry 444 includes a valid return tag value of two, and the RV bit is set. The contents of return stack storage 252 may be explained by considering that the first call or return encountered is Ret instruction 403. At the time the Ret instruction is fetched, the top entry in return stack storage 252 is entry 444. Since the RV bit of entry 444 is clear, return address C is predicted for Ret instruction 403. The RV bit is then set, and the return tag of Ret instruction 403 (i.e. the value two) is stored into the return tag field of entry 444. The next Call or Ret instruction encountered is Call instruction 405. Fourth entry 446 is allocated at the fetch of Call instruction 405, and the call tag is set to the call tag of Call instruction 405 (i.e. the value of three). The pointer is now shown pointing to fourth entry 446.

Turning next to FIG. 4D, the state of return stack storage 252 is shown after fetching Call instruction 413 (i.e. at arrow 416 shown in FIG. 4A). Two additional entries (reference numbers 448 and 450) have been added with respect to the state shown in FIG. 4C, and entry 446 has been updated. Entry 446 is updated at the fetching of Ret instruction 409, which includes a return tag value of five. Entry 446 is the top of return stack storage 252 at the time Ret instruction 409 is fetched, and the RV bit of entry 446 is clear. Therefore, return address D is used as the return address prediction and the RV bit of entry 446 is set. Call instructions 411 and 413, respectively, cause the allocation of entries 448 and 450. Therefore, entry 448 includes a call tag value of six and entry 450 includes a call tag value of seven.

Turning now to FIG. 4E, the state of return stack storage 252 at the end of the exemplary instruction stream shown in FIG. 4A (i.e. at arrow 418 as shown in FIG. 4A). Yet another entry 452 has been added, and entries 448, 450, and 442 have been updated. Entry 450 is updated at the fetch of Ret instruction 415, because entry 450 is at the top of stack storage 252 at the time Ret instruction 415 is fetched. As shown in FIG. 4E, return address F is used as a prediction for Ret instruction 415 and the return tag associated with Ret instruction 415 is stored into entry 450. Similarly, Ret instruction 417 causes the update of entry 448. Entry 448 is not at the top of return stack storage 252, but the entry which is at the top (entry 450) has already been used as a return address prediction for Ret instruction 415. Therefore, entry 448 is used as the return address prediction for Ret instruction 417.

Additionally, Ret instruction 419 is fetched and a return address prediction is formulated. At the time Ret instruction 419 is fetched, entries 450, 448, 446, and 444 have previously been used as return address predictions. Therefore, entry 442 is the entry of return stack storage 252 nearest the top of the stack which has not yet been used as a return address prediction. Return address B is prediction, and entry 442 is updated with the return tag associated with Ret instruction 419 (i.e. a return tag value of ten). Call instruction 421 is then decoded and causes entry 452 to be added to the top of return stack storage 252.

The exemplary code sequence shown in FIG. 4A may be used to illustrate the recovery of return prediction unit 250 from mispredicted branches. As an example, consider Jmp instruction 407 being mispredicted and the misprediction being detected at arrow 416, such that FIG. 4D shows the state of return stack storage 252. Jmp instruction 407 includes a branch tag of four, and therefore any instructions having call and return tags subsequent to a branch tag value of four within return stack storage 252 are invalidated. It is noted that call tags which are associated with retired call instructions are not invalidated. As shown in FIG. 4D, the return tag of entry 446 and the call tags of entries 450 and 448 are invalidated. As a second example, consider Jmp instruction 407 not being determined to be mispredicted until return stack storage 252 achieves the state shown in FIG. 4E. In this example, the return tags of entries 450, 448, 446, and 442 and the call tags of entries 452, 450, and 448 are invalidated. It is noted that call instructions whose target addresses are incorrectly predicted operate similarly with respect to return stack storage 252.

Figure 5:
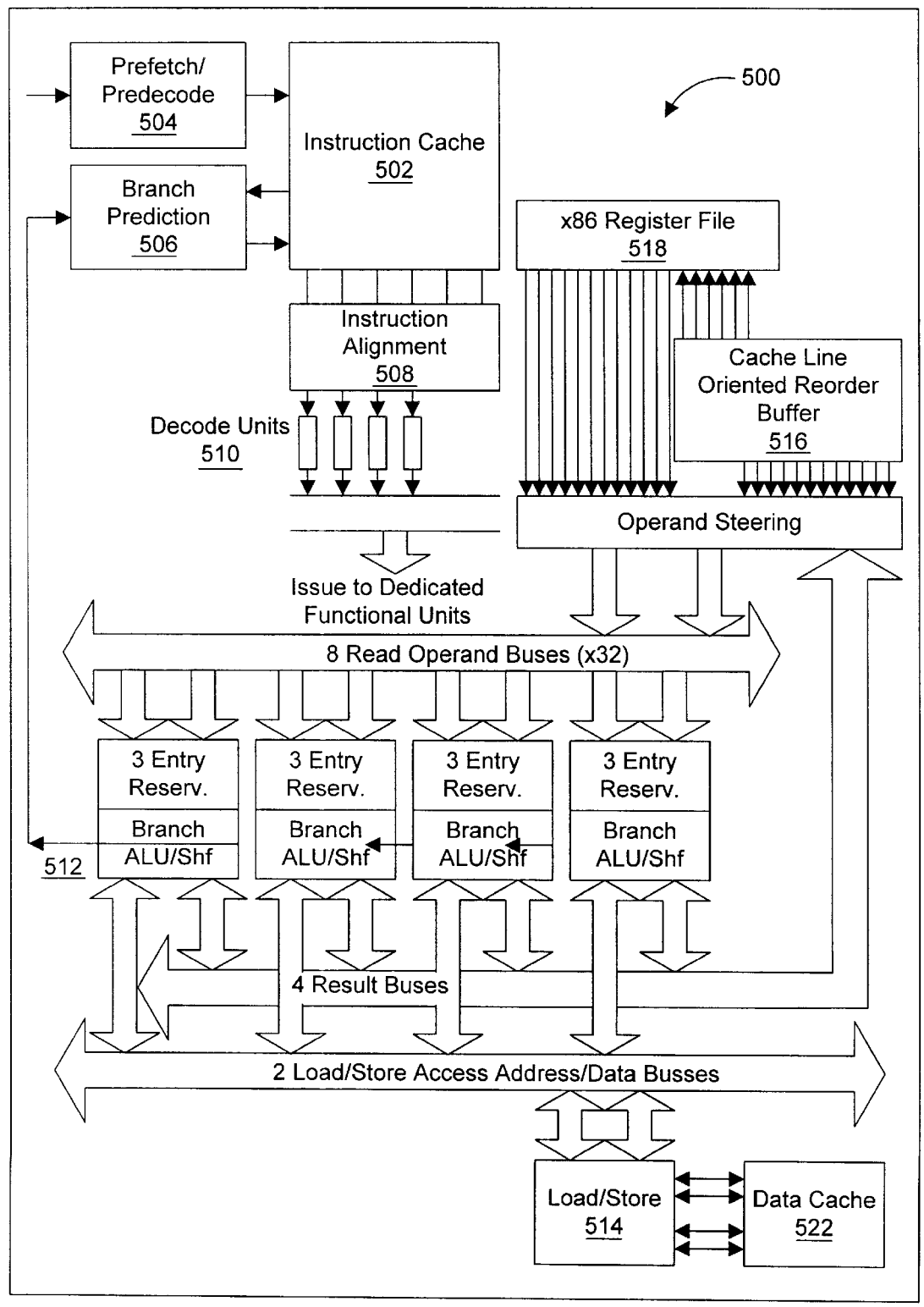
FIGS. 5–67 depict a superscalar microprocessor.
Figure 66:
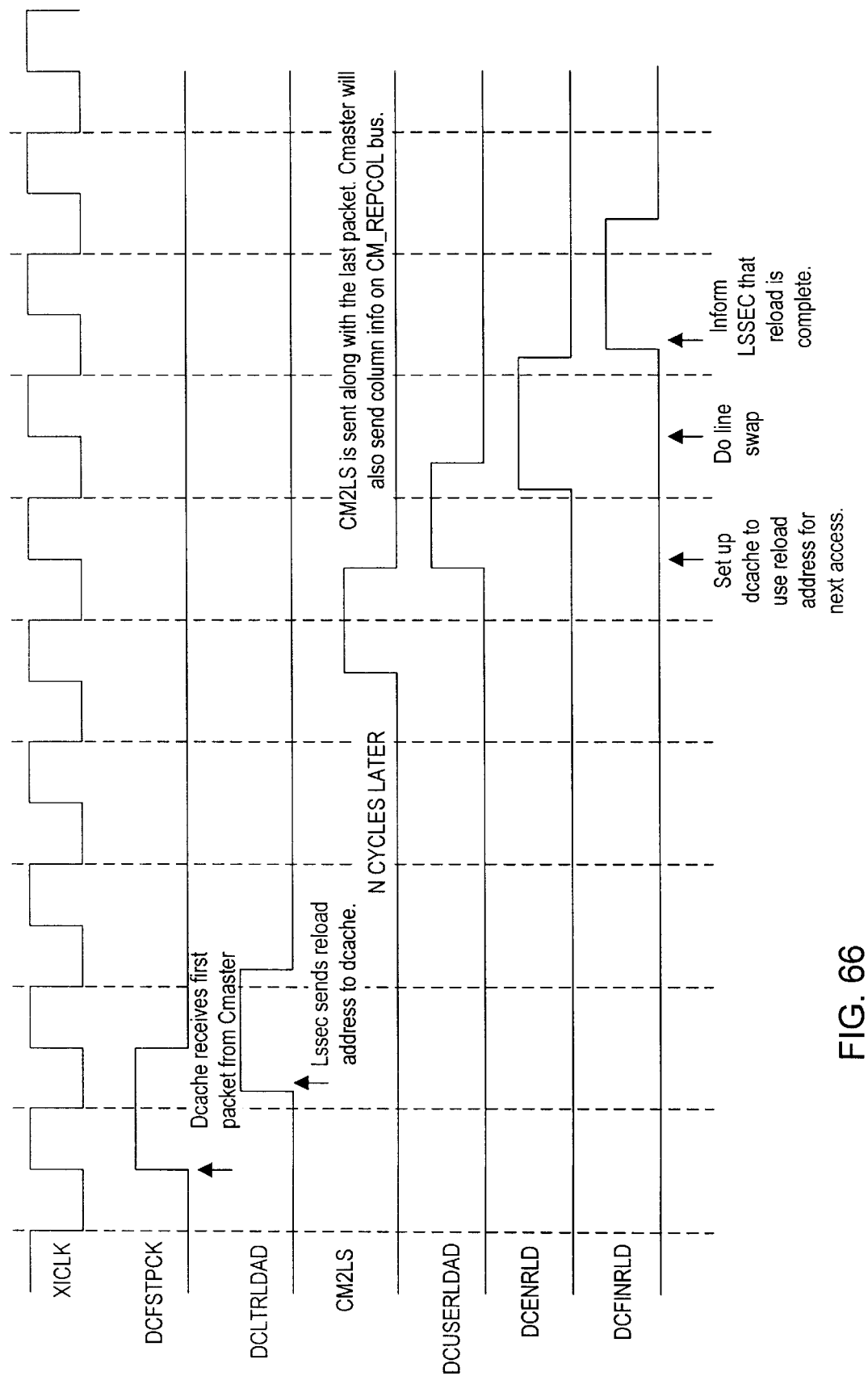

Turning next to FIGS. 5–66, details regarding various aspects of another embodiment of a superscalar microprocessor are next considered. FIG. 5 is a block diagram of a processor 500 including an instruction cache 502 coupled to a prefetch/predecode unit 504, to a branch prediction unit 506, and to an instruction alignment unit 508. A set 510 of decode units is further coupled to instruction alignment unit 508, and a set 512 of reservation station/functional units is coupled to a load/store unit 514 and to a reorder buffer 516. A register file unit 518 is finally shown coupled to reorder buffer 516, and a data cache 522 is shown coupled to load/store unit 514.

Processor 500 limits the addressing mechanism used in the x86 to achieve both regular simple form of addressing as well as high clock frequency execution. It also targets 32-bit O/S and applications. Specifically, 32-bit flat addressing is employed where all the segment registers are mapped to all 4GB of physical memory. the starting address being 0000–0000 hex and their limit address being FFFF hex. The setting of this condition will be detected within processor 500 as one of the conditions to allow the collection of accelerated data paths and instructions to be enabled. The absence of this condition of 32-bit flat addressing will cause a serialization condition on instruction issue and a trapping to MROM space.

Another method to ensure that a relatively high clock frequency may be accommodated is to limit the number of memory address calculation schemes to those that are simple to decode and can be decoded within a few bytes. We are also interested in supporting addressing that fits into our other goals, i.e., regular instruction decoding.

As a result, the x86 instruction types that are supported for load/store operations are:

| | |
|---|---|
| push | [implied ESP – 4] |
| pop | [implied ESP + 4] |
| call | [implied ESP + 8] |
| ret | (implied ESP – 8) |
| load | [base + 8-bit displacement] |
| store | [base + 8-bit displacement] |
| oper. | [EBP + 8-bit displacement] |
| oper. | (EAX + 8-bit displacement] |

Figure 6:
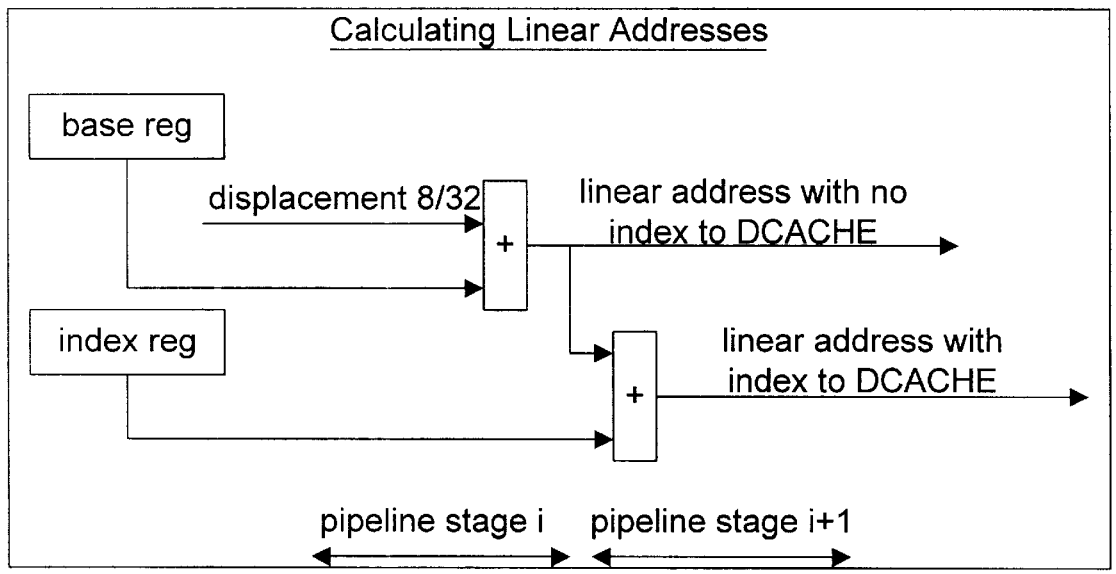

The block diagram of FIG. 6 shows the pipeline for calculating addressing within processor 500. It is noted that base +8/32 bit displacement takes 1 cycle, where using an index register takes 1 more cycle of delay in calculating the address. More complicated addressing than these requires invoking an MROM routine to execute.

An exemplary listing of the instruction sub-set supported by processor 500 as fast path instructions is provided below. All other x86 instructions will be executed as micro-ROM sequences of fast path instructions or extensions to fast path instructions.

The standard x86 instruction set is very limited in the number of registers it provides. Most RISC processors have 32 or greater general purpose registers, and many important variables can be held during and across procedures or processes during normal execution of routines. Because there are so few registers in the x86 architecture and most are not general purpose, a large percentage of operations are moves to and from memory. RISC architectures also incorporate 3 operand addressing to prevent moves from occurring of register values that are desired to be saved instead of overwritten.

The x86 instruction set uses a set of registers that can trace its history back to the 8080. Consequently there are few registers, many side effects, and sub-registers within registers. This is because when moving to 16-bit, or 32-bit operands, mode bits were added and the lengths of the registers were extended instead of expanding the size of the register file. Modern compiler technology can make use of large register sets and have a much smaller percentage of loads and stores. The effect of these same compilers is to have a much larger percentage of loads and stores when compiling to the x86. The actual x86 registers are often relegated to temporary registers for a few clock cycles while the real operation destinations are in memory.

Figure 7:
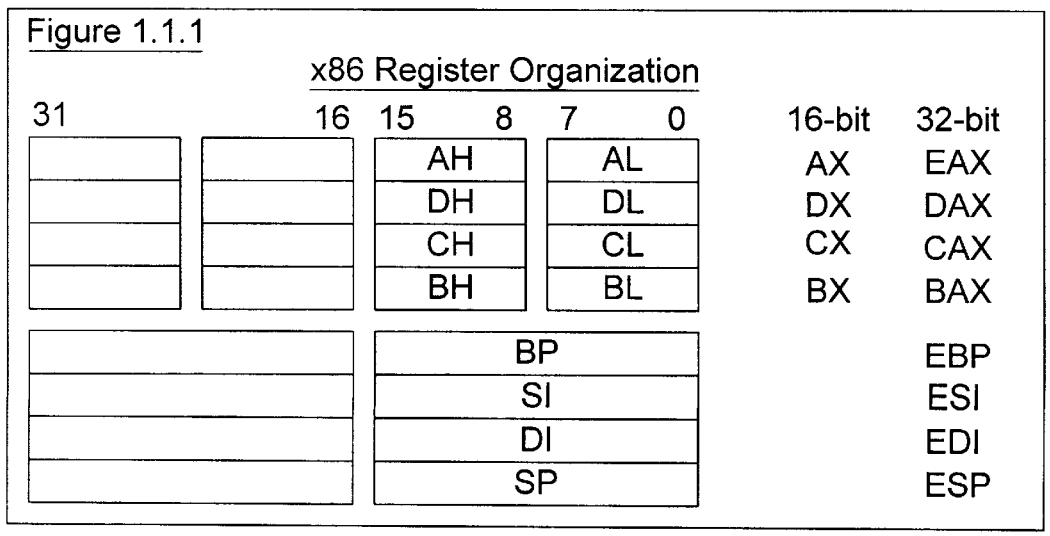

FIG. 7 shows a programmer's view of the x86 register file. One notes from this organization that there are only 8 registers. and few are general purpose. The first four registers, EAX, EDX, ECX, and EBX, have operand sizes of 8, 16, or 32-bits depending on the mode of the processor or instruction. The final 4 registers were added with the 8086 and extended with the 386. Because there are so few real registers, they tend to act as holding positions for the passing of variables to and from memory.

The important thing to note is that when executing x86 instructions, one must be able to efficiently handle 8, 16, and 32-bit operands. If one is trying to execute multiple x86 instructions in parallel, it is not enough to simply multi-port the register file. This is because there are too few registers and all important program variables must be held in memory on the stack or in a fixed location.

RISC designs employ regular instruction decoding along natural boundaries to achieve very high clock frequencies and also with a small number of pipeline stages even for very wide issue processors. This is possible because finding a large number of instructions and their opcodes is relatively straightforward, since they are always at fixed boundaries.

As stated previously, this is much more difficult in an x86 processor where there are variable byte instruction formats, as well as prefix bytes and SIB bytes that can effect the length and addressing/data types of the original opcode.

Processor 500 employs hardware to detect and send simple instructions to fixed issue positions, where the range of bytes that a particular issue position can use is limited. This may be compensated for by adding many issue positions that each instruction cache line can assume in parallel.

Once the instructions are aligned to a particular issue position, the net amount of hardware required to decode common instructions is not significantly greater than that of a RISC processor, allowing equivalent clock frequencies to be achieved. Processor 500 achieves high frequency, wide issue, and limited pipeline depth by limiting the instructions executed at high frequency to a sub-set of the x86 instructions under the conditions of 32-bit flat addressing.

The results of executing instructions are returned to the corresponding entry in the reorder buffer. If a store, the store is held in speculative state in front of the data cache in a store buffer, from which point it can be speculatively forwarded from. The reorder buffer then can either cancel this store or allow it to writeback to the data cache when the line is retired.

The following set of instructions probably comprise 90% of the dynamically executed code for 32-bit applications:

8/32-bit operations
move reg/reg reg/mem
arithmetic operations reg/mem reg/reg logical
operations reg/reg reg/mem push
logical operations reg/reg reg/mem
push -continued pop
call/return
load effective address
jump cc
jump unconditional
16-bit operations
prefix/move reg/reg
prefix/move reg/mem
prefix/arithmetic operations reg/reg, reg/mem
prefix/logical operations reg/reg reg/mem
prefix/push
prefix/pop When executing 32-bit code under flat addressing, these instructions almost always fall within 1–8 bytes in length, which is in the same rough range of the aligned, accelerated fast path instructions.

Accelerated instructions are defined as fast-path instructions between 1 and 8 bytes in length. It noted that it is possible that the start/end positions predecoded reflect multiple x86 instructions, for instance 2 or 3 pushes that are predecoded in a row may be treated as one accelerated instruction that consumes 3 bytes.

When a cache line is fetched from the instruction cache, it moves into an instruction alignment unit which looks for start bytes within narrow ranges. The instruction alignment unit uses the positions of the start bytes of the instructions to dispatch the instructions to four issue positions. Instructions are dispatched such that each issue position accepts the first valid start byte within its range along with subsequent bytes.

A multiplexer in each decoder looks for the end byte associated with each start byte, where an end byte can be no more than seven bytes away from a start byte. The mechanism to scan for a constant value in an instruction over four bytes in length may be given an extra pipeline stage due to the amount of time potentially required.

Note that instructions included in the subset of accelerated instructions, and which are over four bytes in length, always have a constant as the last 1/2/4 bytes. This constant is usually not needed until the instruction is issued to a functional unit, and therefore the determination of the constant value can be delayed in the pipeline. The exception is an instruction requiring an eight-bit displacement for an address calculation. The eight-bit displacement for stack-relative operations is always the third byte after the start byte, so this field will always be located within the same decoder as the rest of the instruction.

It is possible that a given cache line can have more instructions to issue than can be accommodated by the four entry positions contained in each line of the four issue reorder buffer. If this occurs, the four issue reorder buffer allocates a second line in the buffer as the remaining instructions are dispatched. Typically, in 32-bit application and O/S code, the average instruction length is about three bytes. The opcode is almost always the first two bytes, with the third byte being a sib byte specifying a memory address (if included), and the fourth byte being a 16-bit data prefix.

The assumption in the processor 500 alignment hardware is that if the average instruction length is three, then four dedicated issue positions and decoders assigned limited byte ranges should accommodate most instructions found within 16-byte instruction cache lines. If very dense decoding occurs (i.e., lots of one and two byte instructions), several lines are allocated in the four issue reorder buffer for the results of instructions contained in a few lines of the instruction cache. The fact that these more compact instructions are still issued in parallel and at a high clock frequency more than compensates for having some decoder positions potentially idle.

Overview of the Processor 500 Instruction Cache (Icache)

This section describes the instruction cache organization, fetching mechanism, and pre-decode information. The Processor 500 instruction cache has basic features including the ICSTORE, ICTAGV, ICNXTBLK, ICCNTL, ICALIGN, ICFPC, and ICPRED. Highlights are: the pre-decode bits per byte of instructions are 3 bits, the branch prediction increases to 2 targets, 2 different types of branch prediction techniques (bimodal and global) are implemented, the X86 instructions align to 4 fixed length RISC-type instructions, and the pre-decode logic eliminates many serializtion conditions. Processor 500 executes the X86 instructions directly with a few instructions requiring two Rops, the BYTEQ is configured for fast scanning of instructions, and instructions are aligned to 4 decode units. The pre-decode data is separate in a block called ICPDAT, instead of inside the ICSTORE. The pre-fetch buffers are added to the ICSTORE to write instructions directly into the array, and the prefixes are not modified. All branches are detected during pre-decoding. Unconditional branches are taken during pre-decoding and aligning of instructions to the decode units. A return stack is implemented for CALL/RETURN instructions. Way prediction is implemented to read the current block and fetch the next block because the tag comparison and branch prediction do not resolve until the second cycle. The scanning for 4 instructions is done from ICPDAT before selected by tag comparison. Since the pre-decode data does not include the information for the 2-Rop instructions, the instructions must be partially decoded for the 2-rop during prioritizing and aligning of instructions to decode units. The early decoding includes decoding for unconditional branches, operand addresses, flags, displacement and immediate fields of the instruction. The CMASTER takes care of the replacement algorithm for the Icache and sends the way associative along with the data to the pre-fetch buffer. This section includes signal lists, timings and implementation issues for the Icache and all sub-blocks.

Figure 8:
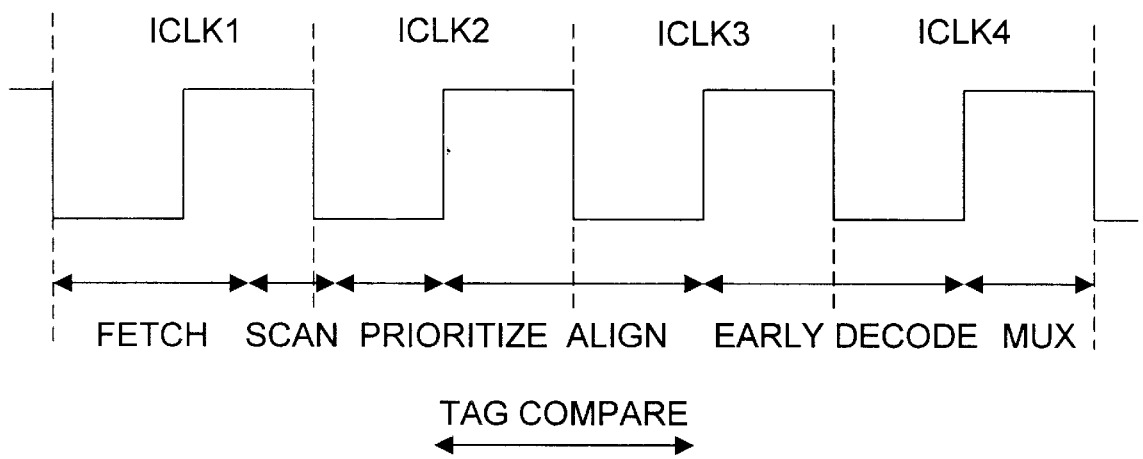

The Icache size is 32K bytes with 8-way set associative. The Icache is linearly addressed. The number of pipeline stages is 9. Icache will have more than one clock cycle to read and align the instructions to the decode units. The row decoding of index address is calculated in first half of ICLK, the data, tag, pre-decode, and predicting information are read in by the end of ICLK. In the next cycle, the data are selected by the TAGHITs and latched. The pre-decode data are scanned to generate the controls to the multiplexers for aligning and sending the instructions to the decode units and MROM units. A part of the scanning logic is done in parallel with the tag comparison. The scanning and alignment of instructions takes two clock cycles. The decode units can start decoding in the second half of the third clock. The Icache includes a way-prediction which can be done in a single clock using the ICNXTBLK target. The branch prediction includes bimodal and global branch prediction which takes two clock cycles. The timing from fetching, scanning, aligning, decoding, and muxing of instructions to decode units are shown in FIG. 8.

Throughout this documentation, a discussion of the layout organization is included in each section. The array is organized into many sets, and each set has its own decoder. The decoder is in the center of the set.

Signal list

SRBB(31:0)—I/O from SRB indicates the special register address for the array or data transferring to/from the SRB.

SRB_VAL—Input from SRB indicates a special register instruction is on the SRBB.

ICTAR_VAL—Output to SRB indicates completion of the special register instruction, for read the data is on the SRBB.

IRESET—Global signal used to reset ICACHE block. Clears all state machines to Idle/Reset.

IDECJAMIC—Global signal from FIROB. Used to indicate that an interrupt or trap is being taken. Effect on Icache is to clear all pre-fetch or access in progress, and set all state machines to Idle/Reset.

EXCEPTION—Global input from FIROB indicates that an interrupt or trap is being taken including re-synchronization. Effect on Idecode and FUs is to clear all instructions in progress.

REQTRAP—Global input from FIROB, one cycle after EXCEPTION, indicates that the trap is initiated with new entry point or new PC is driven.

INVBHREG—Input from FIROB to invalidate the branch holding register. The branch mis-prediction is speculative, an early branch can be mis-predicted at a later time.

CS32X16—Input from LSSEC indicates operand and address size from the D bit of the segment descriptor of the code segment register. If set, 32-bit, if clear, 16-bit.

SUPERV—Input from LSSEC indicates the supervisor mode or user mode of the current accessed instruction.

TR12DIC—Input from SRB indicates that all un-cached instructions must be fetched from the external memory.

SRBINVILV—Input from SRB to invalidate the Icache by clear all valid bits.

INSTRDY—Input from BIU to indicates the valid external fetched instruction is on the INSB(63:0) bus.

INSTFLT—Input from BIU to indicates the valid but faulted external fetched instruction is on the INSB(63:0) bus.

INSB(63:0)—Input from external buses for fetched instruction to the Icache.

L2_IC_ALIAS—Input from CMASTER indicates the instruction is in the Icache with different mapping. The CMASTER provides the way associative and new supervisor bit. The LV will be set in this case.

PFREPLCOL(2:0)—Input from CMASTER indicates the way associative for writing of the ICTAGV.

UPDFPC—Input from FIROB indicate that a new Fetch PC has been detected. This signal accompanies the FPC for the Icache to begin access the cache arrays.

FPC(31:0)—Input from FIROB as the new PC for branch correction path.

BPC(11:0)—Input from FIROB indicates the PC index and byte-pointer of the branch instruction which has been mis-predicted for updating the ICNXTBLK. This index must be compared to the array index for exact recovery of the global shift register.

BRNMISP—Input from the Branch execution of the FU indicates a branch mis-prediction. The Icache changes its state machine to access a new PC and clears all pending instructions.

BRNTAKEN—Input from FIROB indicate the status of the mis-prediction. This signal must be gated with UPDFPC.

BRNTAG(3:0)—Input from FIROB indicates the instruction byte for updating the branch prediction in the ICNXTBLK.

FPCTYP—Input for FIROB indicates the type of address that is being passed to the Icache.

HLDISP(1:0)—Output to Idecode indicates all instructions of the first (bit 0) and/or the second (bit 1) 8-byte of the current line has been dispatched to decode units.

REFRESH2 —Input from Idecode indicates current line of instructions will be refreshed and not accept new instructions from Icache.

MROMEND—Input from MENG indicates completion of the MROM.

DOUSEFL(4:0)

DOWRFL(4:0)—Output to FIROB indicates the type of flag uses/writes for this instruction of decode unit 0:
xx1 CF-carry flag,
x1x OF-overflow flag,
1xx SF-sign, ZF-zero, PF-parity, and AF-auxiliary carry

D1USEFL(4:0)

D1WRFL(4:0)—Output to FIROB indicates the type of flag uses/writes for this instruction of decode unit 1.

D2USEFL(4:0)

D2WRFL(4:0)—Output to FIROB indicates the type of flag uses/writes for this instruction of decode unit 2.

D3USEFL(4:0)

D3WRFL(4:0)—Output to FIROB indicates the type of flag uses/writes for this instruction of decode unit 3.

RD0PTR1(5:0)—Indicates the register address for operand 1 of decode unit 0. The MROM is responsible to send bit 5:3 for the MROM register.

RD1PTR1(5:0)—Indicates the register address for operand 1 of decode unit 1. The MROM is responsible to send bit 5:3 for the MROM register.

RD2PTR1(5:0)—Indicates the register address for operand 1 of decode unit 2. The MROM is responsible to send bit 5:3 for the MROM register.

RD3PTR1(5:0)—Indicates the register address for operand 1 of decode unit 3. The MROM is responsible to send bit 5:3 for the MROM register.

RD0PTR2(5:0)—Indicates register address for operand 2 of decode unit 0. The MROM is responsible to send bit 5:3 for the MROM register.

RD1PTR2(5:0)—Indicates register address for operand 2 of decode unit 1. The MROM is responsible to send bit 5:3 for the MROM register.

RD2PTR2(5:0)—Indicates register address for operand 2 of decode unit 2. The MROM is responsible to send bit 5:3 for the MROM register.

RD3PTR2(5:0)—Indicates register address for operand 2 of decode unit 3. The MROM is responsible to send bit 5:3 for the MROM register.

IDxDAT(1:0)—Output to indicates the data size information. 01-byte, 10-half word, 11-word, 00-not used.

ICBTAG1(3:0)—Output to Idecode indicates the position of the first target branch instruction with respect to the global shift register in case of branch mis-prediction. The branch can be taken or non-taken, branch tag must be sent with all branch instruction.

ICBTAG2(3:0)—Output to Idecode indicates the position of the second target branch instruction with respect to the global shift register in case of branch mis-prediction. The branch can be taken or non-taken, branch tag must be sent with all branch instruction.

UNJMP(3:0)—Output indicates the unconditional branch instruction needs to calculate target address.

BRNTKN(3:0)—Output indicates which decode unit has a predicted taken branch. The operand steering uses this signal to latch and send BTADDR(31:0) to the functional unit.

BRNINST(3:0)—Output indicates which decode unit has a global branch prediction. The operand steering uses this signal to latch and send ICBTAG1(3:0) and ICBTAG2(3:0) to the functional units.

CALLDEC(3:0)—Output to FIROB indicates the CALL instruction is detected, the return stack should be updated with the PC address of instruction after CALL. The information is latched for mis-predicted CALL branch.

RETDEC(3:0)—Output to FIROB indicates a RETURN instruction is detected. The information is latched for mis-predicted RETURN branch.

ICPREF(9:0)—Output to Idecode and MROM indicates the encoded prefix byte. The two most significant bits are repeat prefixes for MROM.

IC2ROP0(3:0)—Output to decode unit 0 indicates 2-rop instruction. Bit 3 indicates the first rop or second rop of the 2-rop instruction, bit 2 indicates POP instruction, bit 1 indicates the MUL instruction, and bit 0 indicates the SIB-byte instruction.

NODEST(3:0)—Output to FIROB indicates no destination for the first rop of the SIB-byte instruction.

DEPTAG(3:1)—Output to FIROB indicates forced dependency tag on the first instruction; the second rop of the SIB-byte instruction.

REFRESH2 —Input from Idecode indicates current line of instructions will be refreshed and not accept new instructions from Icache.

IB1(191:0)—Output indicates the combined instruction line for dispatching to decode units.

MROMEN—Input from MENG indicates the micro-instructions is sent to Idecode instead of the Icache.

MOUSEFL(4:0)

MOWRFL(4:0)—Input from MENG indicates the type of flag used/written for this micro-instruction of decode unit 0:
xx1 CF-carry flag,
x1x OF-overflow flag,
1xx SF-sign, ZF-zero, PF-parity, and AF-auxiliary carry

M1USEFL(4:0)

M1WRFL(4:0)—Input from MENG indicates the type of flag used/written for this micro-instruction of decode unit 1.

M2USEFL(4:0)

M2WRFL(4:0)—Input from MENG indicates the type of flag used/written for this micro-instruction of decode unit 2.

M3USEFL(4:0)

M3WRFL(4:0)—Input from MENG indicates the type of flag used/written for this micro-instruction of decode unit 3.

MINS0(63:0)—Input from MENG indicates the displacement and immediate field of micro-instruction being sent to decode 0.

MINS1(63:0)—Input from MENG indicates the displacement and immediate field of micro-instruction being sent to decode 1.

MINS2(63:0)—Input from MENG indicates the displacement and immediate field of micro-instruction being sent to decode 2.

MINS3(63:0)—Input from MENG indicates the displacement and immediate field of micro-instruction being sent to decode 3.

MR0OPC(7:0)—Input from MENG to decode unit 0 indicates the opcode byte.

MR1OPC(7:0)—Input from MENG to decode unit 1 indicates the opcode byte.

MR2OPC(7:0)—Input from MENG to decode unit 2 indicates the opcode byte.

MR3OPC(7:0)—Input from MENG to decode unit 3 indicates the opcode byte.

MR0EOP(2:0)—Input from MENG to decode unit 0 indicates the extended opcode field.

MR1EOP(2:0)—Input from MENG to decode unit 1 indicates the extended opcode field.

MR2EOP(2:0)—Input from MENG to decode unit 2 indicates the extended opcode field.

MR3EOP(2:0)—Input from MENG to decode unit 3 indicates the extended opcode field.

MR0SS(1:0)—Input from MENG to decode unit 0 indicates the scale factor of the SIB byte.

MR1SS(1:0)—Input from MENG to decode unit 1 indicates the scale factor of the SIB byte.

MR2SS(1:0)—Input from MENG to decode unit 2 indicates the scale factor of the SIB byte.

MR3SS(1:0)—Input from MENG to decode unit 3 indicates the scale factor of the SIB byte.

ICMROM—Output to MENG indicates the current instruction is MROM. The MROM instruction may take two cycles to read the IB, ICEND, and ICFUNC.

ENDINST—Input from ICPRED indicates that pre-decoding is completed for the current instruction. The byte position of the branch instruction is from STARTPTR. The selected instruction from IB should be sent to decode unit 0.

ICVALI(3:0)—Output to Idecode indicates valid instructions. NOOP is generated for invalid instruction.

IC0OPC(7:0)—Output to decode unit 0 indicates the opcode byte.

IC1OPC(7:0)—Output to decode unit 1 indicates the opcode byte.

IC2OPC(7:0)—Output to decode unit 2 indicates the opcode byte.

IC3OPC(7:0)—Output to decode unit 3 indicates the opcode byte.

IC0EOP(2:0)—Output to decode unit 0 indicates the extended opcode field.

IC1EOP(2:0)—Output to decode unit 1 indicates the extended opcode field.

IC2EOP(2:0)—Output to decode unit 2 indicates the extended opcode field.

IC3EOP(2:0)—Output to decode unit 3 indicates the extended opcode field.

IC0SS(1:0)—Output to decode unit 0 indicates the scale factor of the SIB byte.

IC1SS(1:0)—Output to decode unit 1 indicates the scale factor of the SIB byte.

IC2SS(1:0)—Output to decode unit 2 indicates the scale factor of the SIB byte.

IC3SS(1:0)—Output to decode unit 3 indicates the scale factor of the SIB byte.

DISPTR0 (6: 0)—Output to decode unit 0 indicates the displacement pointer and size. Bits 2:0 is the pointer to the 8-byte block, bit 6:5 is the size, and bit 4:3 indicates which 8-byte block. Bit 6:5=00 indicates no displacement.

DISPTR1(6:0)—Output to decode unit 1 indicates the displacement pointer and size. Bits 2:0 is the pointer to the 8-byte block, bit 6:5 is the size, and bit 4:3 indicates which 8-byte block. Bit 6:5=00 indicates no displacement.

DISPTR2(6:0)—Output to decode unit 2 indicates the displacement pointer and size. Bits 2:0 is the pointer to the 8-byte block, bit 6:5 is the size, and bit 4:3 indicates which 8-byte block. Bit 6:5=00 indicates no displacement.

DISPTR3(6:0)—Output to decode unit 3 indicates the displacement pointer and size. Bits 2:0 is the pointer to the 8-byte block, bit 6:5 is the size, and bit 4:3 indicates which 8-byte block. Bit 6:5=00 indicates no displacement.

IMMPTR0(4:0)—Output to decode unit 0 indicates the displacement pointer and size. Bits 2:0 is the pointer to the 8-byte block, and bit 4:3 indicates which 8-byte block. Decoding of all opcodes is needed to detect immediate field.

IMMPTR1(4:0)—Output to decode unit 1 indicates the displacement pointer and size. Bits 2:0 is the pointer to the 8-byte block, and bit 4:3 indicates which 8-byte block. Decoding of all opcodes is needed to detect immediate field.

IMMPTR2(4:0)—Output to decode unit 2 indicates the displacement pointer and size. Bits 2:0 is the pointer to the 8-byte block, and bit 4:3 indicates which 8-byte block. Decoding of all opcodes is needed to detect immediate field.

IMMPTR3(4:0)—Output to decode unit 3 indicates the displacement pointer and size. Bits 2:0 is the pointer to the 8-byte block, and bit 4:3 indicates which 8-byte block. Decoding of all opcodes is needed to detect immediate field.

CONSTn(2:0)—Output to decode unit n indicates the constant for add/substract to ESP of the two-dispatch position instruction.

MROMEN—Input from MENG indicates the micro-instructions is sent to Idecode instead of the Icache.

IB2(191:0)—Output to decode units indicates the current line of instructions.

ICMROM—Output to MENG indicates the current instruction is MROM. The MROM instruction may take two cycles to read the IB, ICEND, and ICFUNC.

ICPC1TAR—Output to Idecode indicates is ICPC1 a branch target of a previous instruction which is a predicted taken branch instruction.

ICPC2TAR—Output to Idecode indicates is ICPC2 a branch target of a previous instruction which is a predicted taken branch instruction.

ICPC1(31:0)—Output to Idecode indicates the current line PC of the first instruction in the 4 issued instructions to pass along with the instruction to FIROB.

ICPC2(31:0)—Output to Idecode indicates the current line PC of a second instruction which cross the 16-byte boundary or branch target in the 4 issued instructions to pass along with the instruction to FIROB.

ICPOS0(4:0)—Output to decode unit 0 indicates the PC's byte position of the next instruction. Bit 4 indicates the next instruction is on the next line.

ICPOS1(4:0)—Output to decode unit 1 indicates the PC's byte position of the next instruction. Bit 4 indicates the next instruction is on the next line.

ICPOS2(4:0)—Output to decode unit 2 indicates the PC's byte position of the next instruction. Bit 4 indicates the next instruction is on the next line.

ICPOS3(4:0)—Output to decode unit 3 indicates the PC's byte position of the next instruction. Bit 4 indicates the next instruction is on the next line.

BTAG1N(3:0)—Output indicates the position of the first target branch instruction for a new line with respect to the global shift register in case of branch mis-prediction.

BTAG2N(3:0)—Output indicates the position of the second target branch instruction for a new line with respect to the global shift register in case of branch mis-prediction.

BTAKEN1(1:0)—Output to decode units and ICFPC indicates a predicted taken branch instruction from PTAKEN, BVAL1. Bit 0 is the last line and bit 1 is new line.

BTAKEN2(1:0)—Output to decode units and ICFPC indicates a predicted taken branch instruction from PTAKEN, BVAL2. Bit 0 is the last line and bit 1 is new line.

ICERROR—Output, indicates an exception has occurred on an instruction pre-fetched, the type of exception (TLB-miss, page-fault, illegal opcode, external bus error) will also be asserted.

INSPFET—Output to BIU and CMASTER requests instruction fetching from the previous incremented address, the pre-fetch buffer in the Icache has space for a new line from external memory.

ICAD(31:0)—Output to MMU indicates a new fetch PC request to external memory.

RETPRED—Output to Idecode indicates the current prediction of the return instruction of the fetched line. The return instruction must be detected in the current line of instruction or the Icache must be re-fetched from a new line.

IC_EXT_RD—Output to CMASTER indicates the next line of instruction should be fetched from external regardless of aliasing. This is for pre-fetching of instruction which crosses the line boundary.

MMUPFPGFLT—Input from MMU indicates page fault for the current instruction address.

TLB_MISS_PF—Input from MMU indicates TLB miss for the current instruction address.

PF_IC_XFER—Output to CMASTER indicates the address for the current line is written into the cache, the L2 should be updated with the physical address. This is when the ICPDAT and the valid bit is written.

BIU_NC—Input from BIU indicates the current line should not be cached.

LS2ICNOIC—Input from LSSEC indicates no caching, pre-fetch only.

LS_CS_WR—Input from LSSEC indicates the CS is being updated.

L2_ICINV(1:0)—Input from CMASTER to invalidate up to 2 lines in the Icache.

PF_IDX(6:0)—Input from CMASTER indicates the array index for invalidating up to 2 lines in the Icache or for aliasing.

PF_SNP_COL(2:0)—Input from CMASTER indicates the way associative for invalidating up to 2 lines in the Icache or aliasing. This signal may be redundant with PFREPLCOL(2:0).

BIT20MASK—Input from CMASTER indicates masking of bit 20 for backward compatible with 8086. The line should not be cache if outside of the page.

BSTRUN—Input from TAP indicates to start the BIST.

BSTRD—Input from TAP indicates to read the array and compare to set the result.

BSTWR—Input from TAP indicates to write the array from input registers.

BSTRST—Input from TAP indicates to reset the counter.

BSTINCR—Input from TAP indicates to increment the counter.

BSTDIN—Input from TAP indicates the test pattern to the input registers. The input can be from the TDI pin or normal burn-in patterns.

FLUSHON—Input from TAP indicates flushing register mode, the result latch should use BSTDIN instead of the compare input for flushing the result registers.

UPDOWN—Input from TAP indicates counting up or down.

BSTSHF1 —Input from TAP indicates shifting of the master latch of registers.

BSTSHF2 —Input from TAP indicates shifting of the slave latch of registers.

BSTFALSE—Input from TAP indicates to invert the test pattern.

PORTSEL—Input from TAP indicates to select the second dual port.

BSTIDOUT—Output to TAP indicates the result of the data chain from the ICSTORE and ICPDAT arrays.

BSTITOUT—Output to TAP indicates the result of the data chain from the ICNXTBLK and ICTAGV arrays.

BSTAMSB—Output to TAP indicates maximum count for dual port arrays.

MAXADDR—Output to TAP indicates maximum index counter.

ATPGIN(15:14)—Input from dedicated pins for ATPG.

ATPGOUT(15:14)—Output to dedicated pins for ATPG.

ICSTORE

Processor 500 executes fast X86 instructions directly, no ROPs are needed. The pre-decode bits with each byte of instruction are 3 bits; start bit, end bit, and functional bit. All the externally fetched instructions will be latched into the Icache. This should not be a problem since the Icache is idle and waits for external instructions. Only single byte prefix of 0×66 and 0×0F is allowed for Processor 500's fast path, multiple prefixes including 0×67 is allowed for multi-prefix, all other prefixes will take an extra cycle in decoding or go to MROM. With these simple prefixes, the instruction bytes need not be modified. The linear valid bit is used for the whole cache-line of instructions, 16-byte. The replacement procedure is done by the CMASTER. Along with each line of instruction, the CMASTER tells the Icache which way to put in the data and tag. The start and end bits are sufficient to validate the instruction. If branching to the middle of the line or instructions wrapping to the next line, the start and end bits must be detected for each instruction or else the instruction must be pre-decoded again. The possible cases are branching to the opcode and skipping the prefix (punning of instruction) and part of the wrapping instruction is replaced in the Icache. The instructions must first pass through the pre-fetch buffers before sending to the ICPRED. The ICPRED has only one input from the IB(127:0) for both the pre-fetched or cached instructions. The pre-decode information is written into the ICPDAT as the whole line is decoded. The output IB(127:0) is merged with the previous 8-byte to form a 24-byte line for the alignment unit to select and send to 4 decode units.

Since the instruction fetching from external memory will be written directly into the Icache, the pre-fetch buffer should be built into the ICSTORE; the input/output path of the array. In this way, the data will be written into the Icache regardless of the pre-decode information or the taken branch instruction and the instructions is available to the Icache as soon as they are valid on the bus. The number of pre-fetch buffers is two, and request will be made to BIU as soon as there is space in the pre-fetch buffer for another line of instructions. The pre-fetch buffer consists of a counter and a valid bit for instructions written into the cache and a valid bit for instructions sent to the decode unit. As long as the address pointer is still in the same block, the data will be written to the array. With the pre-fetch buffer in the Icache, a dedicated bus should be used to transfer instructions directly from the pads to the Icache; this is a step to keep Processor 500 from using dynamic pre-charged buses.

ICSTORE ORGANIZATION

Figure 9:
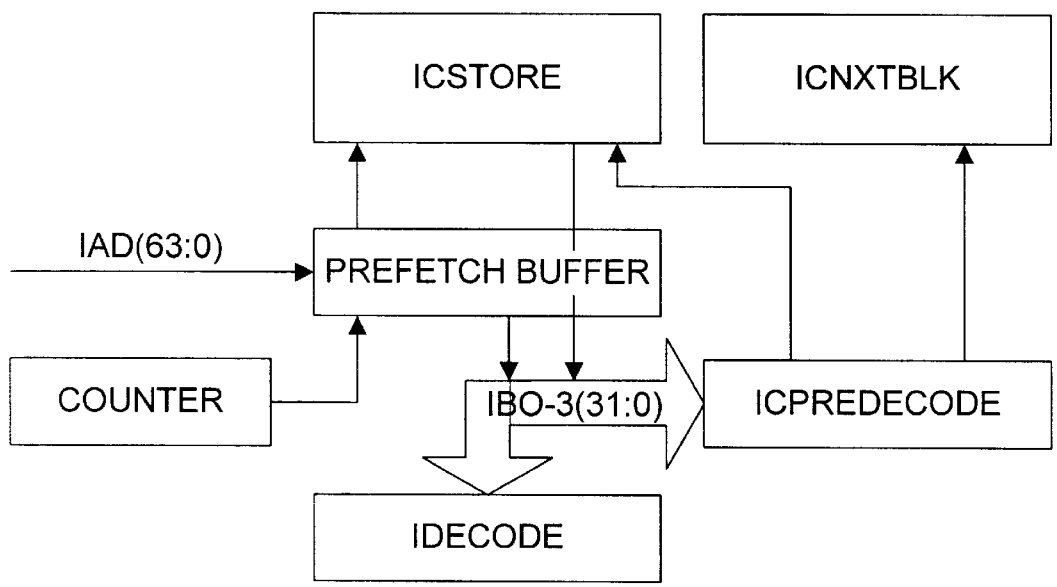

The ICSTORE on Processor 500 does not store the pre-decode data, as shown in FIG. 9. The ICSTORE consists of 32K bytes of instructions organized as 8 sets of 128 rows by 256 columns. The array set in this documentation has its own decoder. The decoder is in the center of the set. Each of the sets consist of 2-byte of instructions. The 8-way associative muxing from the 8 TAG-HITs is performed before the data is routed to the ICALIGN block. With this arrangement, the input/output to each set is 16-bit buses. The muxing information relating to which byte is going to which decode unit should also be decoded; this topic will be discussed in detail below in the ICALIGN block section. For optimal performance the layout of the column should be 64 RAM cells, pre-charge, 64 RAM cells, write buffer and senamp. The row decoder should be in the middle of the array to drive 128 column each way. Basically, the pre-charge and the row decoder should be crossed in the middle of the array. The self-time column is used to generate internal clock for each set of the array. Pre-charge is gated by ICLK. The instruction is valid by the end of ICLK, the data muxes by the TAG-HIT should be gated by ICLK to be valid for the second ICLK. The two-entry pre-fetch buffers are implemented inside the array with data can be written from either entry. The output IB bus is taken from either the array or the pre-fetch buffer.

The BIST for the ICSTORE array uses 128 TAEC cells for reading and writing the arrays, as discussed further below.

Signal list

ISADD(11:2)—2 —Input from ICFPC indicates the address of instruction to access the array. Bits 11:5 are for the row decoder, bits 4:2 are for column select. For normal operation, bits 11:4 is used to read/write 16-byte only.

For special register operation, bits 11:2 is used to read/write 4-byte.

TAGHIT(7:0)—2 —Input from ICTAGV indicates which set is selected to read instructions.

ICSRD—2 —Input from ICCNTL to read instruction.

ICSWR—2 —Input from ICCNTL to write instructions from pre-fetch buffers into the array. This signal is asserted at starting of the pre-fetch enable and de-asserted when a pre-fetch buffer entry is valid, the instruction is written into the array and the valid bit is reset.

GETNEWL—2 —Input from ICPRED indicates that pre-decoding has reached the end of the line or encountered a taken branch instruction, a new line of instructions is needed in the next cycle. The ICSTORE should send a new line onto IB bus and write into the array.

SRSRD—2 —Input from ICCNTL to read instruction from the array in the next cycle.

SRSWR—2 —Input from ICCNTL to write instruction to the array in the next cycle.

ICSRBB(31:0)—14 —I/O from SRB indicates the special register address for the array or data transferring to/from the SRB.

SETSEL(7:0)—14 —Input from ICFPC indicates which set to read, no tag compare is needed.

TAGCHK—14 —Input from ICCNTL to indicates the valid set is from TAGHIT or SETSEL.

PBENAB—14 —Input from ICCNTL to enable the pre-fetch buffer to latch the INSB(31:0) bus and write into the array.

INSTRDY—13 —Input from BIU to indicates the valid external fetched instruction is on the INSB(63:0) bus.

INSTFLT—13 —Input from BIU to indicates the valid but faulted external fetched instruction is on the INSB(63:0) bus.

INSB(63:0)—3 —Input from external buses for fetched instruction to the Icache.

IB(127:0)—1 —Output to ICALIGN after the set select to align instructions to decode units.

PBFLT—15 —Output to ICCNTL indicates a valid faulted line of instruction from external fetch.

PBVAL—15 —Output to ICCNTL indicates a valid line of instruction from external fetch.

PBEMPTY—15 —Output to ICCNTL indicates the pre-fetch buffer is empty.

PBONE—15 —Output to ICCNTL indicates the pre-fetch buffer has one available entry.

PBFULL—15 —Output to ICCNTL indicates the pre-fetch buffer is full.

BSTRD—Input from TAP indicates to read the array and compare to set the result.

BSTWR—Input from TAP indicates to write the array from input registers.

BSTDIN—Input from TAP indicates the test pattern to the input registers. The input can be from the TDI pin or normal burn-in patterns.

FLUSHON—Input from TAP indicates flushing register mode, the result latch should use BSTDIN instead of the compare input for flushing the result registers.

BSTSHF1 —Input from TAP indicates shifting of the master latch of registers.

BSTSHF2 —Input from TAP indicates shifting of the slave latch of registers.

BSTFALSE—Input from TAP indicates to invert the test pattern.

BSTSTOUT—Output to ICPDAT indicates the result of the data.

ICPDAT

In Processor 500, the pre-decode data is in a separate block than the ICSTORE, and is updated with a different timing than that of instructions. The ICPDAT is updated as the whole instruction line is completed decoding in the ICPRED. To prevent erroneous setting of the pre-decode bits, the valid bit in the ICTAGV is not set until the pre-decode data is written into the array. The pointer to ICSTORE can advance before the whole line of instruction is completed in pre-decode for split-line instruction. The pre-decode data includes three bits: start-byte, end-byte, and functional-byte. During pre-decoding, the ICPDAT uses 2 sets of latches to keep the pre-decode information for each line of instructions. The first set is for the current line and the second set is used for split-line instructions. As each instruction is completed in pre-decoding, the start and end pointers set the latches. The functional bits are kept in the ICPRED and write into the array at the completion of pre-decoding for the line. If a taken branch instruction is detected in ICPRED, the control should allow one clock cycle to write the current pre-decode data into the ICPDAT array. A special case of split-line taken branch instruction, the control allows 2 clock cycles to write the two pre-decode lines into the array.

The start-byte and the end-byte are scanned to align the instructions from ICSTORE to the decode units. A valid instruction should start with a start byte and end with an end byte before another start byte can be detected. Any invalid instruction should be detected in the scanning logic before sending the instruction to early decoding. The invalid instruction must be pre-decoded again by the ICPRED block. ICPDAT should keep all pre-decode data for the line of the confused instruction from the array which will be ORed with the functional bits from pre-decoding for writing back into the array. The pre-decoding stops on two conditions: a taken branch is detected or valid start byte (or valid instruction) is detected after the end byte from pre-decoding; this condition should be detected in the ICPDAT.

The start bits are decoded into byte-shifting information for up to 4 instructions per 8-byte block which will be used by the ICALIGN block. The start-byte pointer for the current fetching instruction is used to reset all the start and end bits before the current pointer, and the taken branch pointer from the way prediction is used to reset all the start and end bits after the branch pointer. All 8-way data should be latched in case of way mis-prediction, the corrected way should be read again from the latches for scanning. An 8-byte or 16-byte block can be read from the array to merge with the previous data to form a 16-byte line for scanning and sending to early decoding. The scanning of the start bits is sectioned into two 8-byte blocks, the maximum scanned path is 8-byte long. The scanning outputs control the muxing of up to 7 bytes for each instruction to early decoding unit.

In addition, the scanning of the 8-start-byte generates the look-ahead controls of next 8-byte blocks.

ICPDAT ORGANIZATION

Figure 10:
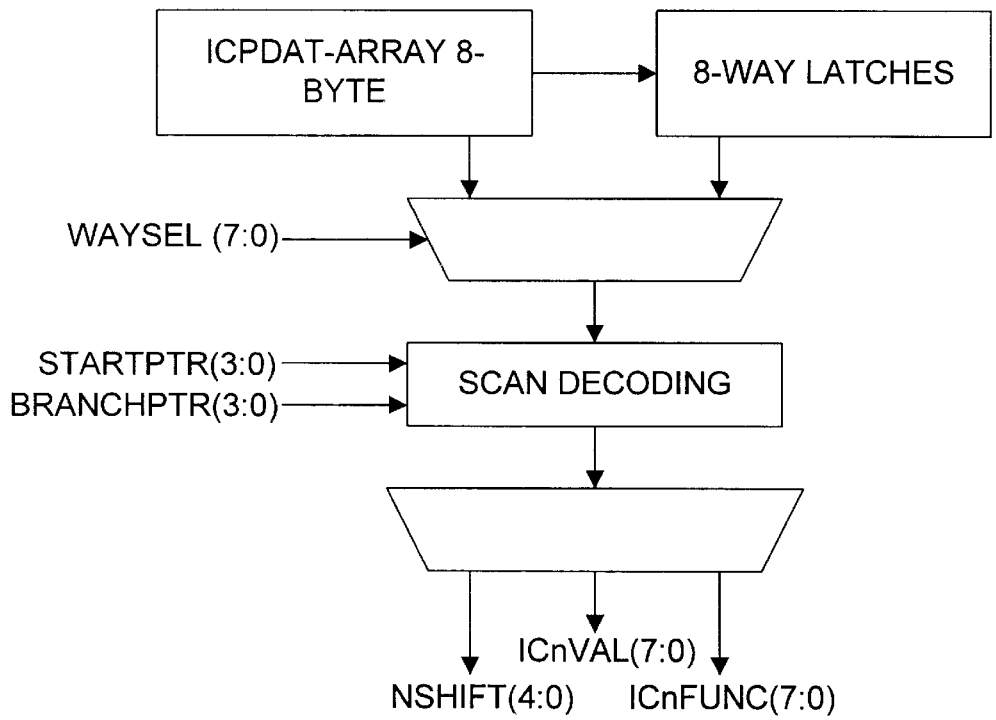

For each 8-byte, the ICPDAT (as shown in FIG. 10) generates 4 sets of valid bits based on the start and end bits. The valid bits are muxed to the ICALIGN the same way as the instruction bytes. The valid bits are used to qualify the functional bits. Example of the valid bits for 8-byte instruction:

| | |
|---|---|
| Start bits | 10100100 01110101 |
| End bits | 01001000 11101010 |
| Valid bits 1 | 11000000 01000000 |
| Valid bits 2 | 00111000 00100000 |
| Valid bits 3 | 00000111 10011000 |
| Valid bits 4 | 00000000 00000110 |

Figure 11:
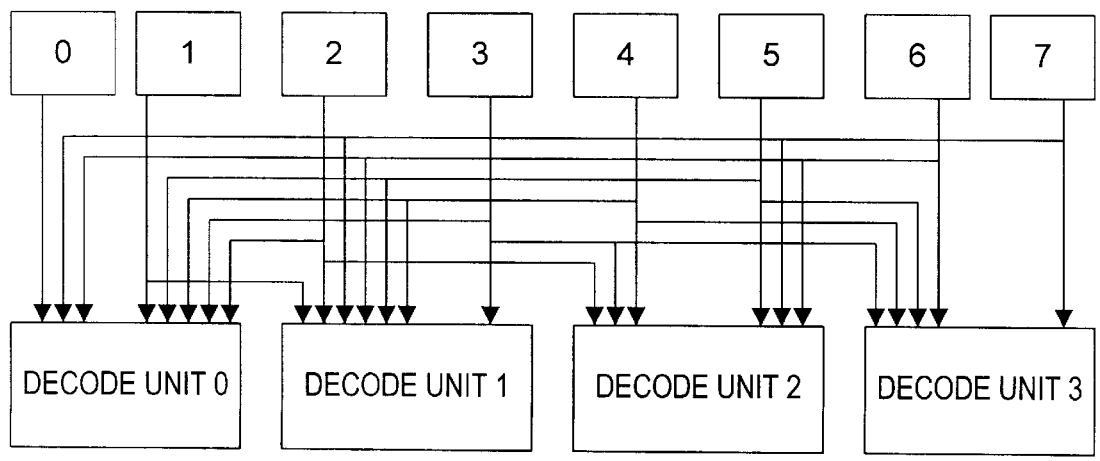

In setting up the valid bits for the instructions, ICPDAT needs to validate the instruction with proper the start and end bits. Only instructions with valid start and end bits can be in ICALIGN. If the line is hit in the cache, the pre-decode data should be latched into the buffer for future reference. ICPDAT notifies ICCNTL to pre-decode the invalid instruction. The functional bits from ICPRED are ORed with the local buffer of functional bits for writing back into the array. During pre-decoding if a valid start byte is detected after an end byte, ICPDAT should notify ICCNTL to stop pre-decoding, writing the current pre-decode data into the array, and re-fetching the line for scanning. The scanning logic should use only the pre-decode data from the array. The MROM instruction should also be detected in ICPDAT with a pointer to the ICALIGN and the MROM. The MROM instruction is read directly from the IB(127:0). MROM is responsible to detect and decode the prefixes and opcode as with ICALIGN. Exemplary hardware is shown in FIG. 11.

The Icache line sets up as two 8-byte sections, the scanned logic and fetching of next line should be independent of each other. While scanning, the end-byte should also be detected to indicate that all 8-byte can be dispatched in one clock cycle and to fetch a new line. Conditions to fetch the next 8-byte are:

Three start bits or less.

Four start bits with no more than 3 end bits.

Four start bits with 4 end bits, the last end bit is on the last byte.

Hold indication from early decoding.

Hold for more than one MROM instruction in the current 16 bytes.

Since the instruction can have up to 15 bytes which can span more than two 8-byte blocks, the ICPDAT can send the instruction to the next stage with assumed valid bits. The split-line instruction has indication to read the rest of the instruction in the next clock cycle. In the next cycle if the end bit is not detected within 15 bytes, the instruction must be sent to ICPRED for pre-decoding. The output from the ICSTORE is IB(127:0), ICPDAT provides the controls for muxing of this bus to the IB1(191:0) which is in the ICALIGN block. The muxing is for any of the 8-byte block on IB(127:0) to any of the 8-byte block on IB1(191:0). ICPRED also provides similar controls for the muxes.

If there are more than 4 instructions in the 8-byte block, the ICPDAT muxes the 8-byte block from IB(127:0) to IB1(191:0) and stalls the next 8-byte block. In the next clock cycle, the first 4 instructions clear the pre-decode data and the 8-byte block starts scanning with the fifth instruction. The same 8-byte block should be muxed from IB(127:0) to IB1(191:0) again. This mechanism keeps the ICALIGN from feeding back information on dispatching of the first 4 instructions. With this method the scanning of instructions in ICPDAT is independent of the next stage and is more flexible; either 3 or 4 instructions can be scanned.

The scanning logic for each 8-byte segment of instructions is done in parallel with the TAGHITs in the ICTAGV block. More details regarding the scanning logic may be found in the commonly assigned, co-pending patent application entitled "A Parallel and Scalable Instruction Scanning Unit", Ser. No. 08/475,400 filed Jun. 7, 1995 by Narayan now abandoned and continued in U.S. patent application Ser. No. 08/915,092, now U.S. Pat. No. 5,875,315. The disclosure of this patent application is incorporated herein by reference in its entirety. It is possible to implement the fetching, scanning, early decoding, and shifting of instructions to the decode units in 4 clock cycles.

MROM INTERFACING

The ICPDAT sends the MROM instruction directly to the MENG. Only one MROM instruction can be sent to the MENG per clock cycle. The MENG pipelines the MROM instructions and provides latches to keep up to 3 MROM instructions including the last MROM on IB(127:0). MROMFULL indicates that the next MROM instruction should be stalled in ICPDAT until the previous MROM instruction is dispatched to a decode unit. ICPDAT provides the byte pointer for the MENG to read the instruction from the IB(127:0) along with the functional and valid bits for decoding the instruction. ICPDAT should indicate MROM instruction to MENG only if the associated 8-bytes can be shifted to the next stage. If the instruction continues to the next line, MENG can expect to read the rest of the instruction on IB(127:0) in the next cycle (similar to sending split-line instruction to ICALIGN). The signal MROM-FULL is used to stop ICPDAT to keep the data on IB(127:0) for MENG to process prefixes of the instruction. The microinstructions rejoin the instruction pipeline in the muxing stage to the decode units. With early detection of MROM instruction to MENG, the penalty for MROM instruction is one clock cycle. MENG is responsible to decode prefixes and all fields of instructions. The same decoding logic is used in the ICPRED and ICALIGN.

In ICALIGN, as the MROM instruction is detected, it moves to dispatched position 0 and waits for micro-instructions from MENG. The following instructions fill the pipeline and dispatch as soon as the last micro-instruction is sent to decode unit. In dispatch position 0, the MROM instruction should start in the first 8-byte block of the IB2(191:0) bus. The MENG can provide pointers to read the displacement and immediate fields of the MROM instruction directly from the IB2(191:0).

ICPDAT ORGANIZATION

The ICPDAT includes of 32K of 3-bit pre-decode data organized as 8 sets of 64 rows by 192 columns. Each of the sets consists of two 3-bit pre-decode data. The pre-decode data is decoded into byte-shifting information which ise used by the ICALIGN block. The 8-way associative muxing from the 8 TAGHITs is performed before the byte-shifting data is routed to the ICALIGN block. In order for the instructions to get to the Idecode in middle of the second ICLK, the decode logic for the byte-shifting should be less than 7 gates. The byte-shifting logic has been done. Because of this byte-shifting logic, the array for ICPDAT is 64 rows instead of 128 rows for the ICSTORE array. For optimal performance the layout of the column should be 32 RAM cells, pre-charge, 32 RAM cells, write buffer and senseamp. The row decoder should be in the middle of the array to drive 96 column each way. Basically, the pre-charge and the row decoder should be crossed in the middle of the array. The self-time column is used to generate internal clock for each set of the array. Pre-charge is gated by ICLK. The byte-shifting data muxed by the TAGHIT should be gated by ICLK to be valid for the second ICLK. The output of the array should include logic to feedback the previous pre-decode data for breaking up of the line for second cycle access.

The BIST for the ICDAT array uses 48 TAEC cells for reading and writing the arrays as explained further below.

Signal list

IPADD(11:2)—Input from ICFPC indicates the address of instruction to access the array. Bits 11:6 are for the row decoder, bits 5:2 are for column select. For normal operation, bits 11:4 is used to read/write 16-byte only. For special register operation, bits 11:2 is used to read/write 4-byte.

TAGHIT(7:0)—Input from ICTAGV indicates which set is selected to read instructions.

ICSRD—Input from ICCNTL to read instruction.

ICPWR—Input from ICCNTL to write pre-decoded data from ICPRED into the array. This signal is asserted at starting of the pre-fetch enable and when ENDLINE is asserted, the pre-decode data is written into the array.

GETNEWL—Input from ICPRED indicates that pre-decoding has reached the end of the line or encountered a taken branch instruction, a new line of instructions is needed in the next cycle. Used to clear the pre-decode latch.

ENDLINE—Input from ICPRED indicates that pre-decoding has reached the end of the line or encountered a taken branch instruction, the pre-decode data should be written into the array.

SRPRD—Input from ICCNTL to read pre-decode data for special register.

SRPWR—Input from ICCNTL to write pre-decode data for special register.

ICSRBB(23:0)—I/O from SRB indicates the special register address for the array or data transferring to/from the SRB. 8-byte of pre-decode data is transferred at one time. The order is Start, Functional, End bits for each byte of instruction.

SETSEL(7:0)—Input from ICFPC indicates which set to read, no tag compare is needed. This signal is from SRB or branch prediction.

TAGCHK—Input from ICCNTL to indicates the valid set is from TAGHIT or SETSEL.

NEWWAY—Input from ICCNTL to indicates way misprediction to select the correct way from the latches using TAGHIT.

ENDINST—Input from ICPRED indicates that pre-decoding is completed for the current instruction. The pre-decode bits should be set at this time. This signal should also be sent along with ENDLINE for partially decode instruction.

PENDIB(4:0)—Input from ICPRED indicates the end byte position of the current instruction. The end bit is set and latched until pre-decoding of the whole line is completed. Bit 4 indicates if the end bit is on the next line.

PFUNCB(15:0)—Input from ICPRED indicates the functional bits of current line of instructions. ICPDAT uses ENDLINE to OR these bits previous pre-decode data and write into the array. As a new line is read from the array the pre-decode data is latch in the buffer. The ICPRED must keep all the functional bits for all the pre-decoded instruction in the line.

STARTPTR(3:0)—Input from ICFPC indicates the byte position of the pre-decoded bytes for current instruction. The start byte should be set at this pointer for writing. For reading, this pointer is decoded into 16 bits to zero-out all bytes before the pointer for scanning logic.

WAYBPTR(3:0)—Input from ICNXTBLK indicates the byte position of the branch taken pointer of way prediciton. For reading, this pointer is decoded into 16 bits to zero-out all bytes after the pointer for scanning logic.

NEXTB(1:0)—Input from ICALIGN indicates that ICALIGN can accept any 8-byte block. This signal includes other hold inputs from MROM and Idecode.

NEWLINE(1:0)—Output to ICALIGN and ICFPC indicates the first (bit 0) or the second (bit 1) 8-byte is the starting of a new line. The current line can start at the second 8-byte. The PC and offset of instructions sending to the decode units should be adjusted accordingly.

VALSTART—Output to ICCNTL indicates a valid start-byte after the end pointer from ICPRED for the current lines of instructions. The pre-decoding stops and instructions is fetched from the array.

IC0POS1(3:0)—Output to ICALIGN indicates the PCTs byte position of the next instruction using the end bit for instruction 0 of the first 8-byte.

IC1POS1(3:0)—Output to ICALIGN indicates the PC's byte position of the next instruction using the end bit for instruction 1 of the first 8-byte.

IC2POS1(3:0)—Output to ICALIGN indicates the PC's byte position of the next instruction using the end bit for instruction 2 of the first 8-byte.

IC3POS1(3:0)—Output to ICALIGN indicates the PC's byte position of the next instruction using the end bit for instruction 3 of the first 8-byte.

IC0POS2(3:0)—Output to ICALIGN indicates the PC's byte position of the next instruction using the end bit for instruction 0 of the second 8-byte.

IC1POS2(3:0)—Output to ICALIGN indicates the PC's byte position of the next instruction using the end bit for instruction 1 of the second 8-byte.

IC2POS2(3:0)—Output to ICALIGN indicates the PC's byte position of the next instruction using the end bit for instruction 2 of the second 8-byte.

IC3POS2(3:0)—Output to ICALIGN indicates the PC's byte position of the next instruction using the end bit for instruction 3 of the second 8-byte.

IC0VAL1(7:0)—Output to ICALIGN indicates valid bytes for instruction 0 of the first 8-byte. The valid bytes are used for muxing of the bytes to early decoding. The valid bytes can continue to next 8-byte blocks until the end bit is detected.

IC1VAL1(7:0)—Output to ICALIGN indicates valid bytes for instruction 1 of the first 8-byte. The valid bytes are used for muxing of the bytes to early decoding. The valid bytes can continue to next 8-byte blocks until the end bit is detected.

IC2VAL1(7:0)—Output to ICALIGN indicates valid bytes for instruction 2 of the first 8-byte. The valid bytes are used for muxing of the bytes to early decoding. The valid bytes can continue to next 8-byte blocks until the end bit is detected.

IC3VAL1(7:0)—Output to ICALIGN indicates valid bytes for instruction 3 of the first 8-byte. The valid bytes are used for muxing of the bytes to early decoding. The valid bytes can continue to next 8-byte blocks until the end bit is detected.

IC0VAL2(7:0)—Output to ICALIGN indicates valid bytes for instruction 0 of the second 8-byte. The valid bytes are used for muxing of the bytes to early decoding. The valid bytes can continue to next 8-byte blocks until the end bit is detected.

IC1VAL2(7:0)—Output to ICALIGN indicates valid bytes for instruction 1 of the second 8-byte. The valid bytes are used for muxing of the bytes to early decoding. The valid bytes can continue to next 8-byte blocks until the end bit is detected.

IC2VAL2(7:0)—Output to ICALIGN indicates valid bytes for instruction 2 of the second 8-byte. The valid bytes are used for muxing of the bytes to early decoding. The valid bytes can continue to next 8-byte blocks until the end bit is detected.

IC3VAL2(7:0)—Output to ICALIGN indicates valid bytes for instruction 3 of the second 8-byte. The valid bytes are used for muxing of the bytes to early decoding. The valid bytes can continue to next 8-byte blocks until the end bit is detected.

ICENDB1(3:0)—Output to ICALIGN indicates if end-bits for 4 instructions are detected in the first 8-byte block. If the end-bit is not set, the instruction continue to the next 8-byte blocks.

ICENDB2(3:0)—Output to ICALIGN indicates if end-bits for 4 instructions are detected in the second 8-byte block. If the end-bit is not set, the instruction continue to the next 8-byte blocks.

ICFUNC(15:0)—Output to ICALIGN and MENG indicates functional-bits, bits 7:0 are for the first 8-byte block and bits 15:8 are for the second 8-byte block.

INVPTR(3:0)—Output to ICFPC indicates the start pointer of the invalid instruction which needs to be pre-decoded.

INVINST—Output to ICFPC and ICCNTL indicates the invalid instruction which needs to be pre-decoded. No valid byte should be sent to the ICALIGN.

MROMPTR(3:0)—Output to ICFPC and MROM indicates the start pointer of the MROM instruction ICMROM(1:0)—Output to MENG, bit 0 indicates the current instruction is MROM, bit 1 indicates the MROM instruction continue to the next line (end-bit is not detected in the current line).

MROMFUL—Input from MENG indicates MENG cannot accept any more instruction.

IC8BSEL(5:0)—Output to ICALIGN controls the muxes from IB(127:0) to IB1(191:0). Bit 5:3 is for the upper 8-byte IB(127:64) and bit 2:0 is for the lower 8-byte IB(63:0). 001 is for muxing to IB1(63:0), the first 8-byte, 010 is for muxing to the second 8-byte, and 100 is for muxing to the third 8-byte.

INVAL2 —Output to ICALIGN to invalidate the second 8-byte block which has been muxed to IB1(191:0) because the first 8-byte has more than 4 instructions or the taken branch invalidates the second 8-byte block.

BSTRD—Input from TAP indicates to read the array and compare to set the result.

BSTWR—Input from TAP indicates to write the array from input registers.

BSTSTOUT—Input from ICSTORE connects the BIST chain.

FLUSHON—Input from TAP indicates flushing register mode, the result latch should use BSTDIN instead of the compare input for flushing the result registers.

BSTSHF1 —Input from TAP indicates shifting of the master latch of registers.

BSTSHF2 —Input from TAP indicates shifting of the slave latch of registers.

BSTFALSE—Input from TAP indicates to invert the test pattern.

BSTIDOUT—Output to TAP indicates the result of the data chain from the ICSTORE and ICPDAT arrays.

ICTAGV

Processor 500 executes the fast X86 instructions directly and the instructions are written into the Icache regardless of the pre-decode information. The linear valid bit is used for the whole line of instructions, assuming that the BIU always fetches 16-bytes of data. The CMASTER indicates which way to put in the pre-fetch data and tag. Writing of the tag is done at the same time as writing the data into the ICSTORE, and writing of the linear valid bit is done at the same time as writing the pre-decode bits into the ICPDAT. The start and end bits are sufficient to validate the instruction. If branching to the middle of the line or instructions wrapping to the next line, the start and end bytes must be detected for each instruction or else the instruction must be pre-decoded again. The possible cases for invalid instructions are (1) branching to the opcode and skipping the prefix, (2) part of the wrapping instruction are replaced in the Icache, (3) part of the line was not pre-decoded because of branch instruction and branch target. Whenever the MMU is re-mapped or the CMASTER execute a certain instruction, all the LV bits can be cleared. The next access to the Icache would results into LV miss, the CMASTER may send new mapping information to the Icache regarding the way associative, the SU, and the new tag. In this case the Icache needs to write the ICTAGV with new information (including setting the LV bit) and read the other arrays.

From the branch prediction, tag address must be read from the ICTAGV in the next cycle to merge with the successor index for the predicted target address. The predicted target address must be sent to the decode units and to the functional units for comparison.

ICTAGV ORGANIZATION

The ICTAGV includes 2048 lines of:

20-bit Tag address.

2 Status bits (SU, LV).

Figure 12:
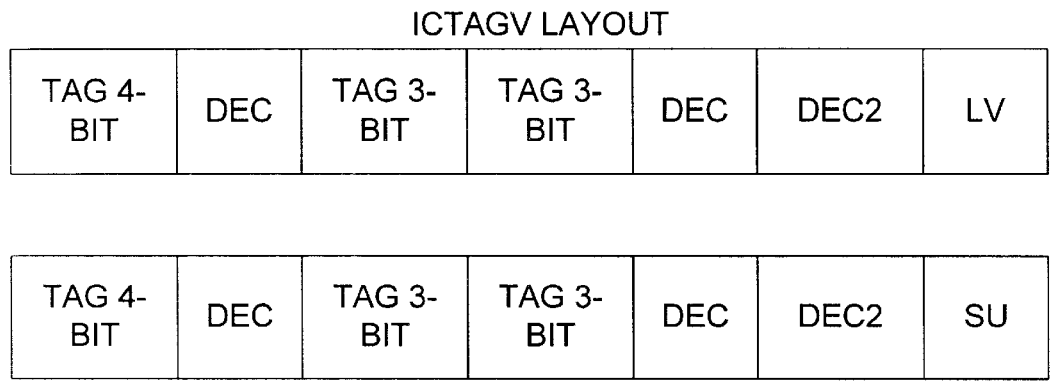

The status bits need to be dual-port to read and write in the same clock cycle. The ICTAGV is organized as two sets of 64 rows by 224 columns and two sets of 64 rows by 128 columns. Each of the first two sets consists of 7-bit tag address, and each of the last two sets consists of 3-bit tag address and the SU or LV bit. The two status bits are dual port RAM cells. The SU uses the delayed PC to write, and the LV bit has the snooping index from CMASTER. The ICTAGV uses 64 rows for dual-port RAM and quick reading of tag address. For optimal performance the layout of the column should be 32 RAM cells, pre-charge, 32 RAM cells, write buffer and senamp. The row decoder should be in the middle of the array to drive 112 or 96 columns each way. Basically, the pre-charge and the row decoder should be crossed in the middle of the array. The row decoder for the dual port RAM should be build at one end of the array. The self-time column is used to generate internal clock for each set of the array. Pre-charge is gated by ICLK. The status bits muxed by the TAGHIT should be gated by ICLK to be valid for the second ICLK. The above layout is to ensure the minimum routing for the TAGHIT, and is shown in FIG. 12.

The BIST for the ICTAGV array uses 22 TAEC cells for reading and writing the arrays, as explained further below.

Signal list

ITADD(11:4)—Input from ICFPC indicates the address of instruction to access the array. Bits 11:5 are for the row decoder, bit 4 is for column select. Writing into the SU array is a delay of the index to next ICLK.

IVADD(11:4)—Input from ICFPC indicates the address of instruction to write the LV bit. Bits 11:5 are for the row decoder, bit 4 is for column select.

ICTAG(31:12)—Input from ICFPC indicates the address of instruction to compare with the tag arrays.

ICTVRD—Input from ICCNTL to read tag array.

ICTWR—Input from ICCNTL to write new tag.

ICCLRA—Input from ICCNTL to clear all valid bits.

ICSUWR—Input from ICCNTL to write the SU bit.

ICLVWR—Input from ICCNTL to write the LV bit.

SRTVRD—Input from ICCNTL to read tag for special register.

SRTVWR—Input from ICCNTL to write tag for special register.

ICSRBB(31:10)—I/O from SRB indicates the special register address for the array or data transferring to/from the SRB. Bits 31:12 are the address, bit 11 is the supervisor/user, and bit 10 is the valid bit.

SETSEL(7:0)—Input from ICFPC indicates which set to read, no tag compare is needed.

TAGCHK—Input from ICCNTL to indicates the valid set is from TAGHIT or SETSEL.

TAGHIT(7:0)—Output indicates which set is selected to read instructions.

VALBIT(7:0)—Output indicates the valid bits of 8 sets, uses for way-prediction.

TVSU—Output indicates the supervisor/user mode of current block.

IBTARGET(31:12)—Output to decode unit indicates the predicted taken branch target for the line on instruction in the previous cycle. The predicted taken branch from ICNXTBLK provides only the index, the upper bits are read from ICTAGV in the next cycle.

BSTRD—Input from TAP indicates to read the array and compare to set the result.

BSTWR—Input from TAP indicates to write the array from input registers.

BSTNBOUT—Input from ICNXTBLK connects the BIST chain.

FLUSHON—Input from TAP indicates flushing register mode, the result latch should use BSTDIN instead of the compare input for flushing the result registers.

BSTSHF1 —Input from TAP indicates shifting of the master latch of registers.

BSTSHF2 —Input from TAP indicates shifting of the slave latch of registers.

BSTFALSE—Input from TAP indicates to invert the test pattern.

PORTSEL—Input from TAP indicates to select the second dual port.

BSTITOUT—Output to TAP indicates the result of the data chain from the ICNXTBLK and ICTAGV arrays.

ICNXTBLK

This block contains the branch prediction information for the Icache. An important feature for performance of superscalar/superpipelined microprocessors is branch prediction. As the number of pipeline stages and the number of functional units increase the cost of mis-prediction is high. The tag comparison and selection of the 8-way associative in ICTAGV takes more than one clock cycle to resolve. Processor 500 implements another prediction technique to pick one out of the 8 ways and to use the predicted way for fetching of next line to remove the bubble in the pipeline. Three bits are needed for this way prediction. Another two bits are needed to select one of the two branch targets for fetching the next predicted line. Without the two bits to select the branch targets, comparison of the start-byte position with the positions of the branch targets will cause the way-prediction to be more than one clock cycle. This speculatively selected line of instructions can be corrected in the next cycle from the proper TAGHIT and the branch prediction. The following rules are used to set up the ICNXTBLK:

During pre-decode, if there is an unconditional branch instruction, the fetching is stalled until the new target PC can be calculated. If the branch is direct, the target PC can be calculated in the next cycle in the ICFPC.

The backward taken conditional branch which the new target PC can be calculated in the ICPFC should also predict taken.

If the branch is indirect, the target PC is from the functional unit. The speculative way-prediction is updated with the successor index in the cycle following the target address access. If there is no pre-decoded taken branch, the speculative way-prediction is updated after fetching of the next sequential block. The index after accessing the array should be kept for 3 clock cycles before the way-prediction is known for updating.

From mis-prediction, the new target PC will be fetched and the selected set and successor index will be kept in a branch holding registers which will be discussed in next section.

For better branch prediction hit ratio, the ICNXTBLK will increase to 2 branch targets for both taken and non-taken branches, and pre-decode for the unconditional branches and taken branches. The pre-decoding also calculate the branch target address for the branch instructions if available. If there is a hit in the ICNXTBLK, the new target will be used for the new fetch PC. The taken branch will have higher priority to occupy the two targets in ICNXTBLK.

Processor 500 will implement two different branch predictors to maximize the performance. The next few sections discuss the Bimodal and Global predictors and the implementation of the combined branch predictor on Processor 500.

Bimodal Branch Prediction

This branch prediction uses a saturated counter for prediction. A 2-bit counter is used for taken/non-taken prediction. The most significant bit is used for taken/non-taken prediction. Since branch instructions are more likely to be taken than non-taken, the counter should initialize to 10 if the branch target address can be calculated. As the branch is taken, the counter increases by 1 and is saturated at 11. As the branch is not taken, the counter decreases by 1 and is saturated at 00. The bimodal branch prediction is better than a single bit prediction as the branch correct prediction is 88.09% instead of 82.29% for two targets prediction. The bimodal branch prediction behaves well for mostly taken or non-taken branch instruction and is worst as the conditional branches flip-flop between taken and non-taken. The cost is one extra bit per branch target in the ICNXTBLK, and extra logic for the counter.

Global Branch Prediction

This branch prediction is an independent branch predictor, not a part of the Icache. There are many different types of global branch prediction; Processor 500 uses the global branch prediction which has the highest branch correct prediction ratio. The prediction entries are indexed by an exclusive OR of the PC and the branch shift register, which is referred to as global sharing branch prediction. This global branch prediction has the branch correct prediction at 89.24%; the prediction improves as more branch history bits are used in the prediction. A single shift register records the direction taken/non-taken by the most recent n conditional branches. Since the branch history is global to all branches, global branch prediction takes advantage of two types of patterns, the direction taken by the current branch may depend strongly on the other recent branches, and the duplicating the behavior of local branch prediction (patterns of branches in loops). For Processor 500, since the highest priority of the two branch targets is taken branch, the global shift register includes both the conditional and unconditional branches. In a few cases, the non-taken conditional branches may not include in the global shift register. To match the number of entries in the Icache, the global branch prediction needs to have 2048 entries with 2 targets per entry. It is organized with 256 rows of 8-way associative. Eight bits are used to index the branch prediction table. The PC uses bit 11:4 for indexing the branch prediction table.

Processor 500's Combined Branch Prediction

Combining the Bimodal and Global branch predictions should give a better correct prediction ratio. A predictor counter is used to select which branch predictor is better for each individual branch instruction. This technique should give a higher correct prediction ratio than the above two prediction techniques; the prediction ratio can be shown to be 89.93%. The same saturated counter is used for the predictor counter: if the bimodal predictor is correct and the global predictor is incorrect then increase the counter until saturated; if the global predictor is correct and the bimodal predictor is incorrect then decrease the counter until saturated; else no change in the predictor counter. The most significant bit of the predictor counter is used for selecting the branch predictor. ICNXTBLK is implemented with the bimodal counter and the predictor counter. ICNXTBLK has 2 targets per instruction line, where each target consists of the following:

12 bits—successor index, need 11:4 for global table index, 11:0 for icache.

3 bits—for 8-way associative.

4 bits—byte position of the branch instruction within the current line.

2 bits—bimodal counter 2 bits—predictor counter 1 bit—valid target

The table for global branch predictor also has 2 targets per entry, where each entry consists of a 2-bit global counter. The bimodal and predictor counters must be able to update the count on every cycle. The least significant bit of the counters is dual ported. If the count is 10, predicted taken, the new count is 11. If the count is 01, predicted non-taken, the new count is 00. Only on branch mis-prediction does the most significant bit of the counters change state.

Figure 13:
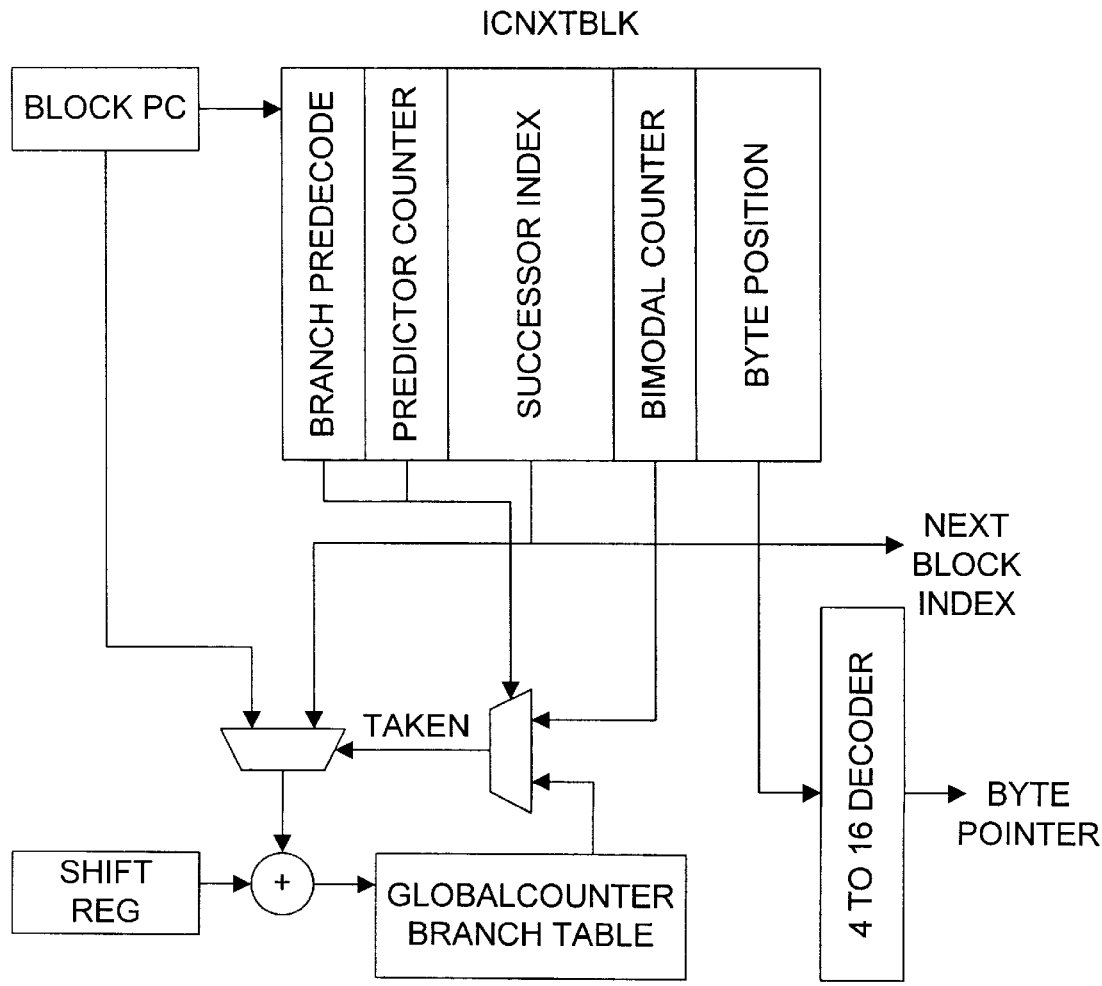

The successor index, way, and byte position are shared between the bimodal and global counters. The predictor counter selects between the bimodal and global counters. The combination of the counters is to predict branch instructions as taken/non-taken. In most cases, the shared target is sufficient for the two branch predictors. The branch may have two different targets depended on two different patterns of branch instructions. In this case, the global predictor may desire to have its own target. It would be very expensive in layout area to have 4 targets per 16 bytes of instruction. A diagram of ICNXTBLK is shown as FIG. 13.

Implementation of Global Branch Tag for Recovery

As discussed above, the global branch predictor needs a table with 256 rows, 8-way associative, and 2 targets per line. A shift register of 8 bits is needed for indexing. The global branch predictor shift register must be able to back track to the previous conditional branch which is mis-predicted. As each conditional branch is predicted, the direction of the branch is shifted into the shift register from right to left, 1 for taken and 0 for non-taken. The shift register needs a total of 24 bits and each of the bit beyond the 8 indexing bits needs to have a tag. The tag has 4 bits to indicate the conditional branch position in the shift register. FIROB has 6 lines of 4 instructions and the pipeline from fetch to dispatch can hold another 3 lines of 4 instructions for a total of 36 instructions. The average length of X86 instruction is 3 bytes, thus (36 instruction X 3 bytes) 108 bytes are equivalent to 6.75 lines from the Icache. Each Icache line of instructions can have up to 2 branch targets, which is 14 branch instructions in the pipeline. The extra 16 bits in the shift register is sufficient to handle all branches in the pipeline. The shift register needs to keep track of all branch instructions. All the branch tags and the taken/non-taken bits are shifted in the shift register. The shift register tag (branch tag) is routed with the branch instruction to the functional units and FIROB. As the branch instruction is mis-predicted the branch tag is used to retreat the old 8 bits in the shift register to restore the shift register with new direction for the mis-predicted branch instruction.

Even though it is unlikely that the number of branch instructions in the pipeline exceeds 16, a mechanism is needed to detect the overflow of the global shift register. An extra valid bit is set for each branch in the global shift register. As the branch instruction is retired, the branch tag is returned to the global shift register to clear all the tail valid bits from the branch tag. As the global shift register is shifted, if the valid bit at the tail of the shift register is set, then the pipeline must stall for the branch instruction to retire from the FIROB.

In the global shift register, beside the taken/non-taken bits, the branch predictor count, the bimodal count, the global count, the valid bit, and the branch target number should be kept in the same global shift register which will be restored for updating of the counters and the branch target number in case of branch mis-prediction. The counters are 6 bits, the valid is 1 bit, the branch target number is 1 bit, the taken/non-taken is 1 bit, and the branch tag is 4 bits; the total bits in the shift register is 13. The branch target number is to update one of the two branch targets in the ICNXTBLK. Since the ICNXTBLK can keep only two branch targets, some of the branch instructions may not be detected and may not get a branch tag from the global shift register. If the mis-prediction was not in the branch prediction, a new entry should be setup. The counters will be restored and incremented/decremented before sending to the holding register for updating the mis-predicted block. The return stack in the ICFPC should also restore from mis-prediction.

The global shift register is set and shifted in the second ICLK as the branch prediction is determined. In later pipeline stages, the unconditional jump, call, and return instructions can be detected and change the direction of the fetched instruction. In this case, the global shift register must be restored. A new branch tag is setup for the unconditional jump, call, and return instructions. The only branch instructions without branch tags are the conditional branch instruction which are not recorded in the ICNXTBLK. The ICFPC must keep track of the branch instructions in the first 4 pipeline stages for recovery of the global shift register.

All the branches must be detected in pre-decoding and kept in the ICNXTBLK unless there are more than two branches. If the branch is mis-predicted and not detected in the prediction then there are more than two branches in the same line with the mis-predicted branch. On Processor 500, there are two branch targets, if the branch mis-prediction matches one of the target, then the mis-prediction will update the same target. If the branch mis-prediction was not in the ICNXTBLK, then one of the two branch targets must be selected to be replaced. Information is needed with each of the line PC, the associated branch information from dispatching is:

Taken/non-taken (1/0) for the two branch targets of the current line PC.

Current way selection of the line PC.

Taken/non-taken prediction with each branch instruction.

Global shift register branch tag with each branch instruction.

Valid branch tag indication with each instruction.

Non-taken is assumed for the invalid branch targets in the ICNXTBLK. Branch target bits and way select are sent with the PC to the FIROB. The FIROB returns the two branch target bits upon mis-prediction for replacement algorithm of the branch targets in the ICNXTBLK. The first priority for replacing the branch targets is non-taken. If both bits are set for the line of the mis-predicted branch, then random replacement based on the least significant bit of the address is used. For branch mis-prediction, the following information are returned from the FIROB:

Current branch way select.

Valid branch tag indication.

Branch tag.

Current branch index.

Taken/non-taken branch target bits of the line PC.

New branch target address.

Figure 14:
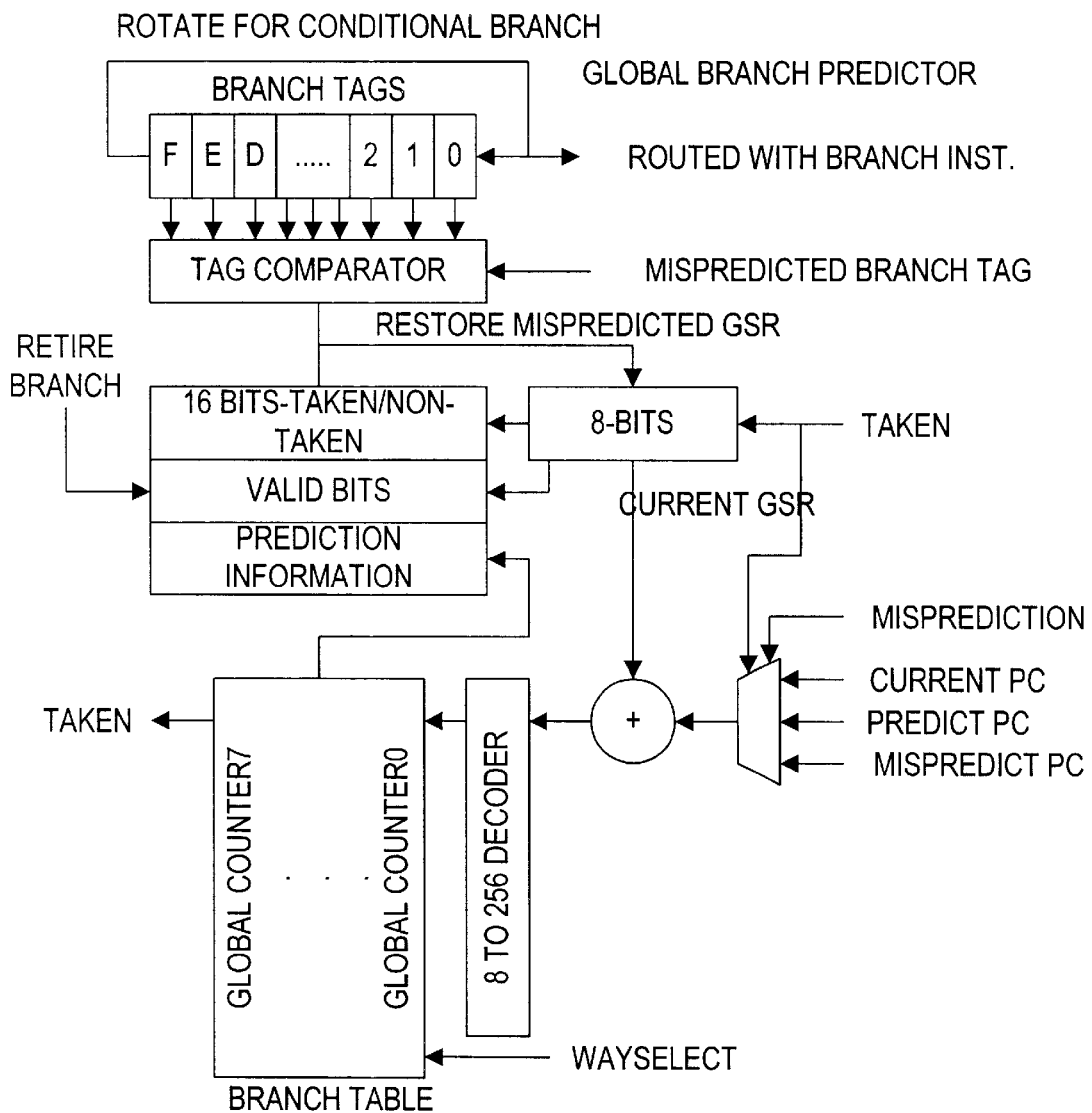

A diagram of the global branch predictor is shown as FIG. 14.

Branch-Holding Register for Updating Branch Targets

Some processors use the successor index instead of the full address to limit the size of the array, the selected way for the successor index is known after the branch target is fetched from the Icache. Updating the ICNXTBLK with successor index and selected way required dual-port RAM. With two targets per line of instructions, the current dual-port RAM cells implementation of the ICNXTBLK would make the ICNXTBLK array larger than the ICSTORE array. There are two cases of updating the branch targets: during pre-decoding of taken branch instruction and branch mis-prediction. On Processor 500, an extra branch holding register for branch mis-prediction and pre-decoding branch instruction will be implemented. The branch holding register should always be compared to the PC address and forward the data instead of reading from the ICNXTBLK. When the next branch mis-prediction occurs, the FIROB sends the logical address PC. The successor index, the way select, and branch predictor counts are latched inside the ICNXTBLK to write into the array at a later convenient time. Since the way prediction array is dual-ported, it should be updated immediately instead of keeping in the branch holding register. The branch holding register will update the last mis-predicted branch target to the ICNXTBLK as the ICFPC takes one cycle to calculate the new linear address from the logical address. Another condition to write the branch holding register into the ICNXTBLK array is when external fetch is started. With the branch holding register, the ICNXTBLK array can be single-ported which is less than half the size of the dual-ported array. The branch holding register includes the branch address which is used for comparison and forwarding of data, the successor index, the update branch predictor count after reading of the new target line. The branch address register resides in the ICFPC for comparison to the current fetch PC. If the mis-prediction is a RETURN instruction, only the target selection of the way prediction should be updated.

The branch predictor counters are kept in the global shift register. If the mis-prediction returns a valid branch tag, then the counters increase or decrease before latching in the branch holding register. If the mis-prediction does not have a valid branch tag, then the bimodal counter is used with 10.

The global shift register should restore the proper branch pattern and the return stack should remove the cancelled CALL/RETURN instructions.

WAY PREDICTION

Since the evaluation of the branch prediction takes two cycles which would create a bubble in the pipeline, the way-prediction is implemented for faster prediction. The way prediction predicts one of the 8-way associative will be hit, and uses the ICNXTBLK for the next fetch PC. The way-prediction is validated in the next cycle with the TAGHIT and the actual branch prediction. If the way is mis-predicted, a correct way will be selected for the 8-way latches in the ICPDAT and a new line will be fetched creating a bubble in the pipeline. Since the tag compare is not completed until the next clock cycle, the scanning logic should be done in parallel with the tag compare for optimal timing of fetching instruction. The scanning logic is implemented on all 8 ways pre-decode data and the outputs are selected by TAGHIT. With the way prediction, a single pre-decode data can be selected for scanning logic thus reducing the logic to one-eighth. The ICPDAT must implement a set of latches to keep the output data; in case of way mis-prediction, the correct data will be used for scanning logic in the next cycle. The branch prediction in the ICNXTBLK should be resolved in parallel with TAGHIT for the correct next line fetch in the third cycle. The instructions from the ICSTORE are not needed for aligning until the next clock cycle which will be selected by TAGHIT. The way select from branch prediction should be used to select the way instead of the way prediction. From branch prediction, there is no tag comparator for the upper address bits.

The way-predicting has 3 bits to mux the successor index and branch prediction from ICNXTBLK for accessing the Icache in the next cycle. Depending the current fetch PC's position, the way prediction can use one of the two branch targets or none for sequential. In order to access the next PC within a cycle, a target selection of 2 bits is needed. The target selection can also include the return stack option. The program for the target selection is:

00—sequential,

01—first branch target, 10 10—second branch target,

11—return stack.

The way prediction should provide the byte position of the return instruction so that the ICPDAT can invalidate all followed instructions. For speed, another 4 bits are needed to indicate the byte position pointer for the instruction after the taken branch instruction for ICPDAT. The ICPDAT can decode and invalidate the pre-decode data directly from this 4-bit branch pointer. If the 4-bit branch pointer is all zeros, no invalidation of the pre-decode data is needed.

The way prediction includes dual ported RAM cells because the information must be updated while reading data, the initial value for the way prediction should be the same as the current PC's set. The way prediction is not known for updating until the next clock cycles or until the early decoding of the return instruction. For convenience, a holding way register is used for updating of the way prediction in the fifth ICLK.

| Clock | Latch 1 | Latch 2 | Latch 3 | Latch 4 | Latch 5 | PC0 |
|---|---|---|---|---|---|---|
| 1 | PC0 | — | — | — | — | read |
| 2 | PC1 | PC0 | — | — | — | branch pred |
| 3 | PC2 | PC1 | PC0 | — | — | return inst. |
| 4 | PC3 | PC2 | PC1 | PC0 | — | decoding |

-continued

| Clock | Latch 1 | Latch 2 | Latch 3 | Latch 4 | Latch 5 | PC0 |
|---|---|---|---|---|---|---|
| 5 | PC4 | PC3 | PC2 | PC1 | PC0 | update way pred |
| 1 | PC0 | — | — | — | — | read |
| 2 | PC1 | PC0 | — | — | — | way mis-pred |
| 3 | PC2 | — | PC0 | — | — | return inst. |
| 4 | PC3 | PC2 | — | PC0 | — | decoding |
| 5 | PC4 | PC3 | PC2 | — | PC0 | update way pred |

Figure 15:
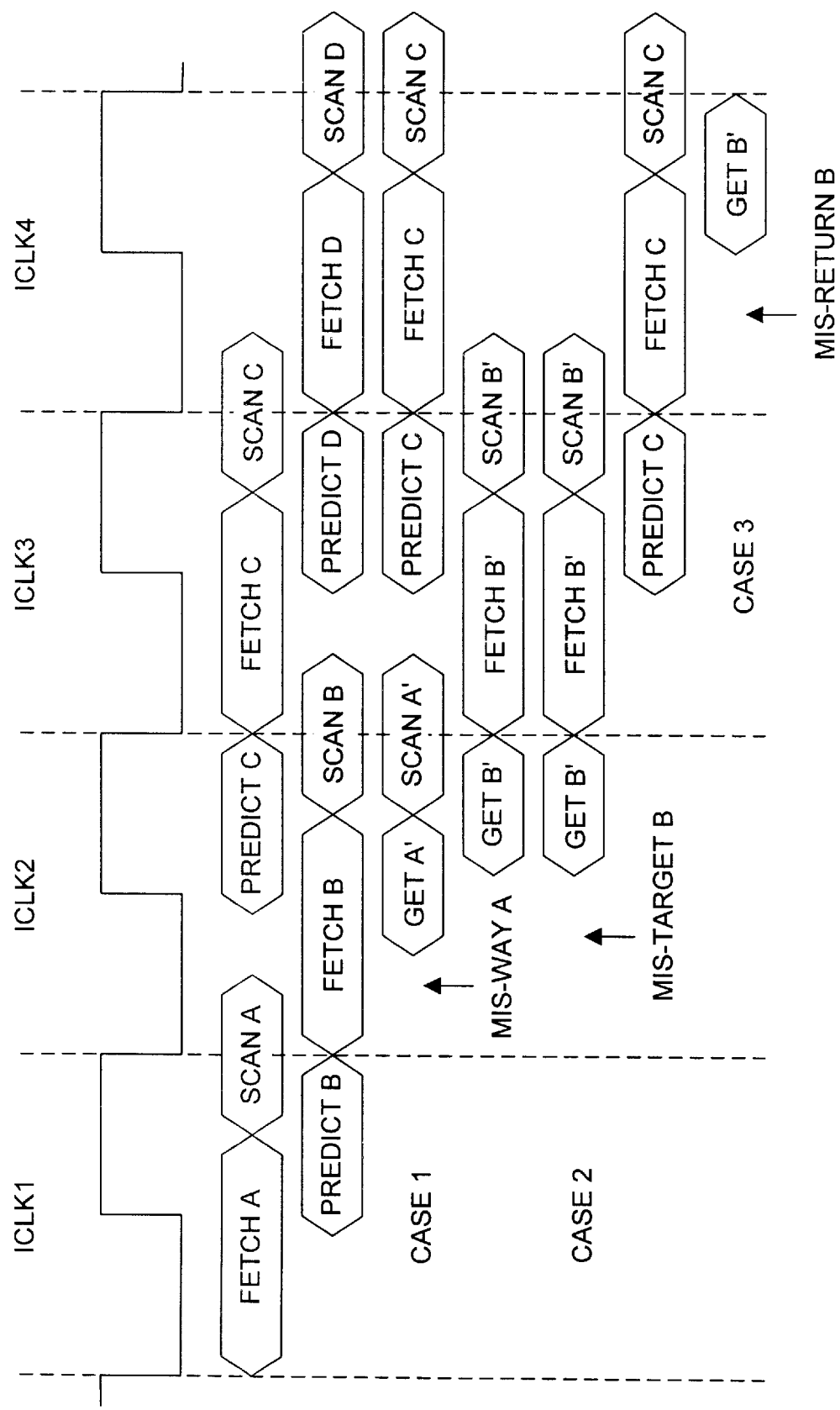

The way mis-prediction can be at two levels, the first level is the wrong predicted way and the second level is the wrong selected target. Way mis-prediction is from comparing the predicted way to the tag compares, a mis-prediction would have re-fetched the correct instruction line and a new fetch address as shown in case 1 of FIG. 15. If the way prediction is correct, the next level is the target selection mis-prediction, the recovery mechanism is shown in case 2 of FIG. 15. The return stack prediction is not known until ICLK4 to correct the fetch done in ICLK2, other target predictions are compared to the branch prediction in ICLK2 and re-fetch the next address in ICLK3 as shown in case 3 of FIG. 15.

ICNXTBLK ORGANIZATION

The ICNXTBLK consists of 2048 lines of 2 branch targets, each target consist of 24 bits:

12 bits—successor index, need 11:4 for global table index, 11:0 for icache.

3 bits—for 8-way associative.

4 bits—byte position.

2 bits—bimodal counter.

2 bits—predictor counter.

1 bit—valid target.

The least significant bits of the bimodal and predictor counters are dual ported for writing back the increment count after reading. For speculative prediction, the most significant bit of the counter should not change. The new value of the bimodal and predictor counters are speculative; if there is a branch mis-prediction, the corrected counters will be written from the branch holding register.

The ICNXTBLK also includes 2048 lines for way prediction which are dual ported:

3 Way-prediction bits.

2 Target-selection bits.

4 Taken branch byte-position bits.

The global branch prediction includes 2048 lines of 2 global counters which is organized as 256 rows for 8-way associative. The least significant bit of the global counter is dual ported for reading and writing the speculative prediction in the next cycle.

The ICNXTBLK is organized as 4 sets of 64 rows by 256 columns, 2 sets of 64 rows by 196 columns including some dual-ported columns, 1 set of 64 rows by 128 dual-ported column, 1 set of 64 rows by 96 dual-ported columns, 1 set of 64 rows by 64 dual-ported columns, and 1 set of global counter array. Each of the first two sets consist of 2×4 bits of successor index. The next two sets consists of 2×4 bits of successor index and 2×4 bits of the byte position. The next two sets consists of 2×2 bits bimodal counter, 2×2 bits predictor counter, and 2×3 bits 8-way associative, the least significant bits of the counters are dual-port. The next set consists of 4 bits of way branch byte pointer. The last two sets consist of the 3 bits way-prediction and 2 bits target selection which are dual-ported RAM cells. The least significant bits of the counters are dual ported to be updated on every cycle. To minimize routing and implementation of the branch holding register, the same associated bits of the two branch targets should be laid out in two sets opposite each other. The branch successor index is selected by the way and target prediction to access the ICACHE in next clock cycle. Because of this speed-path in way prediction for reading the Icache in the next cycle, the array for ICNXTBLK is 64 rows instead of 128 rows as for the ICSTORE array. For optimal performance the layout of the column should be 32 RAM cells, pre-charge, 32 RAM cells, write buffer and senamp. The row decoder should be in the middle of the array to drive 96 or 112 column each way. Basically, the pre-charge and the row decoder should be crossed in the middle of the array. The self-time column is used to generate internal clock for each set of the array. Pre-charge is gated by ICLK. The ICNXTBLK has two different outputs; the first output in the first cycle is based on the way-prediction, and the second output in the second cycle is based on TAGHIT. If the two outputs do not select the same set or are not both non-taken, the reading of instruction in the second cycle will be invalidated, creating a bubble in the pipeline. The second output should be gated with TAGHIT and ICLK to be valid in the second cycle.

The branch holding register may be built into the ICNXTBLK array. This means that the bits of the two targets must be alternated in the array to access the branch holding register. The array may be skewed to accommodate the bits into a single array. The global branch counter is also implemented as the array in ICNXTBLK. The shift register and the branch tag for mis-prediction recovery are also implemented next to the array.

Figure 16:
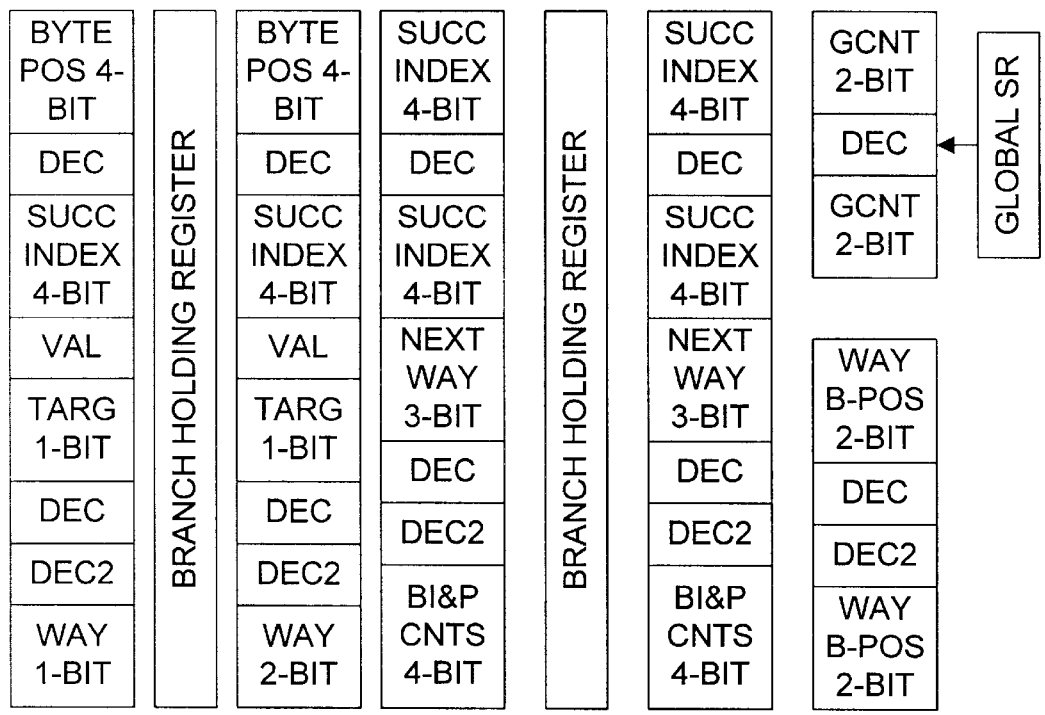

The BIST uses 55 TAEC cells for reading and writing the arrays. See the section on BIST and ATPG. A diagram of ICNXTBLK layout is shown as FIG. 16.

Signal List

INADD(11:3)—Input from ICFPC indicates the address of instruction to access the array. Bits 11:5 are for the row decoder, bit 4 is for column select, bit 3 is for special register read/write to each target. This index should be delayed by 3 cycles to write data for the way prediction bits. This index should be latched into the branch holding register.

ICNVRD—Input from ICCNTL to read branch prediction array.

ICNWR—Input from ICCNTL to write branch prediction. This signal is asserted during pre-decoding, the END-LINE and not PDTAKEN cause the branch holding register to be written into the array.

ICBCWR—Input from ICCNTL to write bimodal counter bits. The index is 2 cycle delay from INADD.

ICPSWR—Input from ICCNTL to write predictor counter bits. The index is 2 cycle delay from INADD.

ICGCWR—Input from ICCNTL to write global counter bits. The index is 2 cycle delay from INADD.

ICWWR—Input from ICCNTL to write way prediction bits. The index is 3 cycle delay from INADD.

INVBHREG—Input from FIROB to invalidate the branch holding register. The branch mis-prediction is speculative, an early branch can be mis-predicted at a later time.

WRBHREG—Input from ICCNTL to write the branch holding register with information from the global shift register or from ICPRED.

WRBHREG1—Input from ICCNTL to write the branch holding register with the way and successor index from accessing the array with information from the global shift register or from ICPRED. This signal is 1 cycle later than WRBHREG.

SRNRD—Input from ICCNTL to read branch prediction for special register.

SRNWR—Input from ICCNTL to write branch prediction for special register.

ICSRBB(28:0)—I/O from SRB indicates the special register address for the array or data transferring to/from the SRB. Bits 23:0 are the branch target, bit 28:26 is the way-selected prediction, and bit 26:24 is way-target prediction. The array requires bit 3 of the address to read the whole line.

SETSEL(7:0)—Input from ICFPC indicates which set to read, no tag compare is needed.

TAGCHK—Input from ICCNTL to indicates the valid set is from TAGHIT or SETSEL.

TAGHIT(7:0)—Input from ICTAGV indicates which set is selected to read branch array.

GETNEWL—Input from ICPRED indicates that pre-decoding has reached the end of the line or encountered a taken branch instruction, a new line of instructions is needed in the next cycle. Use to start with the first target and increase to second target as a branch instruction is detected.

ENDLINE—Input from ICPRED indicates that pre-decoding has reached the end of the line or encountered a taken branch instruction, the pre-decode data should be written into the array.

ENDINST—Input from ICPRED indicates that pre-decoding is completed for the current instruction. The pre-decode bits should be set at this time. This signal should also be sent along with ENDLINE for partially decode instruction. The byte position of the branch instruction is from STARTPTR.

PDJMP—Input from ICPRED indicates the current instruction is a branch instruction. The branch holding register should be setup until pre-decoding of the whole line is completed. If there is a taken branch instruction, the new branch holding register must wait for BWAY and not update the ICNXTBLK until the next opportunity. The ICNXTBLK should send BTAG1 to the decode unit.

PDTAKEN—Input from ICPRED indicates the current instruction is taken branch (the taken branch target can be calculated). The predictor counter in the branch holding register should be setup until pre-decoding of the whole line is completed. The successor index and way associative will be sent to the ICPRED by ICFPC. The ICNXTBLK should send BTAKEN1(0) to decode unit.

GSRSHIFT(3:0)—Input from ICFPC indicates restoring the global shift register from mis-prediction of the RETURN instruction in decode.

MINDEX(14:0)—Input from ICFPC indicates new successor index from branch mis-prediction or new pre-decode taken branch instruction to latch into branch holding register.

MBTAG(3:0)—Input from ICFPC indicates the branch tag from branch mis-prediction to restore the global shift register, counters, byte position, and target number for updating the ICNXTBLK. The target number indicates which branch target to update. The byte position should not change for branch mis-prediction.

BWAY(2:0)—Input from ICFPC indicates new way associative from taken branch mis-prediction or new pre-decode taken branch instruction to latch into branch holding register and for way prediction. This signal is one cycle later than PDINDEX, MINDEX, or MBTAG. BWAY is accessing the next line.

BTAR(1:0)—Output to ICNXTBLK indicates the target of the current line for way prediction. This signal is three cycle after the current line access.

WAYBPTR(3:0)—Output to ICPDAT indicates the byte position of the branch taken pointer of way prediciton. For reading, this pointer is decoded into 16 bits to zero-out all bytes after the pointer for scanning logic.

All the branch prediction signals to the decode units need to mux in the pre-decode branch information and STARTPTR as the first branch target. The branch target address is from the ICFPC as ICPC1 or ICPC2.

BPMSB(1:0)—Internal, indicates taken branch from the msb of the bimodal count of the two targets.

GPMSB(1:0)—Internal, indicates branch taken from the msb of the global count of the two targets.

PSMSB(1:0)—Internal, from the msb of the predictor count of the two targets, 1 indicates using the bimodal predictor, 0 indicates using the global predictor.

PTAKEN(1:0)—Internal, indicates if the branch targets are predicted taken. This signal is the multiplex of the above three signals.

STARTPTR(3:0)—Input from ICFPC indicates the start byte position of the instruction, the position of the branch target must be greater than the start byte. This byte pointer is latched into the branch holding register for pre-decode taken branch instruction and written into the array for pre-decode non-taken branch instruction.

ICBCOL1(3:0)—Internal and output to decode units, indicates the column of the first branch target in the ICNXTBLK for the lines of instructions being fetched. This signal must be greater or equal to STARTPTR. This signal qualifies the BTAG1 in the decode units.

ICBCOL2(3:0)—Internal and output to decode units, indicates the column of the second branch target in the ICNXTBLK for the lines of instructions being fetched. This signal must be greater or equal to STARTPTR. This signal qualifies the BTAG2 in the decode units.

BVAL1—Internal and output to decode units to qualify BTAG1, indicates the first branch target is greater or equal to STARTPTR.

BVAL2—Internal and output to decode units to qualify BTAG2, indicates the second branch target is greater or equal to STARTPTR.

BTAKEN1(1:0)—Output to decode units and ICFPC indicates a predicted taken branch instruction from PTAKEN, BVAL1. Bit 0 is the last line and bit 1 is new line.

BTAKEN2(1:0)—Output to decode units and ICFPC indicates a predicted taken branch instruction from PTAKEN, BVAL2. Bit 0 is the last line and bit 1 is new line.

SINDEX(14:0)—Output indicates the successor index from branch prediction, selected by PTAKEN, BVAL1, and BVAL2.

BTAG1(3:0)—Output indicates the position of the first target branch instruction with respect to the global shift register in case of branch mis-prediction.

BTAG2(3:0)—Output indicates the position of the second target branch instruction with respect to the global shift register in case of branch mis-prediction.

BTAG1N(3:0)—Output indicates the position of the first target branch instruction for a new line with respect to the global shift register in case of branch mis-prediction.

BTAG2N(3:0)—Output indicates the position of the second target branch instruction for a new line with respect to the global shift register in case of branch mis-prediction.

ICPWAY(2:0)—Internal to select the index from way prediction. The branch prediction and targets are used in the ICNXTBLK to access the next line. This signal selects one of the eight way of successor indexes to ICFPC. The ICFPC needs to compare this signal against TAGHIT to validate the way prediction.

ICPTAR(1:0)—Output to ICFPC indicates which branch target to use to access the cache in the next cycle. 00—sequential, 01—return stack, 10—first branch target, and 11—second branch target. Bit 0 selects one of the two successor indexes before the way prediction. The ICFPC needs to compare this signal against the actual taken/non-taken branch prediction. For return stack, the decode unit should detect the return instruction.

WINDEX(14:0)—Output to ICFPC indicates the successor index from way prediction.

DISPBRN1(1:0)—Input from ICALIGN indicates the first predicted branch instruction dispatched to a decode unit. This signal is the OR of ICxBRNB1. Bit 0 is for the first 8-byte and bit 1 is for the second 8-byte of the line if NEWLINE(1) is set for the second 8-byte.

DISPBRN2(1:0)—Input from ICALIGN indicates the second predicted branch instruction dispatched to decode unit. This signal is the OR of ICxBRNB2. Bit 0 is for the first 8-byte and bit 1 is for the second 8-byte of the line if NEWLINE(1) is set for the second 8-byte.

BSTRD—Input from TAP indicates to read the array and compare to set the result.

BSTWR—Input from TAP indicates to write the array from input registers.

BSTDIN—Input from TAP indicates the test pattern to the input registers. The input can be from the TDI pin or normal burn-in patterns.

FLUSHON—Input from TAP indicates flushing register mode, the result latch should use BSTDIN instead of the compare input for flushing the result registers.

BSTSHF1—Input from TAP indicates shifting of the master latch of registers.

BSTSHF2—Input from TAP indicates shifting of the slave latch of registers.

BSTFALSE—Input from TAP indicates to invert the test pattern.

PORTSEL—Input from TAP indicates to select the second dual port.

BSTNBOUT—Output to ICTAGV indicates the result of the data chain.

ICFPC

For continuous instruction addresses, the Icache would be required to request for that IAD bus send the address to the MMU for re-translation before going external. Moving the instruction address latch and incrementor to the ABI block, the instruction address by default can be on the external address bus which can increase the performance of the DRAM access in burst mode. With this change, continuous instruction address request would be relatively simple since the Icache can make a request directly to the BIU without any handshaking for address. With a taken branch, the instruction address latch in ABI will be invalidated, and a new address must be sent to the MMU. The instruction address latch must have a detection for the page-boundary overflow (NAND gates for the lower bits of the address).

This block contains the current fetch PCs to each array, the PC incrementor for sequential access, and the branch holding address register of mis-predicted block for updating of the ICNXTBLK. The branch holding address register is always be compared to the PC to forward the branch data instead of reading from the ICNXTBLK. The ICFPC should keep track of the PCs for all instructions from fetching until all the instructions are valid and all the possible branch instructions are resolved and issued to the decode units. Status bits are needed to indicate the branch targets and return instruction prediction. The ICPDAT provides the information of each valid 8-byte sending to ICALIGN and the ICALIGN provides the information as an instruction starting on a new 8-byte block is dispatched to the decode unit. The instruction must be validated by proper start and end bits, and the RETURN and unconditional jump instructions are detected. These are the possible cases:

1. Invalid instruction must be pre-decoded again:

| Clock | Latch 1 | Latch 2 | Operation of PC0 |
| --- | --- | --- | --- |
| 1 | PC0 | — | read |
| 2 | PC1 | PC0 | invalid instruction |
| 3 | PC2 | — | restart |

2. Branch prediction is not the same as way prediction:

| Clock | Latch 1 | Latch 2 | Operation of PC0 |
| --- | --- | --- | --- |
| 1 | PC0 | — | read |
| 2 | PC1 | PC0 | mis-predict |
| 3 | PC2 | — | restart |

3. Invalid long instruction (more than two 8-byte blocks) must be pre-decoded again:

| Clock | Latch 1 | Latch 2 | Latch 3 | Operation of PC0 |
| --- | --- | --- | --- | --- |
| 1 | PC0 | — | — | read |
| 2 | PC1 | PC0 | — | long instruction |
| 3 | PC2 | PC1 | PC0 | invalid instruction |
| 4 | PC0 | — | — | restart |

4. RETURN branch is mis-predicted in early decoding (compare to way prediction):

| Clock | Latch 1 | Latch 2 | Latch 3 | Latch 4 | Operation of PC0 |
| --- | --- | --- | --- | --- | --- |
| 1 | PC0 | — | — | — | read |
| 2 | PC1 | PC0 | — | — | scan & mux |
| 3 | PC2 | PC1 | PC0 | PC0 | early decode |
| 4 | PC3 | PC2 | PC1 | PC0 | RET mis |
| 5 | PC0 | — | — | — | restart |

Figure 17:
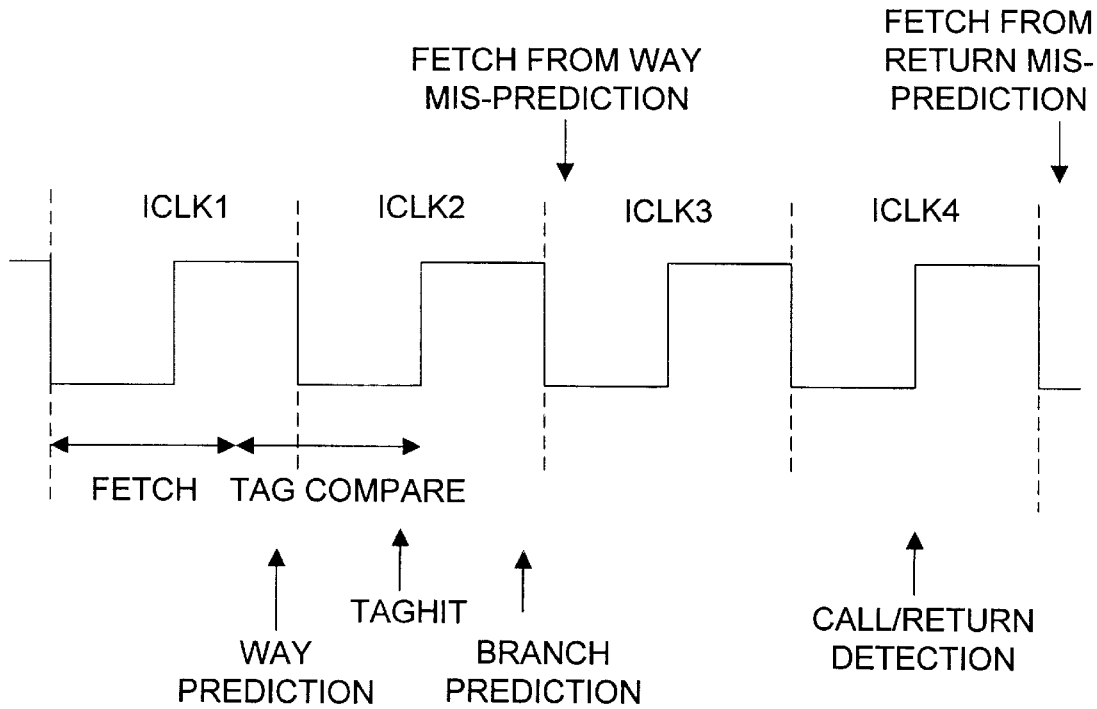

A timing diagram for updating of ICNXTBLK from way misprediction is shown as FIG. 17.

Linear/Logic Address Calculation

The ICACHE uses linear address while the decode units use logical addresses. The code segment register is included in the ICFPC. The translation is either for 16-bit addressing or 32-bit addressing, and either real or protected mode. The code segment register includes:

Segment selector (15:00)

Base Address 15:00, Segment Limit 15:00

Base Address 31:24, Control, Limit 19:16, Control, Type, Base Address 23:16

The Icache is accessed by using linear address while execution of branch instruction uses logical address. On Processor 500, these functions should be done in the ICFPC: calculating the linear address for a new fetch PC, checking for code segment limits, and calculating the logical PC address for dispatching new instructions to IDECODE.

For a mis-predicted branch, the Icache needs to write the branch holding register into the ICNXTBLK before accessing the cache with a new fetch PC. The linear address can be calculated in the Icache without any penalty in performance. The functional unit should send new logical address PC to the Icache directly.

Since Processor 500 does not have a BYTEQ, 4 X86 instructions are scanned and dispatched directly to decode units; the PC of dispatched instructions is known for each clock cycle. The code segment limits checking should be done in the ICFPC and a violation status can be sent with the instruction to the decode unit. The ICFPC should keep both the logical and linear PC addresses for the 4 pipeline stages from fetching to muxing of instructions to decode units, the logical address is sent to the decode unit without any calculation.

Return Stack

The RETURN instruction should be detected in early decoding and fetch the next PC from return stack (the RETURN instruction will not be in the ICNXTBLK). It should be individually decoded in the early decode units. Similarly, the CALL instruction should also be detected in the early decode units to update the return stack. The CALL instruction pushes PC of the next instruction onto the stack which is the concatenation of the line PC and the ICPOSx (3:0). The return stack is a last-in-first-out (LIFO) stack. The return stack is implemented with a pointer to the top of the stack, and the pointer increases as a new entry is allocated for the CALL instruction. When the return stack is full, the stack is shifted down by one for the new CALL instruction, and the pointer should be at top of the stack. In another case, when both the call and return instructions of the same entry in the return stack are retired, the entry can be removed by shifting all entries down by one and the pointer decreases by one. The return stack must be recovered from branch mis-prediction. The mis-predicted RETURN instruction is difficult to handle, there are three possible cases. In the application program, the RETURN instruction can be fake which causes the return stack to be forever mis-predicted, the subroutine changes the return target in the stack pointer before executing the RETURN instruction, and the subroutine uses JMP instruction instead of RETURN instruction. For simplicity, the mis-predicted RETURN instruction will cause the return stack to be invalidated. Another condition for invalidating the return stack is from the CMASTER invalidating the Icache. For RETURN instruction after the mis-predicted branch instruction, the return stack should be able to recover. The current return stack is eight buffers, each buffer contains the call branch tag from the global shift register when the CALL instruction is dispatched, the return PC, the return branch tag, the call valid bit, the return valid bit, and the retired call valid bit. The best way to understand the recovery procedure is by the example of this sequence of instructions:

| | Jump1, Ret2 C, Call3 D, Jump4, Ret5 D, Call6 E, Call7 F, Ret8 F, Ret9 E, Ret10 B, Call11 G. | | | | |
|---|---|---|---|---|---|
| Return PC | Call Tag | Return Tag | CV | RV | RCV |
| Beginning return PCs in the return stack: | | | C, B, A. | | |
| C | 0 | — | 1 | 0 | 0 |
| B | 0 | — | 1 | 0 | 1 |
| A | 0 | — | 1 | 0 | 1 |
| The return stack at Jump4 instruction: | | | | | |
| D | 3 | — | 1 | 0 | 0 |
| C | 0 | 2 | 1 | 1 | 0 |
| B | 0 | — | 1 | 0 | 1 |
| A | 0 | — | 1 | 0 | 1 |
| The return stack at Call7 F instruction: | | | | | |
| F | 7 | — | 1 | 0 | 0 |
| E | 6 | — | 1 | 0 | 0 |
| D | 3 | 5 | 1 | 1 | 0 |
| Jump1, Ret2 C, Call3 D, Jump4, Ret5 D, Call6 E, Call7 F, Ret8 F, Ret9 E, Ret10 B, Call11 G. | | | | | |
| C | 0 | 2 | 1 | 1 | 0 |
| B | 0 | — | 1 | 0 | 1 |
| A | 0 | — | 1 | 0 | 1 |
| The return stack at the end of the sequence: | | | | | |
| G | 11 | — | 1 | 0 | 0 |
| F | 7 | 8 | 1 | 1 | 0 |
| E | 6 | 9 | 1 | 1 | 0 |
| D | 3 | 5 | 1 | 1 | 0 |
| C | 0 | 2 | 1 | 1 | 0 |
| B | 0 | 10 | 1 | 1 | 1 |
| A | 0 | — | 1 | 0 | 1 |

If Jump 1 is mis-predicted, then Tag 1 is used for recovery. The Call Tag in the recovery stack should be less than Tag 1 and Return Tag should be greater than Tag 1 for valid in the return stack. Entries G, F, E, and D should invalidate all valid bits. Entries C and B should reset the return valid bits.

If Jump 4 is mis-predicted, then Tag 4 is used for recovery. Entries G, F, and E should invalidate all valid bits. Entries B and D should reset the return valid bits. There is no change for entry C.

If Call3 D is mis-predicted, then Tag 3 is used for recovery. Entries G, F, and E should invalidate all valid bits. Entries D, C, and B should reset the return valid bits. A new return PC is latched for entry D.

If Call7 F is mis-predicted, then Tag 7 is used for recovery. Entry G should invalidate all valid bits. Entries E and F should reset the return valid bits. A new return PC is latched for entry F.

If Call 11 G is mis-predicted, then Tag 11 is used for recovery. A new return PC is latched for entry G.

Any mis-predicted return instruction invalidates all valid bits in the return stack. The call instruction should retire before the return instruction in the same entry. As the return instruction is retired the entry can be eliminated from the return stack and all the entries can be shifted down by one.

Figure 18:
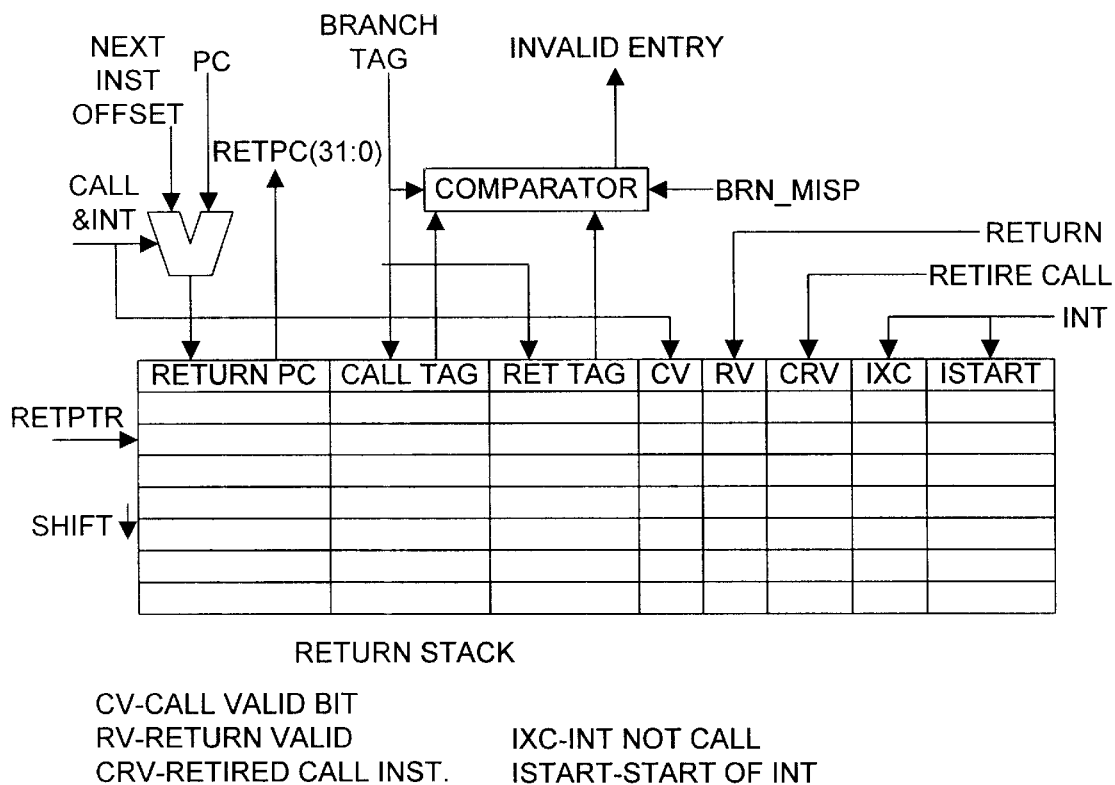

The INT and IRET are similar to the CALL and RETURN instructions. The return stack needs to keep the PC and statuses for the INT and IRET. It is more often that the interrupt routine is from asynchronous interrupt and trap. The IRET executes without the previous INT. To avoid invalidating the entire return stack on mis-predicted IRET, two more status bits are needed. The IXC bit indicates that the entry is from INT or CALL instruction. The IRET pops only the top entry with IXC bit set, and the RETURN pops only the top entry with IXC bit reset. The ISTART bit indicates the starting point for INT routine. In the case of a mis-prediction on the IRET instruction, entries with ISTART bit set will be purged. The entries before the INT should not be affected by the mis-prediction from the interrupt routine. A diagram of the return stack set up is shown as FIG. 18.

ICFPC ORGANIZATION

The possible sources for index of ICSTORE are:

Incrementor of sequential address.

Refresh of current index.

Refresh the previous index because of confused instruction in decode.

Successor index of taken branch from way predictor of ICNXTBLK.

Return instruction target from way predictor of ICNXTBLK.

Corrected index of taken branch from branch prediction of ICNXTBLK.

Predicted taken branch from ICPRED.

Branch mis-prediction or Read-after-Write dependency flush from FIROB.

Special register reading/writing.

Build-In Self-Test counter.

The possible sources for index of ICTAGV are:

Incrementor of sequential address.

Refresh of current index.

Refresh the previous index because of confused instruction in decode.

Next block address to check the cache during pre-fetching.

Successor index of taken branch from way predictor of ICNXTBLK.

Return instruction target from way predictor of ICNXT-BLK.

Corrected index of taken branch from branch prediction of ICNXTBLK.

Branch mis-prediction or Read-after-Write dependency flush from FIROB.

Predicted taken branch from ICPRED.

CMASTER new mapping for current tag miss.

Special register reading/writing.

Build-In Self-Test counter.

The possible sources for index of ICPDAT are:

Incrementor of sequential address for reading (same as ICSTORE).

Refresh of current index.

Refresh the previous index because of confused instruction in decode.

Delay of sequential address for writing of pre-decode data.

Successor index of taken branch from way predictor of ICNXTBLK.

Return instruction target from way predictor of ICNXT-BLK.

Corrected index of taken branch from branch prediction of ICNXTBLK.

Branch mis-prediction or Read-after-Write dependency flush from FIROB.

Predicted taken branch from ICPRED.

Special register reading/writing.

Build-In Self-Test counter.

The possible sources for index of ICNXTBLK are:

Incrementor of sequential address.

Refresh of current index.

Refresh the previous index because of confused instruction in decode.

Delay of sequential address for writing of pre-decode data.

Successor index of taken branch from way predictor of ICNXTBLK.

Return instruction target from way predictor of ICNXT-BLK.

Corrected index of taken branch from branch prediction of ICNXTBLK.

Branch mis-prediction or Read-after-Write dependency flush from FIROB.

Predicted taken branch from ICPRED.

Branch holding address register.

Special register reading/writing.

Build-In Self-Test counter.

The ICFPC block also includes the code segment register, the PC incrementor address, the branch holding address register and comparator, and the subtractor for calculation of logical address. The code segment register includes the base for logical address calculation and the limit for segment violation. The PC incrementor has two parts: the index incrementor and the tag-address incrementor; the tag-address incrementor is used only when the index incrementor is overflowed. It is much faster to break up the PC incrementor into two parts.

ICFPC should keep track of all the way selection in all the arrays. From reading the array, the predicted way and the TAGHITs should match, and the HIT way should be kept with the PC and branch tags. For writing the array, the selected way is from the CMASTER's pseudo random way replacement algorithm or from the branch mis-prediction.

For the special register read/write, the selected way is from the SRB.

An 11-bit counter is implemented in this block for BIST, the counter fakes counting down by exclusive-or the output. See the section on BIST and ATPG.

SIGNAL LIST

REFRESH2—Input from Idecode indicates current line of instructions will be refreshed and not accept new instructions from Icache.

NEWLINE(1:0)—Input from ICPDAT indicates the first (bit 0) or the second (bit 1) 8-byte is the starting of a new line. The byte positions of instructions sending to the decode units should be adjusted accordingly.

HLDISP(1:0)—Input from ICALIGN indicates the first (bit 0) and/or the second (bit 1) 8-byte of the current line has been dispatched to decode units.

NEWBLK—Input from ICCNTL to read new sequential block.

NXTBLK—Input from ICCNTL to check next sequential block during pre-fetching.

INVPTR(3:0)—Input from ICPDAT indicates the start pointer of the invalid instruction which needs to be pre-decoded.

INVINST—Input from ICPDAT indicates the invalid instruction which needs to be pre-decoded.

ICPTAR(1:0)—Input from ICNXTBLK indicates which branch target to use to access the cache in the next cycle. 00 sequential, 01—return stack, 10—first branch target, and 11—second branch target. Bit 0 selects one of the two successor indexes before the way prediction. The ICFPC needs to compare this signal against the actual taken/non-taken branch prediction.

WINDEX(14:0)—Input from ICNXTBLK indicates the successor index from way prediction.

RETPC(31:0)—Internal indicates the PC address from the top of the return stack for fast way prediction.

CALLDEC(3:0)—Input from ICALIGN indicates the CALL instruction is detected, the return stack should be updated with the PC address of instruction after CALL. The line must be taken.

NORETB—Input from ICALIGN indicates no RETURN instruction is detected for the current line. This signal responds to RETPRED. The ICFPC should use the branch prediction of BTAKEN to fetch the next line.

RETDEC(3:0)—Input from ICALIGN indicates a RETURN instruction is detected for the way prediction to update if no RETURN was predicted. The ICFPC needs to keep track of the branch instructions for 4 lines and restores the global shift register in case of mis-predicting the RETURN instruction in Idecode.

BTAKEN1(1:0)—Input from ICNXTBLK indicates a predicted taken branch instruction from PTAKEN, BVAL1. Bit 0 is the last line and bit 1 is new line. SINDEX should be used for accessing the arrays.

BTAKEN2(1:0)—Input from ICNXTBLK indicates a predicted taken branch instruction from PTAKEN, BVAL2. Bit 0 is the last line and bit 1 is new line. SINDEX should be used for accessing the arrays.

SINDEX(11:0)—Input from ICNXTBLK indicates the correct successor index from branch prediction, selected by PTAKEN, BVAL1, and BVAL2.

PDJMP—Input from ICPRED indicates the current instruction is a branch instruction. The branch holding register should be setup until pre-decoding of the whole line is completed. If there is a taken branch instruction, the new branch holding register must wait for MWAY and not update the ICNXTBLK until the next opportunity.

PDTAKEN—Input from ICPRED indicates the current instruction is taken branch (the taken branch target can be calculated). The predictor counter in the branch holding register should be setup until pre-decoding of the whole line is completed. The successor index and way associative will be sent to the ICNXTBLK by ICFPC. The next index for the array is from PTARGET.

PDRETB—Input from ICPRED indicates the current instruction is RETURN instruction. The ICFPC should use the return branch address for fetching the next line.

PTARGET(31:0)—Input from ICPRED indicates the branch target for current branch instruction. The successor index is latched until pre-decoding of the whole line is completed. If the branch is taken, the way calculation is done in ICFPC and latched until branch mis-predictions or external fetch is started.

ICMBWR—Input from ICCNTL indicates starting of external fetch, the branch holding register should be written into the ICNXTBLK in the next cycle. The array index is from BINDEX.

BRNMISP—Input from FIROB indicates a branch mis-prediction. The Icache changes its state machine to access a new PC and clears all pending instructions. This signal is one cycle ahead of the transferring of the new target. The branch holding register should be written into the ICNXTBLK array in next cycle. The array index is from BINDEX.

LINDEX(11:0)—Internal from branch holding register indicates the previous branch to be written into ICNXTBLK.

UPDFPC—Input from FIROB indicate that a new Fetch PC has been detected. This signal accompanies the FPC for the Icache to begin access the cache arrays.

FPC(31:0)—Input from FIROB as the new PC for branch correction path.

BPC(11:0)—Input from FIROB indicates the PC index and byte-pointer of the branch instruction which has been mis-predicted for updating the ICNXTBLK. This index must be compared to the array index for exact recovery of the global shift register.

BRNTAKEN—Input from FIROB indicate the mis-predicted branch status. This signal must be gated with UPDFPC.

BRNTAG(3:0)—Input from FIROB indicates the branch tag in the global shift register to restore the previous branch prediction information and the branch index address. The mis-predicted will be latched into the branch holding register. The branch index of the branch holding register is implemented in the ICFPC.

BINDEX(11:0)—Internal, indicates the previous branch index, the branch indexes are address by the branch tag with similar implementation as the global shift register in the ICNXTBLK.

FPCTYP—Input for FIROB indicates the type of address that is being passed to the Icache.

L2_IC_INV(1:0)—Input from CMASTER to clear the LV bits.

LS_CS_WR—Input from LSSEC to write the new code segment from SRBB. Two cycles are needed.

MVICAR—Output to ICCNTL indicates move to/from special register instruction is for Icache array. The ICCNTL steals one cycle from normal operation.

SRRDXWR—Output to ICCNTL indicates move to/from special register instruction is read or write.

SRB_VAL—Input from SRB indicates a special register instruction is on the SRBB.

ICTAR_VAL—Output to SRB indicates completion of the special register instruction, for read the data is on the SRBB.

SRBB(31:0)—I/O from SRB indicates the special register address for the indexing the arrays, passing to ICSRBB, and to access the code segment register.

ICSRBB(31:0)—I/O passing from SRBB for internal access to the arrays. A number of bits will pass to the ICCNTL for decoding which array.

L2_IC_ALIAS—Input from CMASTER indicates the instruction is in the Icache with different mapping. The CMASTER provides the way associative, new supervisor bit, and new tag address. The LV will be set in this case. All arrays will be read from MCOL except for ICTAGV which will write in the new tag.

PFREPLCOL(2:0)—Input from CMASTER indicates the way associative for writing of the ICTAGV.

PREDEN—Input from ICCNTL to enable the pre-decoding of instruction.

GETNEWL—Input from ICPRED indicates that pre-decoding has reached the end of the line or encountered a taken branch instruction, a new line of instructions is needed in the next cycle. This signal controls the index for ICS-TORE and ICTAGV.

ENDLINE—Input from ICPRED indicates that pre-decoding has completed for the last instruction of the line (if the instruction crosses over to the next line, this instruction should complete in pre-decoding) or encountered a taken branch instruction, the pre-decode data should be written into the array. This signal controls the index for ICPDAT and ICNXTBLK.

ENDINST—Input from ICPRED indicates that pre-decoding is completed for the current instruction. The pre-decode bits should be set at this time. The ICFPC uses this signal and PENDB to generate a new STARTPTR.

PDJMP—Input from ICPRED indicates the current instruction is a branch instruction. The branch holding register should be setup until pre-decoding of the whole line is completed. If there is a taken branch instruction, the new branch holding register must wait for BWAY and not update the ICNXTBLK until the next opportunity.

PDTAKEN—Input from ICPRED indicates the current instruction is taken branch (the taken branch target can be calculated). The predictor counter in the branch holding register should be setup until pre-decoding of the whole line is completed. The successor index and way associative will be sent to the ICPRED by ICFPC.

DISPBRN1(1:0)—Input from ICFPC indicates the first predicted branch instruction dispatched to decode unit. This signal is the OR of ICxBRNB1. Bit 0 is for the first 8-byte and bit 1 is for the second 8-byte of the line if NEWLINE(1) is set for the second 8-byte.

DISPBRN2(1:0)—Input from ICFPC indicates the second predicted branch instruction dispatched to decode unit.

This signal is the OR of ICxBRNB2. Bit 0 is for the first 8-byte and bit 1 is for the second 8-byte of the line if NEWLINE(1) is set for the second 8-byte.

STARTPTR(3:0)—Output indicates the starting byte position for pre-decoding of the instruction in the IB(127:0).

ISADD(11:2)—Output to ICSTORE indicates the address of instruction to access the array. Bits 11:5 are for the row decoder, bits 4:2 are for column select. For normal operation, bits 11:4 is used to read/write 16-byte only. For special register operation, bits 11:2 is used to read/write 4-byte.

IPADD(11:2)—Input from ICFPC indicates the address of instruction to access the array. Bits 11:6 are for the row decoder, bits 5:2 are for column select. For normal operation, bits 11:4 is used to read/write 16-byte only. For special register operation, bits 11:2 is used to read/write 4-byte.

ITADD(11:4)—Output to ICTAGV indicates the address of instruction to access the array. Bits 11:5 are for the row decoder, bit 4 is for column select.

IVADD(11:4)—Output to ICTAGV indicates the address of instruction to access the LV array. Bits 11:5 are for the row decoder, bit 4 is for column select.

INADD(11:3)—Input from ICFPC indicates the address of instruction to access the array. Bits 11:5 are for the row decoder, bit 4 is for column select. This index should be delayed by 3 cycles to write data for the way prediction bits.

SETSEL(7:0)—Output to arrays indicates which set to read, no tag compare is needed.

BWAY(2:0)—Output to ICNXTBLK indicates the way associative for the current taken branch instruction for the branch holding register and way prediction.

BTAR(1:0)—Output to ICNXTBLK indicates the target of the current line for way prediction. This signal is three cycles after the current line access.

ICLIMIT(19:0)—Output to decode units indicates the limit of the code segment register for segment violation.

ICPC1TAR—Output to Idecode indicates is ICPC1 a branch target of a previous instruction which is a predicted taken branch instruction.

ICPC2TAR—Output to Idecode indicates is ICPC2 a branch target of a previous instruction which is a predicted taken branch instruction.

ICPC1(31:0)—Output to Idecode Output to Idecode indicates the current line PC of the first instruction in the 4 issued instructions to pass along with the instruction to FIROB.

ICPC2(31:0)—Output to Idecode indicates the current line PC of a second instruction which cross the 16-byte boundary or branch target in the 4 issued instructions to pass along with the instruction to FIROB.

RETPRED—Output to Idecode indicates the current prediction of the return instruction of the fetched line. The return instruction must be detected in the current line of instruction or the Icache must be re-fetched from a new line.

BSTRUN—Input from TAP indicates to start the BIST.

BSTRD—Input from TAP indicates to read the array and compare to set the result.

BSTWR—Input from TAP indicates to write the array from input registers.

BSTRST—Input from TAP indicates to reset the counter.

BSTINCR—Input from TAP indicates to increment the counter.

UPDOWN—Input from TAP indicates counting up or down.

BSTAMSB—Output to TAP indicates maximum count for dual port arrays.

MAXADDR—Output to TAP indicates maximum index counter.

ICPRED

This block pre-decodes the instructions as they come in from the external memory or from the Icache if the start/end bits are confused. On Processor 500, the ICPRED is connected to the IB(127:0) to read the instructions from either pre-fetch buffer or Icache. For externally fetched instruction, the ICPRED starts from the fetched byte position. The ICPRED latches the instructions in the second ICLK as they are sent to the decode units. If the start/end bits are confused, then the ICPDAT sends the byte position of the invalid instruction to the ICPRED for pre-decoding. All pre-decode data before the confused instruction should remain in the ICPDAT array. The pre-decoding stops on two conditions: a taken branch is detected or valid start byte is detected after the end byte from pre-decoding; this condition should be detected in the ICPDAT. The ICPRED pre-decodes one instruction per two clock cycles plus an extra clock cycle for prefix. The pre-decode information includes the start-byte, end-byte, function-byte, and the branch prediction information. The difference in pre-decode of instructions are:

Fast-path instructions should have any number of prefix except for string prefixes which is an MROM instruction. One extra clock cycle in the pipeline is needed for instructions with more than four prefixes.

A few instructions use two dispatched positions. The SIB instruction also needs two dispatched positions. Any double-dispatched instructions with SIB will go to MROM.

The first functional bit, if set, indicates fast-path instruction, else it is MROM instruction. The Processor 500 instruction set includes:

PUSH

POP

CALL/RETURN near

LEA

JUMP cc/unconditional

8/32-bit operations

MOVE reg/reg reg/mem

ALU operations reg/mem reg/reg (excluding the RCR and RCL instructions).

Decode for CALL, INT, and Unconditional JUMP to set the predictor and the bimodal counters to the saturated value in the ICNXTBLK. The branch target information is kept in the branch holding register for future updating. The ICPRED calculates the target address for the Unconditional Jump if possible. Otherwise, fetching is stalled until the target address is calculated in decoding or executing. ICFPC must have an adder and ICPRED must send the offset to calculate the target address.

The RETURN and IRET instructions are pre-decoded to access the return stack and set the way prediction array.

Decode for Conditional JUMP is needed to keep it in the ICNXTBLK and for global branch prediction. If the target address of the conditional JUMP (and LOOP) can be calculated and the branch jumps backward, then it is predicted taken. Since backward branch is mostly taken and the adder is available to calculate the target address, the conditional branch should be predicted taken. The taken branches have the higher priority to occupy the branch targets. Conditional branch has higher priority to occupy two branch targets in the ICNXTBLK than CALL or Unconditional JUMP with 8-bit displacement linear address. The decoding for all branches are needed to set the global shift register. If the target address is a simple calculation, the decode units should calculate the target address and jump to new block.

The encoding of the functional bits for fast-path instruction are as follows:

| Byte number | 01234 | Type |
|---|---|---|
| Start bit | 1000 | MROM, no prefix |
| Func bit | 0111 | opcode is at first byte. |
| Start bit | 1000 | MROM, one prefix |
| Func bit | 0011 | opcode is at second byte |
| Start bit | 10000 | MROM, three prefixes |
| Func bit | 00001 | opcode is at fourth byte |
| Start bit | 1000 | Fast path, no prefix |
| Func bit | 1000 | opcode is at first byte |
| Start bit | 1000 | Fast path, one prefix |
| Func bit | 1100 | opcode is at second byte |
| Start bit | 10000 | Fast path, three prefix |
| Func bit | 11110 | opcode is at fourth byte |

Along with the start bit, if the functional bit is 0, the instruction is MROM, if the functional bit is 1, the instruction is fast path. The encoding for the functional bits of MROM instruction is inverted that of the fast path instruction. If the first functional bit is 0, all functional bits is inverted before qualifying with the valid bits for prefix and opcode decoding. In addition, the functional bits should also be set for SIB-byte and for the immediate field. The detection of the SIB-byte instruction is necessary to generate 2-dispatch positions instruction.

The ICPRED controls the reading of the next sequential line from ICSTORE to IB(127:0) and writing of the pre-decode data into the ICPDAT and ICNXTBLK. GETNEWL is used to read the next sequential block from ICSTORE, and ENDLINE and ENDINST are used to write pre-decode data into the ICPDAT and ICNXTBLK. If the split-line instruction (instruction started at the end of the first line and end in the next line) is also a predicted taken branch, then ICCNTL and ICPRED should provide control to write predecode data into the ICPDAT array in an extra cycle. ICPRED provides the start and end pointers as completion of pre-decoding of each instruction along with ENDINST. The functional bits are kept in ICPRED until completion of the line. ICPRED must continuously latch the new line from IB(127:0) in case of confused instruction, all functional bits should be cleared before pre-decoding.

The pre-decode instruction should be sent directly to decode unit 0. The instruction has to go through early decoding before dispatching to the decode unit. During pre-decoding all the controls of sending the correct instruction from IB(127:0) to IBl(191:0) should be directly from ICPRED. The ICPRED controls the muxing between the 2 buses and the ICALIGN uses PDSHF(4:0) to read the instruction from the 8-byte of IB1 for the valid opcode, MODRM, and SIB bytes.

Upon detection of MROM instruction, the ICPDAT muxes the STARTPTR(3:0) to the MROM for reading of instruction from IB(127:0). The ICPRED must continue to decode instructions and fill up the bus IB1(191:0) of up to 4 instructions per 8-byte block. The ICALIGN keeps PDSHF(4:0) in ICnVAL(7:0) of each 8-byte block. Similar to ICPDAT, the information from the next stage in ICALIGN and MROM pipeline should be conveyed to this block. The pre-decoding is stalled if ICALIGN or MROM is full.

ICPRED ORGANIZATION

Figure 19:
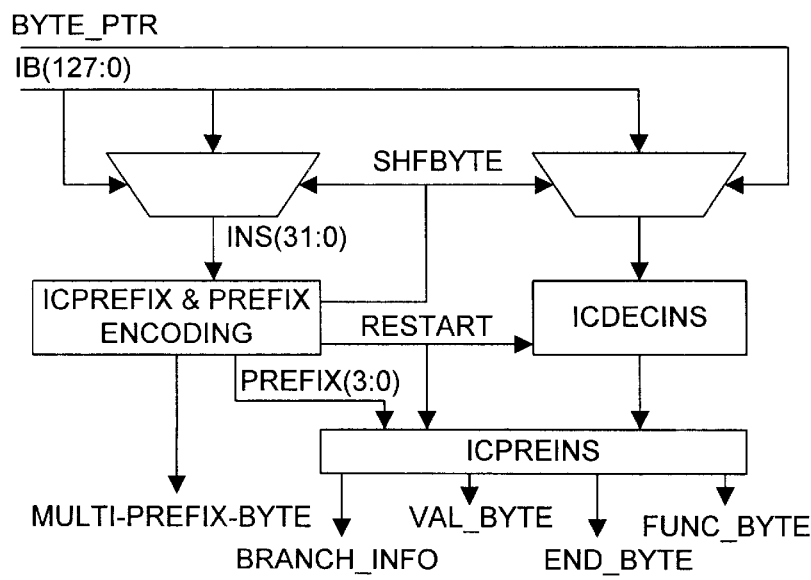

The ICPRED includes three blocks: one block (ICPREFIX) decodes the prefix, one block (ICDECINS) decodes the instruction, and one block (ICPREINS) sets up the pre-decode data. The ICPREFIX decodes up to 4 prefix bytes per clock cycle. The ICPREFIX is similar to the prefix decoding in the ICALIGN, and the same logic should be used. The ICPREFIX should combined the prefixes for dispatching to decode unit; this is to avoid an extra cycle if there are more than 4 prefixes. The ICDECINS accepts prefix status and 3 instruction bytes, the opcode, the MODRM, and the SIB. In the first cycle, no prefix is assumed. If prefix is detected in the ICPREFIX, the ICDECINS will restart the decoding of instruction with new prefix status and 3 new instruction bytes. If more prefixes are detected in subsequent cycle, the ICDECINS will restart with new information. After the decoding, the pre-decode information will be sent to the decode unit 0 and the latch in the ICPDAT, the ICALIGN will dispatch the instruction and pre-decode data to the first decode unit. The byte pointer moves to the next instruction and the procedure continues until the whole line is completed. The writing of the ICPDAT will be done when the whole line is decoded. The ICDECINS also decodes for branch instructions and sets up the two targets in the ICNXTBLK. The ICDECINS sends control to ICFPC for calculating the simple taken branch addresses: PC+displacement. The ICPRED includes local latches of 8 bytes for instruction which can wrap around to the next line. For instructions which are longer than 15 bytes, an exception is asserted to ICCNTL and decode units. The list of Processor 500 fast path instructions can be found below. The outputs of the ICPREFIX and ICDECINS are fed to ICPREINS for analyzing and setting up the pre-decode data. A diagram showing the ICPRED set up is shown as FIG. 19.

SIGNAL LIST

IB(127:0)—Input from ICSTORE indicates the line of instructions from the array or pre-fetch buffer for pre-decoding. A latch should be implemented for unaligned instructions. Data only changes on valid GETNEWL and PBVAL.

STARTPTR(3:0)—Input from ICFPC indicates the starting byte position for pre-decoding of the instruction in the IB(127:0).

CS32X16—Input from LSSEC indicates operand and address size from the D bit of the segment descriptor of the code segment register. If set, 32-bit, if clear, 16-bit.

PREDEN—Input from ICCNTL to enable the pre-decoding of instruction.

PBVAL—Input from ICSTORE indicates a valid line of instruction from external fetch. If GETNEWL is high, the pre-fetch buffer will put a valid line of instruction on the IB(127:0) in early next cycle. ICPRED should use both PBVAL and GETNEWL to read valid instruction byte on IB.

GETNEWL—Output indicates that pre-decoding has reached the end of the line or encountered a taken branch instruction, a new line of instructions is needed in the next cycle. This signal is also asserted at the beginning of PREDEN.

ENDLINE—Output indicates that pre-decoding has completed for the last instruction of the line (if the instruction crosses over to the next line, this instruction should complete in pre-decoding) or encountered a taken branch instruction, the pre-decode data should be written into the array.

ENDINST—Output indicates that pre-decoding is completed for the current instruction. The pre-decode bits saould be set at this time. This signal should also be sent along with ENDLINE for partially decode instruction.

PENDIB(4:0)—Output to ICPDAT indicates the end byte position of the current instruction. The end bit is set and latched until pre-decoding of the whole line is completed. Bit 4 indicates if the end bit is on the next line.

PLFUNCB(15:0)—Output to ICPDAT indicates the functional bits of current line of instructions. ICPDAT uses ENDLINE to OR these bits previous pre-decode data and write into the array. The ICPRED must keep all the functional bits for all the pre-decoded instruction in the line.

PDMROM—Output to ICDPAT and ICALIGN indicates the current instruction is MROM. The MROM instruction may take two cycles to read the PENDB and PFUNCB.

PIFUNCB(2:0)—Output to ICALIGN indicates the functional bits for current instruction. Only three bytes (opcode, MODRM, and SIB) are needed for early decode of the instruction. The prefixes are encoded into one single byte to the decode unit 0.

PDVAL(10:0)—Output to ICALIGN indicates the valid bytes for pre-decode instruction to decode unit 0. This signal is to validate the bytes in decode. The maximum length of the instruction is 11 bytes.

PDSHF(5:0)—Output to ICALIGN indicates which bytes to mux to early decoding. The opcode byte must always be in the first 8-byte of IB1(191:0). The ICPRED must put the current line into the IB1(191:0) for muxing. The upper 2 bits to select which 8-byte block, the ICALIGN can accumulate the pre-decode instructions while waiting for the MROM instructions.

PD8BSEL(5:0)—Output to ICALIGN controls the muxes from IB(127:0) to IB1(191:0). Bit 5:3 is for the upper 8-byte IB(127:64) and bit 2:0 is for the lower 8-byte IB(63:0). 001 is for muxing to the first 8-byte IB1(63:0), 010 is for muxing to the second 8-byte, and 100 is for muxing to the third 8-byte.

PDPREF(7:0)—Output to ICALIGN and then to decode unit 0 or MROM indicates the encoded prefix byte.

PDJMP—Output indicates the current instruction is a branch instruction. The branch holding register should be setup until pre-decoding of the whole line is completed. If there is a taken branch instruction, the new branch holding register must wait for MWAY and not update the ICNXTBLK until the next opportunity.

PDTAKEN—Output indicates the current instruction is taken branch (the taken branch target can be calculated). The predictor counter in the branch holding register should be setup until pre-decoding of the whole line is completed. The successor index and way associative will be sent to the ICNXTBLK by ICFPC.

PDRETB—Output to ICFPC indicates the current instruction is RETURN instruction. The ICFPC should use the return branch address for fetching the next line.

INST_LEGAL—Output to ICCNTL indicates the current instruction is a legal X86 instruction, this signal should be qualified with ENDINST to indicate illegal instruction to the decode unit.

INST_2_LONG—Output to ICCNTL indicates the current instruction is more than 15 bytes, this signal should be qualified with ENDINST to indicate long instruction to the decode unit.

PTARGET(31:0)—Output to ICFPC indicates the branch target for current branch instruction. The successor index is latched until pre-decoding of the whole line is completed. If the branch is taken, the way calculation is done in ICFPC and latched until branch mis-predictions or external fetch is started.

ICALIGN

An extra pipeline stage is added on Processor 500 for early decoding of prefixes and generating two dispatched positions for a few instructions. To gain another half clock cycle for early decoding and dispatching of instructions to the decode units, the operand, flag, and un-conditional jump instruction (including CALL and RETURN) decoding can be done in early decoding. The unconditional branch instruction should be the last instruction in the line which should be compared to the branch information in the ICFPC. If the unconditional branch instruction was not recorded in the branch global shift register, then the ICFPC re-fetches from the target of the unconditional branch and corrects the branch tags in the branch global shift register. The CALL and RETURN instructions are necessary for setting the return stack. The operands and flags are sent directly to the register file and FIROB for accessing the data. The operation of this block takes 2.5 clock cycles which includes prioritizing, aligning, decoding, and muxing of instructions to decode units.

ALIGNMENT OF INSTRUCTIONS TO DISPATCHED POSITIONS

Figure 20:
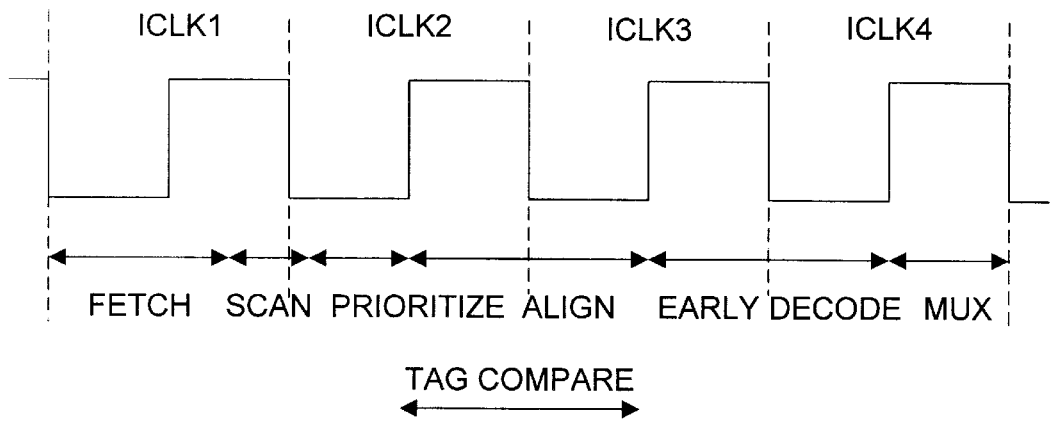

Instructions are sent as 8-byte blocks from the ICPDAT to the ICALIGN, and they are prioritized to 4 dispatched positions for early decoding and muxing to the 4 decode units. FIG. 20 of the 4 pipeline stages is shown for reference. Timing of fetching instructions to the decode units is as followed:

Cycle 1—Fetch from the array, the ICPDAT starts the scanning, and the ICTAGV starts the tag comparison. IB(127:0) is muxed to IB1(191:0) for aligning to 4 dispatched positions.

Cycle 2—Complete the scanning of each individual 8-byte and align 7 bytes for each instruction to the early decoding.

Cycle 3—Multiplex the instructions to 4 early-decoding units (the scanning logic can send up to 8 instructions) and decode up to 5 prefixes and opcode for 2-dispatch positions instruction, and decode for the register operands, flags, CALL/RETURN instructions.

Cycle 4—Multiplex the instructions to 4 decoding units, the prefix is the combined prefix and the instructions from IB2(191:0). The decode unit start the operand and flag decoding.

The operation in the scanning cycle:

If the scanning logic can dispatch all of first and second 8-bytes, it fetches another 16-bytes from the array.

If the first 8-bytes cannot be dispatched, the dispatched instructions of the second 8-bytes in the ICALIGN are invalidated. The pre-decode bits of the first 8-byte is updated. The reading from the array is voided.

If the first 8-bytes can be dispatched, and the second 8-bytes cannot be dispatched, then the pre-decode bits of the second 8-bytes are updated. The second 8-bytes are shifted to the first 8-bytes, and a new 8-bytes are fetched into the second 8-bytes.

Signals from the next stages can indicate the number of 8-bytes to send.

Each 8-byte block consists of the following information:
Number of valid instructions.

The valid bits for each instruction, the valid bits can continue to the next 8-byte blocks.

The functional bits for each instruction, the functional bits can continue to the next 8-byte blocks.

The operation in prioritizing and aligning:

Four instructions are selected from IB1(191:0) to send to early decoding. Each instructions can have up to 7 bytes for decoding, 4 prefix bytes, 1 opcode, 1 MODRM, and 1 SIB.

In the 8-byte block where the third instruction is started, this 8-byte block should be kept until the next clock cycle. The appropriate HOLD signals are generated to ICPDAT for accepting the next 8-byte blocks. If the first two instructions require 2 dispatched positions each, then the third instruction must wait until the next clock cycle. The decode information is not available until the fourth ICLK. The third instruction must remain in the IB1 latch until the first two instructions are decoded. Except for the SIB-byte instruction with early indication by the functional bit, the opcode must be decoded for few other instructions. The information from decoding is too late to stop the scanning cycle from sending the next 8-bytes. MROM instruction should move to dispatch position 0 and wait for the micro-instructions from MENG. MROM instruction remains in the first 8-byte block of IB2 until completion of MROM instruction.

If the prefixes count for any instruction in the first 8-byte is greater than 4, ICALIGN can only accept another 8-byte. The detection logic is an AND gate of 6 valid functional bits.

Invalidate the dispatched instructions in ICALIGN.

Figure 21:
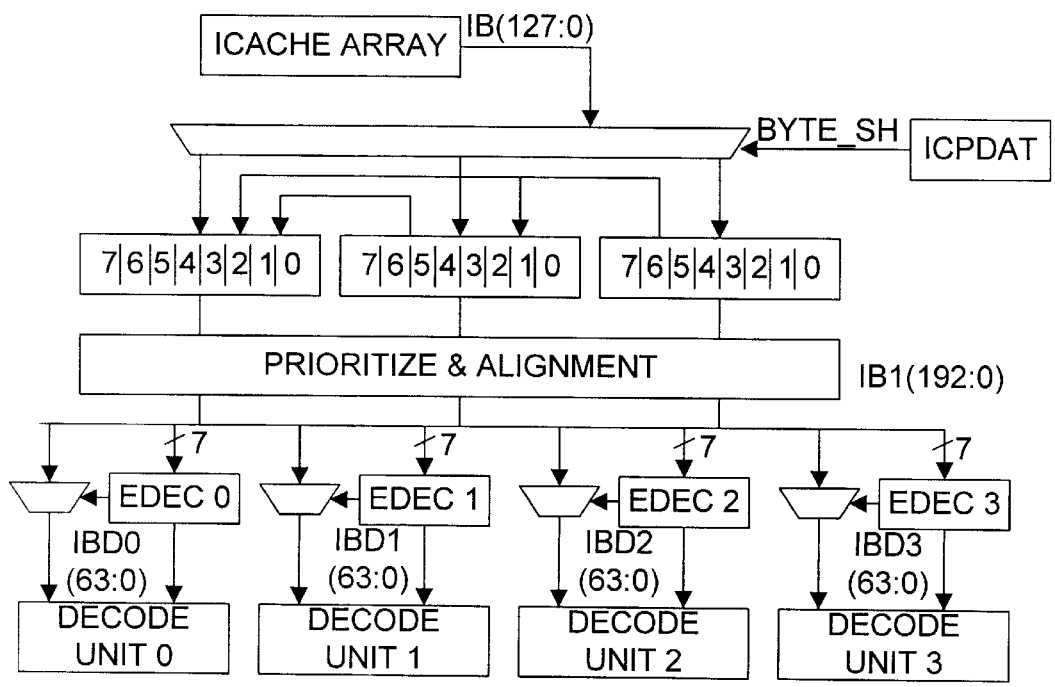

FIG. 21 shows exemplary hardware in a block diagram format for aligning of instructions from Icache to Idecode.

EARLY DECODING

The early decoding functions of this block includes:

Combine all prefixes into one byte.

Detect a few special instructions and send into two dispatched positions in the same line which will be dispatched to decode units.

Decode the unconditional jump instruction to generate taken branch address for the next fetch PC which should be from way and branch prediction. The CALL and RETURN are used to update the return stack.

Verify the predicted taken branch instruction.

Speculatively decode for register operands and flags, and generate the operand size information.

Figure 22:
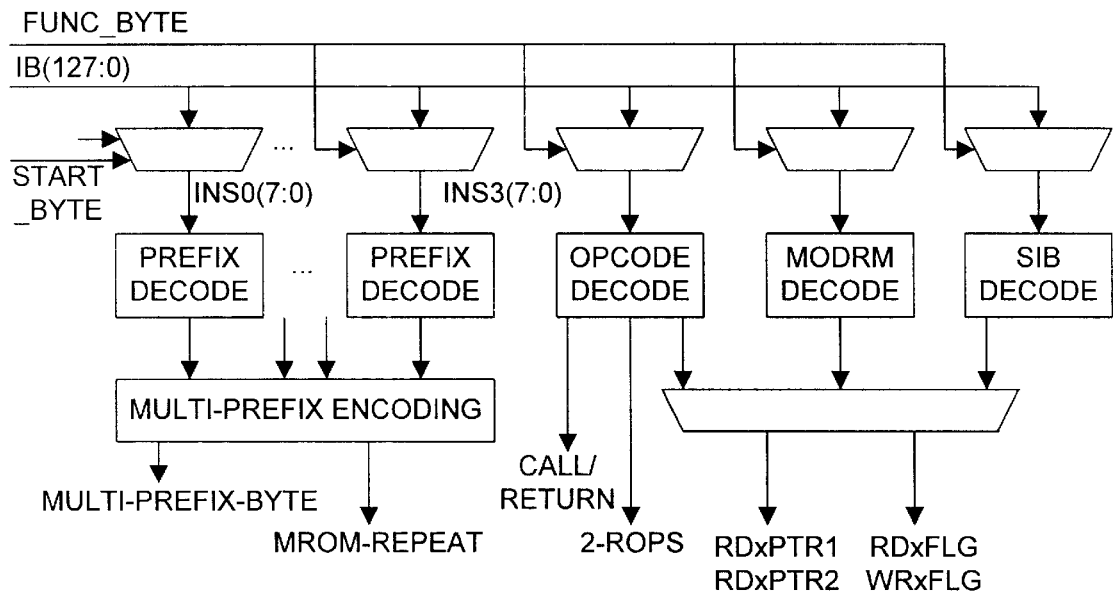

Generate displacement size to read the displacement and immediate fields from the bus to the decode units. A diagram showing exemplary hardware for early decoding of prefixes and opcodes is shown as FIG. 22.

Figure 23:
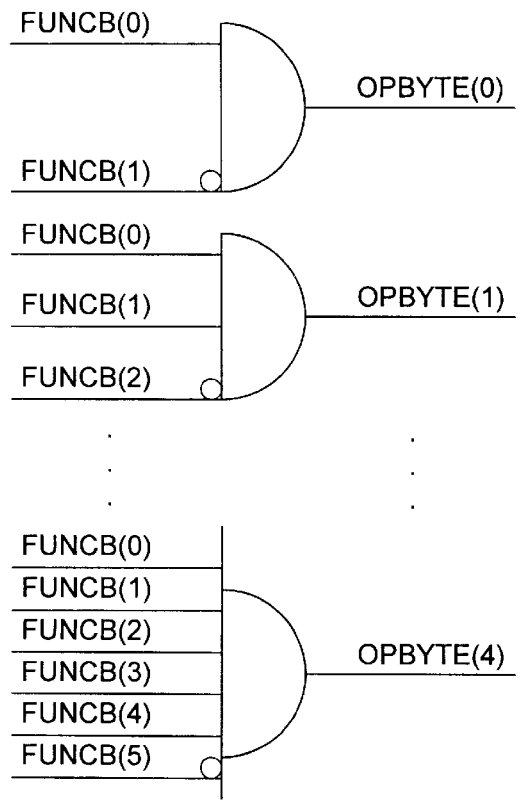

The dispatched instructions from the ICPDAT are in two 8-byte blocks and arrange into three 8-byte blocks for aligning. The ICALIGN must select the first 4 instructions to mux the instruction bytes to early decoding units. Each early decoding unit receives 7 bytes of instructions for the possibility of 4 prefix bytes, 1 opcode byte, 1 MODRM byte, and 1 SIB byte. Two conditions that can be detected early and fed back to the ICPDAT for accepting the next blocks of instructions are: the SIB-byte instruction, and the instruction with more than 4 prefixes. The other conditions for instructions with 2 dispatched positions take longer to detect. The pre-decoded functional bits provide useful information. In early decoding, the valid bits for the instruction should be used to qualify the valid bytes of the instructions. Refer to a previous section for encoding of the functional bit. For the first byte, indicated by the start bit, if the functional bit is 0, the instruction is MROM, if the functional bit is 1, the instruction is fast path. The encoding for the functional bits of MROM instruction is inverted that of the fast path instruction. If the first functional bit is 0, all functional bits are inverted before qualifying with the valid bits for prefix and opcode decoding. MROM instructions are handled in the MROM block. Detection of MROM is passed through the early decode unit and hold for micro-instructions from MROM. In addition, the functional bits should also be set for SIB-byte. The SIB-byte instruction takes two dispatched positions. ICALIGN needs to look at 2 bytes after the opcode byte for SIB-byte setting of the functional bit. The opcode byte can be detected the setting of the functional bits from the start bit. The logic can be as shown in FIG. 23.

PREFIX DECODING

In early decode, 4 prefix decoding units are used for each prefix byte. All the prefixes are combined into a single encoded prefix for decode units. For each start bit, the ICALIGN logic looks at up to 7 functional bits at a time. The start and end bits are used to validate and qualify the functional bits for shifting and decoding of the instruction bytes. Decoding for the prefixes are as followed:

| Prefix | Encoded Prefix |
| --- | --- |
|  | 0000 0000 No prefix |
| 0x0F | 1xxx xxxx 2-byte escape |
| 0x66 | x1xx xxxx operand size override, 16 or 32-bit data |
| 0x67 | xx1x xxxx address size override, 16 or 32-bit addr |
| 0xF0 | xxx1 xxxx LOCK prefix |
| 0x2E | xxxx 1000 CS segment override |
| 0x36 | xxxx 1001 SS segment override |
| 0x3E | xxxx 1010 DS segment override |
| 0x26 | xxxx 1100 ES segment override |
| 0x64 | xxxx 1101 FS segment override |
| 0x65 | xxxx 1110 GS segment override |

Another function of early decoding is to detect instructions which have more than 4 prefix bytes. The instruction will not be dispatched in the next cycle. For more than 4 prefix bytes, an extra clock cycle is needed, after decoding the first 4 prefixes the instruction is shifted by 4 bytes and to decode the prefixes and opcode again. The extra prefixes will override the previous encoding of the same prefix. The percentage of 5 or more prefixes is less than 0.01% for one bench mark and less than 0.00% in all other bench marks. Some notes on the prefix assumptions:

2-byte escape must be before the opcode. Multiple 2-byte escape prefixes cause illegal opcode exception. Segment override changes the default segment used for an instruction. Last prefix is used when multiple segment prefixes are present. Instruction that does not reference a segment ignores segment prefixes.

Operand size toggles the operand size between 16 and 32. When the operand size is 8, the operand size prefix is ignored. Multiple operand size prefixes do the same as single operand size prefix.

Address size toggles the address size between 16 and 32. Stack access of some instructions and instruction without address calculation are not affected by address size prefix. Multiple address size prefixes do the same as single address size prefix.

A lock prefix is only allowed on certain instructions. When not applicable, lock prefixes cause an illegal opcode exception. Some instructions (i.e. EXCH) cause locked accesses by default without the lock prefix. Multiple lock prefixes do the same as single lock prefix.

Repeat for string instructions, repeat prefixes are ignored when not applicable.

DOUBLE-DISPATCH DECODING

Besides the SIB instruction which requires two dispatch positions, few other instructions must go through decoding.

The same opcode are sent to two decode units with an encoded field for indication of the first or second dispatch position. The list of 2-dispatch position instructions are: PUSH, POP, RETURN, CALL, MUL, IMUL, LOOP, JCXZ, JECXZ, and LEAVE. The above instructions have either two destination registers, or two load/store operations, or more than two input operands (not counting the immediate and displacement). The above instructions with SIB should go to MROM. PUSH from memory and POP to memory instructions can become register if the MOD field is 11. In this case, the PUSH from memory should take only one dispatch position, and the POP to memory should take 2 dispatch positions instead of going to MROM.

| Opcode | | 2-dispatch positions |
|---|---|---|
| | 0000000000 | Single instruction |
| | 0xxxxxxxxx | First rop of the 2-dispatch positions instruction |
| | 1xxxxxxxxx | Second rop of the 2-dispatch positions instruction |
| 0xFF /6 | x1xxxxxxxx | PUSH from memory |
| 0x58 | xx1xxxxxxx | POP into register |
| 0x1F | | POP into DS |
| 0x07 | | POP into ES |
| 0x17 | | POP into SS |
| 0x0F A1 | | POP into FS |
| 0x0F A9 | | POP into GS |
| 0xF7 /4 | xxx1xxxxxx | MUL instruction - word/dword |
| 0xF7 /5 | xxx1xxxxxx | IMUL instruction - word/dword |
| 0xC9 | xxxx1xxxxx | LEAVE |
| 0xE0 | xxxxx1xxxx | LOOP with ZF=0 |
| 0xE1 | | LOOP with ZF=1 |
| 0xE2 | | LOOP |
| 0xE3 | xxxxxx1xxx | JCXZ & JECXZ |
| 0xE8 | xxxxxxx1xx | CALL near, displacement relative |
| 0xFF /2 relative | | CALL near, register indirect |
| 0xC3 | xxxxxxxx1x | RETURN near |
| 0xC2 | | RETURN near, immediate |
| FUNC bit set | xxxxxxxxx1 | SIB-byte instruction |

HANDLING OF BRANCH INSTURCITONS

For unconditional branch instructions, the branch is always taken, and the fetching should stall until the target address is known. There are three types of unconditional branch instructions, CALL/INT, RETURN/IRET, and unconditional jump. These branch instructions should be predicted taken. Processor 500 should implement a return stack, and as the CALL and INT instructions are in decode, the next instruction PC will be written into the return stack for future reference. The RETURN and IRET instructions will get the target address from the return stack, it is not necessary to keep the RETURN and IRET instructions in the ICNXTBLK. The target address calculation for non-conditional jump requires an adder to speculatively add the PC to displacement which is done in the ICFPC. The important features of the return stack are discussed in detail in ICFPC.

| | | |
|---|---|---|
| JUMP | 1110 10x1 | PC = PC + imm |
| JUMP | EA | PC = CS:imm |
| JUMP | FF xx100xxx | PC = r/m32 |
| JUMP | FF xx101xxx | PC = CS:[m16:32] |
| CALL | E8 | PC = PC + imm |
| CALL | FF xx010xxx | PC = r/m32 |
| CALL | FF xx011xxx | PC = CS:[m16:32] |
| CALL | 98 | PC = CS:imm |
| RETURN | C2, C3, CA, CB | PC = [return stack] |

-continued

| | | |
|---|---|---|
| INT | CC, CD, CE | PC is from MENG |
| IRET | CF | PC = [return stack] |

If the above instructions are not detected in the way and branch prediction, Icache should re-fetch from the new branch target. INT instruction is not in the ICNXTBLK, detection of the INT will stall until the MENG or FIROB request a new PC. The CALL instruction has the offset matched with the branch taken offset in the ICFPC. The RETURN and IRET are predicted by the way prediction. The ICFPC keeps status bits for each line of instruction to control the proper flow of instructions.

For conditional branch instructions, the ICNXTBLK is in total control of the prediction. Only the taken branch is recognized in the ICALIGN. Only one taken branch is possible per instruction line. The ICALIGN notifies the ICFPC to send the PC's for each line dispatched to the decode units. Only one taken branch is allowed per 4 instructions sent to the decode units. The branch target address and the branch tag from the global shift register should be routed along with any branch instruction (include unconditional jump) to the FIROB in case of mis-prediction.

The ICFPC always sends the current PC to FIROB and decode units. If there is an indication of the dispatching of instruction from a new 8-byte block, the next PC is sent. If the instruction of a new 8-byte block is to decode unit 0, then the next PC is sent as first PC, else the next PC is sent as second PC. The PC is 32-bits which indicates the full address of the instruction. The offset of the instruction is for the next instruction.

MODRM AND SIB DECODING

With up to four instructions dispatched per clock cycle, eight possible read operands must be checked for data dependency. The FIROB checks for dependency against all previously dispatched instructions (up to 5 lines or 20 instructions) and within the current line. In the FIROB, the number of comparators are 20 by 8 for the 6-bit register operands. It is important to decode the register operands as soon as possible. Flags are in the same category with the operands which need early indication. Some of the X86 opcodes have implied references to registers and flags. The register operands are from MODRM byte. In early decoding, the registers are speculatively decoded and sent to dependency checking. In decode units, the direction and validation of the registers are decoded to set the statuses in the FIROB and control the issuing of operands to functional units.

The MODRM has 3 fields: REG, MOD, and R/M. The REG field is sent to the first operand and the R/M field is sent to the second operand. The R/M is not a valid register operand for the following MOD field:

| 16-bit addressing | MOD = 00 and R/M = 110, | 16-bit displacement |
|---|---|---|
| 32-bit addressing | MOD = 00 and R/M = 100, | SIB |
| | MOD = 00 and R/M = 101, | 32-bit displacement |
| | MOD = 01 and R/M = 100, | SIB, 8-bit disp |
| | MOD = 10 and R/M = 100, | SIB, 32-bit displacement |

For 32-bit address mode, the SIB byte is specified as above. The instruction is dispatched in two issue positions. The first Rop is an add of the Base to Index with indication to the FIROB of invalid result. The second Rop is the actual instruction without the SIB byte, the second Rop generates a dependency tag related to the first Rop. For the 16-bit addressing mode, the MODRM also indicates the base and index which are equivalent to the SIB byte for 32-bit addressing mode. The coding of MODRM is as follows:

| | |
|---|---|
| MOD = Ox, 10 | R/M = 000 Base = BX Index = SI |
| MOD = 0x, 10 | R/M = 001 Base = BX Index = DI |
| MOD = 0x, 10 | R/M = 010 Base = BP Index = SI |
| MOD = 0x, 10 | R/M = 011 Base = BP Index = DI |

For MOD=11, the R/M field specifies the register based on the width field and the data sizes. The width field is the least significant bit of the opcode, if w=0, the data size is 8 bit, if w=1, the data size is 16 or 32 bits. The data size is from Code Segment register with possible override from prefix.

| MOD R/M | 8-bit | 16-bit | 32-bit |
|---|---|---|---|
| 11 000 | AL | AX | EAX |
| 11 001 | CL | CX | ECX |
| 11 010 | DL | DX | EDX |
| 11 011 | BL | BX | EBX |
| 11 100 | AH | SP | ESP |
| 11 101 | CH | BP | EBP |
| 11 110 | DH | SI | ESI |
| 11 111 | BH | DI | EDI |

The displacement field is also decoded from the MODRM:

| MOD | R/M | displacement size 16-bit addressing | displacement size 32-bit addressing |
|---|---|---|---|
| 00 | 110 | 16-bit | no displacement |
| 00 | 101 | no displacement | 32-bit |
| 01 | xxx | 8-bit | 8-bit |
| 10 | xxx | 16-bit | 32-bit |

OPCODE DECODING FOR OPERANDS AND FLAGS

Besides register addresses from the MODRM byte the instructions with implied register in the opcode should also be decoded:

| | | | |
|---|---|---|---|
| PUSH | 0101 0nnn | A, C, D, B, SP, BP, SI, DI | R |
| POP | 0101 1nnn | A, C, D, B, SP, BP, SI, DI | W |
| LEAVE | 1100 1001 | EBP, ESP | RW |
| ALU OP | 00xx x100 1000 0000 | AL | RW |
| ALU OP | 00xx x101 1000 00x1 | AX, EAX | RW |
| MUL -byte | 1111 0110 | AX | W |
| SHIFTD | 0F 1010 x101 | CL | R |
| ROT/SHF | 1101 001x | CL | R |
| INC | 0100 0nnn | A, C, D, B, SP, BP, SI, DI | RW |
| DEC | 0100 1nnn | A, C, D, B, SP, BP, SI, DI | RW |
| BSWAP | 0F 1100 1nnn | A, C, D, B, SP, BP, SI, DI | RW |
| CBW | 1001 1000 | A | RW |
| SAHF | 1001 1110 | AH | W |
| LAHF | 1001 1111 | AH | R |
| MOVE | 1010 000x | A | W |
| MOVE | 1010 001x | A | R |
| MOVE | 1011 0nnn | AL, CL, DL, BL, AH, CH, DH, BH | W |
| MOVE | 1011 1nnn | A, C, D, B, SP, BP, SI, DI | W |

The MUL and IMUL instructions should have the first issue position with EAX destination and the second issue position with EDX destination. The second Rop is the actual instruction since the first Rop can be the add for index and base of the SIB-byte. For the stack operations, POP/PUSH/CALL/RETURN instructions, the ESP must be read and written. The instruction is an add of ESP to the address size on the immediate bus for the functional unit. The POP and RETURN instruction read the ESP in the first Rop and add to the ESP in the second ROP. The RETURN with immediate for adding to the ESP must be handled as two operations in the functional units. Opcode decoding is needed to generate the ESP pointers for the instructions:

| | |
|---|---|
| 0x8F | POP into memory |
| 0x58 | POP into register |
| 0x1F | POP into DS |
| 0x07 | POP into ES |
| 0x17 | POP into SS |
| 0x0F A1 | POP into FS |
| 0x0F A9 | POP into GS |
| 0x61 | POP into general registers |
| 0x9D | POP into EFLAGS |
| 0xFF | PUSH from memory |
| 0x50 | PUSH from register |
| 0x6A | PUSH from immediate byte |
| 0x68 | PUSH from immediate word/dword |
| 0x0E | PUSH from CS |
| 0x16 | PUSH from SS |
| 0x1E | PUSH from DS |
| 0x06 | PUSH from ES |
| 0x0F A0 | PUSH from FS |
| 0x0F A8 | PUSH from GS |
| 0x60 | PUSH from general registers |
| 0x9C | PUSH from EFLAGS |
| 0xE8 | CALL near, displacement |
| 0xFF /2 | CALL near, register/memory indirect |
| 0xC3 | RETURN near, ESP = ESP + 2/4 |
| 0xC2 /2 | RETURN near, ESP = ESP + 2/4 + imm16 |
| 0xC9 | LEAVE, ESP = EBP + 2/4, EBP = [EBP] |

A constant field is generated for the ESP calculation. Depending on the address size, a constant of 2 or 4 is needed for the above instructions. For JCXZ and JECXZ instructions, a constant of 0 is needed for the zero detection. For LOOP instructions, a constant of 1 is needed for decrementing of the counter.

The decoding of the flags should be done in early decoding. The status flag information is from the appendix on FLAG CROSS-REFERENCE in the X86 manual. The instructions must provide the reading and writing of the status flags in the same manner as the operands. The flags are set up in three groups:

CF—carry flag.

OF—overflow, SF—sig, ZF—zero, PF—parity, AF—auxiliary carry, and DF—direction flags.

The rest of the control flags in the EFLAG register.

The first two flag groups have dependency checking in the FIROB and forwarding in the reservation station. The second group is implemented with three sub-groups, OF, DF, and {SF, ZF, AF, and PF} (4F). The dependency checking of the second group is similar to that of the operand, if the dependency is wide-to-narrow then it is okay for forward, if the dependency is narrow-to-wide then the instruction stalls in decode units until the dependency is removed. The last flag group will stall the instruction in decode units if there is any dependency. The decoding of the status flags is as followed:

| Instruction | opcode | read flags | write flags |
|---|---|---|---|
| ADC, SBB | 0001 x0xx<br>0001 xx0x<br>8 000x xx01xxxx<br>8 0011 xx01xxxx | CF | CF, OF, 4F |
| ALU OP | 00xx x100 | | CF, OF, 4F |
| SHIFTD | 0F 1010 x101 | | CF, OF, 4F |
| RCL/RCR | D 00xx xx01xxxx<br>C 000x xx01xxxx | CF | CF, OF |
| ROL/ROR | D 00xx xx00xxxx<br>C 000x xx00xxxx | | CF, OF |
| SHF | D 00xx xx10xxxx<br>D 00xx xx111xxx<br>C 000x xx10xxxx<br>C 000x xx111xxx | | CF, OF, 4F |
| INC | 0100 0xxx | | CF, OF, 4F |
| DEC | 0100 1xxx | CF, OF, 4F | |
| LAHF | 1001 1111 | | CF, OF, 4F |
| SAHF | 1001 1110 | | CF, OF, 4F |
| CLC, SETC | 1111 100x | | CF |
| CMC | 1111 0101 | CF | CF |
| CLD, SETD | 1111 110x | | DF |
| CLI, SETI | 1111 101x | | IF |
| SET | 0F 1001 001x<br>0F 1001 011x<br>0F 1001 000x<br>0F 1001 11xx<br>0F 1001 010x<br>0F 1001 10xx | CF<br>CF, ZF<br>OF<br>OF, 4F<br>4F<br>4F | |
| JCCB | 0111 001x<br>0111 011x<br>0111 000x<br>0111 11xx<br>0111 010x<br>0111 10xx | CF<br>CF, ZF<br>OF<br>0F, 4F<br>4F<br>4F | |
| JCCW | 0F 1000 001x<br>0F 1000 011x<br>0F 1000 000x<br>0F 1000 11xx<br>0F 1000 010x<br>0F 1000 10xx | CF<br>CF, ZF<br>0F<br>0F, 4F<br>4F<br>4F | |
| BIT | 0F 1010 x011<br>0F 1011 x011<br>0F 1011 101x | | CF |

MROM REGISTER OPERAND DECODING

Figure 24:
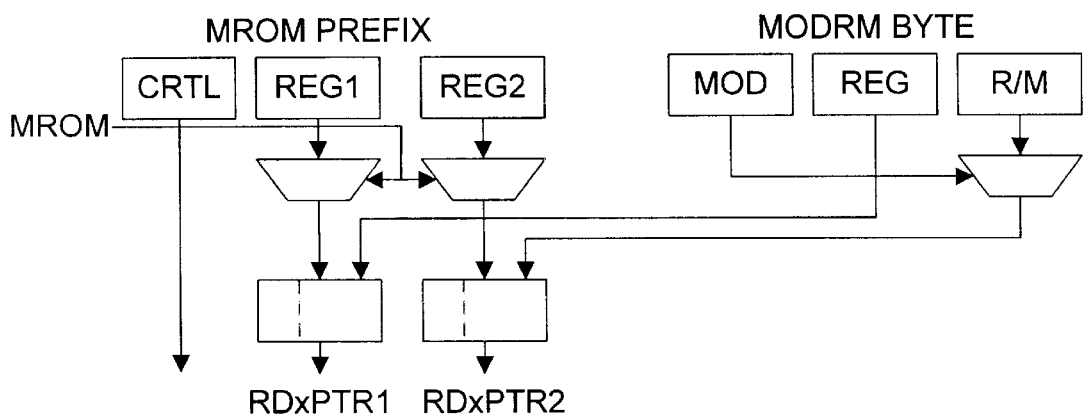

To not effect the MODRM decoding for Processor 500 fast path, the microcode uses the prefix for extending the register field. The extended register field for microcode will be concatenated with the MODRM register field to address the full 64 register file. For Processor 500 fast path instruction, the extended register field is forced to zero. The MODRM, the displacement, and the immediate field can be read from the global decoding registers. A diagram of the MROM register decoding is shown as FIG. 24.

MULTIPLEXING OF INSTRUCTION TO DECODE UNITS

Figure 25:
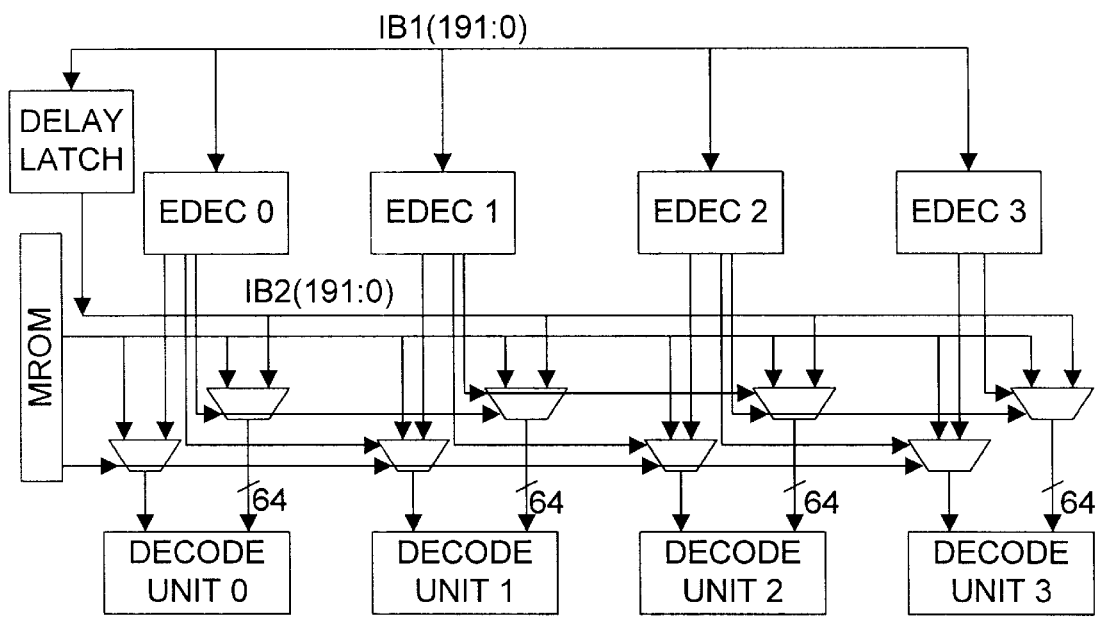

The format of instructions dispatched to the decode unit includes one encoded prefix byte, which may not be valid, speculative register operands and flags, 2-dispatch position control bits, 11-bit opcode, 3-bit constant, up to 4 bytes of displacement, and 4 bytes of immediate field. During early decode, the displacement size and field is determined and read directly from the IB2(191:0) to the decode units. The immediate field is speculative of 4 bytes after the displacement field. Two-dispatch position instructions cause shifting of the next instructions to the next issue positions. If the instruction at 0 takes 2 dispatch positions, then only instruction at 1 is allowed to take 2 dispatch positions. The controls for reading of the displacement and immediate fields are shifted according to the 2-dispatch position instruction. A diagram showing the multiplexing of 2-dispatch position instructions to the decode units is shown as FIG. 25.

The first four instructions from scanning can go through early decoding. If a 2-dispatch position instruction is detected, the followed instruction must be shifted to the next decode unit or wait until the next cycle. If the 2-dispatch position instruction is at the last decode unit, it also must wait until the next cycle.

MENG should provide the same format as with fast-path instructions. Detection of MROM instruction should delay until the next cycle and in dispatch position 0. The MROM instruction should locate at the first 8-byte block on the IB2(191:0). MENG can provide the pointers to read the displacement and immediate fields to decode units directly from IB2(191:0). The MROM instruction is shifted out of the dispatch position 0 along with the last line of the micro-code sequence, the next set of instructions will assume normal dispatching.

EXCEPTION INSTRUCTIONS

The illegal instruction is detected in ICPRED which does not set the valid bit in the ICTAGV. The illegal instruction must be dispatched to decode unit 0 by itself with ICERROR. Similarly for TLB misses, external bus error, and greater-than-15-byte instruction, the error conditions are passed to decode unit 0. The limit checking of each instruction is done in the ICFPC, the ICFPC will notify the ICALIGN with the limit violated byte position. The illegal instruction is higher priority than limit violation.

SIGNAL LIST

STARTPTR(3:0)—Input from ICFPC indicates the byte position of the pre-decoded bytes for current instruction. The start byte should be set at this pointer.

HLDISP(1:0)—Output to ICFPC indicates the first (bit 0) and/or the second (bit 1) 8-byte of the current line has been dispatched to decode units.

NEWLINE(1:0)—Input from ICFPC indicates the first (bit 0) for the second (bit 1) 8-byte is the starting of a new line. The byte positions of instructions sending to the decode units should be adjusted accordingly.

IC0VAL1(7:0)—Input from ICDPAT indicates the valid bytes for instruction 0 of the first 8-byte.

IC1VAL1(7:0)—Input from ICDPAT indicates the valid bytes for instruction 1 of the first 8-byte.

IC2VAL1(7:0)—Input from ICDPAT indicates the valid bytes for instruction 2 of the first 8-byte.

IC3VAL1(7:0)—Input from ICDPAT indicates the valid bytes for instruction 3 of the first 8-byte.

IC0VAL2(7:0)—Input from ICDPAT indicates the valid bytes for instruction 0 of the second 8-byte.

IC1VAL2(7:0)—Input from ICDPAT indicates the valid bytes for instruction 1 of the second 8-byte.

IC2VAL2(7:0)—Input from ICDPAT indicates the valid bytes for instruction 2 of the second 8-byte.

IC3VAL2(7:0)—Input from ICDPAT indicates the valid bytes for instruction 3 of the second 8-byte.

IC8BSEL(5:0)—Output to ICALIGN controls the muxes from IB(127:0) to IB1(191:0). Bit 5:3 is for the upper 8-byte IB(127:64) and bit 2:0 is for the lower 8-byte IB(63:0). 001 is for muxing to the first 8-byte IB1(63:0), 010 is for muxing to the second 8-byte, and 100 is for muxing to the third 8-byte.

NSHIFT1(4:0)—Output to ICALIGN indicates that for the first 8-byte block, the look-ahead shifting of the next 8-byte instructions to decode units. A shift by 4 means that no instruction from the next eight byte is sent to the decode unit.

NSHIFT2(4:0)—Output to ICALIGN indicates that for the second 8-byte block, the look-ahead shifting of the next 8-byte instructions to decode units. A shift by 4 means that no instruction from the next eight byte is sent to the decode unit.

ENDINST—Input from ICPRED indicates that pre-decoding is completed for the current instruction.

MROMEND—Input from MENG indicates completion of the MROM.

PDMROM—Input from ICPRED indicates the current instruction is MROM.

PD8BSEL(5:0)—Output to ICALIGN controls the muxes from IB(127:0) to IB1(191:0). Bit 5:3 is for the upper 8-byte IB(127:64) and bit 2:0 is for the lower 8-byte IB(63:0). 001 is for muxing to the first 8-byte IB1(63:0), 010 is for muxing to the second 8-byte, and 100 is for muxing to the third 8-byte.

PFUNCB(2:0)—Input from ICPRED indicates the functional bits for current instruction. Only three bytes (opcode, MODRM, and SIB) are needed for early decode of the instruction. The prefixes are encoded into one single byte.

PDVAL(10:0)—Input from ICPRED indicates the valid bytes for pre-decode instruction to decode unit 0. This signal is to validate the bytes in decode. The maximum length of the instruction is 11 bytes.

PDSHF(5:0)—Input from ICPRED indicates which bytes to shifting to early decoding. The ICPRED must put the current line into the IB1(191:0) for shifting. This is necessary because the long instruction can span more than three 8-byte blocks. The upper 2 bits to select which 8-byte block, the ICALIGN can accumulate the pre-decode instructions while waiting for the MROM instructions.

PDPREF(7:0)—Input from ICPRED indicates the encoded prefix byte. This is to avoid the pre-decode instruction taking 2 cycles in early decoding because of more than 4 prefixes.

PDTAKEN—Input from ICPRED indicates the current instruction is taken branch (the taken branch target can be calculated.

NEXTB(1:0)—Output to ICPDAT indicates that ICALIGN can accept any 8-byte block. This signal includes other hold inputs from MROM and Idecode.

D0USEFL(4:0)

D0WRFL(4:0)—Output to FIROB indicates the type of flag uses/writes for this instruction of decode unit 0:

xxxx1 CF—carry flag,
xxx1x DF—direction flag,
xx1xx OF—overflow flag,
x1xxx SF—sign, ZF—zero, PF—parity, and AF—auxiliary carry
1xxxx control and processor flags,

D1USEFL (4:0)

D1WRFL(4:0)—Output to FIROB indicates the type of flag used/written for this instruction of decode unit 1.

D2USEFL(4:0)

D2WRFL(4:0)—Output to FIROB indicates the type of flag used/written for this instruction of decode unit 2.

D3USEFL(4:0)

D3WRFL(4:0)—Output to FIROB indicates the type of flag used/written for this instruction of decode unit 3.

RD0PTR1(5:0)—Indicates the register address for operand 1 of decode unit 0. The MROM is responsible to send bit 5:3 for the MROM register.

RD1PTR1(5:0)—Indicates the register address for operand 1 of decode unit 1. The MROM is responsible to send bit 5:3 for the MROM register.

RD2PTR1(5:0)—Indicates the register address for operand 1 of decode unit 2. The MROM is responsible to send bit 5:3 for the MROM register.

RD3PTR1(5:0)—Indicates the register address for operand 1 of decode unit 3. The MROM is responsible to send bit 5:3 for the MROM register.

RD0PTR2(5:0)—Indicates register address for operand 2 of decode unit 0. The MROM is responsible to send bit 5:3 for the MROM register.

RD1PTR2(5:0)—Indicates register address for operand 2 of decode unit 1. The MROM is responsible to send bit 5:3 for the MROM register.

RD2PTR2(5:0)—Indicates register address for operand 2 of decode unit 2. The MROM is responsible to send bit 5:3 for the MROM register.

RD3PTR2(5:0)—Indicates register address for operand 2 of decode unit 3. The MROM is responsible to send bit 5:3 for the MROM register.

IDxDAT(1:0)—Output to indicates the data size information. 01-byte, 10-half word, 11-word, 00-not use.

IC0POS1(3:0)—Input from ICDPAT indicates the PC's byte position for instruction 0 of the first 8-byte.

IC1POS1(3:0)—Input from ICDPAT indicates the PC's byte position for instruction 1 of the first 8-byte.

IC2POS1(3:0)—Input from ICDPAT indicates the PC's byte position for instruction 2 of the first 8-byte.

IC3POS1(3:0)—Input from ICDPAT indicates the PC's byte position for instruction 3 of the first 8-byte.

IC0POS2(3:0)—Input from ICDPAT indicates the PC's byte position for instruction 0 of the second 8-byte.

IC1POS2(3:0)—Input from ICDPAT indicates the PC's byte position for instruction 1 of the second 8-byte.

IC2POS2(3:0)—Input from ICDPAT indicates the PC's byte position for instruction 2 of the second 8-byte.

IC3POS2(3:0)—Input from ICDPAT indicates the PC's byte position for instruction 3 of the second 8-byte.

ICPOSx(4:0)—Output to Idecode indicates the PC's byte position of the next instruction. ICALIGN uses the above signal to generate the offset of the next instruction which will be used for branch mis-prediction. The most significant bit indicates the next instruction started at the next line.

ICBRN(3:0)—Input from ICNXTBLK indicates the branch taken prediction the lines of instructions being fetched.

ICBTAG1(3:0)—Output to Idecode indicates the position of the first target branch instruction with respect to the global shift register in case of branch mis-prediction. The branch can be taken or non-taken, branch tag must be sent with all branch instruction.

ICBTAG2(3:0)—Output to Idecode indicates the position of the second target branch instruction with respect to the global shift register in case of branch mis-prediction. The branch can be taken or non-taken, branch tag must be sent with all branch instruction.

RETPRED—Input from ICNXTBLK indicates the current prediction of the return instruction of the fetched line. The return instruction must be detected in the current line of instruction or the Icache must be re-fetched from a new line.

UNJMP(3:0)—Output to ICCNTL indicates the unconditional branch instruction needs to calculate target address.

BRNTKN(3:0)—Output indicates which decode unit has a predicted taken branch. The operand steering uses this signal to latch and send BTADDR(31:0) to the functional unit.

BRNINST(3:0)—Output indicates which decode unit has a global branch prediction. The operand steering uses this signal to latch and send ICBTAG1(3:0) and ICBTAG2(3:0) to the functional units.

CALLDEC(3:0)—Output to ICFPC indicates the CALL instruction is detected, the return stack should be updated with the PC address of instruction after CALL. The line must be taken.

NORETB—Output to ICFPC indicates no RETURN instruction is detected for the current line. This signal responses to RETPRED. The ICFPC should use the branch prediction of BTAKEN to fetch the next line.

RETDEC(3:0)—Output to ICFPC indicates a RETURN instruction is detected for the way prediction to update if no RETURN was predicted. The ICFPC needs to keep track of the branch instructions for 4 lines and restores the global shift register in case of mis-predicting the RETURN instruction in Idecode.

ICnPREF(7:0)—Output to decode unit n indicates the encoded prefix byte.

IC2ROPn(9:0)—Output to decode unit n indicates 2-dispatch positions instruction. Bit 9 indicates the first rop or second rop of the 2-dispatch positions instruction, bits 8:0 indicate the type of instructions.

NODEST(3:0)—Output to FIROB indicates no destination for the first rop of the SIB-byte instruction.

DEPTAG(3:1)—Output to FIROB indicates forced dependency tag on the first instruction; the second rop of the SIB-byte instruction.

DISPBRN1(1:0)—Output to ICFPC indicates the first predicted branch instruction dispatched to decode unit. This signal is the OR of ICxBRNB1. Bit 0 is for the first 8-byte and bit 1 is for the second 8-byte of the line if NEWLINE(1) is set for the second 8-byte.

DISPBRN2(1:0)—Output to ICFPC indicates the second predicted branch instruction dispatched to decode unit. This signal is the OR of ICxBRNB2. Bit 0 is for the first 8-byte and bit 1 is for the second 8-byte of the line if NEWLINE(1) is set for the second 8-byte.

BVAL1—Input from ICNXTBLK to qualify BTAG1, indicates the first branch target is greater or equal to STARTPTR.

BVAL2—Input from ICNXTBLK to qualify BTAG2, indicates the second branch target is greater or equal to STARTPTR.

REFRESH2—Input from Idecode indicates current line of instructions will be refreshed and not accept new instructions from Icache.

IB(127:0)—Input from ICSTORE indicates the new line of instructions to be sent to decode units.

IB1(191:0)—Internal indicates the combined instruction line for aligning from the array.

IB2(191:0)—Output indicates the combined instruction line for dispatching to decode units, the displacement and immediate fields are read from this bus.

MROMEN—Input from MENG indicates the microinstructions is sent to Idecode instead of the Icache.

M0USEFL(4:0)

M0WRFL(4:0)—Input from MENG indicates the type of flag used/written for this micro-instruction of decode unit 0:

xx1 CF—carry flag, x1x OF—overflow flag,

1xx SF—sign, ZF—zero, PF—parity, and AF—auxiliary carry

M1USEFL(4:0)

M1WRFL(4:0)—Input from MENG indicates the type of flag used/written for this micro-instruction of decode unit 1.

M2USEFL(4:0)

M2WRFL(4:0)—Input from MENG indicates the type of flag used/written for this micro-instruction of decode unit 2.

M3USEFL(4:0)

M3WRFL(4:0)—Input from MENG indicates the type of flag used/written for this micro-instruction of decode unit 3.

MINS0(63:0)—Input from MENG indicates the displacement and immediate field of micro-instruction sending to decode 0.

MINS1(63:0)—Input from MENG indicates the displacement and immediate field of micro-instruction sending to decode 1.

MINS2 (63: 0)—Input from MENG indicates the displacement and immediate field of micro-instruction sending to decode 2.

MINS3(63:0)—Input from MENG indicates the displacement and immediate field of micro-instruction sending to decode 3.

MR0OC (7:0)—Input from MENG to decode unit 0 indicates the opcode byte.

MR1OPC(7:0)—Input from MENG to decode unit 1 indicates the opcode byte.

MR2OPC(7:0)—Input from MENG to decode unit 2 indicates the opcode byte.

MR3OPC(7:0)—Input from MENG to decode unit 3 indicates the opcode byte.

MR0EOP(2:0)—Input from MENG to decode unit 0 indicates the extended opcode field.

MR1EOP(2:0)—Input from MENG to decode unit 1 indicates the extended opcode field.

MR2EOP(2:0)—Input from MENG to decode unit 2 indicates the extended opcode field.

MR3EOP(2:0)—Input from MENG to decode unit 3 indicates the extended opcode field.

MR0SS(1:0)—Input from MENG to decode unit 0 indicates the scale factor of the SIB byte.

MR1SS(1:0)—Input from MENG to decode unit 1 indicates the scale factor of the SIB byte.

MR2SS(1:0)—Input from MENG to decode unit 2 indicates the scale factor of the SIB byte.

MR3SS(1:0)—Input from MENG to decode unit 3 indicates the scale factor of the SIB byte.

MBYTEPTR(3:0)—Output to MENG indicates the byte pointer for the current MROM instruction. MROM uses the pointer to read the instruction on IB(127:0), ICEND(15:0), and ICFUNC(15:0).

ICMROM—Output to MENG indicates the current instruction is MROM. The MROM instruction may take two cycles to read the IB, ICEND, and ICFUNC.

ENDINST—Input from ICPRED indicates that pre-decoding is completed for the current instruction. The byte position of the branch instruction is from STARTPTR. The selected instruction from IB should be sent to decode unit 0.

PDJMP—Input from ICPRED indicates the current instruction is a branch instruction. The ICNXTBLK sends BTAG1 and the ICALIGN sends IC0BRNBN1(0) to the decode unit.

ICVALI(3:0)—Output to Idecode indicates valid instructions. NOOP is generated for invalid instruction.

IC0OPC(7:0)—Output to decode unit 0 indicates the opcode byte.

IC1OPC(7:0)—Output to decode unit 1 indicates the opcode byte.

IC2OPC(7:0)—Output to decode unit 2 indicates the opcode byte.

IC3OPC(7:0)—Output to decode unit 3 indicates the opcode byte.

IC0EOP(2:0)—Output to decode unit 0 indicates the extended opcode field.

IC1EOP(2:0)—Output to decode unit 1 indicates the extended opcode field.

IC2EOP(2:0)—Output to decode unit 2 indicates the extended opcode field.

IC3EOP(2:0)—Output to decode unit 3 indicates the extended opcode field.

IC0SS(1:0)—Output to decode unit 0 indicates the scale factor of the SIB byte.

IC1SS(1:0)—Output to decode unit 1 indicates the scale factor of the SIB byte.

IC2SS(1:0)—Output to decode unit 2 indicates the scale factor of the SIB byte.

IC3SS(1:0)—Output to decode unit 3 indicates the scale factor of the SIB byte.

DISPTR0(6:0)—Output to decode unit 0 indicates the displacement pointer and size. Bits 2:0 is the pointer to the 8-byte block, bit 6:5 is the size, and bit 4:3 indicates which 8-byte block. Bit 6:5=00 indicates no displacement.

DISPTR1(6:0)—Output to decode unit 1 indicates the displacement pointer and size. Bits 2:0 is the pointer to the 8-byte block, bit 6:5 is the size, and bit 4:3 indicates which 8-byte block. Bit 6:5=00 indicates no displacement.

DISPTR2(6:0)—Output to decode unit 2 indicates the displacement pointer and size. Bits 2:0 is the pointer to the 8-byte block, bit 6:5 is the size, and bit 4:3 indicates which 8-byte block. Bit 6:5=00 indicates no displacement.

DISPTR3(6:0)—Output to decode unit 3 indicates the displacement pointer and size. Bits 2:0 is the pointer to the 8-byte block, bit 6:5 is the size, and bit 4:3 indicates which 8-byte block. Bit 6:5=00 indicates no displacement.

IMMPTR0(4:0)—Output to decode unit 0 indicates the displacement pointer and size. Bits 2:0 is the pointer to the 8-byte block, and bit 4:3 indicates which 8-byte block. Decoding of all opcodes is needed to detect immediate field.

IMMPTR1(4:0)—Output to decode unit 1 indicates the displacement pointer and size. Bits 2:0 is the pointer to the 8-byte block, and bit 4:3 indicates which 8-byte block. Decoding of all opcodes is needed to detect immediate field.

IMMPTR2(4:0)—Output to decode unit 2 indicates the displacement pointer and size. Bits 2:0 is the pointer to the 8-byte block, and bit 4:3 indicates which 8-byte block. Decoding of all opcodes is needed to detect immediate field.

IMMPTR3(4:0)—Output to decode unit 3 indicates the displacement pointer and size. Bits 2:0 is the pointer to the 8-byte block, and bit 4:3 indicates which 8-byte block. Decoding of all opcodes is needed to detect immediate field.

CONSTn(2:0)—Output to decode unit n indicates the constant for add/substract to ESP of the two-dispatch position instruction.

ICCNTL

Figure 26:
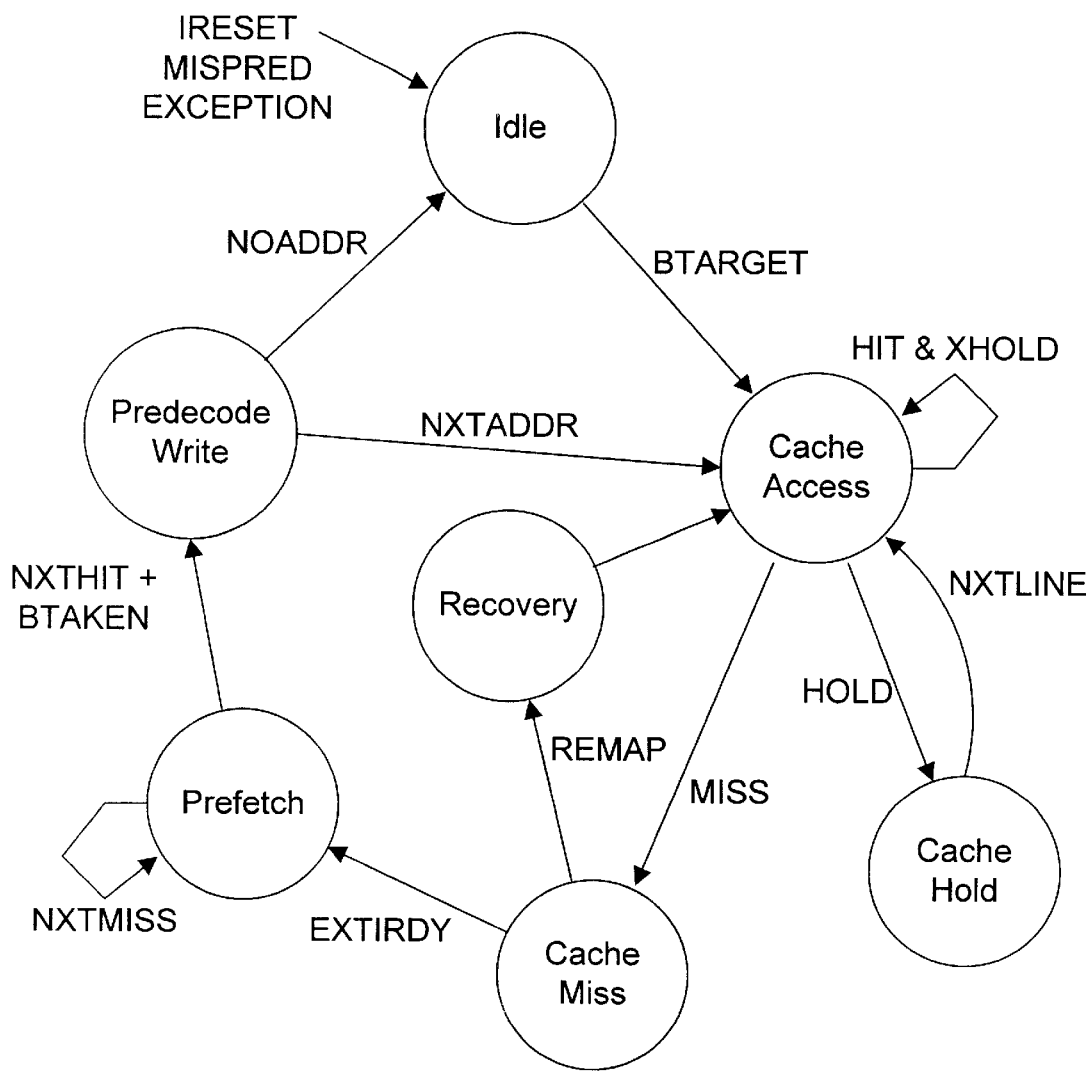

The ICCNTL is the main control in the ICACHE. The state machine controls reading and writing of the arrays in the first two pipeline stages. The next two pipeline stages are controlled by the ICALIGN. The detection of the unconditional branch instruction are treated as mis-prediction to fetching a new instruction stream without updating the ICNXTBLK. It latches the inputs at the beginning of ICLK and generates control signals to the arrays for the next cycle by the end of ICLK. There are a few signals from the arrays, such as TAGHIT, to ICCNTL in early ICLK instead of previous phase. The state machine can be jammed into a certain state with late arriving signals from branch mis-prediction and branch prediction. The IRESET jams the state machine to Idle state, initializes the code segment register, and clears all the status of ICACHE. For external fetch on Processor 500, there will be dedicated buses for address to MMU and instructions from the pads, the state machine for external fetch is not needed. The preliminary state machine definition and transitions are from the definition of Processor 500 and is shown as FIG. 26.

The ICCNTL provides the signals to read and write the cache arrays. For simple operation, the array has the same inputs as the ICCNTL to avoid the speed path through the state machine.

The Move-To/From-Special-Register instruction can occur at any time and steal one cycle at a convenient time away from the normal operation. The move to/from instruction is for testing purposes and happens with instruction cache disabled. The external fetch can be concurrent with Special Register access. The state machine implements with latches to hold the input and output conditions during the Special Register access. The operation of Special Register takes 5 cycles and is as followed:

Command and tag on the SRBB is received with indication by SRB_VAL. The tag on SRBB is decoded to recognized the access is for Icache.

The address of the array is on SRBB. This address should be latched into the ICFPC.

For reading, the array is read in this cycle. For writing, the data is latched from SRBB.

The data is driven on ICSRBB.

For reading, the data is forward from ICSRBB to SRBB. For writing, the data is written into the array. ICTAR_VAL is sent to SRB in this cycle.

STATE0: IDLE STATE

The Idle state is forced by IRESET, Branch Mis-prediction, or EXCEPTION, and waits for taken branch target. This is a default state. If the state is forced by branch mis-prediction, it provides Icache control signals to write the Branch Holding Register into the ICNXTBLK. This state transfers to the Cache Access state when the taken branch address is valid, the transfer provides all Icache control signals for reading the array.

STATE1: CACHE ACCESS STATE

The Icache is being accessed. The TAGHIT is not know until next clock cycle; the assumption is HIT and accessing the next block, the next block address can either be from the ICNXTBLK or sequential. This state provides Icache control signals for reading the array. When the TAGHIT is known, if there is no holding due to breaking up of the instruction line or invalid pre-decode data, then the state remains in Cache Access state, else the state will transition to Cache Hold state. The transition to Cache Hold state will need to provide Icache control signals for reading the next block of the array. If miss in the Icache, the state is transferred to Cache Miss state. The miss can either be the tag or LV miss. The transfer to Cache Miss state must provides Icache control signals to write the Branch Holding Register into the ICNXTBLK.

STATE2: CACHE HOLD STATE

The state waits for the whole line of instruction to be sent to decode units. Icache control signals for reading of next block is continuously provided. As soon as the ICALIGN block can accept the next line, the state transfers to the Cache Access state.

STATE3: CACHE MISS STATE

The Cache Miss state makes a request to the CMASTER and waits for a response. There are two different responses, the first response is the new mapping of the PC (the instructions, pre-decode data, and branch prediction are still valid), the second response is fetched instructions from external memory. The new mapping of the PC includes setting of the LV bit and writing of new SU and tag. For the first case, the state is transferred to Recovery state, the Icache control signals are to write the ICTAGV and read the ICSTORE, ICPDAT, and ICNXTBLK. For the second case, the state is transferred to the Pre-fetch state, and the Icache control signals are to write the ICTAGV and ICSTORE.

STATE4: RECOVERY STATE

The Recovery state is a temporary state before transfers to the Cache Access State. This state provides Icache control signals for reading the array.

STATE5: PRE-FETCH STATE

This state sends the instruction from the pre-fetch buffer to the ICPRED for pre-decoding. The pre-fetch buffer accepts instructions until full, and handshakes with the BIU to stop fetching so as not to overfill the buffer. As the current line is written into the ICSTORE array, the pre-fetch buffer can shift in a new line. The writing of the new line waits for the completion of pre-decoding of the current line. This state provides array control signals for writing of the ICSTORE array and reading of the next sequential block in the ICTAGV. If the next sequential block is present, as soon as the current line is completed in pre-decoding, the state transfers to the Pre-decode Write state. The array control signals for this transfer write to the ICPDAT and ICNXTBLK. If the next sequential block is not present, completing pre-decoding of the current line causes the Icache PC to increment and writing of the new line into the ICSTORE, and restarts the pre-decoding of the new line. If there is an instruction which wraps to the new line, writing of the last line into the ICPDAT and ICNXTBLK must wait for completion of pre-decoding of this wrapped instruction. During pre-decoding, a taken branch can be detected and the state transfers to the Pre-decode Write state.

STATE6: Pre-decode Write state

This state is a temporary state to write the ICPDAT and the ICNXTBLK before transfering to the Idle state or Cache Access state. If the next block address is present from either sequential block or taken branch address which is calculated by the ICPRED, then the state transfers to the Cache Access state. The transfer provides Icache control signals for reading the array. If the taken branch address cannot be calculated by the ICPRED, then the state transfers to the Idle state and waits for the target address from decoding or executing of the instruction. For split-line taken-branch instruction, the pre-decode data of the previous line and the current line (ending of the taken-branch instruction) must be written into the ICPDAT in two clock cycles. The state machine must remain in this state for two clock cycles.

TESTABLILITY

It is important to implement testability features into Processor 500 to reduce test time, burn-in time, and increase fault coverage. The Build-In-Self-Test (BIST) for the arrays and Auto-Test-Pattern-Generation for the random logic are included.

BIST

The BIST is implemented with a chain of input registers to latch and write various patterns into the arrays and to read and compare the data into a chain of output registers. The test pattern is serially shifted into the input registers, and the results are serially shifted out from output registers. With 11-bit counter, the BIST registers for the Icache arrays are with these sizes:

ICSTORE—128 bits.

ICPDAT—48 bits.

ICTAGV—22 bits. (2 bits are dual-port)

ICNXTBLK—55 bits. (5 bits are dual-port)

The ICSTORE and the ICPDAT form one chain of 176 bits, and the ICTAGV and the ICNXTBLK form another chain of 77 bits. The second chain must go through the March C twice to access the second port. There is one output pin for each of the chains of BIST registers. The March C algorithm has 5 steps:

After the test pattern is shifted into the input registers, for every index from 0 to maximum count, write from input registers into the arrays, stall one cycle, then increment to next index.

For every index from 0 to maximum count, read the array, compare with the input register, set the result register if no match, invert the test pattern in the input register, write into the array, read the array, compare with the input register, set the result register if no match, stall one cycle, and increment to next index.

For every index from 0 to maximum count, repeat the above step.

For every index from maximum count to 0, read the array, compare with the input register, set the result register if no match, invert the test pattern in the input register, write into the array, read the array, compare with the input register, set the result register if no match, stall one cycle, and decrement to next index.

For every index from maximum count to 0, repeat the above step. After completion, the results are shifted out and reset while a new test pattern is shifted in, the 5 steps are repeated until test patterns are tested.

The BIST for the arrays are used in the following modes:

Normal BIST—Activate by holding INIT pin high and 4FLUSH pin low while the RESET pin is de-asserted. The March C test is run until completion and the result is latched into the EAX register. This is for testing purpose.

Burn-in BIST—Activate by holding INIT pin high while the RESET pin is de-asserted. The March C test is continuously run concurrently with the ATPG until the RESET pin is asserted. The TDO pin is driven high for each completion of the March C test. This is to have many nodes toggle for burn-in purposes.

JTAG RUNBIST—Activated by the JTAG pins to load and execute the RUNBIST instruction. The processor must be in reset. When the RESET pin is de-asserted, the March C test is run until completion and the result is shifted out to the TDO pin. A special mode can be activated to shift in the test pattern and shift out the result through other pins. The RESET pin must be asserted to end the operation. This is for testing and detecting faults.

JTAG BITMAP BIST—Activated by the JTAG pins to load and execute the BITMAP instruction. The processor must be in reset. When the RESET pin is de-asserted, the March C test is ran, and results are shifted out to the OUTPUT pins after every compare operation. This is for detecting faults JTAG FLUSH REGISTER BIST—Activate by the JTAG pins to load and execute the FLUSH REGISTER instruction, the processor must be in reset. When the RESET pin is de-asserted, the input pattern from the TDI pin is shifted into the result registers serially out to the OUTPUT pins. The RESET pin must be asserted to end the operation. This is for detecting faults in the result registers.

The BIST controller generates the following five test patterns:

```
0101 0101 0101 0101
0011 0011 0011 0011
1001 1001 1001 1001
0000 1111 0000 1111
0000 0000 1111 1111
```

The Build-In Self-Test (BIST) uses the Test Application and Error Compression (TAEC) cells for reading and writing the arrays. Each TAEC cell includes an input shift register for the test pattern and one output shift register for the result. All TAEC cells are connected to form a serial shift path.

ATPG

The ATPG is implemented to test non-array blocks in the Icache. The purpose is to be able to reach any node in the logic. The feedback (loop) paths (state machines) must be broken with scan latches. There is a software algorithm to insert the scan latch into the logic. The control blocks in Icache should include the ATPG inputs and outputs for the software to use.

SIGNAL LIST

BSTRUN—Input from TAP indicates to start the BIST.

BSTRD—Input from TAP indicates to read the array and compare to set the result.

BSTWR—Input from TAP indicates to write the array from input registers.

BSTRST—Input from TAP indicates to reset the counter.

BSTINCR—Input from TAP indicates to increment the counter.

BSTDIN—Input from TAP indicates the test pattern to the input registers. The input can be from the TDI pin or normal burn-in patterns.

FLUSHON—Input from TAP indicates flushing register mode, the result latch should use BSTDIN instead of the compare input for flushing the result registers.

UPDOWN—Input from TAP indicates counting up or down.

BSTSHF1—Input from TAP indicates shifting of the master latch of registers.

BSTSHF2—Input from TAP indicates shifting of the slave latch of registers.

BSTFALSE—Input from TAP indicates to invert the test pattern.

PORTSEL—Input from TAP indicates to select the second dual port.

BSTIDOUT—Output to TAP indicates the result of the data chain from the ICSTORE and ICPDAT arrays.

BSTITOUT—Output to TAP indicates the result of the data chain from the ICNXTBLK and ICTAGV arrays.

BSTAMSB—Output to TAP indicates maximum count for dual port arrays.

MAXADDR—Output to TAP indicates maximum index counter.

ATPGIN(15:14)—Input from dedicated pins for ATPG.

ATPGOUT(15:14)—Output to dedicated pins for ATPG.

TIMING

Since the clock cycle is short, reading of the cache would take the whole clock to get data. The clock is single phase, and the array generates its own self time clock. The self-time clock uses the same cache column self-time line. As the line pre-charges to a high level, the pre-charge is disabled and the array access is enabled. As the line discharges, the row driver and senamp are disabled. In one embodiment, the pre-charge takes 1.7 ns and the current timing for TAGHIT from the self-time clock with 64 rows is 2.8 ns or a total time of 4.5 ns from rising edge of ICLK. The reading data is 2.0 ns from the self-time clock with 64 rows or 0.8 ns before the rising edge of ICLK. The ICSTORE can be built with larger arrays, 128 rows by 256 columns, reading instructions would take all of 4.5 ns ICLK in this case. Other arrays, ICTAGV, ICPRED, and ICNXTBLK, are 64 rows. The align logic in the ICPDAT takes 6–7 gates, and the shifting of X86 instruction bytes to the decode unit can be done by the middle of the second ICLK. The Processor 500 instructions should allow the decode units at least 2.5 ns in the second ICLK for calculation of the linear address.

cycle 1: ICFPC, muxing new PC, pre-charge, and access all arrays cycle 2: Compare tags, aligning logic's from pre-decode, setup branch prediction, and muxing instructions to decode units on IB buses.

cycle 2.5: Displacement linear address calculation. Fast decoding for register operands and validating of the linear address, and fast decoding for non-conditional branch.

If the predicted branch from the ICNXTBLK is taken, the new PC will take two clock cycles to update in the ICFPC. The speculative way-prediction takes 2 gates for set decoding, 3 gates for muxing of success index to ICFPC, and 2 gates in row decoding.

The timing for instructions from external memory is as follows:

cycle 1: Latch data from INSB bus to pre-fetch buffer and mux onto IB buses to ICPRED in next clock; the data on IB buses are held until pre-decode is completed. Write data into cache.

cycle 2: Decode opcode and prefix from the byte pointer. Decoding takes 2 clock cycles. If there is prefix, then restart the decoding of opcode in the next cycle.

cycle 3: Decode opcode. Send pre-decode data to ICP-DAT and allow the align logic to select the instruction on IB buses to decode units cycle 4: Send instruction from IB buses to decode units on IBDx buses. The IBDX buses should have the same timing as reading from the array.

The MROM interface requires a different timing:

ICLK3: Detect MROM instruction and send the byte position to MROM interface.

ICLK4: Decode prefixes and generate MROM entry point.

ICLK5: Decode instruction.

ICLK6: Decode instruction and latch all field of instructions into global registers.

ICLK6: MROM reads global registers and sends micro-instruction to decode units by mid cycle.

LAYOUT

Figure 27:
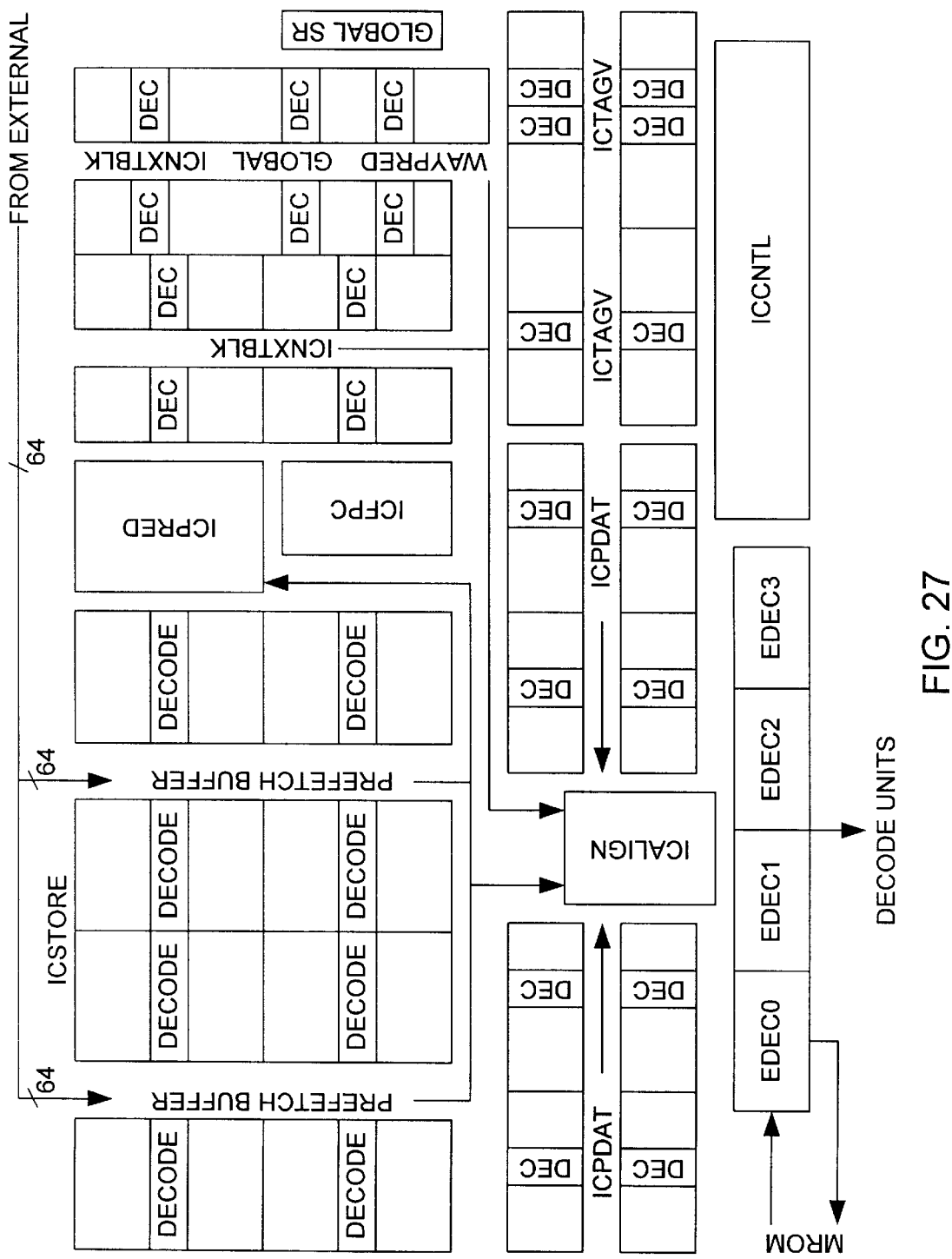

With a short clock cycle, the size of the arrays are limited to 128 rows by 256 columns for single-port RAM arrays which read or write in different clock cycles and not in speed path. For dual-port RAM arrays or faster read timing, the 64 rows by 256 columns array is preferred. The array sizes are based on the single port RAM cell of 10.25u x 6.75 u, and the dual port RAM cell of 10.25 u×14.5 u. The arrays in the ICACHE are layout as shown in FIG. 27:

ICSTORE—2048 lines of 128 bits, 8 sets of 128 X 256, 1312 u X 1728 u, single.

ICPREDAT—2048 lines of 48 bits, 8 sets of 64 X 192, 656 u X 1296 u, single.

ICTAGV—2048 lines of 24 bits, 3 sets of 64 X 224, 656 u X 1512 u, single, and 1 set of 64 X 96, 656 u X 1392 u, dual.

ICNXTBLK—2048 lines of 51 bits, 5 sets of 64 X 256, 656 u X 1728 u, single, 1 set of 64 X 192, 656 u X 1296 u, single, 1 set of 64 X 96, 656 u X 1392 u, dual, and 1 set of 64 X 64, 656 u X 928 u, dual.

ICTAGV includes a of 20-bit tag, a 1-bit valid, a 3-bit status, and a 3-bit way-prediction. The tag and valid are single-port RAM, and the status and way-prediction are dual-port RAM. The ICNXTBLK does not include the global branch prediction. A suggested layout for Icache is shown in FIG. 27.

OVERVIEW OF THE PROCESSOR 500 IDECODE

This section describes the instruction decode organization. The instruction decoding is directly for X86 instructions; there will be no ROPs except for a few instructions. The X86 variable-length instructions from the Icache are sent to the fixed-length decode units. Up to 4 instructions can be decoded and dispatched in one clock cycle. The decode units are identical. The operand and flag are decoded in the Icache for the critical speed path. The instruction decoding takes 2 clock cycles, in the first cycle the operand and flag dependency checking is done and multiplexed to the functional units in the second cycle. The operand addresses access the register file and the FIROB. The operand address includes the X86 registers and temporary registers generated by the MROM. The FIROB will have to check for dependencies. The instruction decoding generates direct controls to the operation of the functional unit, thus eliminating decoding in the functional units. The global controls of the decode units include a mechanism to stall the line due to serialization and limitations of the load/store buffers, the FIROB, and the reservation stations. The MROM interfacing is sent directly from the Icache and the MROM instructions go through the muxes in the Icache to decode units. A few exceptions for MROM instructions are special registers, floating point instructions, temporary registers, and serialization.

TOP LEVEL OF IDECODE

The Idecode has 4 identical decode units. The instructions from Icache and MROM have the same format. Operands and flags are decoded in the Icache or MROM before the instructions are dispatched to the decode units. The MROM may send the micro-instructions with simpler opcodes to the decode units. Decode units decode the micro-instructions separately and multiplex with fast-path instructions to functional units. Prefixes are pre-decoded and sent on separate buses. The format of instructions dispatched to the decode unit includes one encoded prefix byte, which may not be valid, speculative register operands and flags, 2-dispatch position control bits, 11-bit opcode, 3-bit constant, up to 4 bytes of displacement, and 4 bytes of immediate field. Since the Icache validates and partially decodes the instructions before sending to the decode units, a valid bit is issued by the Icache for valid instructions. If the valid is not set, the instruction is dispatched as NOOP. For 2-dispatch position instructions, the indication from Icache causes the decoding of the same instruction to two issue positions. Idecode has 2 clock cycles, the first cycle is for register file accessing and FIROB dependency checking, and the second cycle is for operand steering of the operands and dependency tags to the functional units. The opcode decoding takes 2 clock cycles to generate detail control signals for the functional units. Since the register operands and the immediate field are speculative, the opcode decoding is needed for validation and indication of the direction for the operands and the size of the immediate field if any. The immediate field should be sign-extended as it is sent to the functional unit.

To handle the PC properly, the Icache provides 2 PC's for each set of dispatched instructions per clock cycle. The first case is when the instructions cross the page boundary, and the second case is when the branch target instruction is dispatched along with the branch instruction. The limitations for branch in each 4 instructions are one taken branch instruction and two branches per line.

The Idecode can be divided into 4 blocks:

Opcode decoding for functional unit which can be done in 2 clock cycles.

Opcode decoding for registers and immediate field, generating controls for the operands and flags, and selecting the target address for branch instruction to reservation stations which should be done in 1 clock cycles.

Decoding of other instruction fields such as lock, segment register controls, special register, and floating point unit.

Global control of the pipeline, serialization, and stalling conditions.

SIGNAL LIST

IRESET—Global signal used to reset all decode units. Clear all states.

EXCEPTION—Global signal from the FIROB. Used to indicate that an interrupt or trap is being taken. Effect on Idecode is to clear all instructions in progress.

BRNMISP—Input from the Branch execution of the FU indicates a branch mis-prediction. The Idecode clears all instructions in progress.

ROBEMPTY—Input from the FIROB indicates the FIROB is empty.

ROBFULL—Input from the FIROB indicates the FIROB is full.

CS32X16—Input from the LSSEC indicates the size of the code segment register.

SS32X16—Input from the LSSEC indicates the size of the stack segment register.

MVTOSRIAD—Input from SRB, indicates a move to IAD special register, Idecode needs to check its pointer against the pointer driven on IAD.

MVFRSRIAD—Input from SRB, indicates a move from IAD special register, Idecode needs to check its pointer against the pointer driven on IAD.

MVTOARIAD—Input from SRB, indicates a move to IAD special register array, Idecode needs to check its pointer against the pointer driven on IAD.

MVFRARIAD—Input from SRB, indicates a move from IAD special register array, Idecode needs to check its pointer against the pointer driven on IAD.

RSFULL—Input from the functional units indicates the reservation station is full.

HLDISP(1:0)—Input from Icache indicates all instructions of the first (bit 0) and/or the second (bit 1) 8-byte of the current line has been dispatched to decode units.

ICPC1(31:0)—Input from Icache indicates the current line PC of the first instruction in the 4 issued instructions to pass along with the instruction to the FIROB.

ICPC2(31:0)—Input from Icache indicates the current line PC of a second instruction which cross the 16-byte boundary or branch target in the 4 issued instructions to pass along with the instruction to the FIROB.

ICPOSx(3:0)—Input from Icache to decode units indicates the PCts byte position of the instruction.

ICBTAG1(3:0)—Input from Icache indicates the position of the first target branch instruction with respect to the global shift register in case of branch mis-prediction. The branch can be taken or non-taken, branch tag must be sent with all branch instruction.

ICBTAG2(3:0)—Input from Icache indicates the position of the second target branch instruction with respect to the global shift register in case of branch mis-prediction. The branch can be taken or non-taken, branch tag must be sent with all branch instruction.

UNJMP(3:0)—Input from Icache indicates the unconditional branch instruction needs to calculate target address.

BRNTKN(3:0)—Input from Icache indicates which decode unit has a predicted taken branch. The operand steering uses this signal to latch and send BTADDR(31:0) to the functional unit.

BRNINST(3:0)—Input from Icache indicates which decode unit has a global branch prediction. The operand steering uses this signal to latch and send ICBTAG1(3:0) and ICBTAG2(3:0) to the functional units.

ICPREF(7:0)—Input from Icache and MROM indicates the encoded prefix byte. The two most significant bits are repeat prefixes for MROM.

IC2ROPn(9:0)—Input from Icache to decode unit n indicates 2-dispatch positions instruction. Bit 3 indicates the first rop or second rop of the 2-dispatch positions instruction, bit 2 indicates POP instruction, bit 1 indicates the MUL instruction, and bit 0 indicates the SIB-byte instruction.

IB2(191:0)—Input from Icache indicates the combined instruction line for reading the displacement and immediate field using pointers.

ICVALI(3:0)—Input from Icache indicates valid instructions. NOOP is generated for invalid instruction.

ICnOPC(7:0)—Input from Icache to decode unit n indicates the opcode byte.

ICnEOP(2:0)—Input from Icache to decode unit n indicates the extended opcode field.

ICnSS(1:0)—Input from Icache to decode unit n indicates the scale factor of the SIB byte.

DISPTRn(6:0)—Input from Icache to decode unit n indicates the displacement pointer and size. Bits 2:0 is the pointer to the 8-byte block, bit 6:5 is the size, and bit 4:3 indicates which 8-byte block. Bit 6:5=00 indicates no displacement.

IMMPTRn(4:0)—Input from Icache to decode unit n indicates the displacement pointer and size. Bits 2:0 is the pointer to the 8-byte block, and bit 4:3 indicates which 8-byte block. Decoding of all opcodes is needed to detect immediate field.

MROMEN—Input from MROM indicates the microinstructions is sent to Idecode instead of the Icache.

CONSTn(2:0)—Input from Icache to decode unit n indicates the constant for add/substract to ESP of the two-dispatch position instruction.

ICMROM—Output to MROM indicates the current instruction is MROM. The MROM instruction may take two cycles to read the IB, ICEND, and ICFUNC.

ICPC1TAR—Input from Icache indicates is ICPC1 a branch target of a previous instruction which is a predicted taken branch instruction.

ICPC2TAR—Input from Icache indicates is ICPC2 a branch target of a previous instruction which is a predicted taken branch instruction.

ICPC1(31:0)—Input from Icache indicates the current line PC of the first instruction in the 4 issued instructions to pass along with the instruction to FIROB.

ICPC2(31:0)—Input from Icache indicates the current line PC of a second instruction which cross the 16-byte boundary or branch target in the 4 issued instructions to pass along with the instruction to FIROB.

ICPOSn(4:0)—Input from Icache to decode unit n indicates the PC's byte position of the next instruction. Bit 4 indicates the next instruction is on the next line.

BTAG1N(3:0)—Output indicates the position of the first target branch instruction for a new line with respect to the global shift register in case of branch mis-prediction.

BTAG2N(3:0)—Output indicates the position of the second target branch instruction for a new line with respect to the global shift register in case of branch mis-prediction.

BTAKEN1(1:0)—Input from Icache to decode units and ICFPC indicates a predicted taken branch instruction from PTAKEN, BVAL1. Bit 0 is the last line and bit 1 is new line.

BTAKEN2(1:0)—Input from Icache to decode units and ICFPC indicates a predicted taken branch instruction from PTAKEN, BVAL2. Bit 0 is the last line and bit 1 is new line.

ICERROR—Input from Icache indicates an exception has occurred on an instruction pre-fetched, the type of exception (TLB-miss, page-fault, illegal opcode, external bus error) will also be asserted.

BTADDR(31:0)—Output to functional units indicates the taken branch targets from either the branch prediction (IBTARGET from Icache) or unconditional branch. The functional units need to compare to the actual branch target.

BRNTKN(3:0)—Output indicates which decode unit has a predicted taken branch. The operand steering uses this signal to latch and send BTADDR(31:0) to the functional unit.

BRNINST(3:0)—Output indicates which decode unit has a global branch prediction. The operand steering uses this signal to latch and send BTAG1(3:0) and BTAG2(3:0) to the functional units.

IDxIMM(2:0)—Output indicates the immediate size information. 01-byte, 10-half word, 11-word, 00-not use. Bit 2 indicates (0) zero or (1) sign extend.

IDxDAT(1:0)—Output indicates the data size information. 01-byte, 10-half word, 11-word, 00-not use.

IDxADDR—Output indicates the address size information. 1–32 bit, 0–16 bit.

IDxLOCK—Output indicates the lock prefix is set for this instruction for serialization.

DxUSE1(1:0)—Output to FIROB and register file indicates the type of operand being sent on operand 1 for decode units. Bit 1 indicates source operand, and bit 0 indicates destination operand.

DxUSE2—Output to FIROB and register file indicates source operand.

INSDISP(3:0)—Indicates that the instruction in decode unit is valid, if invalid, NOOP is passed to FIROB.

IMDIWx(31:0)—Output indicates the 32-bit displacement or immediate field of the instruction to pass to the functional units.

IMDINx(7:0)—Output indicates the 8-bit displacement or immediate field of the instruction to pass to the functional units.

USEIDW(3:0)—Output indicates the type used in IMDIWx buses.

USEIDN(3:0)—Output indicates the type used in IMDINx buses.

INSLSxB(5:0)—Output from decode units indicates the prefix values. bit 5—data size, bit 4—address size, bit 3-lock, bit 2:0—segment registers.

REFRESH2—Output indicates current line of instructions will be refreshed and not accept new instructions from Icache.

INSOPxB(11:0)—Output indicates the type of instructions being dispatched, this is the decoded information for the functional units to execute.

INSTRUCTION OPCODE DECODING

The instruction decoding has 1.5 clock cycles for decoding, thereby allowing time to route the output to functional units. The output is a wide bus with direct commands for the functional units to execute the instruction. The current listing for functional unit includes 3-bit protocol, 6-bit opcode, 7-bit p/g for alu, 3-bit size, 4-bit segment register select, and 3-bit flag. Except for the p/g for alu, all other control bits for the functional unit must be further decoded into single-bit control. The size and segment register select are decoded in a later section. The listing of the actual binary is done by going through the X86 instruction one-by-one.

| First 6 bits of decoding: | | |
|---|---|---|
| 000001 | ADD | add |
| 000011 | OR | or |
| 000101 | AND | and |
| 000111 | SUB | subtract |
| 001001 | XOR | exclusive or |
| 001011 | ANDN | nand |
| 001101 | XNOR | exclusive nor |
| 001111 | CONST | constant |
| 000000 | ADDC | add with carry |
| 000010 | SUBB | subtract |
| 000100 | DFADD | directional add |
| 000110 | INT | interrupt |
| 001001 | INTO | interrupt on overflow |
| 001010 | DIV0 | initial divide step |
| 001100 | DIV | divide step |
| 001110 | DIVL | last divide step |
| 010000 | DIVREM | remainder |
| 010010 | DIVCMP | divide compare |
| 010100 | DIVQ | quotient |
| 010110 | IDIVSGN | signed divide signs |
| 011000 | IDIVCMP | signed divide compare |
| 011010 | IDIVDEND0 | signed divide dividend LSW |
| 011100 | IDIVDEND1 | signed divide dividend MSW |
| 011110 | IDIVSOR | signed divide divisor |
| 011111 | IDIVQ | signed divide quotient |
| 100000 | ROL | rotate left |
| 100001 | ROR | rotate right |
| 100010 | SHL | shift logical left |
| 100011 | SHR | shift logical right |
| 100100 | SAR | shift arithmetic right |
| 100101 | SHLD | shift left double |
| 100110 | SHRD | shift right double |
| 100111 | SETFC | set funnel count |
| 101000 | EXTS8 | sign extend 8 bit operand |
| 101001 | EXTS16 | sign extend 16 bit operand |
| 101100 | MTFLAGS | store AH into flags |
| 101101 | CONSTHZ | move lower constant into upper, zero lower |
| 101110 | BTEST | bit test |
| 101111 | BTESTS | bit test and set |
| 110000 | BTESTR | bit test and reset |
| 110001 | BTESTC | bit test and compliment |
| 110010 | BSF | bit scan forward |
| 110011 | BSR | bit scan reverse |
| 110100 | BSWAP | byte swap |
| 110101 | SHRDM | shift right double microcode |
| 110110 | RC0 | initialize rotate carry |
| 110111 | RCL | rotate carry left by 1 |
| 111000 | RCR | rotate carry right by 1 |
| 111001 | MTSRRES | move to special register over result bus |
| 111010 | MFSRRES | move from special register over result bus |
| 111011 | MTSRSRB | move to special register over SRB bus |
| 111100 | MFSRSRB | move from special register over SRB bus |
| 111101 | MTARSRB | move to cache array over SRB bus |
| 111110 | MFARSRB | move from cache array over SRB bus |
| Second 6 bits of decoding: | | |
| 000000 | JMPB | jump if below CF=1 |
| 000001 | JMPNB | jump if not below CF=0 |
| 000010 | JMPA | jump if above CF=0 & ZF=0 |
| 000011 | JMPNA | jump if not above CF=1 or ZF=1 |
| 000100 | JMPO | jump if overflow OF=1 |
| 000101 | JMPNO | jump if not overflow OF=0 |
| 000110 | JMPZ | jump if zero ZF=1 |
| 000111 | JMPNZ | jump if not zero ZF=0 |
| 001000 | JMPS | jump if sign SF=1 |
| 001001 | JMPNS | jump if not sign SF=0 |
| 001010 | JMPP | jump if parity PF=1 |
| 001011 | JMPNP | jump if not parity PF=0 |
| 001100 | JMPL | jump if less SF<>OF |
| 001101 | JMPGE | jump if greater or equal SF=OF |
| 001110 | JMPLE | jump if less or equal SF<>OF or ZF=1 |
| 001111 | JMPG | jump if greater SF=OF and ZF=0 |
| 010000 | SETB | set if below CF=1 |
| 010001 | SETNB | set if not below CF=0 |

-continued

| | | |
|---|---|---|
| 010010 | SETA | set if above CF=0 & ZF=0 |
| 010011 | SETNA | set if not above CF=1 or ZF=1 |
| 010100 | SETO | set if overflow OF=1 |
| 010101 | SETNO | set if not overflow OF=0 |
| 010110 | SETZ | set if zero ZF=1 |
| 010111 | SETNZ | set if not zero ZF=0 |
| 010000 | SETS | set if sign SF=1 |
| 011001 | SETNS | set if not sign SF=0 |
| 011010 | SETP | set if parity PF=1 |
| 011011 | SETNP | set if not parity PF=0 |
| 011100 | SETL | set if less SF<>OF |
| 011101 | SETGE | set if greater or equal SF=OF |
| 011110 | SETLE | set if less or equal SF<>OF or ZF=1 |
| 011111 | SETG | set if greater SF=OF and ZF=0 |
| 100000 | SELB | move if below CF=1 |
| 100001 | SELNB | move if not below CF=0 |
| 100010 | SELA | move if above CF=0 & ZF=0 |
| 100011 | SELNA | move if not above CF=1 or ZF=1 |
| 100100 | SELO | move if overflow OF=1 |
| 100101 | SELNO | move if not overflow OF=0 |
| 100110 | SELZ | move if zero ZF=1 |
| 100111 | SELNZ | move if not zero ZF=0 |
| 101000 | SELS | move if sign SF=1 |
| 101001 | SELNS | move if not sign SF=0 |
| 101010 | SELP | move if parity PF=1 |
| 101011 | SELNP | move if not parity PF=0 |
| 101100 | SELL | move if less SF<>OF |
| 101101 | SELGE | move if greater or equal SF=OF |
| 101110 | SELLE | move if less or equal SF<>OF or ZF=1 |
| 101111 | SELG | move if greater SF=OF and ZF=0 |
| 110000 | | |
| 110001 | CONSTPC | move from EIP over DPC |
| 110010 | JMP | relative jump |
| 110011 | JMPI | absolute jump |
| 110100 | JMPNU | absolute jump, no prediction update |
| 110101 | JMPIFAR | absolute far jump |
| 110110 | JMPRZ | jump if A_OP == 0 |
| 110111 | JMPNRZ | jump if A_OP != 0 |
| 111000 | JMPNRZZ | jump if A_OP != 0 & ZF==1 |
| 111001 | JMPNRZNZ | jump if A_OP != 0 & ZF==0 |
| 111010 | JMPRS | jump if A_OP msb==1 |
| 111011 | JMPRNS | jump if A_OP msb==0 |
| 111100 | | |
| 111101 | | |
| 111110 | | |
| 111111 | | |

One exception in the above decoding is the reversed subtract which would be sent as subtract instruction. The MROM instruction will try to use the X86 opcode format. Some operations are not possible in the fast-path instructions such as floating point, string, integer divide, special register, and processor control. These MROM instructions will have different opcodes which need to be recognized by Idecode.

SIGNAL LIST

ICPREF(7:0)—Input from Icache and MROM indicates the encoded prefix byte. The two most significant bits are repeat prefixes for MROM.

IC2ROPn(9:0)—Input from Icache to decode unit n indicates 2-dispatch positions instruction. Bit 3 indicates the first rop or second rop of the 2-dispatch positions instruction, bit 2 indicates POP instruction, bit 1 indicates the MUL instruction, and bit 0 indicates the SIB-byte instruction.

ICVALI(3:0)—Input from Icache indicates valid instructions. NOOP is generated for invalid instruction.

ICnOPC(7:0)—Input from Icache to decode unit n indicates the opcode byte.

ICnEOP(2:0)—Input from Icache to decode unit n indicates the extended opcode field.

PROTOCOLn(3:0)

OPCTLn(5:0)

PGALUn(6:0)—Output indicates the type of instructions being dispatched, this is the decoded information for the functional units to execute.

DECODING FOR REGISTERS AND FLAGS

The opcode should also be decoded for the immediate field, the validation and direction of the operands to the FIROB and the register file. The decoding of the register direction and validation should be less than 1 clock cycle. During fetching, the register operands are speculatively decoded and sent to the FIROB for dependency checking. The FIROB's dependency checking may be in a critical speed path, and the decoding of the register direction and validation may be implemented in the early decoding in the Icache. Two register operands are sent to the FIROB. The Idecode sends the operand data to the functional units in the correct order of A and B. The A operand is the first operand which can be both destination and source. The B operand is the second operand which is source data. The immediate field co-exists with the B operand on three instructions, IMUL, SHLD, and SHRD. SHLD and SHRD are MROM instructions which will be sent as shifting one bit at a time. The exception is with the IMUL instruction. The first operand is only for destination which is not needed by the functional unit. The second operand will be sent on the A operand and immediate is on B operand. The data and address sizes and the sign-extended information for all operands and immediate data must also be decoded in this block. Data from Idecode is arranged on three 32-bit buses and one constant bus to the functional units:

| From Idecode | To Functional Unit |
|---|---|
| First operand | 32-bit A operand bus |
| Second operand (not IMUL) | 32-bit B operand bus |
| Second operand - IMUL | 32-bit A operand bus |
| Immediate | 32-bit B operand bus |
| Predicted Branch Target | 32-bit A operand bus |
| EIP/second operand | 32-bit B operand bus |
| Displacement | 32-bit Displacement bus |
| Constant | 4-bit Constant bus |

For branch instructions, the target PC is sent on A operand bus because it is possible to have the immediate field (RETURN instructions) and displacement field. All predicted taken branch instructions have indication and branch tag to keep in the FIROB. Few non-taken branch instructions are not detected in branch prediction, the FIROB keeps track of the sequential PC.

This block also decodes the load/store, special register, and floating point operations, and serialization which are needed global control of the decode units.

SIGNAL LIST

ICBTAG1(3:0)—Input from Icache indicates the position of the first target branch instruction with respect to the global shift register in case of branch mis-prediction. The branch can be taken or non-taken, branch tag must be sent with all branch instruction.

ICBTAG2(3:0)—Input from Icache indicates the position of the second target branch instruction with respect to the global shift register in case of branch mis-prediction. The branch can be taken or non-taken, branch tag must be sent with all branch instruction.

UNJMP(3:0)—Input from Icache indicates the unconditional branch instruction needs to calculate target address.

BRNTKN(3:0)—Input from Icache indicates which decode unit has a predicted taken branch. The operand steering uses this signal to latch and send BTADDR(31:0) to the functional unit.

BRNINST(3:0)—Input from Icache indicates which decode unit has a global branch prediction. The operand steering uses this signal to latch and send ICBTAG1(3:0) and ICBTAG2(3:0) to the functional units.

IB2(191:0)—Input from Icache indicates the combined instruction line for reading the displacement and immediate field using pointers.

ICVALI(3:0)—Input from Icache indicates valid instructions. NOOP is generated for invalid instruction.

ICnOPC(7:0)—Input from Icache to decode unit n indicates the opcode byte.

ICnEOP(2:0)—Input from Icache to decode unit n indicates the extended opcode field.

ICnSS(1:0)—Input from Icache to decode unit n indicates the scale factor of the SIB byte.

DISPTRn(6:0)—Input from Icache to decode unit n indicates the displacement pointer and size. Bits 2:0 is the pointer to the 8-byte block, bit 6:5 is the size, and bit 4:3 indicates which 8-byte block. Bit 6:5=00 indicates no displacement.

IMMPTRn(4:0)—Input from Icache to decode unit n indicates the displacement pointer and size. Bits 2:0 is the pointer to the 8-byte block, and bit 4:3 indicates which 8-byte block. Decoding of all opcodes is needed to detect immediate field.

CONSTn(2:0)—Input from Icache to decode unit n indicates the constant for add/substract to ESP of the two-dispatch position instruction.

ICPC1TAR—Input from Icache indicates is ICPC1 a branch target of a previous instruction which is a predicted taken branch instruction.

ICPC2TAR—Input from Icache indicates is ICPC2 a branch target of a previous instruction which is a predicted taken branch instruction.

ICPC1(31:0)—Input from Icache indicates the current line PC of the first instruction in the 4 issued instructions to pass along with the instruction to FIROB.

ICPC2(31:0)—Input from Icache indicates the current line PC of a second instruction which cross the 16-byte boundary or branch target in the 4 issued instructions to pass along with the instruction to FIROB.

ICPOSn(4:0)—Input from Icache to decode unit n indicates the PC's byte position of the next instruction. Bit 4 indicates the next instruction is on the next line.

IDxIMM(2:0)—Output to indicates the immediate size information. 01-byte, 10-half word, 11-word, 00-not used. Bit 2 indicates (0) zero or (1) sign extend.

IDxDAT(1:0)—Output to indicates the data size information. 01-byte, 10-half word, 11-word, 00-not used.

IDXADDR—Output to indicates the address size information. 1–32 bit, 0–16 bit.

DxUSE1(1:0)—Output to FIROB and register file indicates the type of operand being sent on operand 1 for decode units. Bit 1 indicates source operand, and bit 0 indicates destination operand.

DxUSE2—Output to FIROB and register file indicates source operand.

INSDISP(3:0)—Indicates that the instruction in decode unit is valid, if invalid, NOOP is passed to FIROB.

SEGMENT REGISTER AND SPECIAL CONTROL

In general, writing to special registers and cache array causes serialization after dispatching of the instruction. Reading of special register and cache array does not cause serialization. Cache array access is from MROM instructions for testing and debugging purposes. Most special register access is also from MROM instructions; few MOVE instructions specify the special register directly. Serialization is a major degradation in performance. Implementation of a special register buffer in the load/store section reduces the serialization as will be discussed in a later section. For special register access, the destination register of the instruction is the indication of special register (not a real register in the register file), the special register address and control information are encoded in the immediate field of the MROM instruction. The functional unit will pass the immediate field directly to the special register buffer. The immediate field is decoded in the special register to generate read/write to the appropriate special register or cache array. Fast-path instruction which read/write to the special register must provide the same format in the immediate field as the MROM to the functional unit.

The prefix of the instruction is decoded during fetching. The segment register override is encoded as a prefix byte. The MROM instruction provides the ES reference for the string operation. All accesses to segment registers must be detected in decoding to generate controls to the load/store section. The percentage of writing to some segment register is significant to the performance of Processor 500. To further reduce the penalty of serialization due to the writing of segment registers, control signals and dependency status bits are generated. In the next section, a detailed implementation of this technique is discussed.

The floating point unit is implemented as a co-processor. The MROM provides the same format for the floating point instructions in 4 issue positions. The first three issue positions are for the possible 80-bit load/store access of the floating point instructions. For 32-bit or 64-bit floating point operations, the issue position is filled with NOOP. The last issue position is the actual opcode of the floating point instruction. The floating as point opcode is in the immediate field of the MROM instruction. Idecode treats the floating point instruction as a special register instruction; the immediate field is passed from special register block to the floating point unit. The floating point unit latches and loads data from the LSSEC and send the store data through the functional unit to the LSSEC.

SPECIAL-REGISTER INSTRUCTIONS

There are two types of special-register (SR) instructions. One is for testing/debugging purpose, and the other is for normal execution. The testing/debugging SR instructions are for the cache arrays, it is not important to speed up these instructions. Implementation of the serialized instruction is as followed:

SR instructions can be issued from any dispatch position.

The SR address is sent to the functional unit in the Immediate field.

Read from SR instructions are not serialized.

Up to 4 SR instructions can be in execute. The load/store special register (LSR) buffer has 4 entries. The LSR buffer is global to both the SRB and LSR. Idecode will communicates with the LSR to allocate an entry when a SR instruction is dispatched. This is the same implementation as with the load/store buffer.

Write to SRs except to DS, GS, ES, and FS are serialized. The serialization is to dispatch the write to SR instruction, stall all other instructions, and wait for LSR to notify the completion of the instruction. The write to LSR instruction must execute in program order (same as STORE instructions).

Write to DS, GS, ES, and FS instruction sets a dependency bit for each of the four segment register when dispatching. Four global WRxS signals to all functional units indicate the write to the segment register is outstanding. The LSR will reset the dependency bit and clear WRxS from execution of the write to SR instruction. Any read to DS/GS/ES/FS instruction after the write will have a status read dependency bit (RD_DEP_xS). Instructions with RD_DEP_xS set, must wait in reservation station until WRxS is cleared. The read to GS/ES/FS instruction includes (1) Prefix segment override, (2) Move from segment register, and (3) String operation (ES only). The string operation will have indication from MROM. A second write to segment register with WRxS set, must stall in decode.

SIGNAL LIST

IMMPTRn(4:0)—Input from Icache to decode unit n indicates the displacement pointer and size. Bits 2:0 is the pointer to the 8-byte block, and bit 4:3 indicates which 8-byte block. Decoding of all opcodes is needed to detect immediate field.

MROMEN—Input from MROM indicates the microinstructions is sent to Idecode instead of the Icache.

IDxIMM(2:0)—Output to indicates the immediate size information. 01-byte, 10-half word, 11-word, 00-not use. Bit 2 indicates (0) zero or (1) sign extend.

INSLSxB(5:0)—Output from decode units indicates the prefix values. bit 5—data size, bit 4—address size, bit 3—lock, bit 2:0—segment registers.

GLOBAL CONTROL OF DECODE UNITS

The decode units, can decode instructions, generate operand addresses, and dispatch to the functional units independent from each other. There are a few exceptions where global control is needed. With the extra pipeline stage before the alignment, some decoding of the instructions is done before sending to the decode units. Early decoding includes MROM instruction, SIB-byte instruction, 2-dispatch position instructions, multi-prefix instruction, and branch taken instructions. During decoding, partial dispatching of a line can happen for serialization, dependency, and move-to-special-register. Conditions to halt the line of instructions before dispatching to the functional units in the next ICLK are the reservation stations full, the FIROB full, and the Load/Store buffer full. These halt conditions will stop the pipeline in the decoder from advancing. For serialization, the instructions can occupy the entries in the FIROB and wait for ROBEMPTY to dispatch the instructions to functional units. Most of the serialization conditions is provided by the MENG, few serialized instructions must be decoded from fast-path instructions. The two clock cycle in decode units are pipelined, the appropriate pipeline control such as HOLD and REFRESH are needed for the decode units and Icache.

STALLINA AND PARTIALLY DISPATCHING OF INSTRUCTIONS

Each stage of the pipeline has a latch and the instructions can be refreshed. In the first stage, the stalling conditions for the operand pointers and instructions from Icache to decode units are:

If the FIROB is full, the decoding is stalled until the FIROB can accept another line of instruction.

In the next stage, the line in the FIROB must be allocated, the stalling conditions for the operand data to remain on the buses are:

If there is a narrow-to-wide dependency; i.e. the read operand is 32-bit and the previous destination operand is 8-bit, the decoding is stalled until the FIROB retires the previous destination entry. Instructions may be partially dispatched, the FIROB invalidates instructions from the narrow-to-wide dependency. The Idecode invalidates instructions before the narrow-to-wide dependency and re-issues the instructions to FIROB. A similar procedure is needed for the second group of flag dependency checking.

Dependency is detected for the third group of flags. If the load/store buffer is full, the decoding is stalled until the load/store buffer is available. Partial line dispatching can be done instead of stalling the whole line. This will be discussed in a later section.

If the special register buffer is full, the decoding is stalled until the load/store buffer is available. This was discussed in an earlier section.

Decoding is stalled on write to special registers and cache array except for write to DS, ES, FS, and GS. This was discussed in an earlier section.

If any set of reservation stations is full, the decoding is stalled until the reservation station is available.

Serialized instructions.

INSTRUCTION SERIALIZATION

Serialization is controlled by MROM and the decode units. On some processors, the ROB must be empty before the instructions can be dispatched from the decode units, and the ROB must be empty again before the next instruction can be dispatched. The cost is about 6 cycles to execute a single instruction. The performance degrades tremendously by serialization. On Processor 500, serialization will be minimized, most frequent serialization instructions will be in the fast path. The serialization can be categorized into serialized instructions, exception instructions, break-point instructions, and special register instructions. Serialized instructions which must be handled by the decode units:

INVD—Dispatch the instruction to invalidate the data/instruction cache and wait for the FIROB re-fetch the next instruction.

HALT—Dispatch the instruction to the FIROB and wait for interrupt.

WAIT—Dispatch the instruction to the FIROB and wait.

INSTRUCITON BREAKPOINTS AND TRACING

When enabled, instruction breakpoint check instructions are inserted before each instruction by the decode unit. A hardwired input to dispatch position zero is serially dispatched before every instruction. The breakpoint instructions go to the LSSEC to check for breakpoint.

HANDLING OF LOAD/STORE INSTRUCTIONS

The load/store section implements a finite size load/store buffer. There would be cases that the buffer is full and creates a stall in functional units. To avoid stalling in the functional units, the decode will not dispatch the current line of instructions if there is not enough space in the load/store buffer to handle the load/store instructions of the current line. The decode units have more time to make this decision than the functional units.

At dispatch, the decode units send the load/store information to the load/store section. The information includes the current FIROB line, data dependency tags, and load/store type LSTYPE(1:0):

00: No load/store
01: Load operation
10: Store operation
11: Both Load and Store operations If the instruction has a memory reference, then the load/store type should be set. The linear address and/or data will be sent to the load/store buffer from the functional units or reservation station at a later time. The load/store buffer allocates entries for the dispatched instructions. The store operation should get a slot in the load/store buffer and the load instruction increases a counter to keep track of the number of load in the executing stage. A 3-bit count is sent to the decode units to indicate the number of empty entries in the load/store buffer. The decode units will dispatch a line of instructions only if the number of load/store instructions in the line is less than or equal to the empty entries in the load/store buffer.

SIGNAL LIST

LSCNT(2:0)—Input from LSSEC indicates the number of empty entries in the load/store buffer.

RSFULL—Input from functional units indicates that the reservation stations are full. This signal is the OR of the 6 functional units ROBFULL—Input from FIROB indicates the FIROB is full.

REFRESH2—Output indicates that the operand pointer to the register file and the FIROB will be refreshed and not accept new operand.

REFRESH1—Output indicates current line of instructions will be refreshed and not accept new instructions from Icache.

IDPREF(5:0)—Output from 2-cycle prefix decode to decode units indicates the prefix values. bit 5—data size, bit 4 address size, bit 3—lock, bit 2:0—segment registers.

IDSIB(3:0)—Output to FIROB indicates which decode unit has the SIB-byte instruction. The FIROB should generate dependency on the previous instruction of the last line in the same issue position.

TIMING

The Idecode has 2 pipeline stages:
first stage: Decode instruction opcode for functional units. Decode register direction and validation for operands to dispatch to functional units. Dependency checking in the FIROB.
second stage: Operand steering for tags and operand data to the functional units. Complete decoding for instruction and send to functional units.

LAYOUT

Figure 28:
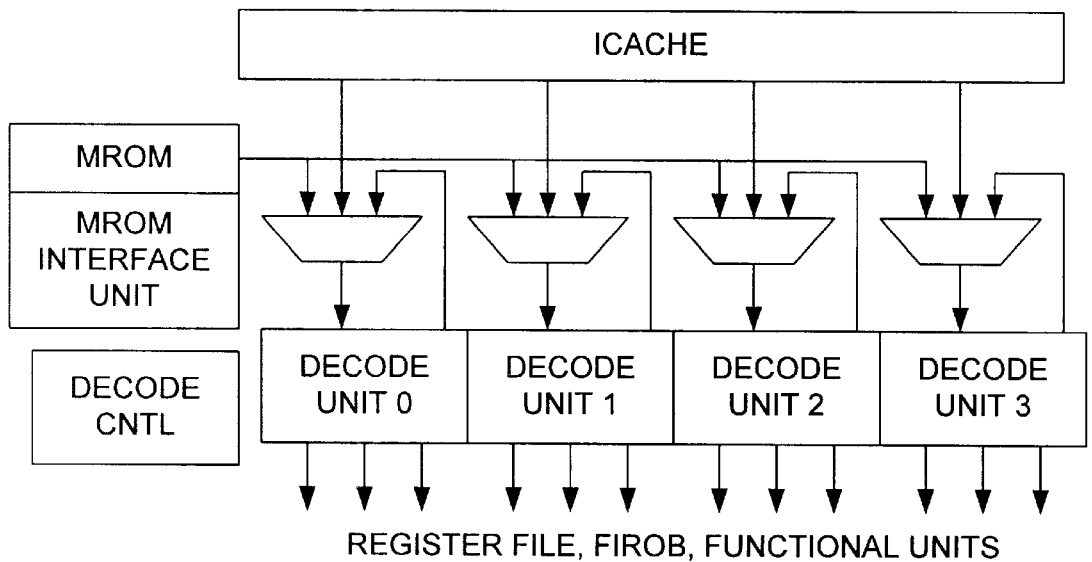

The Idecode includes six decode unit blocks. The decode unit 0 and 6 are slightly different because of passing part of the instruction from different lines. The global blocks are: MROM interface unit, the prefix decoding and control for 2-cycle Processor 500 fast-path instructions, the return stack and controls for branch instructions, and global decoding controls. The MROM interface unit includes global registers accessible by MROM instruction. FIG. 28 is a block diagram of the IDECODE layout.

DISPATCH AND ISSUE LOGIC

For this section, dispatch means sending a new set of up to four pseudo-opcodes with their tags and operands to the operand steering unit and then to the reservation station. Issue means sending the source operands to the FNCU for execution. The term pseudo-opcode is used since fast path x86 instructions are sent as either one or two side by side pseudo-opcodes. Each pseudo-opcode is further sub-divided into two vectors (a type of mini-opcode). Both vectors have access to the same four data busses {Aop(31:0), Bop(31:0), Disp(31:0), and Const(3:0)} but use the data differently depending on which reservation station protocol that the reservation station entry has. There are a total of three reservation station entries. Every pseudo-opcode is one dispatch position that carries an identification or DTAG denoted by the FIROB line number and entry number that will become its destination. Only the FIROB line number needs to be carried around since the entry number will correspond to a fixed dispatch position from 0 to 3. DTAG (destination tags) can only be 0_0 to 5_3 which represents four dispatch positions and six FIROB lines.

ALLOCATION AND DISPATCH

Once the opcode has been dispatched to a reservation station (station 0, 1, or 2), the station then watches the result bus tags for the remaining operands that will be forwarded to it. Issue from the reservation stations to the functional units can be done out of order on Processor 500. The oldest opcode (in program order) which has all of its operands will be issued to the functional unit and the functional unit cannot stall. The decoder/dispatcher communicates with the FPU, LSSEC, and SRB, and FIROB and will stall if a new opcode( ready to be dispatched) has no place to go. As an example, when all six FIROB lines are allocated or when all eight LSSEC entries are allocated, the dispatcher must stall.

Opcodes, tags, and operands for the reservation stations are always dispatched into RS2. Issue to the functional unit can then come from RS2, RS1, or RS0. When a another opcode is dispatched into RS2, the previous opcode in RS2 is shifted down to RS1. If an opoode was in RS1, it would in turn be shifted to RS0.

RESERVATION STATION SUB-BLOCKS

The reservation station logic (per dispatch/issue position) is divided into a control sub-block named RSCTL and three reservation stations named RS2, RS1, and RS0. Opcodes, tags, and operands are only dispatched to RS2, while any of the reservation stations can issue to the FNCU. If an operation gets all of its operands from the REGF and FIROB data section and has no higher priority requests in the reservation stations before it, it can go from the operand steering section directly to the FNCU for evaluation; otherwise, the operation waits in the reservation station until its operands are forwarded to it. The entry being issued to the FNCU is driven on a set of tristate busses. Another set of tristate busses is used by the Multiplier for source operands. These tristate busses (SAOPND and SBOPND) are shared by all four reservation block positions, and a multiplier request/grant protocol determines which position drives them.

Figure 29:
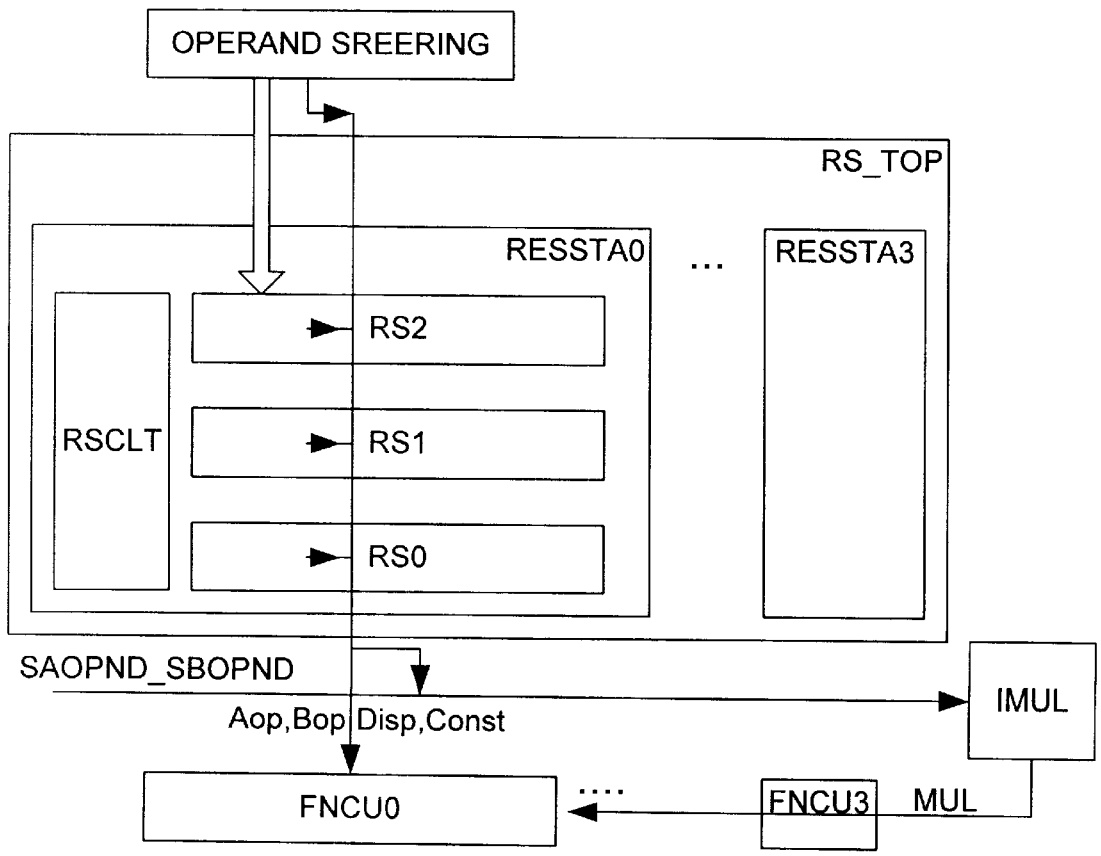
Figure 30:
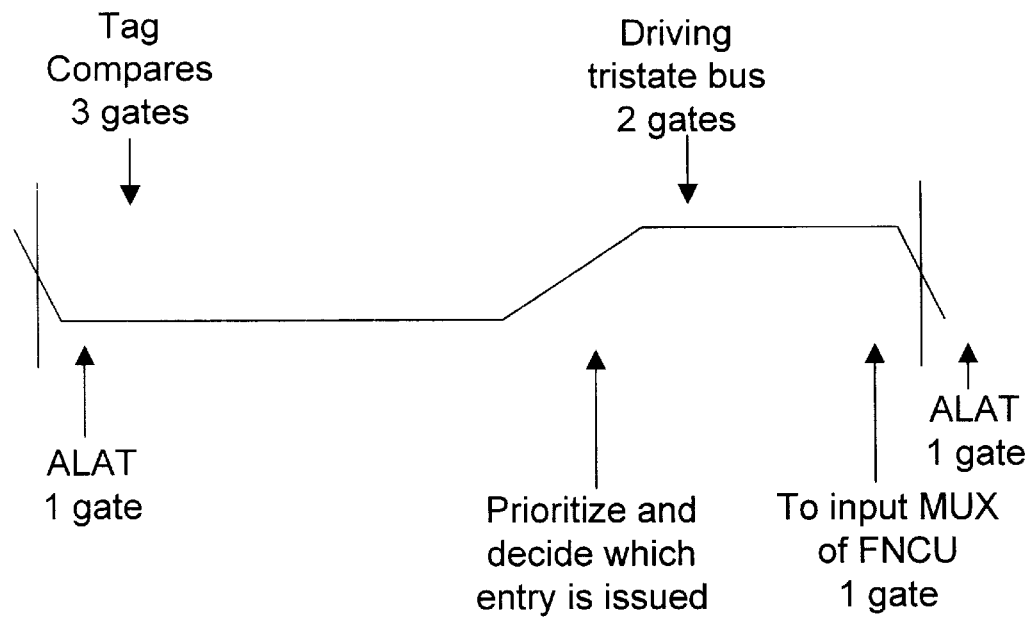

The RSCTL decides which operations end up in which reservation stations. A set of operands will stay in their current reservation station entry unless they are shifted to the next entry or sent to the FNCU for evaluation. No attempt is made to keep all operations pushed up against one side or the other of the reservation station chain. A block diagram of reservation station logic is shown as FIG. 29. A timing diagram for the reservation stations is shown as FIG. 30.

RESERVATION STATION PROTOCOLS

Various protocols are used to indicate how the reservation station should use the two vectors stored in the VCBS (vector control bit store) section of the FNCU and which operands are needed.

Protocol Definitions

```
OP  -  operation only valid
       (v0: na {0};              v1: operation {F})
TOP -  two opcode are fully supplied
       (not used by uCode)
       (fast path only)
       (v0: decode supplied;     v1: decode supplied)
V12 -  v0 fwd to v1
       (v0: Bop+const   {I};     v1: operation {F)})
LO  -  Load-Operation
       (v0: Bop+disp {Lw};       v1: operation {F})
                                 after v0, BTAG=DTAG
LOS -  Load-OP-Store
       (v0: Aop+disp {Lw};       v1: op & store {M})
                                 after v0, BTAG=DTAG
OS  -  op-store
       (v0: Aop+disp {L};        v1: op & store {M})
SRB -  SRB info
       (v0: na {0};              v1:pass Bop {S})
```

-continued

Protocol Definitions

```
FLA -  fpu linear adr
       (v0: Bop+disp {I};           v1: fwd+const {L})
       unlike regular linear adr calc;
       this one immediately
       clears the resv_sta entry
BRN -  Branch eval
       (v0:        na {0};          v1: operation,brn eval {B})
LBR -  Load-brn (RET)
       (v0: Aop+disp {Lw};          v1: operation,brn eval {B})
SIB -  1st pos SIB
       (v0: Aop+scaled(Bop) {F};    v1: na {0})
PU  -  Push
       (v0: Aop-const {L,F}         v1: op & store {M})
POP -  Pop
       (v0: Aop+const    {F}        v1: na {0})
DIV -  vector0 or vector1
       (v0: ADD       {F};          v1: SUB      {F})
```

The following letters indicate which blocks should latch data off the RES bus (enclosed in { }):

0 (nothing)

F (FIROB or FNCU forwarding)

L (linear address for store)

Lw (linear address for load; Res_sta changes Bop= DTAG and waits)

M (memory data for store only)

S (SRB)

B (Branch eval info for FIROB)

I (intermediate value; ignored for forwarding except for same Res sta)

Summary of How Protocols Apply to Various Instructions

|  | dispatch positions | | | |
|---|---|---|---|---|
|  | 1st pos | 2nd pos | | |
| regular operation | OP | / | — | ; |
| regular op w/ imm | OP | / | — | ; |
| Load-op | LO | / | — | ; |
| OP-store | OS | / | — | ; |
| Load-op-store | LOS | / | — | ; |
| SIB w/ Load-op | SIB | / | LO | ; |
| SIB w/ OP-store | SIB | / | OS | ; |
| SIB w/ L-O-S | SIB | / | LOS | ; |
| divide opcode | DIV | / | — | ; |
| FPU linear adr | FLA | / | — | ; |
| Jcc | BRN | / | — | ; |
| JMP nr disp rel | BRN | / | — | ; |
| JMP nr reg indr | BRN | / | — | ; |
| JMP nr mem indr | LBR | / | — | ; |
| PUSH reg | PU | / | — | ; |
| PUSH mem | LO | / | PU | ; |
| PUSH mem w/SIB | uCode | | | |
| PUSHF | PU | / | — | ; using MOVF |
| PUSHF w/OF fwd | V2 | / | PU | ; using MOVF and MOVOF |
| CALL nr disp rel | PU | / | BRN | ; |
| CALL nr reg indr | PU | / | BRN | ; pos 2 adds indr_reg w/ zero instead of EIP + rel |
| CALL nr mem indr | PU | / | LBR | ; |
| POP mem | uCode | | | |
| POP mem w/SIB | uCode | | | |
| POPF IOPL can change | uCode | | | ; this goes to uCode since |
| RET | LBR | / | OP | ; |
| RET imm | LBR | / | V12 | ; |
| XCHG | uCode | | | |
| XADD | uCode | | | |
| LEAVE | POP | / | LO | ; |

-continued

| | | | | | | |
|---|---|---|---|---|---|---|
| LOOP | OP | / | BRN | ; | | |
| LOOPcond | uCode | | | | | |
| JCXZ | OP | / | BRN | ; | | |
| MUL 1 disp pos | OP | / | — | ; | | |
| MUL 2 disp pos | OP | / | OP | ; | 2nd pos is a NOP | |
| Operand to bus assignments and opcode details: | | | | | | |
| Aop, Bop, and Disp busses are 32 bits | | | | | | |
| Const bus is 4 bits | | | | | | |
| regular operation | OP | / | — | ; | | |
| dsptch pos 1: | Aop | Bop | Disp | Const | operation | Latch |
| inputs-> | A | B | — | — | | |
| v0: | | | | | none | {0} |
| v1: | A | B | | | operation | {F} |
| same but with immediate data | | | | | | |
| regular operation | OP | / | — | ; | OP_STR block moves imm to Bop | |
| dsptch pos 1: | | | | | | |
| inputs-> | A | imm | — | — | | |
| v0: | | | | | none | {0} |
| v1: | A | imm | | | operation | {F} |
| Load-op | LO | / | — | ; | | |
| dsptch pos 1: | | | | | | |
| inputs-> | | B | disp | — | | |
| v0: | | B | disp | | Bop + disp & | {Lw} Btag <= Dtag |
| v1: | | LSRES | | | operation | {F} |
| OP-store | OS | / | — | ; | | |
| dsptch pos 1: | | | | | | |
| inputs-> | A | B | disp | — | | |
| v0: | A | | disp | | Aop + disp | {L} |
| v1: | | B | | | operation | {M} |
| Load-op-store | LOS | / | — | ; | | |
| dsptch pos 1: | | | | | | |
| inputs-> | A | B | — | — | | |
| v0: | A | | disp | | Aop + disp & | {Lw} Atag <= Dtag |
| v1: | LSRES | B | | | operation | {M} |
| SIB w/ Load-op | SIB | / | LO | ; | | |
| dsptch pos 1: | | | | | | |
| inputs-> | base | index | — | — | | |
| v0: | base | index | | | base + scaled (ind) | {F} |
| v1: | | | | | none | {0} |
| dsptch pos 2: | | | | | | |
| inputs-> | | B | disp | — | | |
| v0: | | fwd | disp | | fwd + disp & | {Lw} Btag <= Dtag |
| v1: | | LSRES | | | operation | {F} |
| SIB w/ OP-store | SIB | / | OS | ; | | |
| dsptch pos 1: | | | | | | |
| inputs-> | base | index | — | — | | |
| v0: | base | index | | | base + scaled (ind) | {F} |
| v1: | | | | | none | {0} |
| dsptch pos 2: | | | | | | |
| inputs-> | A | B | disp | — | | |
| v0: | fwd | | disp | | fwd + disp | {L} |
| v1: | | B | | | operation | {M} |
| SIB W/ L-O-S | SIB | / | LOS | ; | | |
| dsptch pos 1: | | | | | | |
| inputs-> | base | index | — | — | | |
| v0: | base | index | | | base + scaled (ind) | {F} |
| v1: | | | | | none | {0} |
| dsptch pos 2: | | | | | | |
| inputs-> | A | B | disp | — | | |
| v0: | fwd | | disp | | fwd + disp & | {Lw} Atag <= Dtag |
| v1: | LSRES | B | | | operation | {M} |
| divide opcode | DIV | / | — | ; | | |
| dsptch pos 1: | | | | | | |
| inputs-> | A | B | — | — | | |
| v0: | A | B | | | ADD A, B | {F} |
| v1: | A | B | | | SUB A, B | {F} |
| FPU linear address | FLA | / | — | ; | | |
| dsptch pos 1: | | | | | | |
| inputs-> | | B | disp | const | | |
| v0: | | B | disp | | Bop + disp & | {I} Btag <= Dtag |

```
v1:                   fwd           const      fwd + const          {L}
Jcc                   BRN     /     —          ;
dsptch pos 1:
inputs->       EIP    pre_adr       rel        —
v0:                                            none                 {0}
v1:            EIP    B             rel        EIP + rel            {B}
   next cycle  flag logic compares EIP + rel & pre_adr for
predicted taken
JMP nr disp rel       BRN     /     —          ;  same as conditional
except always taken
dsptch pos 1:
inputs->       EIP    pre_adr       rel        —
v0:                                            none                 {0}
v1:            EIP    B             rel        EIP + rel            {B}
   next cycle  flag logic compares EIP + rel & pre_adr for
predicted taken
JMP nr reg indr       BRN     /     —          ;
dsptch pos 1:
inputs->       reg    pre_adr       —          0
v0:                                            none                 {0}
v1:            reg                  0          reg + 0              {B}
   next cycle  flag logic compares reg + 0 & pre_adr for
predicted taken
JMP nr mem indr       LBR     /     —          ;
dsptch pos 1:
inputs->       Aop    pre_adr       disp       0
v0:            Aop                  disp       Aop + disp           {Lw}
                                               &                    Atag <= Dtag
v1:            LSRES                0          LSRES + 0            {B}
   next cycle  flag logic compares LSRES + 0 & pre_adr for
predicted taken
PUSH reg              PU      /     —          ;
dsptch pos 1:
inputs->       ESP    B             —          const
v0:            ESP                  const      ESP-const            {L, F}
v1:                   B                        operation            {M}
PUSH mem              LO      /     PU         ;
dsptch pos 1:
inputs->              B             disp       —
v0:                   B             disp       Bop + disp           {Lw}
                                               &                    Btag <= Dtag
v1:                   LSRES                    operation            {F}
dsptch pos 2:
inputs->       ESP    fwd           —          —
v0:            ESP                  const      ESP-const            {L ,F}
v1:                   fwd                      operation            {M}
PUSHF                 PU      /     —          ;  using MOVF
dsptch pos 1:
inputs->       ESP    flg           —          const
v0:            ESP                  const      ESP-const            {L, F}
v1:                   flg                      MOVF                 {M}
   the MOVF on v1 combines system flags on Bop with CF & XF
PUSHF w/OF fwd OP     /       PU          ;  using MOVF and MOVOF
dsptch pos 1:
inputs->       —      flg           —          —
v0:                                            none                 {0}
v1:                   flg                      MOVF                 {F}
   the MOVF on v1 combines system flags on Bop with CF & XF
dsptch pos 2:
inputs->       ESP    fwd           —          const
v0:            ESP                  const      ESP-const            {L, F}
v1:                   fwd                      MOVOF                {M}
   the MOVOF on v1 overwrites the OF bit position of Bop
CALL nr disp rel      PU      /     BRN        ;
dsptch pos 1:
inputs->       ESP    EIP           —          const
v0:            ESP                  const      ESP-const            {L, F}
v1:                   EIP                      operation            {M}
dsptch pos 2:
inputs->       EIP    pre_adr       disp       —
v0:                                            none                 {0}
v1:            EIP                  disp       EIP + disp           {B}
   next cycle  flag logic compares EIP + disp & pre_adr for
predicted taken
CALL nr reg indr      PU      /     BRN        ;  pos 2 adds indr_reg w/
zero instead of EIP + rel
dsptch pos 1:
inputs->       ESP    EIP           —          const
v0:            ESP                  const      ESP-const            {L,F}
v1:                   EIP                      operation            {M}
```

-continued

```
dsptch pos 2:
inputs->        reg     pre_adr  0       —
v0:                                              none               {0}
v1:             reg              0       —       reg + 0            {B}
    next cycle  flag logic compares reg + 0 & pre_adr for
predicted taken
CALL nr mem indr  PU    /   LBR          ;
dsptch pos 1:
inputs->        ESP     EIP      —       const
v0:             ESP                      const   ESP-const          {L, F}
v1:                     EIP                      operation          {M}
dsptch pos 2:
inputs->        A       pre_adr  disp    —
v0:             A                disp            Aop + disp         {Lw}
                                                 &                  Atag <= Dtag
v1:             LSRES                            LSRES + 0          {B}
    next cycle  flag logic compares LSRES + 0 & pre_adr for
predicted taken
POP reg               LO    /   POP          ;
dsptch pos 1:
inputs->                ESP      0       —
v0:                     ESP      0               ESP + 0            {Lw}
                                                 &                  Btag <= Dtag
v1:                     LSRES                    operation          {F}
dsptch pos 2:
inputs->                ESP      —       —       const
v0:                     ESF                      const   ESF + const {F}
v1:                                              none               {0}
RET              LBR    /   OP           ;
dsptch pos 1:
inputs->        ESP     pre_adr  —       0
v0:             ESP              0               ESP + 0            {Lw}
                                                 &                  Atag <= Dtag
v1:             LSRES                    0       LSRES + 0          {B}
    next cycle  flag logic compares LSRES + 0 & pre_adr for
predicted taken
dsptch pos 2:
inputs->        ESP     —        —       const
v0:             ESP                      const   ESP + const        {F}
v1:                                              none               {0}
RET imm          LBR    /   V12          ;
dsptch pos 1:
inputs->        ESP     pre_adr  0       —
v0:             ESP              0               ESP + 0            {Lw}
                                                 &                  Atag <= Dtag
v1:             LSRES            0               LSRES + 0          {B}
    next cycle  flag logic compares LSRES + 0 & pre_adr for
predicted taken
dsptch pos 2:
inputs->        ESP     imm              const
v0:             ESP                      const   ESP + const        {I}
v1:             fwd     imm                      fwd + imm          {F}
LEAVE                   V12    /   LO        ;
dsptch pos 1:
inputs->                EBP      —       const
v0:                                      const   EBP + const        {I}
v1:                     fwd                      R <- fwd           {F}
    this one is used so another protocol is not needed and
dependency checking is easy; otherwise, use a version of the
POP protocol with Bop + const.
    FIROB latches the output as the new ESP value.
dsptch pos 2:
inputs->                EBP      0       —
v0:                     EBP      0               EBP + 0            {Lw}
                                                 &                  Btag <= Dtag
v1:                     LSRES                    operation          {F}
    FIROB latches v1 result as the new EBP value
LOOP             OP     /   BRN          ;
dsptch pos 1:
inputs->                ECX      1       —       —
v0:                                              none               {0}
v1:                     ECX      1               operation          {F}
dsptch pos 2:
inputs->                EIP      pre_adr  disp   —
v0:                                              none               {0}
v1:                     EIP              disp    —       EIP + disp {B}
    next cycle  flag logic compares EIP + disp & pre_adr for
predicted taken
JCXZ             OP     /   BRN          ;
dsptch pos 1:
```

-continued

```
inputs->        ECX      0         —         —
v0:                                           none           {0}
v1:             ECX      0                    operation      {F}
dsptch pos 2:
inputs->        EIP      pre_adr   disp       —
v0:                                           none           {0}
v1:             EIP                disp       —    EIP + disp {B}
  next cycle   flag logic compares EIP + disp & pre_adr for
  predicted taken
MUL  1 disp pos    OP     /      —         ;
dsptch pos 1:
inputs->        A        B         —         —
v0:                                           none           {0}
  resv_sta receives grant and sends source on SAOPND &
SBOPND; FNCU is idle
  resv_sta starts counting 3 cycles and issues v1 to pass
MUL result
v1:                                           pass MUL       {F}
MUL  2 disp pos    OP     /      OP        ;  2nd pos is a NOP
dsptch pos 1:
inputs->        A        B         —         —
v0:                                           none           {0}
  resv_sta receives grant and sends source on SAOPND &
SBOPND; FNCU is idle
  resv_sta starts counting 3 cycles and issues v1 to pass
MUL result
  resv_sta(i) signals resv sta(i + 1) to start counting 4
cycles
v1:                                           pass MUL       {F}
dsptch pos 2:
inputs
v0:                                           NOP            {0}
  resv_sta starts counting 4 cycles and issues v1 to pass
MUL result
v1:                                           NOP            {F}
```

CYCLE TYPE

Sometimes incorrect data will be sent by the Dcache or the LSSEC. The reservation station will resend the cancelled cycle after the correct data comes from the data cache in the case of a hit in a mispredicted way. When the DCUNPAHIT or DCUNPBHIT (Dcache hit in unpredicted way) signal is detected, the R_VALID status is changed to an R_NONE status by the FNCU and the reservation station will latch in the correct data next cycle. The correct data from an unpredicted way will have to wait one extra cycle to be issued since the reservation station has already prioritized another entry for issue. DCUNPAHIT and DCUNPBHIT correspond to Dcache results for the data on LSRES0 and LSRES1 respectively. A Dcache miss is detected when valid tags match on LSTAG0 bus but no DCUNPAHIT or DCPRPAHIT is detected. The DCUNPBHIT and DCPRPBHIT signals are for the LSTAG1 bus status. The LSSEC uses a similar protocol for miss only by sending the LSCANFWD signal which indicates that the forwarded data was incorrect. When load data is received on the LSRES bus, the reservation station keeps the corresponding entry for a cycle after it is issued to the FNCU and checks to see if its tags needed to be set again for the miss condition. Keeping the reservation station entry valid for an extra cycle is not needed in the case of an FPU load linear address calculation. The FPU reservation station must be responsible for detecting and handling the incorrect load data conditions. Another side note is that AHBYTE data is not sent back to bits 15:8 for "store" data.

SRB, FPU, AND MULT HANDLING

SRB opcodes look like a move instruction with the exception that a STAT_SRB signal is asserted to let the LSSEC know the 32 bit value needs to be latched into the 4 entry SRB file. FPU opcodes go to uCode and get dispatched on a single FIROB line which uses the first three positions for calculating linear addresses and the last position for the entry point into the Fcode (FPU microcode). FPU entry points are sent directly from dispatch to the FPU.

Each of the four dispatch positions can send a multiply request signal to the multiplier unit, and wait to see which position receives a grant signal. Once a reservation station position has the grant it can use the SAOPND and SBOPND busses to send its sources to the multiplier. It also starts counting three cycles. Nothing except a DTAG, valid status, and a selection signal are sent to the FNCU at the end of the count. The multiply result will be multiplexed onto the FNCU's RES bus. If two results are going to be written by the multiplier, the reservation station that gets the multiplier grant will send a count start signal to the (I+1) reservation station position. After four cycles the (I+1) reservation station will finish its count and let the second multiply result pass onto the RES bus for it's FNCU.

RESERVATION STATION SIGNALS

This signal list covers the reservation station at the top of its hierarchy. There are three reservation station entries covered in the RS signal list and a control section signal list covered in the RSCTL.

Reservation Station Input Signals

AXBLAC3—use A operand or B operand for linear address calc

DCPAPRHIT—data cache port A predicted way hit
DCPBPRHIT—data cache port B predicted way hit
DCUNPAHIT—data cache port A unpredicted way hit
DCUNPBHIT—data cache port B unpredicted way hit
FOCTLST_VUSE3—valid control store use next cycle
FOCTLST_VWR3—valid control store write next cycle
MULCYC2X3_3 -indicates 2 or 3 cycle multiply is required MULGRn—multiply grant to position n1

MULRES3_3—leave RES bus free for MUL result in 3 cycles MULX;

RD_DEP_DS3—entry specific read bit for DS; entry wait if both read and write are set RD_DEP_ES3—entry specific read bit for ES; entry wait if both read and write are set RD_DEP_FS3—entry specific read bit for FS; entry wait if both read and write are set RD_DEP_GS3—entry specific read bit for GS; entry wait if both read and write are set RQLAC3—request linear address calc VAT3—valid A operand tag VBT3—valid B operand tag VCFT3—valid carry flag operand tag VRS3—valid entry going from op steer to RS2

VSFT3—valid status flag operand tag

WRDS—global bit for write to DS

WRES—global bit for write to ES

WRFS—global bit for write to FS

WRGS—global bit for write to GS

[10:0] INSSEG—LSSEC segment MUX select

[10:0] RSPROTOCOL3—determines protocol (ie: LOS, MUL, DIV, etc.)

[1:0] LSCANFWD—LSSEC cancel signal for forwarded data on the LSRESn bus

[2:0] CDTAG3—current destination tag for the incoming opcode for RS2

[31:0] AOPND3—A operand

[31:0] BOPND3—B operand

[31:0] DSPR3—displacement

[31:0] LSRES0—LSSEC result bus 0

[31:0] LSRES1—LSSEC result bus 1

[31:0] RES0—forwarded result bus from position 0

[31:0] RES1—forwarded result bus from position 1

[31:0] RES2—forwarded result bus from position 2

[31:0] RES3—forwarded result bus from position 3

[3:0] F0CTLST_WR—indicates which control store vector to use

[4:0] ATAG3—A operand tag sent to RS2

[4:0] BTAG3—B operand tag sent to RS2

[4:0] CFTAG3—carry (CF) tag sent to RS2

[4:0] DTAG0—destination ID for result at position 0

[4:0] DTAG1—destination ID for result at position 1

[4:0] DTAG2—destination ID for result at position 2

[4:0] DTAG3—destination ID for result at position 3

[4:0] LSTAG0—destination ID for LS result at position 0

[4:0] LSTAG1—destination ID for LS result at position 1

[4:0] SFTAG3—status flags (ZF,AF,PF,SF,DF,OF) tag sent to RS2

[6:0] FLGD3—input flag data from the reservation station

[6:0] RFLAG0—input flag data from position 0

[6:0] RFLAG1—input flag data from position 1

[6:0] RFLAG2—input flag data from position 2

[6:0] RFLAG3 -input flag data from position 3

[6:0] RFLAGLS0—input flag data from LSSEC 0

[6:0] RFLAGLS1—input flag data from LSSEC 1

[7:0] F0CTLST_USE3—indicates which control store vector to use

RESERVATION STATION OUTPUT SIGNAL LIST

F0CTLST_VUSE—valid control store use next cycle

F0CTLST_VWR—valid control store write next cycle

FNCUGO—functional unit GO indication

FUGNT3—indicates for operand steer to drive the shared data busses into the FNCU MULCYC2X3—number of multiply cycles is 2, else use 3

MULONEOP—opcode is for the one operand version

MULRES3—leave RES bus free for MUL result in 3 cycles

MULRQn—multiply request from position n

MULSIGN—signed values

OPALSRES0—used to qualify valid status; else mispredicted way miss; Aop & DC port 0

OPALSRES1—used to qualify valid status; else mispredicted way miss; Aop & DC port 1

OPBLSRES0—used to qualify valid status; else mispredicted way miss; Bop & DC port 0

OPBLSRES1—used to qualify valid status; else mispredicted way miss; Bop & DC port 1

RSFULL—reservation station full

[10:0] INSSEG—LSSEC segment MUX select

[1:0] MULOPSIZE—output operands are 01: byte, 10: word, or 11: dword

[2:0] CDTAG—current destination tag for the incoming opcode YY use DTAG

[31:0] AOPND—A operand

[31:0] BOPND—B operand

[31:0] DSPR—displacement

[31:0] SAOPND—shared A operand bus

[31:0] SBOPND—shared B operand bus

[3:0] F0CTLST_WR—indicates which control store vector to use

[6:0] FLGD—input flag data from the reservation station

[6:0] FNCUMUXA—mux control from reservation station for A operand input

[6:01 FNCUMUXB—mux control from reservation station for B operand input

[6:0] FNCUMUXCF—mux control from reservation station for the carry flag

[6:0] FNCUMUXSF—mux control from reservation station for the status flags

[7:0] FOCTLST_USE—indicates which control store vector to use

RS: RESERVATION STATION ENTRY SIGNAL LIST

Three identical reservation station entries for each reservation station block allow storage and forwarding for three outstanding dispatch positions.

RS INPUT SIGNAL LIST

AXBLACI—use A operand or B operand for linear address calc

F0CTLST_VUSEI—valid control store use next cycle

F0CTLST_VWRI—valid control store write next cycle

MULCYC2X3I—2 or 3 cycle multiply

MULGRI—multiply grant to position n1

MULRES3I—leave RES bus free for MUL result in 3 cycles

RD_DEP_DSI—entry specific read bit for DS; entry wait if both read and write are set RD_DEP_ESI—entry specific read bit for ES; entry wait if both read and write are set RD_DEP_FSI—entry specific read bit for FS; entry wait if both read and write are set RD_DEP_GSI—entry specific read bit for GS; entry wait if both read and write are set RQLACI—request linear address calc VATI—valid A operand tag VBTI—valid B operand tag VCFTI—valid carry flag operand tag VRSI—valid entry going from op steer to RS2

VSFTI—valid status flag operand tag

[10:0] INSSEGI—LSSEC segment MUX select

[10:0] RSPROTOCOLI—determines protocol (ie: LOS, MUL, DIV, etc.)

[2:0] CDTAGI—current destination tag for the incoming opcode for RS2

[31:0] AOPNDI—A operand

[31:0] BOPNDI—B operand

[31:0] DSPRI—displacement

[31:0] LSRES0—LSSEC result bus 0

[31:0] LSRES1—LSSEC result bus 1

[31:0] RES0—forwarded result bus from position 0

[31:0] RES1—forwarded result bus from position 1

[31:0] RES2—forwarded result bus from position 2

[31:0] RES3—forwarded result bus from position 3

[3:0] F0CTLST_WRI—indicates which control store vector to use

[4:0] ATAGI—A operand tag sent to RS2

[4:0] BTAGI—B operand tag sent to RS2

[4:0] CFTAGI—carry (CF) tag sent to RS2

[4:0] DTAG0—destination ID for result at position 0

[4:0] DTAG1 destination ID for result at position 1

[4:0] DTAG2—destination ID for result at position 2

[4:0] DTAG3 destination ID for result at position 3

[4:0] LSTAG0—destination ID for LS result at position 0

[4:0] LSTAG1—destination ID for LS result at position 1

[4:0] SFTAGI—status flags (ZF,AF,PF,SF,DF,OF) tag sent to RS2

(6:0] FLGDI—input flag data from the reservation station

[6:0] RFLAG0—input flag data from position 0

[6:0] RFLAG1—input flag data from position 1

[6:0] RFLAG2—input flag data from position 2

[6:0] RFLAG3—input flag data from position 3

[6:0] RFLAGLS0—input flag data from LSSEC 0

[6:0] RFLAGLS1—input flag data from LSSEC 1

[7:0] F0CTLST_USEI—indicates which control store vector to use

RS OUTPUT SIGNAL LIST

AXBLACO—use A operand or B operand for linear address calc

F0CTLST_VUSE—valid control store use next cycle

F0CTLST_VUSEO valid control store use next cycle

F0CTLST_VWR—valid control store write next cycle

F0CTLST_VWRO—valid control store write next cycle

FNCUGO—functional unit GO indication

MULCYC2X3—number of multiply cycles is 2, else use 3 MULCYC2X3O

MULGRO—multiply grant to position n1

MULONEOP—opcode is for the one operand version

MULRES3—leave RES bus free for MUL result in 3 cycles

MULRES3O—leave RES bus free for MUL result in 3 cycles

MULSIGN—signed values

OPALSRES0—used to qualify valid status; else mispredicted way miss; Aop & DC port 0

OPALSRES1—used to qualify valid status; else mispredicted way miss; Aop & DC port 1

OPBLSRES0—used to qualify valid status; else mispredicted way miss; Bop & DC port 0

OPBLSRES1—used to qualify valid status; else mispredicted way miss; Bop & DC port 1

RD_DEP_DSO—entry specific read bit for DS; entry wait if both read and write are set RD_DEP_ESO—entry specific read bit for ES; entry wait if both read and write are set RD_DEP_FSO—entry specific read bit for FS; entry wait if both read and write are set RD_DEP_GSO—entry specific read bit for GS; entry wait if both read and write are set RQLACO—request linear address calc VATO—valid A operand tag VBTO—valid B operand tag VCFTO—valid carry flag operand tag VRSO—valid entry going from op steer to RS2

VSFTO—valid status flag operand tag

[10:0] INSSEG—LSSEC segment MUX select

[10:0] INSSEGO—LSSEC segment MUX select

[10:0] RSPROTOCOLO—determines protocol (ie: LOS, MUL, DIV, etc.)

[1:0] MULOPSIZE—output operands are 01: byte, 10: word, or 11: dword

[2:0] CDTAG—current destination tag for the incoming opcode YY use DTAG

[2:0] CDTAGO—current destination tag for the incoming opcode for RS2

[31:0] AOPND—A operand

[31:0] AOPNDO—A operand

[31:0] BOPND—B operand

[31:0] BOPNDO—B operand

[31:0] DSPR—displacement

[31:0] DSPRO—displacement

[31:0] SAOPND—shared A operand bus

[31:0] SBOPND—shared B operand bus

[3:0] F0CTLST_WR—indicates which control store vector to use

[3:0] F0CTLST_WRO—indicates which control store vector to use

[4:0] ATAGO—A operand tag sent to RS2

[4:0] BTAGO—B operand tag sent to RS2

[4:0] CFTAGO—carry (CF) tag sent to RS2

[4:0] SFTAGO—status flags (ZF,AF,PF,SF,DF,OF) tag sent to RS2

[6:0] FLGD—input flag data from the reservation station

[6:0] FLGDO—input flag data from the reservation station

[6:0] FNCUMUXA—mux control from reservation station for A operand input

[6:0] FNCUMUXB—mux control from reservation station for B operand input

[6:0] FNCUMUXCF—mux control from reservation station for the carry flag

[6:0] FNCUMUXSF—mux control from reservation station for the status flags

[7:0] F0CTLST_USE—indicates which control store vector to use

[7:0] F0CTLST_USEO—indicates which control store vector to use

RSCTL SUB-BLOCK

Controls shifting of entries within the reservation station and controls what the FNCU does and which control bit vector is used.

RSCTL INPUT SIGNAL LIST

AXBLACx—use A operand or B operand for linear address calc

DCPAPRHIT—data cache port A predicted way hit

DCPBPRHIT—data cache port B predicted way hit

DCUNPAHIT—data cache port A unpredicted way hit

DCUNPBHIT—data cache port B unpredicted way hit

MATx—match on A operand tag

MBTx—match on B operand tag

MCFTx—match on carry flag (CF) tag

MSFTx—match on status flag (STF) tag

MULCYC2X3_x—multiply takes 2 or 3 cycles MULGRn;

MULRES3_x—leave RES bus free for MUL result in 3 cycles

RD_DEP_DSx—entry specific read bit for DS; entry wait if both read and write are set RD_DEP_ESx—entry specific read bit for ES; entry wait if both read and write are set RD_DEP_FSx—entry specific read bit for FS; entry wait if both read and write are set RD_DEP_GSx—entry specific read bit for GS; entry wait if both read and write are set RQLACx—request linear address calc VATx—valid A operand tag VBTx—valid B operand tag VCFTx—valid carry flag operand tag VRSx—valid entry going from op steer to RS2

VSFTx—valid status flag operand tag

WRDS—global bit for write to DS

WRES—global bit for write to ES

WRFS—global bit for write to FS

WRGS—global bit for write to GS

[10:0] RSPROTOCOLx—determines protocol (ie: LOS, MUL, DIV, etc.)

[1:0] LSCANFWD—LSSEC cancel signal for forwarded data on the LSRESn bus

RSCTL OUTPUT SIGNAL LIST

FNCUGO—functional unit GO indication

FUGNT0—indicates for operand steer to drive the shared data busses into the FNCU FUGNT1—indicates for operand steer to drive the shared data busses into the FNCU FUGNT2—indicates for operand steer to drive the shared data busses into the FNCU FUGNT3—indicates for operand steer to drive the shared data busses into the FNCU MULRQn—request use of multiplier R0SHF—shift new data into entry 0

R1SHF—shift new data into entry 1 R2SHF—shift new data into entry 2

RSFULL—reservation station full

OPERAND STEERING

The operand steering sections purpose is to give an extra cycle to gather source data together for the reservation station or functional unit and to provide time to decode opcodes into two vectors of fully decoded control signals for the functional unit. Since several units may be sending data/tags to the operand steering block at the same time, the operand steering section uses the following priority: 1) tags, 2) FIROB data, 3) REGF. The incoming data for the two sources may also be in the incorrect position, and the operand steering section will need to swap the sources to the correct positions for the A and B operands. The operand steering section will also need to detect any forwarding and have RS2 latch in the forwarded data. The operand steering section cannot issue directly to the functional unit while using forwarded data. Reservation station entries however can be issued to the functional unit while forwarded busses arrive at the FNCU inputs at the same cycle.

TAG BUS

The ATAG and BTAG busses are used for renaming when the actual operand value is not available to be sent to the reservation station. The tag takes the form of three bits representing the FIROB line. The entry position on the FIROB line is understood by the physical placement of each operand steering section. Since each functional unit only drives its own dedicated result bus, the reservation stations compare for the FIROB line value on the three bits of the corresponding result bus The tag entry on a given FIROB line is known by the physical placement of the FNCU and its dedicated result bus. The only exception is data for the LSRES1 and LSRES0 busses; the tag of the entry that made the load request is driven on the LSTAG0 or LSTAG1 busses. For example when the operation for FIROB line 2 entry 3 is waiting on the LSSEC for the load data, it will compare both the LSRES0 and LSRES1 busses for the 010_11 tag. Instead of watching for a tag from another FNCU, the reservation station is watching its own tag to be sent along with load data from the LSSEC.

Vector Generation for the Vector Bit Control Store (VBCS)

During the operand steering cycle, the two vectors per dispatch position entry will be generated. The FNCU does not have time to decode an opcode, execute the opcode, and generate flags in one cycle. The opcode generation has been pushed back in to the operand steering section while the flag generation has been pushed out to the cycle after execution. A seven bit opcode comes from decode to the operand steering section along with five bits of reservation station control protocol. This information and some other signals such as size, ahbyte, etc. are used by the operand steering section to generate the two vectors. Sometimes the first vector will be used for linear address generation while the second is used for the actual opcode. For the divide opcodes there will be a division direction signal held locally at the FNCUO. This signal determines when to use vector0 (ADD) or vector1 (SUB).

RESERVATION STATION PROTOCOL CONTROL

This table is used to give control signals to the reservation station and decide what types of control vectors and status signals to generate.

| | | | |
|---|---|---|---|
| OP - | operation only valid | | |
| | (v0: na {0}; | v1: operation {F}) | |
| TOP - | two opcode are fully supplied | | |
| | (not used by uCode) | | |
| | (fast path only) | | |
| | (v0: decode supplied; | v1: decode supplied) | |
| V12 - | v0 fwd to v1 | | |
| | (v0: Bop+const {I}; | v1: operation {F}) | |
| LO - | Load-Operation | | |
| | (v0: Bop+disp {Lw}; | v1: operation {F}) after v0, BTAG=DTAG | |
| LOS - | Load-OP-Store | | |
| | (v0: Aop+disp {Lw}; | v1: op & store {M}) after v0, BTAG=DTAG | |
| OS - | op-store | | |
| | (v0: Aop+disp {L}; | v1: op & store {M}) | |
| SRB - | SRB info | | |
| | (v0: na {0}; | v1:pass Bop {S}) | |
| FLA - | fpu linear adr | | |
| | (v0: Bop+disp {I}; unlike regular linear adr calc; this one immediately clears the resv_sta entry | v1: fwd+const {L}) | |
| BRN - | Branch eval | | |
| | (v0: na {0}; | v1: operation,brn eval {B}) | |
| LBR - | Load-brn (RET) | | |
| | (v0: Aop+disp {Lw}; | v1: operation,brn eval {B}) | |
| SIB - | 1st pos SIB | | |
| | (v0: Aop+scaled(Bop) {F}; | v1: na {0}) | |
| PU - | Push | | |
| | (v0: Aop-const {L,F} | v1: op & store {M}) | |
| POP - | Pop | | |
| | (v0: Aop+const {F} | v1: na {0}) | |

The following letters indicate which blocks should latch data off the RES bus (enclosed in { })

0 (nothing)

F (FIROB or FNCU forwarding)

L (linear address for store)

Lw (linear address for load; Res_sta changes Bop= DTAG and waits)

M (memory data for store only)

S (SRB)

B (Branch eval info for FIROB)

I (intermediate value; ignored for forwarding except for same Res sta)

Definitions of the Flag Equations and the Opcode Bus

Flag Equation Groups

| | | |
|---|---|---|
| ADD_F | 3'b000 | // flag equations for addition, sub, etc. |
| LOG_F | 3'b001 | // flag equations for logical |
| CMC_F | 3'b010 | // flag equations for complement CF |
| BCD_FS | 3'b011 | // flag equations for AAA, AAS |
| BCD_FC | 3'b100 | // flag equations for AAA, AAS |
| DAA_FS1 | 3'b101 | // flag equations for DAA, DAS |
| STD_F | | // flag equations for STD |
| CLD_F | | // flag equations for CLD |

The opcode groups form the first three bits of the opcode. A fourth bit may be needed if new opcodes are added.

Opcode Groups

| | | |
|---|---|---|
| G_ALU | 3'b000 | // |
| G_BRN_ALU | 3'b001 | // |
| G_XFR | 3'b010 | // |
| G_SFT | 3'b011 | // |
| G_BIT | 3'b100 | // |
| G_MUL | 3'b101 | // |
| G_DIV | 3'b110 | // |
| G_IDIV | 3'b111 | // |

Basic ALU group

| | | | |
|---|---|---|---|
| ADD | 3'b000 | // R <- A + B | p=1001, g=110 |
| OR | 3'b001 | // R <- A \| B | p=1000, g=111 |
| ADC | 3'b010 | // R <- A + B + CF | p=1001, g=110 |
| SBB | 3'b011 | // R <- A - B + CF | p=0110, g=101 |
| AND | 3'b100 | // R <- A & B | p=1110, g=111 |
| SUB | 3'b101 | // R <- A - B | p=0110, g=101 |
| XOR | 3'b110 | // R <- A ^ B | p=1001, g=111 |
| MULH | 3'b111 | // this opcode is a NOP which holds a res sta slot and waits for | |
| | | // the 2nd multiply result to request to drive data to the FNCU | |

Branch and extended ALU group (for BRN >>> FNCU receives: A <- EIP, disp <- rel, B <- pred addr)

| | | | |
|---|---|---|---|
| JMPRI | 3'b000 | // R <- A | register indirect (uncond); source = r16, r32, [r16 + d16], or [r32+d32] & set R_BRN_ADR |
| JMP | 3'b001 | // R <- A + disp | jump relative (uncond) & set R_BRN_ADR |
| JMPCC | 3'b010 | // R <- A + disp | jump relative if condition true & set R_BRN_OK, R_BRN_NT, or R_BRN_ADR |
| SETCC | 3'b011 | // R (0) <- 1'b1 | set result bit 0 if condition true |
| ANDN | 3'b100 | // R <- A & XB | p=1101, g=111 |
| SUBR | 3'b101 | // R <- B - A | p=0110, g=011 |
| DFADD | 3'b110 | // R <- A + B | p=1001, g=110 <-when EFLAGDF=0 |
| | | // R <- A - B | p=0110, g=101 <-when EFLAGDF=1 |
| MOVCC | 3'b111 | // R <- B | p=1010, g=111 <-when condition is true |
| | | // R <- A | p=1010, g=111 ignore adder result and pass Aop when cond. false |

Transfer group

| | | | |
|---|---|---|---|
| MOVSX | 3'b000 | // R <- B | p=1010, g=111 sign extend B |
| MOVZX | 3'b001 | // R <- B | p=1010, g=111 zero extend B |
| SIGNXA | 3'b010 | // R <- A | p=1100, g=111 sign extend A |
| ZEROXA | 3'b011 | // R <- A | p=1100, g=111 zero extend A |
| MOVDSPSX | 3'b100 | // R <- disp | p=1010, g=111 sign extend disp |
| MOVDSPZX | 3'b101 | // R <- disp | p=1010, g=111 zero extend disp |
| LEAA | 3'b110 | // R <- A+disp | p=1001, g=110 loads effective address (Aside) |
| LEAB | 3'b111 | // R <- B+disp | p=1001, g=110 loads effective address (Bside) |

Shift group

| | | |
|---|---|---|
| ROL | 3'b000 | // rotate left |
| ROR | 3'b001 | // rotate right |
| RCL_1 | 3'b010 | // rotate left through carry (1 bit only) |
| RCR_1 | 3'b011 | // rotate right through carry (1 bit only) |
| SHL | 3'b100 | // shift left arithmetic or logical |

111 -continued

| | | |
|---|---|---|
| SHR | 3'b101 | // shift right logical |
| RC0 | 3'b110 | // initial step of rotate through carry sequence |
| SAR | 3'b111 | // shift right arithmetic |

Bit group

| | | |
|---|---|---|
| BT | 3'b000 | // bit test |
| LAHF | 3'b001 | // load flags into AH<br>R <- flags<br>(sf:zf:00:af:00:pf:00:df) |
| SAHF | 3'b010 | // store AH into flags R <- A;<br>flags <- A (low byte)<br>(sf:zf:00:af:00:pf:00:df) |
| MOVF | | // combine Bop and flag to form result |
| MOVOF | | // overwrite the OF position of Bop to form result |
| MOVDF | | // overwrite the DF position of Bop to form result |
| BSF | 3'b011 | // bit scan forward |
| BSR | 3'b100 | // bit scan reverse |
| BTS | 3'b101 | // bit test and set |
| BTR | 3'b110 | // bit test and reset |
| BTC | 3'b111 | // bit test and complement |

Multiply group

| | | |
|---|---|---|
| MUL16 | 3'b000 | // R (word) <- A * B (byte) |
| IMUL16 | 3'b001 | // R (word) <- A * B (byte) |
| IMUL16S | 3'b010 | // R (word) <- A * B (word) |
| MUL32 | 3'b011 | // R (low word) <- A * B (word);<br>allocate high word with MULH |
| IMUL32 | 3'b011 | // R (low word) <- A * B (word);<br>allocate high word with MULH |
| IMUL32S | 3'b011 | // R (dword) <- A * B (dword) |
| MUL64 | 3'b011 | // R (low dword) <- A * B (dword);<br>allocate high dword with MULH |
| IMUL64 | 3'b011 | // R (low dword) <- A * B (dword);<br>allocate high dword with MULH<br>// if result fits in A then CF=OF=0<br>else CF=OF=1; SF=ZF=AF=PF=xxx |

DIV group

| | | |
|---|---|---|
| DIV | 3'b000 | // p=1001, g=110 <-when SDF= 0<br>// p=0110, g=101 <-when SDF= 1 |
| DIVL | 3'b001 | // p=1001, g=110 <-when SDF= 0<br>// p=0110, g=101 <-when SDF= 1 |
| DIV0 | 3'b010 | |
| DIVREM | 3'b011 | // p=1001, g=110 <-when SDF= 0<br>// p=1100, g=111 <-when SDF= 1 |
| DIVCMP | 3'b100 | // p=0110, g=101 |
| DIVQ | 3'b101 | // |
| DIV_X0 | 3'b110 | // not used |
| DIV_X1 | 3'b111 | // not used |

IDIV group

| | | |
|---|---|---|
| IDIVSGN | 3'b000 | // p=0110, g=101 |
| IDIVCMP | 3'b001 | // p=0011, g=111<br>// p=0011, g=111 |
| IDIVDEND0 | 3'b010 | // p=0011, g=111 |
| IDIVDEND1 | 3'b011 | // p=0011, g=111 |
| IDIVSOR | 3'b100 | // p=0011, g=111 |
| IDIVQ | 3'b101 | // p=0011, g=111 |
| IDIV_X0 | 3'b110 | // not used |
| IDIV_X1 | 3'b111 | // not used |

// *note: JMP w/ R <- immed will be handled in the IFETCH for absolute jump using immediate value The following two groups of encodings indicate what the RES bus of the functional unit contains.

STATUS Signals for RES bus

| | |
|---|---|
| [10:0] INSLSB | indicates segment information for LSSEC |
| F0BRN_ADR; | assert proper branch status |
| F0BRN_NT; | assert proper branch status |
| F0BRN_OK; | assert proper branch status |
| F0BRN_T_ADR; | assert proper branch status |
| F0BRN_T_OK; | assert proper branch status |

112 -continued

| | |
|---|---|
| F0STAT_LD; | RES bus status - load linear address |
| F0STAT_MUL; | RES bus status - multiplier |
| F0STAT_NONE; | RES bus status - no result |
| F0STAT_OPST; | RES bus status - operand data for a store |
| F0STAT_SRB; | RES bus status - SRB information |
| F0STAT_ST; | RES bus status - store linear address |
| F0STAT_VAL; | RES bus status - valid |
| [10:0] INSLSB; | LSSEC segment MUX |
| [2:0] DTAG; | destination tag |

Operand Steering Section Signal List
Inputs from the REGF and FIROB

| | |
|---|---|
| FLAGCFDATn; | CF flag from FIROB |
| FLAGXFDATn; | CF flag from FIROB |
| RESET; | resets all processes in the multiplier and GRNT_CNT |
| ROBDCKnDAT1; | use the data from FIROB for pointer 1 |
| ROBDCKnDAT2; | use the data from FIROB for pointer 2 |
| SWAPPTR1W2; | swap pointer 1 data with pointer 2 data |
| VATIn; | A TAG is valid - don't use data for Aoperand |
| VBTIn; | B TAG is valid - don't use data for Boperand |
| VCFTIn; | CF TAG is valid - don't use data for carry flag |
| VFLAGCFnD; | valid flag data on the CF flag bus |
| VFLAGXFnD; | valid flag data on the status flag bus |
| VSFTIn; | XF TAG is valid - don't use data for status flags |
| [2:0] DESTAGn; | destination tag which indicates the ID of entry |
| [31:0] DISPIMM; | displacement and immediate data (immediate will go to Bop bus) |
| [31:0] RBnDAT1; | FIROB data for pointer1 |
| [31:0] RDnREG1; | data from the register read of pointer 1 |
| [31:0] RDnREG2; | data from the register read of pointer 2 |
| [3:0] CONSTD; | four bits of constant offsets for PUSHes, POPs, and FPU linear addresses |
| [4:0] ATAGIn; | A tag |
| [4:0] BTAGIn; | B tag |
| [4:0] CFTAGIn; | CF tag |
| [4:0] SFTAGIn; | XF tag |

Inputs from the decode / ucode

| | |
|---|---|
| RD_DEP_DS; | entry specific read bit for DS; entry wait if both read and write are set |
| RD_DEP_ES; | entry specific read bit for ES; entry wait if both read and write are set |
| RD_DEP_FS; | entry specific read bit for FS; entry wait if both read and write are set |
| RD_DEP_GS; | entry specific read bit for GS; entry wait if both read and write are set |
| VALPOS; | valid entry going from op steer to RS2 |
| WRDS; | global bit for write to DS |
| WRES; | global bit for write to ES |
| WRFS; | global bit for write to FS |
| WRGS; | global bit for write to GS |
| [3:0] FLGEQ_CC_CHK; | flag equation or condition code checks |
| [3:0] OPSIZE; | size position of result (dword, word, ah, al) |
| [3:0] SEGSEL; | LSSEC segment MUX select |
| [4:0] PROTOCOL; | determines protocol (ie: LOS, MUL, DIV, etc.) RQLAC AXBLAC |
| [6:0] OPCODE2; | this is for extra control of vector 2 by the fast path (not for ucode)- might this remove later |
| [6:0] OPCODE; | the main opcode for both fast path and ucode |

Outputs for the reservation station control

| | |
|---|---|
| MULCYC2X3N; | number of multiply cycles is 2, else use 3 |
| RSRD_DEP_DS; | entry specific read bit for DS; entry wait if both read and write are set |
| RSRD_DEF_ES; | entry specific read bit for ES; entry wait if both read and write are set |

-continued

| | |
|---|---|
| RSRD_DEP_FS; | entry specific read bit for FS; entry wait if both read and write are set |
| RSRD_DEP_GS; | entry specific read bit for GS; entry wait if both read and write are set |
| [10:0] RSPROTOCOL; | determines protocol (ie: LOS, SRB, DIV, etc.) |

Outputs for the reservation station entries

| | |
|---|---|
| FLGCFDATn; | CF flag from FIROB |
| FLGXFDATn; | CF flag from FIROB |
| VATn; | A TAG is valid - don't use data for Aoperand |
| VBTn; | B TAG is valid - don't use data for Boperand |
| VCFTn; | CF TAG is valid - don't use data for carry flag |
| VFLGCFnD; | valid flag data on the CF flag bus |
| VFLGXFnD; | valid flag data on the status flag bus |
| VSFTn; | XF TAG is valid - don't use data for status flags |
| [10:0] INSSEG; | LSSEC segment MUX select |
| [2:0] CDTAG; | current destination tag for the incoming opcode |
| [31:0] AOPND; | A operand |
| [31:0] BOPND; | B operand |
| [31:0] DSPR; | displacement |
| [3:0] CONST; | constant offset value for PUSHes, POPes, FPU linear addresses |
| [4:0] ATAGn; | A tag |
| [4:0] BTAGn; | B tag |
| [4:0] CFTAGn; | CF tag |
| [4:0] SFTAGn; | XF tag |

Outputs for control store - shared for both vectors (for FNCU0 only)

| | |
|---|---|
| F0CTLST_VWR; | valid control store write next cycle |
| F0DIV0; | initial divide opcode |
| F0DIV; | divide opcode |
| F0DIVCMP; | divide opcode |
| F0DIVL; | divide opcode |
| F0DIVQ; | divide opcode |
| F0DIVREM; | divide opcode |
| F0DIVSGN; | divide opcode |
| F0IDIVCMP; | divide opcode |
| F0IDIVDEND0; | divide opcode |
| F0IDIVDEND1; | divide opcode |
| F0IDIVSOR; | divide opcode |
| F0SELOPA; | The initial quotient is from operand A else from adder output |
| F0UPDDF; | update division direction bit |
| F0UPDQ; | update division quotient |
| SELSQXOPA; | indicates that quotient gets shifted quotient slave instead of adder or OPA |
| [3:0] F0CTLST_WR; | indicates which control store vector to use |
| [7:0] F0CTLST_USE; | indicates which control store vector to use |

Outputs for control store - shared for both vectors FNCU1, FNCU2, and FNCU3

| | |
|---|---|
| F0CTLST_VWR; | valid control store write next cycle |
| [3:0] F0CTLST_WR; | indicates which control store vector to use |
| [7:0] F0CTLST_USE; | indicates which control store vector to use |
| [7:0] FRESMUX; | select lines for MUX to RES bus |

Outputs for control store - vector 0 ; no shifts allowed

| | |
|---|---|
| AXBLAC0; | indicates if operand A or B is used for linear addr calc |
| F0ADD_F0; | addition type flag generation |
| F0BCD_FC0; | BCD clear type flag generation |
| F0BCD_FS0; | BCD set type flag generation |
| F0CIN0; | carry-in from the control block |
| F0CLD_F0; | clear direction flag generation |
| F0CMC_F0; | complement carry type flag generation |
| F0COMPB0; | complement the B operand |
| F0COND_CODE0; | evaluate condition codes |
| F0DAA_FS0; | DAA type flag generation |
| F0FLAGCF0; | opcode requires using a version of EFLAGSCF |
| F0LOG_F0; | logical type flag generation |
| F0MOVCC0; | MOVCC instruction |
| F0MUXCIN0; | carry-in MUX |
| F0MUXDF0; | direction flag MUX |
| F0SETCC0; | SETCC instruction |
| F0SETCF0; | ADC uses true version of EFLAGSCF else ~EFLAGSCF |
| F0STD_F0; | store direction flag generation |
| F0UNC_BRN0; | unconditional branch evaluation |
| FISTAT_BRN0; | assert proper branch status |
| FISTAT_LD0; | RES bus status - load linear address |
| FISTAT_MUL0; | RES bus status - multiplier |
| FISTAT_NONE0; | RES bus status - no result |
| FISTAT_OPST0; | RES bus status - operand data for a store |
| FISTAT_SRB0; | RES bus status - SRB information |
| FISTAT_ST0; | RES bus status - store linear address |
| FISTAT_VAL0; | RES bus status - valid |
| RQLAC0; | linear address calculation |
| SIGNXA0; | sign extend the A operand |
| SIGNXB0; | sign extend the B operand |
| SIGNXD0; | sign extend the D operand |
| USEOFFSET0; | use offset for PUSH, POP, or FPU lin adr calc |
| ZEROXA0; | zero extend the A operand |
| ZEROXB0; | zero extend the B operand |
| ZEROXD0; | zero extend the D operand |
| [1:0] AHBYTE0; | alignment select bits0;move bits 15:8 to 7:0 |
| [2:0] F0GIN0; | generate style inputs (used here to indicate type of operation) |
| [3:0] F0PIN0; | propagate style inputs (used here to indicate type of operation) |
| [3:0] OPSIZEIN0; | size position of result (dword, word, ah, al) |
| [4:0] F0SCALE0; | scale for SIB: 8, 4, 2, 1, 0 |
| [7:0] FRESMUX0; | select lines for MUX to RES bus |

Outputs for control store - vector 1 ; shifts allowed

| | |
|---|---|
| AXBLAC1; | indicates if operand A or B is used for linear addr calc |
| F0ADD_F1; | addition type flag generation |
| F0BCD_FC1; | BCD clear type flag generation |
| F0BCD_FS1; | BCD set type flag generation |
| F0CIN1; | carry-in from the control block |
| F0CLD_F1; | clear direction flag generation |
| F0CMC_F1; | complement carry type flag generation |
| F0COMPB1; | complement the B operand |
| F0COND_CODE1; | evaluate condition codes |
| F0DAA_FS1; | DAA type flag generation |
| F0FLAGCF1; | opcode requires using a version of EFLAGSCF |
| F0LOG_F1; | logical type flag generation |
| F0MOVCC1; | MOVCC instruction |
| F0MUXCIN1; | carry-in MUX |
| F0MUXDF1; | direction flag MUX |
| F0SETCC1; | SETCC instruction |
| F0SETCF1; | ADC uses true version of EFLAGSCF else ~EFLAGSCF |
| F0STD_F1; | store direction flag generation |
| F0UNC_BRN1; | unconditional branch evaluation |
| FISTAT_BRN1; | assert proper branch status |
| FISTAT_LD1; | RES bus status - load linear address |
| FISTAT_MUL1; | RES bus status - multiplier |
| FISTAT_NONE1; | RES bus status - no result |
| FISTAT_OPST1; | RES bus status - operand data for a store |
| FISTAT_SRB1; | RES bus status - SRB information |
| FISTAT_ST1; | RES bus status - store linear address |
| FISTAT_VAL1; | RES bus status - valid |
| RQLAC1; | linear address calculation |
| SHFBCMP1; | indicates a Bit Test and Complement |
| SHFBITEST1; | a select signal for any Bit Test opcode |
| SHFBITOPA1; | a select signal for only the BTEST (BT) opcode |
| SHFBSF1; | select signal for Bit Scan Forward |
| SHFBSR1; | select signal for Bit Scan Reverse |

-continued

| | |
|---|---|
| SHFBSXR1; | indicates a set/reset for bit test instruction |
| SHFEFLAG1; | merge Bop & all flags into result |
| SHFFLGDF1; | overwrite the DF position of Bop to form result |
| SHFFLGOF1; | overwrite the OF position of Bop to form result |
| SHFLAHF1; | load Flags into AH opcode |
| SHFLEFT1; | indicates RCL, ROL, or SHL opcode |
| SHFRIGHT1; | indicates RCR, ROR, SAR, or SHR opcode |
| SHFROT1; | indicates a rotate or SHL opcode |
| SHFSAHF1; | store AH into Flags opcode |
| SHFSELSF31_1; | set the sign flag to the shifter output bit 31 |
| SHFSETCF1; | set carry flag for RCL & RCR equal to EFLAGSCF |
| SHF_UPD_RC1; | select for updating the local carry flag |
| SIGNXA1; | sign extend the A operand |
| SIGNXB1; | sign extend the B operand |
| SIGNXD1; | sign extend the D operand |
| USEOFFSET1; | use offset for PUSH, POP, or FPU lin adr calc |
| ZEROXA1; | zero extend the A operand |
| ZEROXB1; | zero extend the B operand |
| ZEROXD1; | zero extend the D operand |
| [1:0] AHBYTE1; | alignment select bits0;move bits 15:8 to 7:0 |
| [21:0] SHFSELPRE1; | the preshift mux select signals |
| [2:0] F0GIN1; | generate style inputs (used here to indicate type of operation) |
| [2:0] SHFSELZF1; | determines which groups of bit to use for setting the zero flag |
| [3:0] F0PIN1; | propagate style inputs (used here to indicate type of operation) |
| [3:0] OPSIZEIN1; | size/position of result (dword, word, ah, al) |
| [3:0] SHFSELOF1; | determines which groups of bit to use for setting the overflow flag |
| [3:0] SHFSELOUT1; | indicates final byte alignment for the shifter output |
| [7:0] FRESMUX1; | select lines for MUX to RES bus |
| [7:0] SHFSELCF1; | determines which shifter bits to use to set the carry flag |
| [9:0] SHFSELCNT1; | mux select signals determining source of shifter count value |

FUNCTIONAL UNIT (FNCU)

Figure 31:
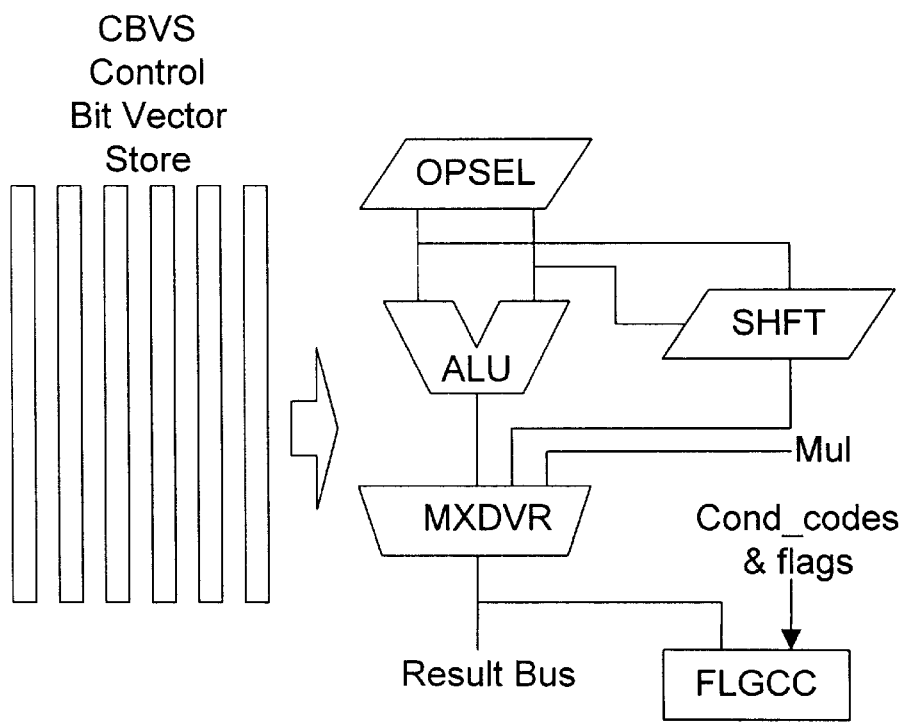

This section covers the functional unit (FNCU) which contains the ALU, branch evaluation, and shifter. The six sub blocks of the FNCU are the CBVS (control bit vector store), the OPSEL (operand selection and alignment), the ALU (for logical and arithmetic operations), the SHFT (shifter), the FLGCC (flag generations, branch/condition code evaluation), and the MXDVR (output multiplier, alignment, and drivers). An overview of basic flow (shown in FIG. 31) is that all opcode, tag, and operand information goes to the operand steering section where the appropriate information is determined and driven onto the A operand, B operand, A tag, B tag, and other busses. Also some decode is done in the operand steering section for such information as the P and G bits for the given opcode. The operand steering section drives RS2 of the reservation station block. Reservation station control logic latches in tags at the beginning of the cycle, compares to determine if forwarding can be done, and prioritizes which reservation station will drive the FNCU. At the beginning of the next cycle the DTAG for the opcode to be executed that cycle is driven out to allow other reservation stations to forward during the following cycle. Then a short delay is given to allow the latched in MUX controls, the P and G bits, and other input information to set up the adder or shifter. Then if needed, the B operand can be aligned (bits 15:8 to 7:0, or scaled 1×,2×,4×,8×) or complemented. The execution (add, and, shift, etc) then takes place, and the output of the adder is driven ASAP for bits 14:0 to the RESLA bus. Two control bit vectors can be used by each entry in the reservation station. These vectors come from decoding logic in the operand steering block and the Idecode block. For example one vector could be for linear address calculation while the second is for the actual operation. Another example is that one vector could represent an ADD while the other represents a SUB and the division direction flag would be used to choose the vector to use. The FDRES bus drives (with minimum capacitive load) to the input MUXes of the FNCUs. The FDRES bus also is buffered to become the RES (result) bus which goes to the reservation stations (not for immediate forwarding), LSSEC, and the FIROB data block.

Branch evaluations are performed in the FNCU with a branch address being generated along with a branch status. Logical load/store address are calculated in the FNCU and sent out on the LSSEC bus (also RESLA) bus with a corresponding encoding on the status bus to identify them. Multiply operands are sent from the reservation station onto the A operand and B operand busses and then onto the shared tristate SAOPND and SBOPND busses (shared A operand) to the multiplier and the floating point unit.

Figure 32:
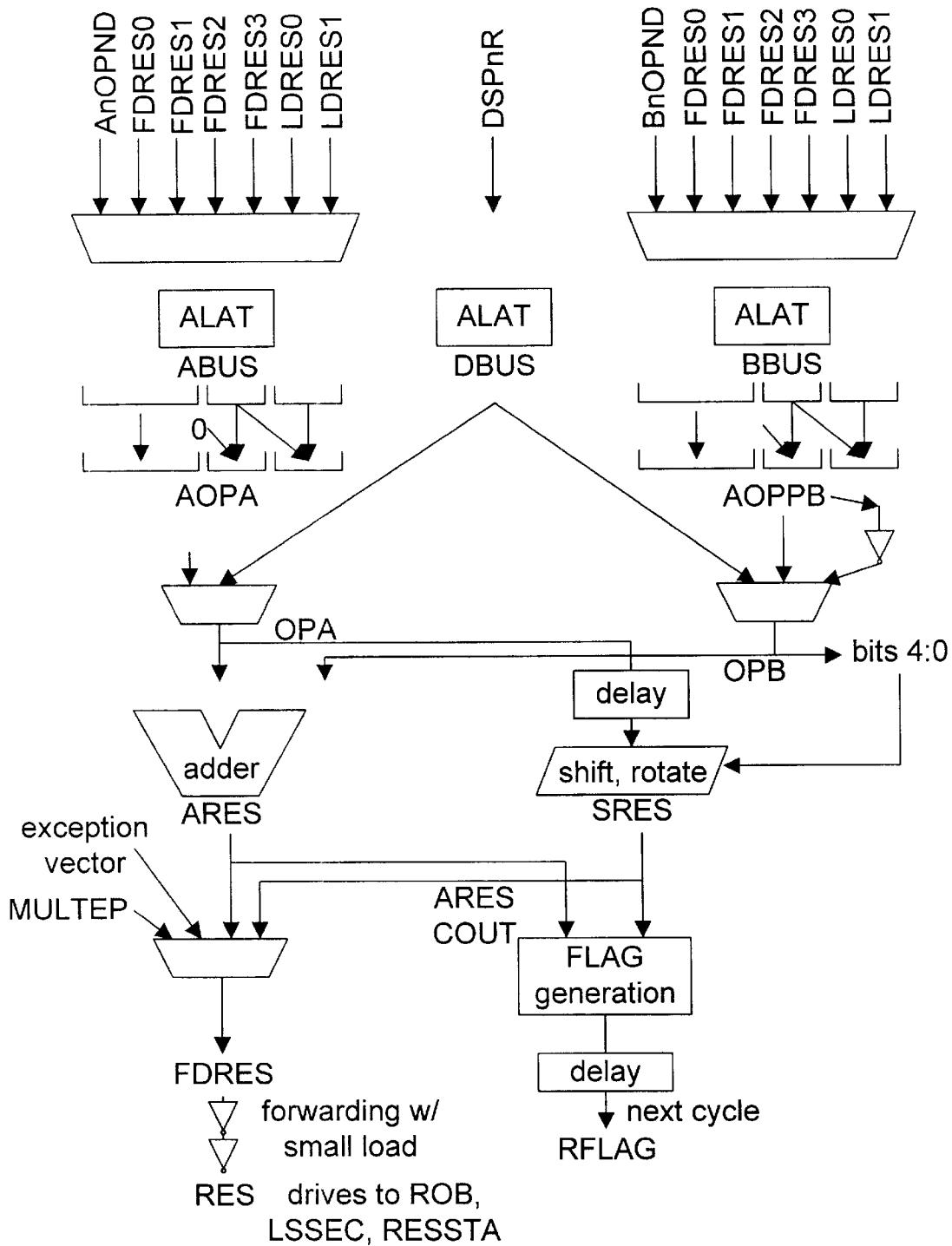

RFLAGs (result flags: {ZF,AF,PF,SF,DF,OF}) are generated the during the cycle following the execution of the corresponding opcode. The carry flag {CF} is generated the same cycle that the result gets generated. A block diagram of a functional unit is shown as FIG. 32.

Basic Flow of Operands to the FNCU

This section will cover the general flow of operands meeting up with their opcodes. For more detailed descriptions, refer to the sections on operand steering and on dependency checking. Forwarding is used here to indicate that a unit other than the FIROB has watched the DTAG busses and LSTAG busses for a renamed value (eg: EAX renamed to DTAG=2_0) and latched the value off of the corresponding result bus. The operand steering blocks, the 12 reservation stations, and the FNCU can all receive data by forwarding; the multiplier cannot. In some cases such as receiving load data from the LSRES busses, both the FNCU and the reservation station can receive the forwarded data. The FNCU will execute the opcode using the forwarded data, and the reservation station that issued that opcode would hold the entry for an extra cycle just in case a miss or way_misprediction signal comes back. In the following example, the B, C, and D instructions are all waiting for data that is generated by the A instruction.

Example:

| instruction ID | instruction | |
|---|---|---|
| A | DTAG=1_0 | ADD EAX,immed |
| B | DTAG=2_1 | SUB EBX,EAX |
| C | DTAG=3_0 | XOR ECX,EAX |
| D | DTAG=4_3 | OR EDX,EAX |

| | Cycle | | | | |
|---|---|---|---|---|---|
| Stage | 1 | 2 | 3 | 4 | 5 |
| dep. chec decode | inst A dtag= 1_0 | inst B dtag= 2_1 | inst C dtag= 3_0 | inst D dtag= 4_3 | |
| REGF access | | btag= 1_0 | | EAX from regf | |
| operand steering | | inst A dtag= 1_0 | inst B dtag= 2_1 | inst C dtag= 3_0 | inst D dtag= 4_3 |

|  | btag= 1_0 | EAX from FIROB | EAX from regf |
|---|---|---|---|
| execute | inst A | inst B | inst C |
|  | dtag= 1_0 forward- | dtag= 2_1 | dtag= 3_0 |
| writeback (same as dep check stage) | ing | inst A dtag= 1_0 | inst B dtag= 2_1 |

The B instruction uses forwarding to get the operand steering section to receive the EAX result from the A instruction. The C instruction gets its EAX data from the FIROB, and the D instruction gets its EAX data from the REGF. The "A" result tags are driven through cycle 3 so that any other reservation stations or the operand steering section can detect BTAG=1_0 and latch the "A" result value at the end of cycle 3. No "A" result tag information is being broadcast in cycle 4, so the C instruction cannot receive EAX by forwarding. This example assumes that the FIROB is writing back every cycle; otherwise, the D instruction would also get its EAX data from the FIROB if EAX had not been written back yet. The operand steering must have tag compare logic inside it to get the EAX operand.

ALU/Shift/Rotate/Branch Opcodes

The following encodings determine which flag equations to generate. Separate signals are sent from the Idecode to the FIROB to indicate which combination of the three flag groups gets written back by the FIROB to the EFLAGS0 (standard) or EFLAGS1 (scratch) registers.

Flag Equation Groups

| | | |
|---|---|---|
| ADD_F | 3'b000 | // flag equations for addition, sub, etc. |
| LOG_F | 3'b001 | // flag equations for logical |
| CMC_F | 3'b010 | // flag equations for complement CF |
| BCD_FS | 3'b011 | // flag equations for AAA, AAS |
| BCD_FC | 3'b100 | // flag equations for AAA, AAS |
| DAA_FS1 | 3'b101 | // flag equations for DAA, DAS |
| STD_F | | // flag equations for STD |
| CLD_F | | // flag equations for CLD |

Basic ALU group

| | | | |
|---|---|---|---|
| ADD | 3'b000 | // R <- A + B | p=1001, g=110 |
| OR | 3'b001 | // R <- A \| B | p=1000, g=111 |
| ADC | 3'b010 | // R <- A + B + CF | p=1001, g=110 |
| SBB | 3'b011 | // R <- A - B + CF | p=0110, g=101 |
| AND | 3'b100 | // R <- A & B | p=1110, g=111 |
| SUB | 3'b101 | // R <- A - B | p=0110, g=101 |
| XOR | 3'b110 | // R <- A ^ B | p=1001, g=111 |
| MULH | 3'b111 | // this opcode is a NOP which holds a res sta slot and waits for // the 2nd multiply result to request to drive data to the FNCU | |

Branch and extended ALU group (for BRN >>> FNCU receives: A <- EIP, disp <- rel, B <- pred addr)

| | | | |
|---|---|---|---|
| JMPRI | 3'b000 | // R <- A register indirect (uncond); source = r16, r32, [r16 + d16], or [r32+d32]& set R_BRN_ADR | |
| JMP | 3'b001 | // R <- A + disp jump relative (uncond) & set R_BRN_ADR | |
| JMPCC | 3'b010 | // R <- A + disp jump relative if condition true & set R_BRN_OK, R_BRN_NT, or R_BRN_ADR | |
| SETCC | 3'b011 | // R(0) <- 1'b1 set result bit 0 if condition true | |
| ANDN | 3'b100 | // R <- A & XB | p=1101, g=111 |
| SUBR | 3'b101 | // R <- B - A | p=0110, g=011 |

| | | | |
|---|---|---|---|
| DFADD | 3'b110 | // R <- A + B | p=1001, g=110 <-when EFLAGDF=0 |
|  |  | // R <- A - B | p=0110, g=101 <-when EFLAGDF=1 |
| MOVCC | 3'b111 | // R <- B | p=1010, g=111 <-when condition is true |
|  |  | // R <- A | p=1010, g=111 ignore adder result and pass Aop when cond. false |

Transfer group

| | | | |
|---|---|---|---|
| MOVSX | 3'b000 | // R <- B extend B | p=1010, g=111 sign |
| MOVZX | 3'b001 | // R <- B extend B | p=1010, g=111 zero |
| SIGNXA | 3'b010 | // R <- A extend A | p=1100, g=111 sign |
| ZEROXA | 3'b011 | // R <- A extend A | p=1100, g=111 zero |
| MOVDSPSX | 3'b100 | // R <- disp extend disp | p=1010, g=111 sign |
| MOVDSPZX | 3'b101 | // R <- disp extend disp | p=1010, g=111 zero |
| LEAA | 3'b110 | // R <- A+disp loads effective address (Aside) | p=1001, g=110 |
| LEAB | 3'b111 | // R <- B+disp loads effective address (Bside) | p=1001, g=110 |

Shift group

| | | |
|---|---|---|
| ROL | 3'b000 | // rotate left |
| ROR | 3'b001 | // rotate right |
| RCL_1 | 3'b010 | // rotate left through carry (1 bit only) |
| RCR_1 | 3'b011 | // rotate right through carry (1 bit only) |
| SHL | 3'b100 | // shift left arithmetic or logical |
| SHR | 3'b101 | // shift right logical |
| RC0 | 3'b110 | // initial step of rotate through carry sequence |
| SAR | 3'b111 | // shift right arithmetic |

Bit group

| | | |
|---|---|---|
| BT | 3'b000 | // bit test |
| LAHF | 3'b001 | // load flags into AH R <- flags (sf:zf:00:af:00:pf:00:df) |
| SAHF | 3'b010 | // store AH into flags R <- A; flags <- A (low byte) (sf:zf:00:af:00:pf:00:df) |
| MOVF |  | // combine Bop and flag to form result |
| MOVOF |  | // overwrite the OF position of Bop to form result |
| MCVDF |  | // overwrite the DF position of Bop to form result |
| BSF | 3'b011 | // bit scan forward |
| BSR | 3'b100 | // bit scan reverse |
| BTS | 3'b101 | // bit test and set |
| BTR | 3'b110 | // bit test and reset |
| BTC | 3'b111 | // bit test and complement |

Multiply group

| | | |
|---|---|---|
| MUL16 | 3'b000 | // R(word) <- A * B(byte) |
| IMUL16 | 3'b001 | // R(word) <- A * B(byte) |
| IMUL16S | 3'b010 | // R(word) <- A * B(word) |
| MUL32 | 3'b011 | // R(low word) <- A * B(word); allocate high word with MULH |
| IMUL32 | 3'b011 | // R(low word) <- A * B(word); allocate high word with MULH |
| IMUL32S | 3'b011 | // R(dword) <- A * B(dword) |
| MUL64 | 3'b011 | // R(low dword) <- A * B(dword); allocate high dword with MULH |
| IMUL64 | 3'b011 | // R(low dword) <- A * B(dword); allocate high dword with MULH // if result fits in A then CF=OF=0 else CF=OF=1; SF=ZF=AF=PF=xxx |

DIV group

| | | |
|---|---|---|
| DIV | 3'b000 | // p=1001, g=110 <-when SDF = 0 // p=0110, g=101 <-when SDF = 1 |
| DIVL | 3'b001 | // p=1001, g=110 <-when SDF = 0 // p=0110, g=101 <-when SDF = 1 |

-continued

| | | |
|---|---|---|
| DIV0 | 3'b010 | // |
| | | // |
| DIVREM | 3'b011 | // p=1001, g=110 <-when SDF = 0 |
| | | // p=1100, g=111 <-when SDF = 1 |
| DIVCMP | 3'b100 | // p=0110, g=101 |
| DIVQ | 3'b101 | // |
| DIV_X0 | 3'b110 | // not used |
| DIV_X1 | 3'b111 | // not used |
| IDIV group | | |
| IDIVSGN | 3'b000 | // p=0110, g=101 |
| | | // |
| IDIVCMP | 3'b001 | // p=0011, g=111 |
| | | // p=0011, g=111 |
| IDIVDEND0 | 3'b010 | // p=0011, g=111 |
| IDIVDEND1 | 3'b011 | // p=0011, g=111 |
| IDIVSOR | 3'b100 | // p=0011, g=111 |
| IDIVQ | 3'b101 | // p=0011, g=111 |
| IDIV_X0 | 3'b110 | // not used |
| IDIV_X1 | 3'b111 | // not used |

// *note: JMF w/ R <- immed will be handled in the IFETCH for absolute jump using immediate value The following two groups of encodings indicate what the RES bus of the functional unit contains.

| STATUS Signals for RES bus | |
|---|---|
| [10:0] INSLSB | indicates segment information for LSSEC |
| F0BRN_ADR; | assert proper branch status |
| F0BRN_NT; | assert proper branch status |
| F0BRN_OK; | assert proper branch status |
| F0BRN_T_ADR; | assert proper branch status |
| F0BRN_T_OK; | assert proper branch status |
| F0STAT_LD; | RES bus status - load linear address |
| F0STAT_MUL; | RES bus status - multiplier |
| F0STAT_NONE; | RES bus status - no result |
| F0STAT_OPST; | RES bus status - operand data for a store |
| F0STAT_SRB; | RES bus status - SRB information |
| F0STAT_ST; | RES bus status - store linear address |
| F0STAT_VAL; | RES bus status - valid |
| [10:0] INSLSB; | LSSEC segment MUX |
| [2:0] DTAG; | destination tag |

ALU Sub-Block

This sub-block is used for calculating linear addresses needed by the LSSEC, performing comparisons, and for computing arithmetic operations. Operations such as DAA, DAS, AAA, AAS, AAM, and AAD will be done in microcode and will not receive direct support from the ALU except maybe for flag handling. The adder uses propagates and generates which are setup in the reservation stations based on the type of operation.

Shifter Sub Block

The FNCU contains a barrel shifter which shifts the A operand by the amount indicated on the B operand. This unit handles bit manipulation instructions, counting leading zeroes/ones, and shifts and rotates. RCL and RCR by one is handled but microcode is used for RCL and RCR by more than one. There is a SHFT block which contains the data path portion of the shifter while the control logic is contained along with the ALU control logic in the FNCUCTL block. The output of the shifter has tristate drivers which drive the result bus. At the beginning of the cycle the opcode type is latched in from the reservation station and this information is used to decide if the ALU or the SHFT block will drive the result bus.

Branch Evaluation

For branch instructions, the EIP value is sent on the A operand bus while the relative jump value is sent on the displacement bus. The B operand bus is used for the predicted address. For "jump near indirect" the jump address is the r/m16 or r/m32 loaded into the EIP. The control section of the functional unit evaluates whether the condition codes and the forwarded flags result in a branch taken or not taken. The same logic is also used for the SETcc opcode. Branch prediction information is sent by the branch prediction unit to the dispatch unit and then to the IFCORE. Four different cases for conditional branches are handled.

| Cond Code | Predicted | ALU | Status |
|---|---|---|---|
| not taken | not taken | EIP (Aopnd) + displacement | R_BRN_OK |
| not taken | taken | EIP (Aopnd) + displacement | R_BRN_NT |
| taken | not taken | EIP (Aopnd) + displacement | R_BRN_ADR |
| taken | taken | EIP (Aopnd) + displacement | R_BRN_ADR |

For the case of a predicted taken branch, either the R_BRN_NT status shows that the branch was not taken, or the R_BRN_ADR indicates that the actual branch address will be compared to the predicted address using the flag evaluation unit and the result of that compare will be seen next cycle.

1st cycle RES_STA assign branch evaluation to FNCU for next cycle

2nd cycle EIP+d32; evaluate condition codes and flags (last cycle for predicted not taken)

3rd cycle Flags block compares the predicted branch address with the actual branch address. ZF=1 indicates that the two addresses are the same.

Output Drivers (Buffers/MUX) Sub Block

This block muxes the output data from either the adder, shifter, exception vector, or the MULTFP bus (for FNCU0). The linear address calculation uses the adder. Some bits, RESLAn(14:5), for the linear address are sent out to the data cache early while the entire result goes out on FDRESn (31:0) at the end of the cycle. The purpose of the FDRESn bus is to forward quickly to the input MUXes of all four functional units. RESn is a buffered version of FDRESn which is less time critical than FDRESn. The RESn bus drives the LSSEC, the FIROB, and all of the reservation stations. To determine which sub-block will be MUXed onto the FDRES bus, the opcode group indicator, the multiply request (also MULH mnemonic), exception information, linear address indication, and branch information are used.

Condition Flags Sub Block

Three flag groups are defined as follows: {CF}, {OF,ZF, SF,AF,PF,DF}, and {TF,IF,IOPL,NT,RF,VM,AC,VIF,VIP, ID}. These flags are generated during the next cycle after the FNCU executes. The carry flag will simply be the carry out from cell 31, 15, or 7 based on operand size. For the case of a subtract opcode, the carry flag is used to represent the borrow and is the inverted bit from the bit 31, 15, or 7 carry out. The parity flag is the even parity on the lowest byte which requires about 2*Order(log2n)=6 gate levels. The sign flag is a mux of the highest order bit (31, 15, or 7). These flags are latched by the FIROB at the beginning of the next cycle and also forwarded to any FNCU looking for them. The dependency checking will be done individually on each of the three groups. The first two flag groups allow forwarding of the results while the last group will require serialization when a dependency is detected. The reservation station receives an early use signal from decode which corresponds to the two flag groups. This means that for a given opcode which is sitting in a reservation station entry and waiting on flags, an early use entry can issue the cycle right after the flag match is detected. Any other reservation station entry must wait an additional cycle before issuing to the functional units. The additional cycle is because the flags are generated the cycle after the functional unit executes. For instructions like ADC, the carry flag will be needed at the beginning of the cycle. For instructions like jump, the flags and condition codes start evaluating during the middle of the cycle. The conditional jumps, MOVCC, and SETCC opcodes get their flags forwarded during mid-cycle while all others wait until the beginning of one additional cycle.

In addition to the standard EFLAGS register (EFLAGS0) there is also a scratch EFLAGS register (EFLAGS1) for microcode. The FNCU knows nothing about these two different EFLAGS registers. It simply gets forwarded flag data off the RFLAGSn busses or off its flag input bus. The cycle after every opcode execution, the flags block generates a complete set of flags according to the flag equations mnemonics generated by the IDECODE.

The flag section also takes the B operand (predicted branch address) and compares it the result (EIP+d32). If the two are equal for a branch evaluation, the ZF (zero flag) is set during the next cycle. If the ZF is not set, then the FIROB knows that for a predicted branch taken and actual branch taken case, the IFETCH did not branch to the correct address.

Method of Sending Data Cache Linear Addresses to LSSEC

The FNCU can be used to calculate a linear address using the displacement bus and either the A or B operand bus. The result is sent to the LSSEC using the RES bus. This assumes that a segment with no offset is being used. When the segment offset needs to be added in, the LSSEC handles the segment offset addition. AXBnLAC lets the functional unit know if the AOPND or BOPND bus will be added to the displacement bus. RQnLAC indicates that the functional unit is performing a linear address calculation. In the case of [EAX] Which has no displacement, the decode block will have sent a zero constant on the displacement bus.

Linear address calculations will be handled as follows:

1) SIB will be mapped to two dispatch positions such that the first one adds the base with the scaled index; this result goes to the second dispatch position which operates like a regular opcode but gets results from the first (eg: OPCODE [1st_result+d32],r32. The reason for dividing the SIB into two opcodes is to get dependency checking performed on three source operands.

2) All other linear address calculations (one forwarded variable and one displacement) go to the reservation station where they wait for the forwarded variable. Then for a Load or Load followed by store, the reservation station keeps its information with the forwarded variable and displacement go to the functional unit to be added. Then the result bus is

---

Flag equations for functional units
(these are what the FNCU generates; not what the FIROB writesback)
     ADD_F    flag equations for addition, sub, etc.
                 if (Byte) :           OF = CO(7) ^ CO(6) ;   SF = R(7) ;
ZF = ~| R(7:0); AF = CO(3); PF = ~^ R(7:0); CF = CO(7); DF = DF(in)
                 if (Word) :          OF = CO(15) ^ CO(14);   SF = R(15);
ZF = ~| R(15:0); AF = CO(3); PF = ~^ R(7:0); CF = CO(15); DF = DF(in)
                 if (Dword):         OF = CO(31) ^ CO(30);   SF = R(31);
ZF = ~| R(31:0); AF = CO(3); PF = ~^ R(7:0); CF = CO(31) DF = DF(in)
     LOG_F    flag equations for logical
                 if (Byte) :           OF = 0;            SF = R(7);
ZF = ~| R(7:0); AF = xxx; PF = ~^ R(7:0); CF = 0; DF = DF(in)
                 if (Word) :          OF = 0;           SF = R(15);
ZF = ~| R(15:0); AF = xxx; PF = ~^ R(7:0); CF = 0; DF = DF(in)
                 if (Dword):         OF = 0;           SF = R(31);
ZF = ~| R(31:0); AF = xxx; PF = ~^ R(7:0); CF = 0; DF = DF(in)
     CMC_F    flag equations
                 if (Byte) :           OF = CO(7) ^ CO(6);    SF = R(7);
ZF = ~| R(7:0); AF = CO(3); PF = ~^ R(7:0); CF = ~ CF(in); DF = DF(in)
                 if (Word) :          OF = CO(15) ^ CO(14);   SF = R(15);
ZF = ~| R(15:0); AF = CO(3); PF = ~^ R(7:0); CF = ~ CF(in); DF = DF(in)
                 if (Dword):         OF = CO(31) ^ CO(30);   SF = R(31);
ZF = ~| R(31:0); AF = CO(3); PF = ~^ R(7:0); CF = ~ CF(in); DF = DF(in)
     BCD_FS    flag equations
                 if (Byte) :           OF = CO(7) ^ CO(6);    SF = R(7);
ZF = ~| R(7:0); AF = 1; PF = ~^ R(7:0); CF = 1; DF = DF(in)
     BCD_FC    flag equations
                 if (Byte) :           OF = CO(7) ^ CO(6);    SF = R(7);
ZF = ~| R(7:0); AF = 0; PF = ~^ R(7:0); CF = 0; DF = DF(in)
     DAA_FS1    flag equations
                 if (Byte) :           OF = CO(7) ^ CO(6);    SF = R(7);
ZF = ~| R(7:0); AF = 1; PF = ~^ R(7:0); CF = CF(input) | CO(7) DF = DF(in)
     STD_F    flag equations
     OF = OF(in); SF = SF(in); ZF = ZF(in); AFS = AF(in); PF = PF(in);
CF = CF(in); DF = 1;
     CLD_F    flag equations
     OF = OF(in); SF = SF(in); ZF = ZF(in); AFS = AF(in); PF = PF(in);
CF = CF(in); DF = 1;

---

*CF is inverted when representing borrow instead of carry out
*note: the flag equations mnemonic sent to the FNCU is ignored during LAHF and SAHF; the FNCU generates all flags per the flag mnemonic but the FIROB decides which flags are actually written back used to send the Load linear address to the LSSEC. The LSSEC must be able to latch one linear address from each functional unit during a cycle. Dispatch/decode makes sure that no more than 8 loads and stores are pending at any one time. If a non-zero segment offset is present, four adders are used in the LSSEC to complete the calculation from logical to linear address.

3) For a Load and Store, once the Load linear address is calculated by the functional unit this linear address is both saved for the subsequent store and also sent to the LSSEC for the Load.

In the case of a load, the reservation station remains valid and waits for the LSSEC to return the data. The status bus indicates whether the RES bus contains an FOSTAT__NONE, FOSTAT__LD, etc. The LSSEC can do Loads in any order but also checks them with the Store buffer (in parallel) for any dependencies. DTAG Information is sent from the decode/dispatch directly to the LSSEC to indicate the true store order, since the functional units (FNCU) may give stores to the LSSEC in out of order sequence.

The typical flow for forwarding from a Load-OP instruction followed by an operation only instruction is shown. Note that after the BTAG changes from its original value (don't care for this case) to the DTAG value of its opcode. When the LSSEC sends back the data the DTAG of the receiving opcode will be on the LSTAG bus.

| example: | ADD EAX, [ECX+d32] | | send to issue position 0 |
|---|---|---|---|
| | XOR EBX, EAX | | send to issue position 2 |
| | RES_STA | RES_STA | |
| | DTAG=1_0 | DTAG=2_2 | |
| | BTAG=xxx | BTAG=1_0 | |
| | calc LA | idle | idle |
| | FNCU0 | FNCU2 | LSSEC:SRB |
| | _RES0_ | _RES2_ | _LSRES_ |
| | B+disp | | |
| | DTAG=1_0 | | |
| | R_LOAD | | |
| | RES_STA | RES_STA | |
| | DTAG=1_0 | DTAG=2_2 | |
| | BTAG=1_0 | BTAG=1_0 | performs |
| | idle | idle | load |
| | FNCU0 | FNCU2 | LSSEC:SRB |
| | _RES0_ | _RES2_ | _LSRES_ |
| | | | LSTAG=1_0 |
| | | | R_LD_DAT |
| | RES_STA | RES_STA | |
| | | DTAG=2_2 | |
| | | BTAG=1_0 | |
| | execute | idle | idle |
| | FNCU0 | FNCU2 | LSSEC:SRB |
| | _RES0_ | _RES2_ | _LSRES_ |
| | execute | | |
| | DTAG=1_0 | | |
| | R_VAL | | |
| | RES_STA | RES_STA | |
| | idle | execute | idle |
| | FNCU0 | FNCU2 | LSSEC:SRB |
| | _RES0_ | _RES2_ | _LSRES_ |
| | | execute | |
| | | DTAG=2_2 | |
| | | R_VAL | |

Push/Pop Linear address calculations will be handled as follows:

For a PUSH, the first vector will subtract 2h or 4h from the ESP and the result will be both latched by the FIROB as the new ESP and latched by the LSSEC as the store linear address. The second vector is a move of some register (passes through the FNCU) to the LSSEC, and to memory. A push memory will require two dispatch positions (see reservation station document for more details).

For a POP, two dispatch positions are always required because there are two register destinations that must be updated. Vector 0 of the first dispatch position passes the ESP value through the FNCU and the LSSEC latches it as a load linear address. The reservation station waits for the load data to be returned and uses the next vector to pass the load through the FNCU and onto the RES bus where the FIROB latches it and eventually writes it back to a the correct register. The second dispatch position is to add 2h or 4h to ESP.

Interface for Multiply, Divide, SRB, and FPU

Each of the four issue positions has AOPND and BOPND busses which are tristated and transfer operands from the operand steering unit, RS2, RS1, and RS0 to the FNCU. No forwarding is allowed on these AOPND and BOPND busses. Forwarding from the RES busses is multiplexed directly at the input to the FNCU. These AOPND and BOPND busses also have tristate drivers onto the SAOPND and SBOPND busses which are shared operand busses going to the integer multiplier block.

Floating point instructions go to the Integer uCode to have one FIROB line with four entries assigned to it. If needed, the first three dispatch positions will contain linear address calculations for the 3 possible floating point loads (32 bits, 32 bits, and 16 bits), and those integer reservation station entries free up after the linear address calculations for the FPU. The last dispatch position is a NOOP from the functional unit point of view. The uCode sends an Fcode entry point (corresponding to the last dispatch position) directly to the FPU. For floating point stores, the integer reservation stations perform the linear address calculations, and the LSSEC latches the linear addresses. Those integer reservation station entries then free up. Later, the FPU would request the multiplier for use of the MUL result bus and indicate to the reservation station control for position 3 that it needs to drive store data from the FPU to the MUL result bus to the FNCU3 result MUX to the RES3 bus. The LSSEC latches the data off the RES3 bus and performs the stores.

The SRB instructions go to issue positions in any order. They use a similar protocol to the LOAD/STORE instructions. The SRB contains a four entry file which receives tags and other information from the IDECODE/DISPATCH. SRB opcodes can pass through the functional units in any order and then be reordered in the SRB file before the SRB executes them. No renaming is done on the SRB registers (CR0, CR4, various array entries, etc.). Data from the SRB to a standard x86 register or temporary register is returned to the FIROB using the LSRES0 bus and can be forwarded to the reservation stations at the same time. The following example shows how information is sent to the SRB and how information is forwarded from the LSRES0 bus. The actual SRB transfers (setup and move) would take several cycles to complete and the latencies are not shown in this example.

The SRB flow follows:

| RES_STA | RES_STA | |
|---|---|---|
| | DTAG=2_2 | |
| | BTAG=1_0 | |
| pass SRB info | idle | idle |
| FNCU0 | FNCU2 | LSSEC:SRB |
| _RES0_ | _RES2_ | _LSRES_ |
| pass | | |
| DTAG=1_0 | | |
| R_SRB | | |
| RES_STA | RES_STA | |
| | DTAG=2_2 | |
| | BTAG=1_0 | perform |

| | | |
|---|---|---|
| idle | idle | reg <- CR0 |
| FNCU0 | FNCU2 | LSSEC:SRB |
| _RES0_ | _RES2_ | _LSRES_ |
| | | LSTAG=1_0 |
| | | R_SRB_DAT |
| RES_STA | RES_STA | |
| idle | execute | idle |
| FNCU0 | FNCU2 | LSSEC:SRB |
| _RES0_ | _RES2_ | _LSRES_ |
| | execute | |
| | DTAG=2_2 | |
| | R_VALID | |

Functional Unit Handling of Unaligned Operands and SIB

When a byte operand such as AH is not located in the lowest bits, the functional unit needs to shift the AH operand from bits (15:8) to bits (7:0), perform the operation, and shift the result back to bits (15:8). The AHBYTE information will tell the functional unit when this alignment is required. SIB (scale, index, and base) addressing forms are sent as two dispatch positions because the instructions require dependency checking and renaming on three source operands. During the first opcode the base and the scaled index are added together, the result is given to the second opcode to perform the actual operation. IDECODE will send scale information to the functional unit indicating shifts by (0,1, 2,3, or 4). Except for the scale information, the FNCU would not have needed to know anything about SIBs.

Integer Multiplier

The integer multiplier will use a two iteration method, the first pass goes through an 8×32 array, then through the Wallace tree, and if the final result is 32bits or less, go through the carry propagate adder and be finished, else take another iteration using a larger Wallace tree to combine the carries and sums from the first iteration with the carries and sum generated from the 8×32 array on the second iteration, and finish with a pass through the carry propagate adder.

As the reservation stations get all of the operands needed for the multiply, they will send the multiply on the SAOPND and the SBOPND busses which are shared tristate busses from the AOPND and the BOPND of each reservation station group. There will be a a total of three cycles used for the multiply. The Multiply block and the FPU will arbitrate for the MUL result bus such that the multiplier always has highest priority.

X86 Assembly Instruction Mapping for Fast Path

Processor 500 executes a small subset of the x86 instruction set (around 50 instructions) as fast path instructions while everything else gets sent to microcode. The current startup delay for the microcode engine is one extra cycle. The following chart lists the instructions which go to fast path and the ones which get sent to the microcode engine. Some of the x86 instructions are also broken up into two dispatch positions.

| x86 Assembly | Fast Path | Opcode seen by FNCU |
|---|---|---|
| AAA | | uCode |
| AAD | | uCode |
| AAM | | uCode |
| AAS | | uCode |
| ADC | fast | ADC |
| ADD | fast | ADD |
| AND | fast | AND |
| ARPL | | uCode |
| BOUND | | uCode |
| BSF | fast eight bits at a time | BSF (may become uCode with 16 bit BSF) |
| BSR | fast eight bits at a time | BSR (may become uCode with 16 bit BSR) |
| BSWAP | | uCode |
| BT | fast | BT |
| BTC | fast | BTC |
| BTR | fast | BTR |
| BTS | fast | BTS |
| CALL | fast | near indirect or near relative else uCode |
| CBW | fast | SIGNXA |
| CWDE | fast | SIGNXA |
| CLC | fast | use flag equations |
| CLD | fast | use flag equations |
| CLI | | uCode |
| CLTS | | uCode |
| CMC | fast | use flag equations |
| CMP | fast | SUB (no result writeback by FIROB) |
| CMPS | | uCode |
| CMPSB | | uCode |
| CMPSW | | uCode |
| CMPSD | | uCode |
| CMPXCHG | | uCode |
| CMPXCHG8B | | uCode |
| CPUID | | uCode |
| CWD | | uCode |
| CWQ | | uCode |
| DDA | | uCode |
| DAS | | uCode |
| DEC | fast | SUB wo/ CF save |
| DIV | | uCode |
| ENTER | | uCode |
| HLT | | uCode |
| IDIV | | uCode |
| IMUL | fast | IMUL, some are 2 dispatch pos |
| IN | | uCode |
| INC | fast | ADD wo/ CF save |
| INS | | uCode |
| INSB | | uCode |
| INSW | | uCode |
| INSD | | uCode |
| INT | | uCode |
| INTO | | uCode |
| INVD | | uCode |
| INVLPG | | uCode |
| IRET | | uCode |
| IRETD | | uCode |
| Jcc | fast | JMPCC |
| JCXZ | fast | two dispatch positions |
| JECXZ | fast | two dispatch positions |
| JMP | fast | near and indirect else uCode |
| LAHF | fast | LAHF |
| LAR | | uCode |
| LDS | | uCode |
| LES | | uCode |
| LFS | | uCode |
| LGS | | uCode |
| LSS | | uCode |
| LEA | fast | LEAB |
| LEAVE | fast | two dispatch position |
| LGDT | | uCode |
| LIDT | | uCode |
| LLDT | | uCode |
| LMSW | | uCode |
| LODS | | uCode |

| x86 Assembly | Fast Path | Opcode seen by FNCU |
|---|---|---|
| LODSB | | uCode |
| LODSW | | uCode |
| LODSD | | uCode |
| LOOP | fast | two dispatch positions |
| LOOPcond | | uCode |
| LSL | | uCode |
| LTR | | uCode |
| MOV | fast | MOVZX |
| MOVCC | fast | MOVCC |
| MOV CR | | uCode |
| MOV DR | | uCode |
| MOVS | | uCode |
| MOVSB | | uCode |
| MOVSW | | uCode |
| MOVSD | | uCode |
| MOVSX | fast | MOVSX |
| MOVZX | fast | MOVZX |
| MUL | fast | MUL; some are two dispatch pos |
| NEG | fast | SUB |
| NOP | | not sent to FNCU |
| NOT | fast | SUB |
| OR | fast | OR |
| OUT | | uCode |
| OUTS | | uCode |
| OUTSB | | uCode |
| OUTSW | | uCode |
| OUTSD | | uCode |
| POP | fast | two dispatch positions |
| POPA | | uCode |
| POPAD | | uCode |
| POPF | | uCode-may change IOPL |
| POPFD | | uCode-may change IOPL |
| PUSH | fast | some are two dispatch pos |
| PUSHA | | uCode |
| PUSHAD | | uCode |
| PUSHF | fast | MOVF |
| PUSHFD | fast | MOVF |
| RCL | | uCode using RCL_1 |
| RCR | | uCode using RCR_1 |
| ROL | fast | ROL |
| ROR | fast | ROR |
| RDMSR | | uCode |
| REF | | uCode |
| REPE | | uCode |
| REPZ | | uCode |
| REPNE | | uCode |
| REPNZ | | uCode |
| RET | fast | two dispatch positions |
| RSM | | uCode |
| SAHF | fast | SAHF |
| SAL | fast | SHL |
| SAR | fast | SAR |
| SHL | fast | SHL |
| SHR | fast | SHR |
| SBB | fast | SBB |
| SCAS | | uCode using DFADD |
| SCASB | | uCode using DFADD |
| SCASW | | uCode using DFADD |
| SCASD | | uCode using DFADD |
| SETcc | fast | SETCC |
| SGDT | | uCode |
| SIDT | | uCode |
| SHLD | | uCode |
| SHRD | | uCode |
| SLDT | | uCode |
| SMSW | | uCode |
| STC | fast | ZEROXA & flags=BCD_FS |
| STD | fast | FIROB |
| STI | | uCode |
| STOS | | uCode |
| STOSB | | uCode |
| STOSW | | uCode |
| STOSD | | uCode |
| STR | | uCode |
| SUB | fast | SUB |
| TEST | fast | AND (no result writeback by FIROB) |
| VERR | | uCode |
| VERW | | uCode |
| WBINVD | | uCode |
| WRMSR | | uCode |
| XADD | | uCode |
| XCHG | | uCode |
| XLAT | fast | MOV |
| XLATB | fast | MOV |
| XOR | fast | XOR |

Details of the Divide Mnemonics and Their Use

The restoring division algorithm is done using uCode and FNCU0 only. Local divide direction bits are kept by FNCU0 and can be used to select between two different vectors (one for ADD and one for SUB). Numerous signals are supplied from the control bit vector to the FNCU0 special logic so that proper handling of the division direction bit and proper multiplexing of the result can be performed.

FNCU0 Signal List

Functional Unit 0 is the only one which can do divides. This signal list shows where the various functional unit signals come from or go to.

| FNCU0 Output Signals | |
|---|---|
| F0BRN_ADR; | assert proper branch status |
| F0BRN_NT; | assert proper branch status |
| F0BRN_OK; | assert proper branch status |
| F0BRN_T_ADR; | assert proper branch status |
| F0BRN_T_OK; | assert proper branch status |
| F0STAT_LD; | RES bus status - load linear address |
| F0STAT_MUL; | RES bus status - multiplier |
| F0STAT_NONE; | RES bus status - no result |
| F0STAT_OPST; | RES bus status - operand data for a store |
| F0STAT_SRB; | RES bus status - SRB information |
| F0STAT_ST; | RES bus status - store linear address |
| F0STAT_VAL; | RES bus status - valid |
| [10:0] INSLSB; | LSSEC segment MUX |
| [14:0] RESLA; | early result bits send to LSSEC DCACHE |
| [2:0] DTAG; | destination tag |
| [2:0] RSTAT; | result status |
| [31:0] FDRES; | forwarded RES bus |
| [6:0] RFLAG; | result flags |
| FNCU0 Inputs from reservation station, forwarding, and multiplier | |
| DCPAPRHIT; | data cache port A predicted way hit |
| DCPBPRHIT; | data cache port B predicted way hit |
| DCUNPAHIT; | data cache port A unpredicted way hit |
| DCUNPBHIT; | data cache port B unpredicted way hit |
| FNCUGO; | functional unit GO indication |
| MULXF; | value of all multiply flags |
| OPALSRES0; mispredicted way | used to qualify valid status; else miss; Aop & DC port 0 |
| OPALSRES1; mispredicted way | used to qualify valid status; else miss; Aop & DC port 1 |
| OPBLSRES0; mispredicted way | used to qualify valid status; else miss; Bop & DC port 0 |
| OPBLSRES1; mispredicted way | used to qualify valid status; else miss; Bop & DC port 1 |
| PURGE; | resets all processes in the multiplier |
| RESET; | resets all processes in the multiplier and GRNT_CNT |
| [1:0] LSCANFWD | LSSEC cancel of forwarded load data on LSRESn |
| [10:0] INSSEG; | LSSEC segment MUX select |

-continued

| | | |
|---|---|---|
| [2:0] CDTAG; | current destination tag for the incoming opcode | |
| [31:0] AOPND; | A operand | |
| [31:0] BOPND; | B operand | |
| [31:0] DSPR; | displacement | |
| [31:0] FDRES0; | forwarded result bus from position 0 | |
| [31:0] FDRES1; | forwarded result bus from position 1 | |
| [31:0] FDRES2; | forwarded result bus from position 2 | |
| [31:0] FDRES3; | forwarded result bus from position 3 | |
| [31:0] LSRES0; | LSSEC result bus 0 | |
| [31:0] LSRES1; | LSSEC result bus 1 | |
| [31:0] MULTRES; | multiply floating point bus | |
| [6:0] FLGD; | input flag data from the reservation station | |
| [6:0] RFLAG0; | input flag data from position 0 | |
| [6:0] RFLAG1; | input flag data from position 1 | |
| [6:0] RFLAG2; | input flag data from position 2 | |
| [6:0] RFLAG3; | input flag data from position 3 | |
| [6:0] RFLAGLS0; | input flag data from LSSEC 0 | |
| [6:0] RFLAGLS1; | input flag data from LSSEC 1 | |
| [7:0] FNCUMUXA; | mux control from reservation station for A operand input | |
| [7:0] FNCUMUXB; | mux control from reservation station for B operand input | |
| [7:0] FNCUMUXCF; | mux control from reservation station for the carry flag | |
| [7:0] FNCUMUXSTF; | mux control from reservation station for the status flags | |

FNCU0 Inputs for control store - shared for both vectors

| | |
|---|---|
| F0CTLST_VWR; | valid control store write next cycle |
| F0DIV0; | initial divide opcode |
| F0DIV; | divide opcode |
| F0DIVCMP; | divide opcode |
| F0DIVL; | divide opcode |
| F0DIVQ; | divide opcode |
| F0DIVREM; | divide opcode |
| F0DIVSGN; | divide opcode |
| F0IDIVCMF; | divide opcode |
| F0IDIVDEND0; | divide opcode |
| F0IDIVDEND1; | divide opcode |
| F0IDIVSOR; | divide opcode |
| F0SELOPA; | The initial quotient is from operand A else from adder output |
| F0UPDDF; | update division direction bit |
| F0UPDQ; | update division quotient |
| SELSQXOPA; | indicates that quotient gets shifted quotient slave instead of adder or OPA |
| [3:0] F0CTLST_WR; | indicates which control store vector to use |
| [7:0] F0CTLST_USE; | indicates which control store vector to use |
| [7:0] FRESMUX; | select lines for MUX to RES bus |

FNCU0 Inputs for control store - vector 0 ; no shifts allowed

| | |
|---|---|
| AXBLAC0; | indicates if operand A or B is used for linear addr calc |
| F0ADD_F0; | addition type flag generation |
| F0BCD_FC0; | BCD clear type flag generation |
| F0BCD_FS0; | BCD set type flag generation |
| F0CIN0; | carry-in from the control block |
| F0CLD_F0; | clear direction flag generation |
| F0CMC_F0; | complement carry type flag generation |
| F0COMPB0; | complement the B operand |
| F0COND_CODE0; | evaluate condition codes |
| F0DAA_FS0; | DAA type flag generation |
| F0FLAGCF0; | opcode requires using a version of EFLAGSCF |
| F0LOG_F0; | logical type flag generation |
| F0MOVCC0; | MOVCC instruction |
| F0SETCC0; | SETCC instruction |
| F0MUXCIN0; | carry-in MUX |
| F0MUXDF0; | direction flag MUX |
| F0SETCF0; | ADC uses true version of EFLAGSCF else ~EFLAGSCF |
| F0STD_F0; | store direction flag generation |
| F0UNC_BRN0; | unconditional branch evaluation |
| FISTAT_BRN0; | assert proper branch status |
| FISTAT_LD0; | RES bus status - load linear address |
| FISTAT_MUL0; | RES bus status - mulitplier |
| FISTAT_NONE0; | RES bus status - no result |
| FISTAT_OPST0; | RES bus status - operand data for a store |
| FISTAT_SRB0; | RES bus status - SRB information |
| FISTAT_ST0; | RES bus status - store linear address |
| FISTAT_VAL0; | RES bus status - valid |
| RQLAC0; | linear address calculation |
| SIGNXA0; | sign extend the A operand |
| SIGNXB0; | sign extend the B operand |
| SIGNXD0; | sign extend the D operand |
| USEOFFSET0; | use offset for PUSH, POP, or FPU lin adr calc |
| ZEROXA0; | zero extend the A operand |
| ZEROXB0; | zero extend the B operand |
| ZEROXD0; | zero extend the D operand |
| [1:0] AHBYTE0; | alignment select bits0;move bits 15:8 to 7:0 |
| [2:0] F0GIN0; | generate style inputs (used here to indicate type of operation) |
| [3:0] F0PIN0; | propagate style inputs (used here to indicate type of operation) |
| [3:0] OFSIZEIN0; | size / position of result (dword, word, ah, al) |
| [4:0] F0SCALE; | scale for SIB: 8,4,2,1,0 |
| [7:0] FRESMUX0; | select lines for MUX to RES bus |

FNCU0 Inputs for control store - vector 1 ; shifts allowed

| | |
|---|---|
| AXBLAC1; | indicates if operand A or B is used for linear addr calc |
| F0ADD_F1; | addition type flag generation |
| F0BCD_FC1; | BCD clear type flag generation |
| F0BCD_FS1; | BCD set type flag generation |
| F0CIN1; | carry-in from the control block |
| F0CLD_F1; | clear direction flag generation |
| F0CMC_F1; | complement carry type flag generation |
| F0COMPB1; | complement the B operand |
| F0COND_CODE1; | evaluate condition codes |
| F0DAA_FS1; | DAA type flag generation |
| F0FLAGCF1; | opcode requires using a version of EFLAGSCF |
| F0LOG_F1; | logical type flag generation |
| SHFEFLAG1; | merge Bop and all flags into result |
| F0MOVCC1; | MOVCC instruction |
| F0SETCC1; | SETCC instruction |
| F0MUXCIN1; | carry-in MUX |
| F0MUXDF1; | direction flag MUX |
| F0SETCF1; | ADC uses true version of EFLAGSCF else ~EFLAGSCF |
| F0STD_F1; | store direction flag generation |
| F0UNC_BRN1; | unconditional branch evaluation |
| FISTAT_BRN1; | assert proper branch status |
| FISTAT_LD1; | RES bus status - load linear address |
| FISTAT_MUL1; | RES bus status - multiplier |
| FISTAT_NONE1; | RES bus status - no result |
| FISTAT_OPST1; | RES bus status - operand data for a store |
| FISTAT_SRB1; | RES bus status - SRB information |
| FISTAT_ST1; | RES bus status - store linear address |
| FISTAT_VAL1; | RES bus status - valid |
| RQLAC1; | linear address calculation |
| SHFBCMP1; | indicates a Bit Test and Complement |
| SHFBITEST1; | a select signal for any Bit Test opcode |
| SHFBITOPA1; | a select signal for only the BTEST (BT) opcode |
| SHFBSF1; | select signal for Bit Scan Forward |
| SHFBSR1; | select signal for Bit Scan Reverse |
| SHFBSXR1; | indicates a set/reset for bit test instruction |
| SHFEFLAG1; | merge Bop and all flags into result |
| SHFFLGOF1; | overwrite the OF position of Bop to form result |
| SHFFLGEF1; | overwrite the OF position of Bop to form result |
| SHFLAHF1; | load Flags into AH opcode |
| SHFLEFT1; | indicates RCL, ROL, or SHL opcode |
| SHFRIGHT1; | indicates RCR, ROR, SAR, or SHR opcode |
| SHFROT1; | indicates a rotate or SHL opcode |
| SHFSAHF1; | store AH into Flags opcode |
| SHFSELSF31 1; | set the sign flag to the shifter output bit 31 |

| | |
|---|---|
| SHFSETCF1; | set carry flag for RCL & RCR equal to EFLAGSCF |
| SHF_UPD_RC1; | select for updating the local carry flag |
| SIGNXA1; | sign extend the A operand |
| SIGNXB1; | sign extend the B operand |
| SIGNXD1; | sign extend the D operand |
| USEOFFSET0; | use offset for PUSH, POP, or FPU lin adr calc |
| ZEROXA1; | zero extend the A operand |
| ZEROXB1; | zero extend the B operand |
| ZEROXD1; | zero extend the D operand |
| [1:0] AHBYTE1; | alignment select bits0;move bits 15:8 to 7:0 |
| [21:0] SHFSELPRE1; | the preshift mux select signals |
| [2:0] F0GIN1; | generate style inputs (used here to indicate type of operation) |
| [2:0] SHFSELZF1; | determines which groups of bit to use for setting the zero flag |
| [3:0] F0PIN1; | propagate style inputs (used here to indicate type of operation) |
| [3:0] OPSIZEIN1; | size / position of result (dword, word, ah, al) |
| [3:0] SHFSELOF1; | determines which groups of bit to use for setting the overflow flag |
| [3:0] SHFSELOUT1; | indicates final byte alignment for the shifter output |
| [7:0] FRESMUX1; | select lines for MUX to RES bus |
| [7:0] SHFSELCF1; | determines which shifter bits to use to set the carry flag |
| [9:0] SHFSELCNT1; | mux select signals determining source of shifter count value |
| FNCU1 to 3 Signals List | |
| FNCU1 to FNCU3 contain the same signals as FNCU0 except for the shared list | |
| FNCU1 Inputs for control store - shared for both vectors | |
| F0CTLST_VWR; | valid control store write next cycle |
| [7:0] F0CTLST USE; | indicates which control store vector to use |
| [3:0] F0CTLST_WR; | indicates which control store vector to use |

CBVS Sub-Block

Fully decoded control vectors are stored in the Control Bit Vector Store sub-block. The reservation station and/or division direction flag determine which vector to use. As an example vector 0 and 1 could be used by the entry 2 of the reservation station. To do the linear address calculation for a load, entry 2 of the reservation station could select vector 0 and perform the add. When the load data came back, entry 2 of the reservation station would detect the tag match and use vector 2 along with the forwarded data to perform the actual operation. Only vector 2 can be used for shifting.

| | |
|---|---|
| CBVS Input Signals List | |
| AXBLAC0; | indicates if operand A or B is used for linear addr calc |
| AXBLAC1; | indicates if operand A or B is used for linear addr calc |
| F0ADD_F0; | addition type flag generation |
| F0ADD_F1; | addition type flag generation |
| F0BCD_FC0; | BCD clear type flag generation |
| F0BCD_FC1; | BCD clear type flag generation |
| F0BCD_FS0; | BCD set type flag generation |
| F0BCD_FS1; | BCD set type flag generation |
| F0CIN0; | carry-in from the control block |
| F0CIN1; | carry-in from the control block |
| F0CLD_F0; | clear direction flag generation |
| F0CLD_F1; | clear direction flag generation |
| F0CMC_F0; | complement carry type flag generation |
| F0CMC_F1; | complement carry type flag generation |
| F0COMPB0; | complement the B operand |
| F0COMFB1; | complement the B operand |
| F0COND_CODE0; | evaluate condition codes |
| F0COND_CODE1; | evaluate condition codes |
| F0CTLST_VWR; | valid control store write next cycle |
| F0DAA_FS0; | DAA type flag generation |
| F0DAA_FS1; | DAA type flag generation |
| F0DIV0; | initial divide opcode |
| F0DIV; | divide opcode |
| F0DIVCMP; | divide opcode |
| F0DIVL; | divide opcode |
| F0DIVQ; | divide opcode |
| F0DIVREM; | divide opcode |
| F0DIVSGN; | divide opcode |
| F0FLAGCF0; | opcode requires using a version of EFLAGSCF |
| F0FLAGCF1; | opcode requires using a version of EFLAGSCF |
| F0IDIVCMP; | divide opcode |
| F0IDIVDEND0; | divide opcode |
| F0IDIVDEND1; | divide opcode |
| F0IDIVSOR; | divide opcode |
| F0LOG_F0; | logical type flag generation |
| F0LOG_F1; | logical type flag generation |
| F0MUXCIN0; | carry-in MUX |
| F0MUXCIN1; | carry-in MUX |
| F0MUXDF0; | direction flag MUX |
| F0MUXDF1; | direction flag MUX |
| F0SELOPA; | The initial quotient is from operand A else from adder output |
| F0SETCF0; | ADC uses true version of EFLAGSCF else ~EFLAGSCF |
| F0SETCF1; | ADC uses true version of EFLAGSCF else ~EFLAGSCF |
| F0STD_F0; | store direction flag generation |
| F0STD_F1; | store direction flag generation |
| F0UNC_BRN0; | unconditional branch evaluation |
| F0UNC_BRN1; | unconditional branch evaluation |
| F0UPDDF; | update division direction bit |
| F0UPDQ; | update division quotient |
| FISTAT_BRN0; | assert proper branch status |
| FISTAT_BRN1; | assert proper branch status |
| FISTAT_LD0; | RES bus status - load linear address |
| FISTAT_LD1; | RES bus status - load linear address |
| FISTAT_MUL0; | RES bus status - multiplier |
| FISTAT_MUL1; | RES bus status - multiplier |
| FISTAT_NONE0; | RES bus status - no result |
| FISTAT_NONE1; | RES bus status - no result |
| FISTAT_CPST0; | RES bus status - operand data for a store |
| FISTAT_OPST1; | RES bus status - operand data for a store |
| FISTAT_SRB0; | RES bus status - SRB information |
| FISTAT_SRB1; | RES bus status - SRB information |
| FISTAT_ST0; | RES bus status - store linear address |
| FISTAT_ST1; | RES bus status - store linear address |
| FISTAT_VAL0; | RES bus status - valid |
| FISTAT_VAL1; | RES bus status - valid |
| FNCUGO; | functional unit GO indication |
| PURGE; | resets all processes |
| RESET; | resets all processes |
| RQLAC0; | linear address calculation |
| RQLAC1; | linear address calculation |
| SELSQXOPA; | indicates that quotient gets shifted quotient slave instead of adder or OPA |
| SHFBCMP1; | indicates a Bit Test and Complement |
| SHFBITEST1; | a select signal for any Bit Test opcode |
| SHFBITOPA1; | a select signal for only the BTEST (BT) opcode |
| SHFBSF1; | select signal for Bit Scan Forward |
| SHFBSR1; | select signal for Bit Scan Reverse |
| SHFBSXR1; | indicates a set/reset for bit test instruction |
| SHFEFLAG1; | merge Bop & all flags into result |
| SHFFLGDF1; | overwrite the DF position of Bop to form result |
| SHFFLGOF1; | overwrite the OF position of Bop to form result |
| SHFLAHF1; | load Flags into AH opcode |
| SHFLEFT1; | indicates RCL, ROL, or SHL opcode |
| SHFRIGHT1; | indicates RCR, ROR, SAR, or SHR opcode |

-continued

| | |
|---|---|
| SHFROT1; | indicates a rotate or SHL opcode |
| SHFSAHF1; | store AH into Flags opcode |
| SHFSELSF31_1; | set the sign flag to the shifter output bit 31 |
| SHFSETCF1; | set carry flag for RCL & RCR equal to EFLAGSCF |
| SHF_UPD_RC1; | select for updating the local carry flag |
| SIGNXA0; | sign extend the A operand |
| SIGNXA1; | sign extend the A operand |
| SIGNXB0; | sign extend the B operand |
| SIGNXB1; | sign extend the B operand |
| SIGNXD0; | sign extend the D operand |
| SIGNXD1; | sign extend the D operand |
| USEOFFSET0; | use offset for PUSH, POP, or FPU lin adr calc |
| USEOFFSET1; | use offset for PUSH, POP, or FPU lin adr calc |
| ZEROXA0; | zero extend the A operand |
| ZEROXA1; | zero extend the A operand |
| ZEROXB0; | zero extend the B operand |
| ZEROXB1; | zero extend the B operand |
| ZEROXD0; | zero extend the D operand |
| ZEROXD1; | zero extend the D operand |
| [1:0] AHBYTE0; | alignment select bits0;move bits 15:8 to 7:0 |
| [1:0] AHBYTE1; | alignment select bits0;move bits 15:8 to 7:0 |
| [21:0] SHFSELPRE1; | the preshift mux select signals |
| [2:0] F0GIN0; | generate style inputs (used here to indicate type of operation) |
| [2:0] F0GIN1; | generate style inputs (used here to indicate type of operation) |
| [2:0] SHFSELZF1; | determines which groups of bit to use for setting the zero flag |
| [3:0] F0CTLST_WR; | indicates which control store vector to use |
| [3:0] F0PIN0; | propagate style inputs (used here to indicate type of operation) |
| [3:0] F0PIN1; | propagate style inputs (used here to indicate type of operation) |
| [3:0] OPSIZEIN0; | size / position of result (dword, word, ah, al) |
| [3:0] OPSIZEIN1; | size / position of result (dword, word, ah, al) |
| [3:0] SHFSELOF1; | determines which groups of bit to use for setting the overflow flag |
| [3:0] SHFSELOUT1; | indicates final byte alignment for the shifter output |
| [4:0] F0SCALE; | scale for SIB: 8,4,2,1,0 |
| [7:0] F0CTLST_USE; | indicates which control store vector to use |
| [7:0] FRESMUX0; | select lines for MUX to RES bus |
| [7:0] FRESMUX1; | select lines for MUX to RES bus |
| [7:0] FRESMUX; | select lines for MUX to RES bus |
| [7:0] SHFSELCF1; | determines which shifter bits to use to set the carry flag |
| [9:0] SHFSELCNT1; | mux select signals determining source of shifter count value |

CBVS Output Signal List (control bit vector store)

| | |
|---|---|
| AXBLAC; | indicates if operand A or B is used for linear addr calc |
| DIV0; | initial divide opcode |
| DIV; | divide opcode |
| DIVCMP; | divide opcode |
| DIVL; | divide opcode |
| DIVQ; | divide opcode |
| DIVREM; | divide opcode |
| DIVSGN; | divide opcode |
| F0ADD_F; | addition type flag generation |
| F0BCD_FC; | BCD clear type flag generation |
| F0BCD_FS; | BCD set type flag generation |
| F0CIN; | carry-in from the control block |
| F0CLD_F; | clear direction flag generation |
| F0CMC_F; | complement carry type flag generation |
| F0COMPB; | complement the B operand |
| F0COND_CODE; | evaluate condition codes |
| F0DAA_FS; | DAA type flag generation |

-continued

| | |
|---|---|
| F0FLAGCF; | opcode requires using a version of EFLAGSCF |
| F0LOG_F; | logical type flag generation |
| F0MUXCIN; | carry-in MUX |
| F0MUXDF; | direction flag MUX |
| F0SETCF; | ADC uses true version of EFLAGSCF else ~EFLAGSCF |
| F0STD_F; | store direction flag generation |
| F0UNC_BRN; | unconditional branch evaluation |
| FISTAT_BRN; | assert proper branch status |
| FISTAT_LD; | RES bus status - load linear address |
| FISTAT_MUL; | RES bus status - multiplier |
| FISTAT_NONE; | RES bus status - no result |
| FISTAT_OPST; | RES bus status - operand data for a store |
| FISTAT_SRB; | RES bus status - SRB information |
| FISTAT_ST; | RES bus status - store linear address |
| FISTAT_VAL; | RES bus status - valid |
| IDIVCMP; | divide opcode |
| IDIVDEND0; | divide opcode |
| IDIVDEND1; | divide opcode |
| IDIVSOR; | divide opcode |
| ISELOPA; | The initial quotient is from operand A else from adder output |
| ISELSQXOPA; | indicates that quotient gets shifted quotient slave instead of adder or OPA |
| MOVCC; | select Bop from ALU output else take Aop |
| RQLAC; | linear address calculation |
| SETCC; | set bit 0 if conditions are true |
| SHFBCMP; | indicates a Bit Test and Complement |
| SHFBITEST; | a select signal for any Bit Test opcode |
| SHFBITOPA; | a select signal for only the BTEST (BT) opcode |
| SHFBSF; | select signal for Bit Scan Forward |
| SHFBSR; | select signal for Bit Scan Reverse |
| SHFBSXR; | indicates a set /reset for bit test instruction |
| SHFEFLAG; | merge Bop & all flags into result |
| SHFFLGDF; | overwrite the DF position of Bop to form result |
| SHFFLGOF; | overwrite the OF position of Bop to form result |
| SHFLAHF; | load Flags into AH opcode |
| SHFLEFT; | indicates RCL, ROL, or SHL opcode |
| SHFRIGHT; | indicates RCR, ROR, SAR, or SHR opcode |
| SHFROT; | indicates a rotate or SHL opcode |
| SHFSAHF; | store AH into Flags opcode |
| SHFSELSF31; | set the sign flag to the shifter output bit 31 |
| SHFSETCF; | set carry flag for RCL & RCR equal to EFLAGSCF |
| SHF_UPD_RC; | select for updating the local carry flag |
| SIGNXA; | sign extend the A operand |
| SIGNXB; | sign extend the B operand |
| SIGNXD; | sign extend the D operand |
| UPDDF; | update division direction bit |
| UPDQ; | update division quotient |
| USEOFFSET; | use offset for PUSH, POP, or FPU lin adr calc |
| ZEROXA; | zero extend the A operand |
| ZEROXB; | zero extend the B operand |
| ZEROXD; | zero extend the D operand |
| [1:0] AHBYTE; | alignment select bits0;move bits 15:8 to 7:0 |
| [21:0] SHFSELPRE; | the preshift mux select signals |
| [2:0] F0GIN; | generate style inputs (used here to indicate type of operation) |
| [2:0] SHFSELZF; | determines which groups of bit to use for setting the zero flag |
| [3:0] F0PIN; | propagate style inputs (used here to indicate type of operation) |
| [3:0] OPSIZEIN; | size / position of result (dword, word, ah, al) |
| [3:0] SHFSELOF; | determines which groups of bit to use for setting the overflow flag |
| [3:0] SHFSELOUT; | indicates final byte alignment for the shifter output |
| [7:0] FRESMUX; | select lines for MUX to RES bus |
| [7:0] SHFSELCF; | determines which shifter bits to use to set the carry flag |

| | |
|---|---|
| [9:0] SHFSELCNT; | mux select signals determining source of shifter count value |

OPSEL Sub-Block

The operand selection sub-block multiplexes the correct data in for forwarding and latches in the A operand, B operand, Displacement/immediate bus, and flags. Sign extension and alignment for Ahbyte data is also performed here.

OPSEAL Input Signals (operand select and alignment)

| | |
|---|---|
| AXBLAC; | indicates if operand A or B is used for linear addr calc |
| F0COMPB; | complement the B operand |
| RQLAC; | linear address calculation |
| SIGNXA; | sign extend the A operand |
| SIGNXB; | sign extend the B operand |
| SIGNXD; | sign extend the D operand |
| USEOFFSET; | use offset for PUSH, POP, or FPU lin adr calc |
| ZEROXA; | zero extend the A operand |
| ZEROXB; | zero extend the B operand |
| ZEROXD; | zero extend the D operand |
| [1:0] AHBYTE; | alignment select bits0;move bits 15:8 to 7:0 |
| [31:0] AOPND; | A operand |
| [31:0] BOPND; | B operand |
| [31:0] DSPR; | displacement |
| [31:0] FDRES0; | forwarded result bus from position 0 |
| [31:0] FDRES1; | forwarded result bus from position 1 |
| [31:0] FDRES2; | forwarded result bus from position 2 |
| [31:0] FDRES3; | forwarded result bus from position 3 |
| [31:0] LSRES0; | LSSEC result bus 0 |
| [31:0] LSRES1; | LSSEC result bus 1 |
| [3:0] OFFSET; | offset used for PUSH, POP, and FPU lin adr calc |
| [3:0] OPSIZEIN; | size / position of result (dword, word, ah, al) |
| [4:0] F0SCALE; | scale for SIB: 8,4,2,1,0 |
| [6:0] FLGD; | input flag data from the reservation station |
| [6:0] RFLAG0; | input flag data from position 0 |
| [6:0] RFLAG1; | input flag data from position 1 |
| [6:0] RFLAG2; | input flag data from position 2 |
| [6:0] RFLAG3; | input flag data from position 3 |
| [6:0] RFLAGLS0; | input flag data from LSSEC 0 |
| [6:0] RFLAGLS1; | input flag data from LSSEC 1 |
| [7:0] FNCUMUXA; | mux control from reservation station for A operand input |
| [7:0] FNCUMUXB; | mux control from reservation station for B operand input |
| [7:0] FNCUMUXCF; | mux control from reservation station for the carry flag |
| [7:0] FNCUMUXSTF; | mux control from reservation station for the status flags |

OPSEL Output Signals (operand select and alignment)

| | |
|---|---|
| [31:0] OPA; | aligned operand A |
| [31:0] OPB; | aligned operand B |
| [6:0] IFLG; | latched input flags |

ALU Sub-Block

All logical, arithmetic, and basic moves are performed by this block. Linear address calculations and branch address calculations are also performed here. Only FNCU0 is capable of performing division operations.

ALU Input Signals for FNCU0 Type

| | |
|---|---|
| DIV0; | initial divide opcode |
| DIV; | divide opcode |
| DIVCMP; | divide opcode |
| DIVL; | divide opcode |
| DIVQ; | divide opcode |
| DIVREM; | divide opcode |
| DIVSGN; | divide opcode |
| F0CIN; | carry-in from the control block |
| F0MUXCIN; | carry-in MUX |
| F0MUXDF; | direction flag MUX |
| FNCUGO; | functional unit GO indication |
| IDIVCMP; | divide opcode |
| IDIVDEND0; | divide opcode |
| IDIVDEND1; | divide opcode |
| IDIVSOR; | divide opcode |
| ISELOPA; | The initial quotient is from operand A else from adder output |
| ISELSQXOFA; | indicates that quotient gets shifted quotient slave instead of adder or OPA |
| PURGE; | resets all processes |
| RESET; | resets all processes |
| UPDDF; | update division direction bit |
| UPDQ; | update division quotient |
| [2:0] F0GIN; | generate style inputs (used here to indicate type of operation) |
| [31:0] OPA; | aligned operand A |
| [31:0] OPB; | aligned operand B |
| [3:0] F0PIN; | propagate style inputs (used here to indicate type of operation) |
| [3:0] OPSIZEIN; | size / position of result (dword, word, ah, al) |

ALU Input Signals for FNCU1 to FNCU3 Types

| | |
|---|---|
| F0CIN; | carry-in from the control block |
| F0MUXCIN; | carry-in MUX |
| F0MUXDF; | direction flag MUX |
| FNCUGO; | functional unit GO indication |
| PURGE; | resets all processes |
| RESET; | resets all processes |
| [2:0] F0GIN; | generate style inputs (used here to indicate type of operation) |
| [31:0] OPA; | aligned operand A |
| [31:0] OPB; | aligned operand B |
| [3:0] F0PIN; | propagate style inputs (used here to indicate type of operation) |
| [3:0] OPSIZEIN; | size / position of result (dword, word, ah, al) |

ALU Output Signals

| | |
|---|---|
| A0COUT14; | ALU output bit |
| A0CCUT30; | ALU output bit |
| A0COUT3; | ALU output bit |
| A0COUT6; | ALU output bit |
| F0COUT15; | ALU output bit |
| F0COUT31; | ALU output bit |
| F0COUT7; | ALU output bit |
| [31:0] ARES; | ALU result |

SHFT Sub-Block

The shifter sub-block performs right shifts only. It can also perform bit test and set/clear/complement as well as RCL by one or RCR by one.

SHFT Input Signals (shifter)

| | |
|---|---|
| FNCUGO; | functional unit GO indication |
| PURGE; | resets all processes |
| RESET; | resets all processes |
| SFTCFIN; | carry in flag for shifter |
| SHFBCMP; | indicates a Bit Test and Complement |
| SHFBITEST; | a select signal for any Bit Test opcode |
| SHFBITOPA; | a select signal for only the BTEST (BT) opcode |

-continued

| | |
|---|---|
| SHFBSF; | select signal for Bit Scan Forward |
| SHFBSR; | select signal for Bit Scan Reverse |
| SHFBSXR; | indicates a set/reset for bit test instruction |
| SHFEFLAG; | merge Bop & all flags into result |
| SHFFLGDF; | overwrite the DF position of Bop to form result |
| SHFFLGOF; | overwrite the OF position of Bop to form result |
| SHFLAHF; | load Flags into AH opcode |
| SHFLEFT; | indicates RCL, ROL, or SHL opcode |
| SHFRIGHT; | indicates RCR, ROR, SAR, or SHR opcode |
| SHFROT; | indicates a rotate or SHL opcode |
| SHFSAHF; | store AH into Flags opcode |
| SHFSELSF31; | set the sign flag to the shifter output bit 31 |
| SHFSETCF; | set carry flag for RCL & RCR equal to EFLAGSCF |
| SHF_UPD_RC; | select for updating the local carry flag |
| [21:0] SHFSELPRE; | the preshift mux select signals |
| [2:0] SHFSELZF; | determines which groups of bit to use for setting the zero flag |
| [31:0] OPA; | aligned operand A |
| [31:0] OPB; | aligned operand B |
| [3:0] OPSIZEIN; | size / position of result (dword, word, ah, al) |
| [3:0] SHFSELOF; | determines which groups of bit to use for setting the overflow flag |
| [3:0] SHFSELOUT; | indicates final byte alignment for the shifter output |
| [7:0] SHFSELCF; | determines which shifter bits to use to set the carry flag |
| [9:0] SHFSELCNT; | mux select signals determining source of shifter count value |
| SHFT Output Signals (shifter) | |
| [31:0] SHFTOUT; | shifter information for flag generation |
| [31:0] SRES; | shifter result |

MXDRV Sub-Block

This block multiplexes results from several different sub-blocks and from the multiplier and aligns the output properly before driving the result onto the FDRES bus.

MXDRV Input Signals
(output multiplier, alignment, and drivers)

| | |
|---|---|
| BRN_ADR; | assert proper branch status |
| BRN_NT; | assert proper branch status |
| BRN_OK; | assert proper branch status |
| BRN_T_ADR; | assert proper branch status |
| BRN_T_OK; | assert proper branch status |
| DCPAPRHIT; | data cache port A predicted way hit |
| DCPBPRHIT; | data cache port B predicted way hit |
| DCUNPAHIT; | data cache port A unpredicted way hit |
| DCUNPBHIT; | data cache port B unpredicted way hit |
| FISTAT_BRN; | assert proper branch status |
| FISTAT_LD; | RES bus status - load linear address |
| FISTAT_MUL; | RES bus status - multiplier |
| FISTAT_NONE; | RES bus status - no result |
| FISTAT_OPST; | RES bus status - operand data for a store |
| FISTAT_SRB; | RES bus status - SRB information |
| FISTAT_ST; | RES bus status - store linear address |
| FISTAT_VAL; | RES bus status - valid |
| FNCUGO; | functional unit GO indication |
| MOVCCSEL; | select Bop from ALU input else take Aop |
| OPALSRES0; | used to qualify valid status; else mispredicted way miss; Aop & DC port 0 |
| OPALSRES1; | used to qualify valid status; else mispredicted way miss; Aop & DC port 1 |
| OPBLSRES0; | used to qualify valid status; else mispredicted way miss; Bop & DC port 0 |
| OPBLSRES1; | used to qualify valid status; else mispredicted way miss; Bop & DC port 1 |
| PURGE; | resets all processes |
| RESET; | resets all processes |
| [10:0] INSSEG; | LSSEC segment MUX select |
| [1:0] LSCANFWD; | LSSEC cancel signal for forwarded data on the LSRESn bus |
| [2:0] CDTAG; | current destination tag for the incoming opcode |
| [31:0] ARES; | ALU result |
| [31:0] FLGRES; | combined EFLAGS result |
| [31:0] MULTRES; | multiply floating point bus |
| [31:0] SRES; | shifter result |
| [3:0] OPSIZEIN; | size / position of result (dword, word, ah, al) |
| [7:0] FRESMUX; | select lines for MUX to RES bus |
| MXDRV Output Signals | |
| (output multiplier, alignment, and drivers) | |
| F0BRN_ADR; | assert proper branch status |
| F0BRN_NT; | assert proper branch status |
| F0BRN_OK; | assert proper branch status |
| F0BRN_T_ADR; | assert proper branch status |
| F0BRN_T_OK; | assert proper branch status |
| F0STAT_LD; | RES bus status - load linear address |
| F0STAT_MUL; | RES bus status - multiplier |
| F0STAT_NONE; | RES bus status - no result |
| F0STAT_OPST; | RES bus status - operand data for a store |
| F0STAT_SRB; | RES bus status - SRB information |
| F0STAT_ST; | RES bus status - store linear address |
| F0STAT_VAL; | RES bus status - valid |
| [10:0] INSLSB; | LSSEC segment MUX |
| [14:0] RESLA; | early result bits send to LSSEC DCACHE |
| [2:0] DTAG; | destination tag |
| [2:0] RSTAT; | result status |
| [31:0] FDRES; | forwarded RES bus |

FLGCC Sub-Block

This block is responsible for the flag generation, condition code evaluation, and branch evaluation. The CF, carry flag, is generated the same same and can be immediately forwarded with the result data. However, the other six flags are generated next cycle and can only be forwarded to such operations as jumps which can accept the flags mid-cycle.

FLGCC Input Signals
(flags generation, condition codes and branch evaluation)

| | |
|---|---|
| A0COUT14; | ALU output bit |
| A0COUT30; | ALU output bit |
| A0COUT3; | ALU output bit |
| A0COUT6; | ALU output bit |
| F0ADD_F; | addition type flag generation |
| F0BCD_FC; | BCD clear type flag generation |
| F0BCD_FS; | BCD set type flag generation |
| F0CLD_F; | clear direction flag generation |
| F0CMC_F; | complement carry type flag generation |
| F0COND_CODE; | evaluate condition codes |
| F0COUT15; | ALU output bit |
| F0COUT31; | ALU output bit |
| F0COUT7; | ALU output bit |
| F0DAA_FS; | DAA type flag generation |
| F0LOG_F; | logical type flag generation |
| F0STD_F; | store direction flag generation |
| F0UNC_BRN; | unconditional branch evaluation |
| FISTAT_BRN; | assert proper branch status |
| FNCUGO; | functional unit GO indication |
| MOVCC, | select Bop from ALU output else take Aop |
| MULXF; | value of all multiply flags |
| PURGE; | resets all processes |
| RESET; | resets all processes |

-continued

| | |
|---|---|
| SETCC; | set bit 0 if conditions are true |
| [31:0] OPB; | aligned operand B |
| [31:0] SHFTOUT ; | shifter information for flag generation |
| [3:0] OPSIZEIN; | size / position of result (dword, word, ah, al) |
| [6:0] IFLG; | latched input flags |
| FLGCC Output Signals | |
| (flags generation, condition codes and branch evaluation) | |
| | |
| BRN_ADR; | assert proper branch status |
| BRN_NT; | assert proper branch status |
| BRN_OK; | assert proper branch status |
| BRN_T_ADR; | assert proper branch status |
| BRN_T_OK; | assert proper branch status |
| MOVCCSEL; | select Bop from ALU output else take Aop |
| [31:0] FLGRES; | combined EFLAGS result |
| [6:0] RFLAG; | result flags |
| Multiplier Signal List | |
| Multiplier Input Signals List | |
| | |
| MULCYC2X3; | number of multiply cycles is 2, else use 3 |
| MULONEOP; | opcode is for the one operand version |
| MULRQ0; | multiply request from position 0 |
| MULRQ1; | multiply request from position 1 |
| MULRQ2; | multiply request from position 2 |
| MULRQ3; | multiply request from position 3 |
| MULSIGN; | signed values |
| PURGE; | resets all processes in the multiplier |
| RESET; | resets all processes in the multiplier and GRNT_CNT |
| [1:0] MULOPSIZE; | input operands are 01: byte, 10: word, or 11: dword |
| [31:0] SAOPND; | shared A operand bus |
| [31:0] SBOPND; | shared B operand bus |
| Multiplier outputs | |
| | |
| MULGR0; | multiply grant to position 0 |
| MULGR1; | multiply grant to position 1 |
| MULGR2; | multiply grant to position 2 |
| MULGR3; | multiply grant to position 3 |
| MULXF; | value of all multiply flags |
| [31:0] MULRES; | multiplier output bus 0 |

Overview of the Processor 500 FIROB

This section describes the Four-Issue Re-Order Buffer (FIROB), including methods of reducing the dependency checking time. The Processor 500 FIROB has a structure including the data array, the status and control arrays with associated control logic, and the special registers. The four-issue ROB is line-oriented which means that the number of dispatched instructions is always 4 (some of the instructions may be NOOP), and the number of retired instructions is always 4. The FIROB size is 6 lines of 4 instructions for a total of 24 entries. There are a few exceptions to retire the partial line such as branch mis-prediction, interrupt, and re-synchronization. There are 8 read buses and 4 retire buses to support a line of Processor 500 instructions. The number of result buses are 6, 4 result buses are for results from 4 functional units and 2 results buses are for load/store and special register instructions to return data to the FIROB. The buses are 32-bits wide. The FIROB supports a massive number of comparators to dispatch 4 instructions in a line. To support the push/pop instructions with indirect references to the ESP, the FIROB includes 6 ESP latches. The latches are strictly for updating the ESP in the register file correctly.

Top Level of the FIROB

The FIROB is accessed by a line of instructions instead of an individual instruction. The line has 4 instructions, some instructions can be NOOP. Line-oriention has the advantage of a single input and allocation in the FIROB. The logic to deal with one line is much simpler than logic to deal with a combination of 0 to 4 instructions. Since the clock cycle time is short, a new method has to be implemented to do the dependency checking in one clock cycle and driving the data in the next cycle. The FIROB includes of 6 lines of instructions, where each line has 4 instructions. FIROB will have one clock cycle to compare the read addresses of the dispatched line to the destination entries of the previous 5 lines for dependency and to check the dependency within the dispatched line. The FIROB implements new status bits to indicate the most up-to-date destination to reduce the dependency checking time. The X86 instructions allow 2 operands, wherein one of the operands can be both destination and source. The FIROB checks dependency on both source and destination operands, the dependency of the destinations sets the last-in-line status which reduces the future dependency checking. A set of ESP latches are implemented to provide fast execution of the push/pop instructions. The FIROB can keep track and generate dependency data for the ESP without stalling or serializing any ESP instructions.

Organization of the FIROB

Figure 33:
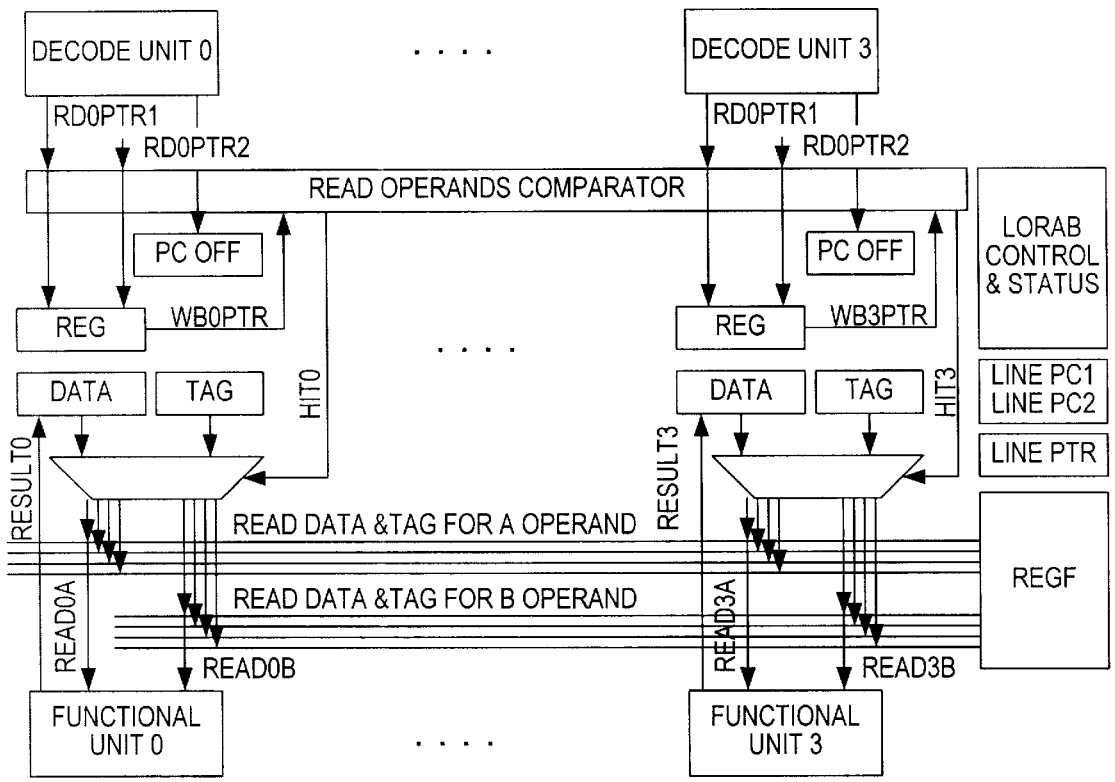

Processor 500 uses fixed issue positions for the decode units and the functional units. The FIROB and the register file conform to this arrangement. The operand addresses from the decode unit and the result buses from the functional unit individually access the fixed positions of the FIROB. The proposed arrangement of the FIROB is to have the address and data registers, the comparator, and the control status bits for the comparator in the data path between the decode units and the functional units. Other status bits and control logic are on one side of the data path as shown in FIG. 33. A proposed layout of the FIROB and register file is described below. The read buses can come from any entry in the FIROB because of forwarding. An operand bus steering may be needed to take the inputs from the FIROB or REGF and route to the functional units.

FIROB is organized as 6 lines of 4 instructions each. The pointer to the entries has two parts: a 3-bit line pointer and a 2-bit entry pointer. The line pointer increases after every dispatch, and the whole line is dispatched or retired at one time. This is 3-bit incrementor and wraps around at the count of 5. Other reorder buffers (ROBs) are implemented with read and write pointers, the read pointer increases as instructions are dispatched and the write pointer increases as the instruction are retired. Since Processor 500 FIROB allocates or retires one line of instructions at a time and the number of dependency comparator is large, FIROB should be a FIFO (First-In-First-Out) instead of moving the pointers. The dependency comparators are always at lines 0–4. No dependency checking is needed in line 5, and the retire line (write pointer) is always from line 0. As a line of instructions is retired from line 0, lines 1–5 will shift up by 1. The read pointer increases as a new line is dispatched and decreases as a line is retired. To track the FIROB line number for the instructions in the reservation station, functional units, and load/store section, a virtual line pointer is assigned to each line as the line is dispatched from the decode units. The virtual line pointer is used by the reservation stations for result forwarding, by the functional unit and the load/store section to return result data to the FIROB, and by the load/store buffer to access the data cache in program order. The FIROB use the virtual line pointer to latch the result data. The virtual line pointer is attached to each line in the FIROB and circular shifted as the line is retired from the FIROB.

Figure 34:
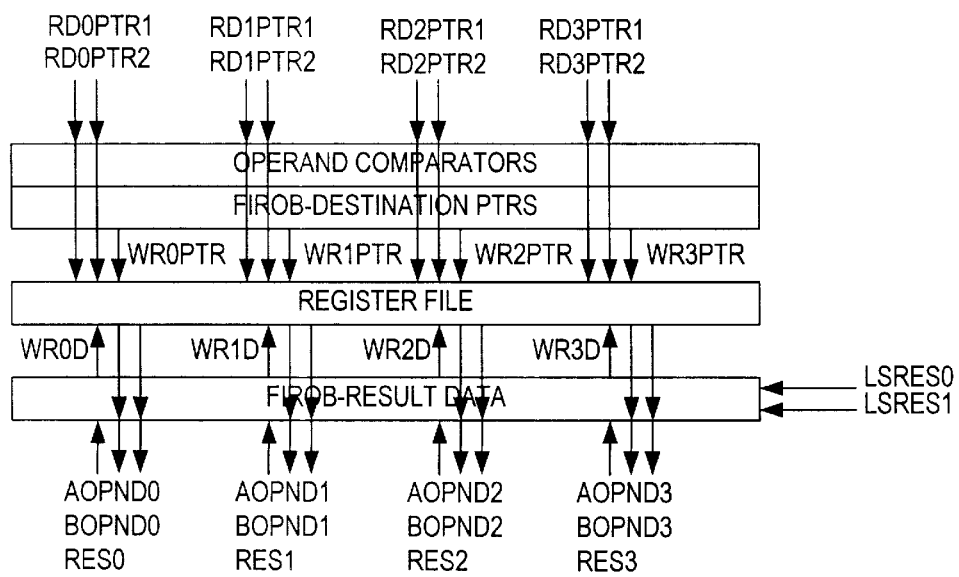

From FIG. 33, the result data of the FIROB and the register file drive the source data to 8 horizontal buses. Each functional unit receives 2 read buses from these horizontal buses. The layout of the result data of the FIROB and the register file sis adjacent to access the horizontal buses directly. A suggested layout organization is illustrated in FIG. 34.

Signal List

IRESET - Global signal used to reset all decode units. Clears all states.

NMI_P - Input from BIU indicates non-maskable interrupt, the FIROB generates a clean instruction boundary trap to a fixed entry point. The FIROB is sensitive only to the rising edge of this signal INTR_P - Input from BIU indicates the external interrupt. This signal is qualified with the IF bit of the EFLAGS register. The interrupt occurs at appropriate instruction boundaries.

SRBHALT - Input from SRB to enter HALT mode. The FIROB stops retiring instructions until RESET, NMI, or external interrupt occurs. The FIROB must retire the HALT instruction before shutting down.

CRONE - Input from SRB indicates the NE bit of the CR0 register. The NE bit indicates the floating point exception can be trapped directly (NE=1) or via XFERR_P and an external interrupt (NE=0).

XIGNNE_P - Input from BIU indicates the copy of pin IGNNE. When CRONE=0, this signal is inspected to response to enabled floating point exceptions.

XFLUSH_P - Input from BIU indicates an external flush request occurs. It is falling edge sensitive and trap on instruction boundary. It is sample during IRESET to enter tri-state test mode, the FIROB should not generate exception.

IINIT - Input from BIU indicates an initialization request. It is rising edge sensitive and trap on instruction boundary. It is sample during IRESET to enter BIST test mode, the FIROB generates on of the two reset entry point.

MVTOSRIAD - Input from SRB, indicates a move to IAD special register, FIROB needs to check its pointer against the pointer driven on IAD.

MVFRSRIAD - Input from SRB, indicates a move from IAD special register, FIROB needs to check its pointer against the pointer driven on IAD.

MVTOARIAD - Input from SRB, indicates a move to IAD special register array, FIROB needs to check its pointer against the pointer driven on IAD.

MVFRARIAD - Input from SRB, indicates a move from IAD special register array, FIROB needs to check its pointer against the pointer driven on IAD.

MROMDEC(3:0) - Input from MROM indicates the microcodes are being decoded by the decode units. Use to set the ROBEXIT bit.

RESx(31:0) - Input from FU indicates result data.

DTAGx(2:0) - Input from FU indicates FIROB line number of the result.

DSTATx(3:0) - Input from FU indicates the status of the result data:

0000 - no result
0001 - valid result
0010 - valid result, shift by zero
0011 - exception with vector
0100 - software interrupt with vector
0101 - TLB miss with vector
0110 - load/store breakpoint
0111 - exchange result
1000 - exchange with underflow
1001 - exchange abort
1010 - branch taken, mis-prediction
1011 - branch not taken, mis-prediction
1100 - reserved for FPU
1101 - reserved for FPU
1110 - reserved for FPU
1111 - reserved for FPU RFLAGx(31:0) - Input from FU indicates result flags.

LSTAG0(4:0) - Input from LSSEC indicates FIROB line number of the first access.

LSTAG1(4:0) - Input from LSSEC indicates FIROB line number of the second access.

LSRES0(31:0) - Input from LSSEC indicates result data of the first access.

LSRES1(31:0) - Input from LSSEC indicates result data of the second access.

IDPC1(31:0) - Input from Idecode indicates the current line PC of the first instruction in the 4 dispatched instructions.

IDPC2(31:0) - Input from Idecode indicates the current line PC of a second instruction which cross the 16-byte boundary or branch target in the 4 dispatched instructions ICPOSx(3:0) - ICLK7 Input from Icache to decode units indicates the PCTS byte position of the instruction.

IDxDAT(1:0) - Input from Idecode indicates the data size information. 01-byte, 10-half word, 11-word, 00-not use.

IDxADDR - Input from Idecode indicates the address size information. 1–32 bit, 0–16 bit.

ICVALI(3:0) - Input from Icache indicates valid instructions. NOOP is generated for invalid instruction.

NODEST(3:0) - Input from Icache indicates no destination for the first rop of the SIB-byte instruction.

DEPTAG(3:1) - Input from Icache indicates forced dependency tag on the first instruction; the second rop of the SIB-byte instruction.

DxUSEFL(2:0)

DxWRFL(2:0) - Input from Icache indicates the type of flag uses/writes for this instruction of decode units:

xx1 CF-carry flag,
x1x OF-overflow flag,
1xx SF-sign, ZF-zero, PF-parity, and AF-auxiliary carry DxUSE1(1:0) - Input from Icache indicates the type of operand being sent on operand 1 for decode units. Bit 1 indicates source operand, and bit 0 indicates destination operand.

DxUSE2 - Input from Idecode indicates indicates source operand.

INSDISP(3:0) - Input from Idecode indicates that the instruction in decode unit is valid, if invalid, NOOP is passed to FIROB.

RDxPTR1(5:0) - Input from Icache indicates the register address for operand 1 of the instructions.

RDxPTR2(5:0) - Input from Icache indicates the register address for operand 2 of the instructions.

INSLSxB(5:0) - Input from decode units indicates the prefix values. bit 5 - data size, bit 4 - address size, bit 3 - lock, bit 2:0 - segment registers.

IDECJAMIC - Output indicates that an interrupt or trap is being taken. Effect on Icache is to clear all pre-fetch or access in progress, and set all state machines to Idle/Reset.

EXCEPTION - Global output indicates that an interrupt or trap is being taken including resynchronization. Effect on Idecode and Fus is to clear all instructions in progress.

REQTRAP - Global output, one cycle after EXCEPTION, indicates that the trap is initiated with new entry point or new PC is driven.

SYNC - Output indicates whether the new entry point or new PC is driven.

EXCHGSYNC - Output indicates exchange instruction resynchronization to Icache. This occurs when an exchange with a masked underflow is retired. It is a special resynchronize exchange with alternate entry point.

XFERR_P - Output to BIU indicates the floating point error which is inverted of the ES bit from the slave of the floating point status register. It is also used by the FIROB to generate the plunger traps.

EFLAGSAC
EFLAGSVM
EFLAGSRF
EFIOPL(13:12)
EFLAGSOF
EFLAGSDF
EFLAGSAF

EFLAGSCF - Output generates from the EFLAGS register, these bits are visible from the slave copy of the EFLAGS register. The RF bit is also used in the FIROB to handle instruction breakpoint.

BRNMISP - Input from the Branch execution of the FU indicates that a branch mis-prediction. The Idecode clears all instructions in progress.

UPDFPC - Output to Icache indicate that a new Fetch PC has been detected. This signal accompanies the FPC for the Icache to begin access the cache arrays.

TARGET(31:0) - Output to Icache as the new PC for branch correction path.

BRNMISP - Input to Icache indicates that a branch mis-prediction. The Icache changes its state machine to access a new PC and clears all pending instructions.

BRNTAKEN - Output to Icache indicates the status of the mis-prediction. This signal must be gated with UPDFPC.

BRNFIRST - Output to Icache indicates the first or second target in the ICNXTBLK for updating the branch prediction.

BRNCOL(3:0) - Output to Icache indicates the instruction byte for updating the branch prediction in the ICNXTBLK.

FPCTYP - Input to Icache indicates the type of address that is being passed to the Icache.

BPC(11:0) - Output indicates the PC index and byte-pointer of the branch instruction which has been mis-predicted for updating the ICNXTBLK.

ROBEMPTY - Output indicates the FIROB is empty.
ROBFULL - Output indicates the FIROB is full.
LINEFPTR(2:0) - Output indicates the current line pointer in the FIROB for the dispatch line of instructions.

WBLPTR(2:0) - Output indicates the write-back line pointer in the FIROB for the retiring line of instructions.

WBXNC - Output indicates the invalid write-back data to the register file for retiring instructions.

WBxPTR(5:0) - Output indicates the write-back pointer to the register file for retiring instructions.

WBxD(31:0) - Output indicates the write-back data to the register file for retiring instructions.

WBxBYTE(3:0) - Output indicates the write-back selected bytes to the register for retiring instructions.

RBxDAT1(31:0) - Output indicates the first source operand data for dispatching instructions.

RBxDAT2(31:0) - Output indicates the second source operand data for dispatching instructions.

FLGxDAT1(5:0) - Output indicates the status flags for dispatching instructions.

RBxTAG1(4:0) - Output indicates the first dependency tag for dispatching instructions.

RBxTAG2(4:0) - Output indicates the second dependency tag for dispatching instructions.

FCFxTAG(4:0) - Output indicates the CF flag dependency tag for dispatching instructions.

FOFxTAG(4:0) - Output indicates the CF flag dependency tag for dispatching instructions.

FXFxTAG(4:0) - Output indicates the CF flag dependency tag for dispatching instructions.

PUSHPOP(2:1) - Output to register file indicates the pop bits of the floating point status register to clear the full bits of the register being popped. FPTOP(2:0) contains the current top-of-stack when these bits are asserted.

FPTOP(2:0) - Output to register file indicates the current top-of-stack to identify the registers being popped to clear the full bits.

WBEXCHG - Output to register file indicates the exchange instruction being retired. It causes the permanent remapping register to be updated from the write-back bus.

WRPTR(4:0) - Output to LSSEC indicates the bottom (oldest) entry in the FIROB without valid result. If this entry matches the store or load-miss entry in the LSSEC, the entry can access the data cache at this time.

CANENTRY - Output to LSSEC indicates the bottom entry in the FIROB without valid result is canceled. If this entry matches the store or load-miss entry in the LSSEC, the entry can return without access the data cache at this time.

WRPTR1(4:0) - Output to LSSEC indicates the next to bottom entry in the FIROB without valid result. If this entry matches the store or load-miss entry in the LSSEC, the entry can access the data cache.

CANENTRY - Output to LSSEC indicates the next to bottom entry in the FIROB without valid result is canceled. If this entry matches the store or load-miss entry in the LSSEC, the entry can return without access the data cache.

Basic Operations

The FIROB interfaces with the decode units for dispatching instructions, with the functional units and LSSEC for results, and with the register file for retiring instructions. The FIROB updates the special registers correctly with each retiring instructions, handles trap/interrupt gracefully, and re-synchronizes the pipeline after branch mis-prediction, self-modifying code, or changing the code segment register.

Dispatch Interface

Every cycle, the FIROB indicates the space status to the decode unit via ROBFULL or ROBEMPTY. As long as the FIROB is not full a line of instructions can be dispatched. The empty status is for serialized instructions. The dependency checking is performed for the operands and flags of the top 5 valid lines of the FIROB. The FIROB performs the dependency checking for 2 register operands and validates the results with decode information and hit signals. The FIROB keeps the destination operands of the X86 instructions.

The FIROB provides the dependency tags for the source operands and flags. The destination tags is by the virtual line number. The fixed location of the instructions is simple for returning of the results. The FIROB implements a FIFO shifter to limit the dependency checking to the first 5 lines. The virtual line number is shifted along with retiring line to keep track of the instructions in the functional units.

Result Bus Interface

The result buses are dedicated between the functional units and the destination buffers of the FIROB. The FIROB compares the line number for returning results. The exceptions are the floating point unit and LSSEC. The line number and the entry number are compared in this case. The functional units send the data and address to the LSSEC for data cache access. The result buses contain the status flags, and results. Various status/control bits in the FIROB will be set and cleared for the benefit of the retire logic. Since the store and move-to-special-register instructions must access the data cache in the program order, all previous instructions must be completed with valid results. The FIROB broadcasts the top two entries which do not have the valid results to the LSSEC and SRB. If the broadcasted entries match the store or load-miss instructions, the LSSEC can access the data cache and returns results. Similar procedure is used for the move-to-special-register instruction in the SRB.

The result data and tag are returned to the FIROB in the execution and data cache access cycle. The status can be a cycle later because of the zero-detect, carry, and tag-hit in the data cache. The retire logic may not be able to retire the instructions with late result immediately (require some work in logic and circuit design). There may be a cycle delay in retiring instructions with late statuses. Furthermore, the limit violation checking on data access in the LSSEC can be later in the next clock cycle along with the late tag-hit status. The limit violation results in trap instead of retiring the instruction.

Write-Back Interface

The write-back interface of the FIROB is to ensure the retiring of instructions in program order. In addition to controlling write back to the register file, the FIROB updates the EIP register and flags registers and controls the order of the load-miss, store accesses and move-to-special-register instructions. In normal operation, the FIROB retires an entire line of instructions at a time. All instructions in the line must have the valid results from the functional units or LSSEC. All entries with valid result destination will write back to the register file. The LIL and NC status bits of the FIROB ensures that none of the write-back destinations are the same. The destination address includes the selected bytes for writing back data. In the case LIL and NC status bits are set for destinations of different size, and the FIROB masks the selected bytes before sending to the register file. In some special case, the FIROB retires a partial line. The LIL and NC status bits must be checked and reset before retiring, an extra cycle is needed for this case. The LIL and NC status bits are also used for the flags to simplify updating the flags registers.

A branch mis-prediction causes a partial line to be retired. The register file destination addresses are compared to all the previous destinations within the partial line and reset the LIL and NC bits before retiring the store instruction in the next cycle. The write-back data is in the correct byte position with byte enables for the register file. The bytes are put in the correct position from the functional units, no shifting is needed in the FIROB.

Two PC's are kept for each line. The first PC is for the first instruction in the line, the second PC is for a second instruction which crosses the 16-byte boundary or the branch target within the line. The PC offset is concatenated with line PC to get the current PC for retired instructions. A real register for the flags and program states is updated with the retired instruction. As the taken branch instruction is retiring, the PC is updated with the branch target or next line instruction.

Updating the EIP Register

The EIP is used to keep track of the X86 instruction execution. Instructions can be aligned on any byte boundary so 32 bits of EIP are implemented. Each retiring instruction updates the EIP register, and there is no concept of freezing. The MROM instructions do not update the EIP register, indicatds by ROBEXIT, except for the last MROM instruction in the sequence. The EIP update falls into one of three categories:

Retire the entire line, no mis-prediction, EIP=Next line PC1.

Retire the line with branch mis-prediction, EIP=branch target.

Retire the partial line, ROBNPC=0, EIP=EIP: next entry PC offset.

Retire the partial line, ROBNPC=1, EIP=Next line PC2.

Floating-Point Interface

The FIROB keeps the floating point instruction pointer, data pointer, floating point status and opcode registers for floating point interfacing. The data pointer is updated on each floating point load with the instruction pointer and opcode registers are updated on floating point exception. The data pointer is implemented in the load/store section. The floating point status register is implemented with working and backup copies to ensure correct operation of floating point stores.

Trap and Interrupt Processing

For internal exceptions from the functional units, LSSEC, and SRB, the exception entry in the FIROB will be retired in order. Similar to the branch mis-prediction, the pipe and fetching should stop on an exception indication. When all entries before the exception entry have completed and retired, the exception procedure is initiated. All entries in the FIROB, the functional units, and LSSEC will be purged. The exception routine will be fetched. The FIROB is responsible to generate the entry point to the MROM exception routine or new PC to the Icache. No state is updated when a trap is taken. The processor fetches from an appropriate entry point and allows the microcode to perform the necessary state modifications. It is up to the microcode to save the current EIP on the stack before the user's trap handler is called.

Dependency Checking & Dispatching

The FIROB is responsible for checking dependency of the source operands of the dispatched line of instructions against the destination operands of the previous lines of instructions. The dependency comparators are needed for the first 5 lines in the FIROB and within the current line. The source addresses are checked for dependency against the previous destination addresses, and the dependency tags are generated by the end of this cycle. The forwarding data from the FIROB is driven in the next clock to the reservation station. Since the X86 instruction can only have 2 operands, the operand can be both destination and source which is indicated by the operand's tag bits, the current destination addresses are checked for dependency against the previous destination addresses with no extra cost in hardware. The write-after-write dependency information is used to set three new status bits for most up-to-date destination and the previously match destination. The three new status bits are referred to as Last-In-Line (LIL) bit for each line, and No-Compare (NC) bit for the whole FIROB. The NC bits ensure that there is only a single HIT for any read operand. The NC bits are used to qualify the dependency checking comparator, and the LIL bits are used to restore the most up-to-date status of the destination in case of partial-line retiring by branch mis-prediction. Other ROBs can have multiple HITs and search for the most current HIT. The procedure for dependency checking on this type of ROB is:

Compare source addresses to previous destination addresses.

Search for the most current HIT from multiple HITs.

Encode for the dependency tag.

Route tag and data to reservation station. On Processor 500, the two intermediate steps are eliminated, since there is only a single HIT, the HIT signal can be used as control to mux the tag and data directly. The NC and LIL bits are also used for retiring the line to the register file. No two entries have the same destination pointer for the line of instruction. The same method can be applied to the status flags. The FNC and FLIL bits are used for the status flags. The status flags are in three groups, OF, {SF,ZF,AF,PF}, and CF.

Figure 35:
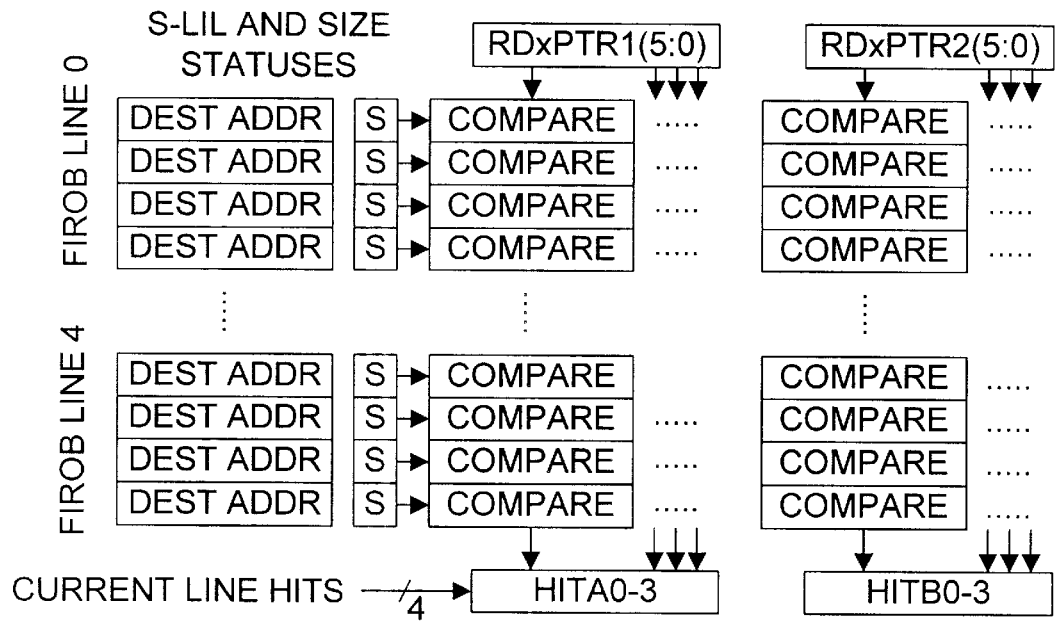

As illustrated in FIG. 35, the matrix for dependency checking is 20 6-bit destination addresses against the 8 source operand addresses. For read operand, if there is a hit in the FIROB, the FIROB has the highest priority to drive the data on the operand bus to the functional unit.

If there is a branch mis-prediction, all instructions in the same line after the mis-predicted branch with the LIL bit set feed back to the RDOPTR to check and reset the previous entries with the NC bit set. An extra cycle is used to retire instructions. The CANCEL status bits for all instruction after the branch mis-prediction should be used to qualify the instructions as NC.

Operand's Size Dependency

The size of the operands in dependency checking is quite complex for the X86 instruction set. Processor 500 checks for dependency from wide to narrow and stalls the dispatch line in decode for the narrow to wide dependency. Only one dependency tag is needed for each source operand.

Signal List

TOPPTR(2:0) - Pointer to the top of the FIROB. This pointer is used to enable the number of lines in the FIROB for dependency checking.

ENINTR(3:0) - Input from Idecode indicates external interrupt enable for each instruction. This information is used for retiring instruction.

IDSIB(3:0) - Input from Idecode indicates which decode unit has the SIB-byte instruction. The FIROB should generate dependency on the previous instruction of the last line in the same issue position.

MROMDEC(3:0) - Input from MROM indicates the microcodes are being decoded by the decode units. Use to set the ROBEXIT bit.

INSDISP(3:0) - Input from Idecode indicates that the instruction in decode unit is valid, if invalid, NOOP is passed to FIROB.

INSLSxB(5:0) - Input from decode units indicates the prefix values. bit 5 - data size, bit 4 - address size, bit 3 - lock, bit 2:0 - segment registers.

IDSIB(3:0) - Input from Idecode indicates which decode unit has the SIB-byte instruction.

RBxTAG1(4:0) - Output indicates the first dependency tag for dispatching instructions.

RBxTAG2(4:0) - Output indicates the second dependency tag for dispatching instructions.

FCFxTAG(4:0) - Output indicates the CF flag dependency tag for dispatching instructions.

FOFxTAG(4:0) - Output indicates the CF flag dependency tag for dispatching instructions.

FXFxTAG(4:0) - Output indicates the CF flag dependency tag for dispatching insructions.

DSETALL(4:0)

DSETEXIT(4:0)

DSETINTR(4:0) - Input to set signals for dispatched instructions. The bits should be set in the cycle after the dependency checking.

Handling of Load/Store

Handling of store and load-miss can also be done with the broadcasted entry. The FIROB broadcasts the next-in-line entry which does not yet have a the result from a functional unit. With this FIROB entry, WRPTR(4:0), the LSSEC knows when to execute the store or load-miss instruction without any handshake from the FIROB. This implementation will eliminate the signals between the FIROB and the load/store unit. An extra signal, CANENTRY, will accompany the WRPTR to indicate that this entry has been canceled by mis-prediction. The LSSEC and the reservation stations can use this information to return the results without any execution, and any data dependency in the load/store buffer is ignored. The FIROB treats the load/store instructions the same as other ALU instructions with this method.

The LSSEC implements a store buffer to keep track of the store instructions in the pipe for address dependency checking. The store buffer is capable of issuing 2 store instructions to the data cache if the store instructions are next-in-line for retiring. To accomplish this, the FIROB will broadcast another pointer, WRPTR1(4:0), and CANENTRY1 to the store buffer, if the first two entries in the store buffer match the WRPTR and WRPTR1, two stores can be executed concurrently as long as they accesses two different banks in the data cache. The WRPTR and WRPTR1 point to two entries in the FIROB which need results. The two entries do not necessarily point to store instructions.

A similar procedure is also used for in-order execution of the move-to-special-register instructions. A buffer in the load/store special register is used for the special register instructions, the ROB tag is compare to the WRPTR to execute the instruction and return result to the FIROB.

Load and store instructions assume single cycle access to the data cache. The results are speculatively latched into the data buffer. The validation of the load/store is from the HIT signal of the data cache early in the next cycle. The result valid bits of the load/store is clear in the next cycle if miss in the data cache.

Unaligned Accesses

Processor 500 is optimized for aligned 8/16/32 bits accesses. For aligned access, the operand comparison is for bit 31:2 with indication for checking of 8/16/32 bits. The LSSEC takes two or more clock cycles to execute the instruction. The operation of the LSSEC for unaligned load is as followed:

First cycle: Access the data cache (DC) to read data with the current address, another access may be concurrent. Increase the address by 4 for the second access.

Second cycle: Access the DC to read data with the increased address, other access can be concurrent. Latch the data of the first access at the beginning of this cycle. The DC puts the 8 or 16 bits at the least significant byte (same as any narrow access), and the LSSEC puts the first half data of the unaligned at the most significant byte of the result bus.

A miss in either part of the unaligned access must wait for the WRPTR or WRPTR1 of the FIROB to execute the instruction in program order. The load/store buffer must keep the status to access the data cache and send the results correctly on the buses.

Both halves of the unaligned store are written into the cache at one time to avoid any intermediate exception. The operation of the LSSEC for unaligned store is as follows:

First cycle: Access the data cache (DC) with the current address, do not write data, another access may be concurrent. If miss in the data cache, the reload routine may start this cycle. Increase the address by 4 for the second access.

Second cycle: Access the DC using two ports to write data with both addresses

The advantages of the above procedure are:

The LSSEC always does two accesses and the unaligned access always takes two cycles. The LSSEC has a whole cycle to increase the address; no different for crossing the line boundary.

The LSSEC does all the merging for unaligned load with ease. The DC does not need to know about the unaligned access.

Signal List

LSTAG0(4:0) - Input from LSSEC indicates FIROB line number of the first access.

LSTAG1(4:0) - Input from LSSEC indicates FIROB line number of the second access.

LSRES0(31:0) Input from LSSEC indicates result data of the first access.

LSRES1(31:0) - Input from LSSEC indicates result data of the second access.

WRPTR(4:0) - Output to LSSEC indicates the bottom (oldest) entry in the FIROB without valid result. If this entry matches the store or load-miss entry in the LSSEC, the entry can access the data cache at this time.

CANENTRY - Output to LSSEC indicates the bottom entry in the FIROB without valid result is canceled. If this entry matches the store or load-miss entry in the LSSEC, the entry can return without access the data cache at this time.

WRPTR1(4:0) - Output to LSSEC indicates the next to bottom entry in the FIROB without valid result. If this entry matches the store or load-miss entry in the LSSEC, the entry can access the data cache.

CANENTRY - Output to LSSEC indicates the next to bottom entry in the FIROB without valid result is canceled. If this entry matches the store or load-miss entry in the LSSEC, the entry can return without access the data cache.

Handling of Branch and Re-synchronization

Since branches may be executed in parallel in multiple functional units, branch mis-prediction is handled in order. The mis-prediction of branches is handled by the FIROB. There are two types of branches, the conditional branch and the unconditional branch. The unconditional branch is always taken and includes call, return, and unconditional jump. The mis-prediction is when the targets do not match. For conditional branch, the mis-prediction is from taken/non-taken prediction and/or matching target address. Branch mis-prediction stops the pipe which can be done from the functional units, and all instructions in decode are cleared, and the new target is fetched by the Icache at a later time. The functional units may send the mis-predicted signal to stop the pipe and return the correct logical PC address to the FIROB. Because of the branch holding register, the branch mis-prediction does not update the ICNXTBLK until the next branch mis-prediction. The FIROB can speculatively send the branch mis-prediction to the Icache. If there is another mis-predicted branch prior to the last one, the FIROB can invalidate the branch holding register in the ICNXTBLK. The Icache uses an extra cycle to update the previously mis-predicted branch into the ICNXTBLK, and the FIROB uses this cycle to update the NC status bit and retire the instruction to the register file. The new logical PC address from branch mis-prediction should be sent to the Icache and allow the code segment to be added to generate the linear address for accessing the Icache. When an entry in the FIROB is completed with mis-prediction status, entries after the branch are marked with cancelled status. The cancelled entries can have incorrect result data from the functional units or LSSEC.

Another condition to re-fetch the instructions is re-synchronization. There is a possibility of executing a wrong instruction from self-modifying code and updating the code segment register. The stream of instructions must be re-fetched. From external snooping which cause an invalidation of a line in the instruction cache or an internal store instruction which can change a line in the instruction cache, the FIROB is re-synchronized at this point. As soon as the write to code-segment register is detected, following instructions are re-fetched upon completion of the code segment register write.

Recover of Status Bits from Branch Mis-prediction

The status bits are no longer correct with branch mis-prediction. The FIROB takes one clock cycle to reset the status bits for each line of the FIROB after the branch mis-prediction. First, the line with the branch mis-prediction will be corrected. Within the line if there is any LIL bit is set after the branch mis-prediction, the destination is compared against the previous destinations before the branch mis-prediction. A match will set the LIL bit and clear the NC bit for that entry

Updating PC

Each line of the FIROB has two PCs, and each entry has a PC offset of the next instruction and one status bit to indicate if the offset is related to the second PC. As the line is retired, the current PC pointer will point to the next line PC. For partial retiring of the line, the line PC is updated with the offset of the present entry in the FIROB. For the MROM entry, the offset is with the last MROM instruction, and all other MROM instruction should have the same offset with the line PC. With this technique, handling of the PC is relatively simple. In the case of branch mis-prediction for sequential fetch, (the branch prediction is taken) the PC can be calculated by concatenating the line PC with the offset. If the PC is at the end of the line, the sequential PC is+16.

Signal List

BRNMISP - Input from the Branch execution of the FU indicates that a branch mis-prediction. The Idecode clears all instructions in progress.

UPDFPC - Output to Icache indicate that a new Fetch PC has been detected. This signal accompanies the FPC for the Icache to begin access the cache arrays.

TARGET(31:0) - Output to Icache as the new PC for branch correction path.

BRNMISP - Input to Icache indicates a branch mis-prediction. The Icache changes its state machine to access a new PC and clears all pending instructions.

BRNTAKEN - Output to Icache indicates the status of the mis-prediction. This signal must be gated with UPDFPC.

BRNFIRST - Output to Icache indicates the first or second target in the ICNXTBLK for updating the branch prediction.

BRNCOL(3:0) - Output to Icache indicates the instruction byte for updating the branch prediction in the ICNXTBLK.

FPCTYP - Input to Icache indicates the type of address that is being passed to the Icache.

BPC(11:0) - Output indicates the PC index and byte-pointer of the branch instruction which has been mis-predicted for updating the ICNXTBLK.

Handling Traps and Interrupts

A function of the FIROB is to detect and prioritize the traps and interrupts and to initiate specific redirections at appropriate times. The LSSEC and functional units send the highest exceptions to the FIROB. The basic mechanism for redirection is:

Assert EXCEPTION to clear out instructions in the pipe.

One cycle later, assert REQTRAP and drive new entry point to the MROM.

Correct look-ahead registers at decode and in the branch units. The FIROB initiates the microcode routine from the MROM by REQTRAP and does not wait for LSSEC to be idle. There are three groups of traps and interrupts:

Exception results from functional units, FPU, and LSSEC.

External interrupts (maskable and non-maskable).

Single step traps. The FIROB includes a set of entry point vectors which can be sent to MROM on REQTRAP indication.

Internal Traps and Interrupts

The internal exception results are coded into 3 bits of ROBEXC:

000 - no exception

001 - load/store breakpoint This is set when any load or store breakpoint status is returned. The instruction is retired normally. The debug entry point is generated and the B bits of the debug status register are set according to the 2-bit debug register hit code reported with the result. The redirection starts when the whole instruction is completed; the ROBEXIT bit is set. Another trap or interrupt can have higher priority while the load/store breakpoint is waiting for the rest of the instruction to complete. The floating point exception causes the FIROB to update all the floating point exception registers but the debug trap has higher priority.

010 - software interrupt with vector This is set when a software interrupt status is returned. This exception includes the INTO instruction. When the instruction is retired, the PC is updated and the exception with vector is taken.

011 - floating point exception with write-back/push/pop This is set when the corresponding status is returned. The instruction retires normally with the floating point opcode and instruction pointer registers are updated. The FIROB does one of the four actions:

if a pending breakpoint exits, take a breakpoint trap.

if NE=1, take a floating point trap directly.

if NE=0 and IGNNE=0, freeze and wait for an external interrupt.

if NE=0 and IGNNE=1, resync to the next instruction.

100 - exception with vector This is set when an exception result is returned with a vector (including a TLB miss). When the instruction is retired, no write-back nor PC update occurs and the redirection with the entry point is initiated. This is used for majority of traps, the entry point is provided with the results.

101 - exchange abort This is set when an exchange abort status is returned. The retire procedure is the same as exception with vector except that the PC is driven back instead of the MROM entry point. The signal SYNC and EXCHGSYNC are asserted along with REQTRAP to notify the Icache.

110 - not used.

111 - floating point exception without write-back/push/pop This is set when the corresponding status or an exchange result with underflow is returned. The retire procedure is the same as the above floating point exception without write-back or push/pop.

External Interrupts

The external interrupts include both maskable and non-maskable interrupts. The non-maskable interrupt (NMI) is a normal, precise, external interrupt. The NMI should only be seen by the FIROB. The external interrupt is only recognized during selected windows:

Partially retired valid instructions in the bottom line with ROBEXIT status and did not cause a trap or resynchronization.

Frozen due to having retired a floating point exception with NE=0 and IGNNE=0.

On external interrupts, the entry point is generated locally by the FIROB at the time the redirection is initiated. The maskable interrupt is level sensitive while the NMI is edge sensitive. FLUSH and INIT are also treated as edge sensitive asynchronous interrupts, similar to NMI. If the NMI is taken, it cannot be taken again before an IRET is executed. The microcode maintains a series of global flags that are inspected and modified by many of the trap handler entry points, and the IRET instruction. It is also the responsibility of the microcode to detect the NMI and delay the NMI until after executing of the IRET. The MROM allows only one level of NMI. Many other aspects of nested trap control (double fault, shutdown, etc.) will be handled with this microcode mechanism. There is no hardware support for this. When an enabled trap condition arises, the FIROB takes it at the next available window.

The HALT instruction causes the FIROB to update the EIP before entering shutdown mode. If the shutdown is entered as a result of a failed NMI, microcode should also clear the IF bit before halting.

Single Step Traps

When the TF bit of the EFLAGS register is set, a debug trap is taken at the successful completion of each instruction, not including the instruction that actually caused TF to be set (i.e. the POP or IRET). The FIROB takes a single step trap on the successful retirement of the second instruction after the setting of the TF bit. When the TF bit is clear the effect is immediate. When a single step trap is taken, the entry point is generated locally by the FIROB, and the BS bit of the debug status register is set. The TF bit of the EFLAGS register is not cleared by hardware; it is cleared by microcode after pushing EFLAGS onto the stack.

Debug Interface

A summary of each type of debug trap is presented in this section. Load and store breakpoints are detected by the LSSEC and returned as a status to the FIROB with a 2-bit code identifying the breakpoint register matched. When the instruction is retired the FIROB initiates a debug trap and sets the corresponding B bit in the debug status register. The entry point for this trap is generated locally. The instructions with load/store breakpoint trap are considered to have completed successfully.

Instruction breakpoints are not handled by the FIROB. The pre-decode disables the Icache and sends a special serializing instruction to each new instruction, whenever any of the debug registers are enabled for code breakpoints. The special instruction is serially dispatched to the LSSEC where it compares the pre-decode PC to the breakpoint registers, accounting for the state of the RF bit. If a breakpoint is detected, a normal exception status is returned to the FIROB and a trap is taken. The provided to entry point depends upon which breakpoint register got the hit, and the setting of the appropriate B bit is the responsibility of the microcode. The FIROB is unaware of the nature of the trap being taken. The RF bit is cleared automatically by the FIROB on the successful retire of the second instruction following its low to high transition.

Single step debug traps are handled in hardware by the FIROB as was described in previous section. The setting of the BS bit is done automatically by the FIROB but the handling of the TF bit is the responsibility of the microcode.

The global detect debug trap is handled by the SRB, by inspecting the state of the GD bit in the debug control register whenever a move to or from any debug register is attempted. If it is set, no move is performed and a trap status is returned. The setting of the BD bit when the trap is taken is performed by microcode; the FIROB is unaware of the nature of the trap being taken.

The task-switch debug trap is handled by microcode, including the setting of the BT bit in the debug status register.

The breakpoint instruction (INT 3 - 0xCC) is treated like a normal software interrupt. It is dispatched to a is functional unit and returns an appropriate status. The FIROB updates the EIP register (which is one byte for the INT 3 instruction) and traps to the provided entry point. The FIROB does not treat this instruction any different than other software interrupts.

Signal List

NMI_P - Input from BIU indicates non-maskable interrupt, the FIROB generates a clean instruction boundary trap to a fixed entry point. The FIROB is sensitive only to the rising edge of this signal INTR_P - Input from BIU indicates the external interrupt. This signal is qualified with the IF bit of the EFLAGS register. The interrupt occurs at appropriate instruction boundaries.

SRBHALT - Input from SRB to enter HALT mode. The FIROB stops retiring instructions until RESET, NMI, or external interrupt occurs. The FIROB must retire the HALT instruction before shutting down.

CRONE - Input from SRB indicates the NE bit of the CR0 register. The NE bit indicates the floating point exception can be trapped directly (NE=1) or via XFERR_P and an external interrupt (NE=0).

XIGNNE_P - Input from BIU indicates the copy of pin IGNNE. When CRONE=0, this signal is inspected to response to enabled floating point exceptions.

XFLUSH_P - Input from BIU indicates an external flush request occurs. It is falling edge sensitive and trap on instruction boundary. It is sample during IRESET to enter tri-state test mode, the FIROB should not generate exception.

IINIT - Input from BIU indicates an initialization request. It is rising edge sensitive and trap on instruction boundary. It is sample during IRESET to enter BIST test mode, the FIROB generates on of the two reset entry point.

EFLAGSRF - Output generates from the EFLAGS register, these bits are visible from the slave copy of the EFLAGS register. The RF bit is also used in the FIROB to handle instruction breakpoint.

EFLAGSIF - Output generates from the EFLAGS register, this is the mask bit for INTR_P. When clear, INTR_P is ignored.

EFLAGSTF - Output generates from the EFLAGS register, the interrupt and trace flags are needed locally to control external interrupts and single step trapping after two completed instructions retires.

LOCVEC - Input from ROBCTL indicates whether entry point of the redirection is from the result status or locally generated.

ASYNCOK - Input from ROBWB indicates an external interrupt or NMI can be taken.

DOEXC - Input from ROBWB indicates an EXCEPTION is asserted and a trap to the entry point returned with the instruction is initiated.

DOXABORT - Input from ROBWB indicates an EXCEPTION is asserted and a resync is initiated. The signal EXCHGSYNC is asserted in addition to the normal resync signals.

DOFP - Input from ROBWB indicates an floating point exception by inspecting CRONE and XIGNNE_P. Exception, freeze mode, or resync is taken in next cycle.

DOBREAK - Input from ROBWB indicates an EXCEPTION is asserted and a trap to a locally generated debug entry point is initiated.

DOSBZ - Input from ROBWB indicates an EXCEPTION is asserted is and a resync to the next instruction is initiated.

DOLSYNC - Input from ROBWB indicates an EXCEPTION is asserted and a resync to the next instruction is initiated.

DOTRACE - Input from ROBWB indicates an EXCEPTION is asserted and a trap to a locally generated single-step entry point is initiated.

LOCENTRY(9:0) - Output of local entry point vector for traps or interrupts.

EXCEPTION - Global output indicates that an interrupt or trap is being taken including resynchronization. Effect on Idecode and Fus is to clear all instructions in progress.

REQTRAP - Global output, one cycle after EXCEPTION, indicates that the trap is initiated with new entry point or new PC is driven.

SYNC - Output indicates whether the new entry point or new PC is driven.

FREEZE - Output from a latch indicates when an SRB-HALT occurs, or when DOFP is asserted with CRONE=0 and XIGNNE_P=1. The latch is reset when an enabled external interrupt, NMI, or IRESET occurs.

XFERR_P - Output to BIU indicates the floating point error which is inverted of the ES bit from the slave of the floating point status register. It is also used by the FIROB to generate the plunger traps.

EXCHGSYNC - Output indicates exchange instruction resynchronization to Icache. This occurs when an exchange with a masked underflow is retired. It is a special resynchronize exchange with alternate entry point.

Listing of Status Bits

This block describes the status bits and fields in the FIROB. The FIROB keeps track of the processor states, status flags, handling correct PC, and retires instructions in program order to the register file. The number of status bits and fields in the FIROB is organized in four groups: the data path, the entry's status bits, the line's status, and the global field.

The Data Path

The data path contains the necessary data for the 32-bit communication with the decode units, the register file, and the functional units.

ROBDATA - RESULT DATA - 32-bit - Receive data from functional unit by comparison of result line number. Write data back to the register file from the bottom of the FIROB. This can also be the branch target to be routed to the Icache.

ROBDEST - DESTINATION OPERAND - 6-bit - Receive the register address from the decode units into the top of the FIROB. Send the address to the register file to latch valid result data from the bottom of the FIROB. The address routes to the comparators for dependency checking.

ROBTYPE - OPERAND TYPE - 1-bit - Receive the type of the destination operand from the decode units. Indicates if ROBDEST is valid.

ROBBYTE - SELECT BYTE - 3-bit - Receive the operand size from the decode units. Decode into 3 bits and for comparators and write back to the register.

ROBNC - NO-COMPARE - 3-bit - Received from the dispatch line comparator; indicates that there is another instruction in the dispatch line with the same destination. The 3 bits is used for the bytes in the data word. This entry should not used in dispatch dependency checking. If the ROBLIL bit is not set, the destination of this entry should not be used for writing back to the register file.

ROBLIB - LAST-IN-BUFFER BIT - 3-bit - From comparing of the dispatch line against the previous line in the FIROB. The 3 bits are used for the bytes in the data word. This entry ensures a single hit for lines in the FIROB. Use for dispatch dependency checking.

ROBLIL - LAST-IN-LINE BIT - 3-bit - Received from the dispatch line comparator; indicates that there is another instruction in the dispatch line with the same destination. The 3 bits are used for the bytes in the data word. Use for writing back to the register file and for dependency checking. If the ROBNC bit is also set; indicates the matched destination with another entry in the buffer.

ROBFNC - FLAG NO-COMPARE - 5-bit - Received from the dispatch line comparator, indicates that there is another instruction in the dispatch line with the same flag destination. This entry is not used in flag dependency checking. If the ROBFLIL bit is not set, the destination of this entry should not be used for updating the flags registers.

ROBFLIB - FLAG LAST-IN-BUFFER BIT - 5-bit - From comparing of the dispatch line against the previous line in the FIROB. This entry to ensure a single hit for all lines in the FIROB. Use for flag dependency checking.

ROBFLIL - FLAG LAST-IN-LINE BIT - 5-bit - Received from the dispatch line comparator; indicates that there is another instruction in the dispatch line with the same flag destination. Use for updating the flags registers and for dependency checking. If the ROBFNC bit is also set, indicates the matched destination with another entry in the buffer.

ROBPCOFF - PC OFFSET - 4-bit - Received from the decode units, indicates the offset from the current line PC. This PC offset concatenates with the PC to form the 32-bit address.

ROBTAG - FIROB TAG - 3-bit - The hard-wired tag of the FIROB entries. A single tag is used for all lines in the FIROB. This tag in combination with the ROBLTAG is multiplexed to the reservation station in case of dependency.

ROBFUPD - FLAG UPDATE - 3-bit - Received from the decode units, indicates that the instructions will update the status flags. Use for flag dependency checking and writing back to the global status flag registers. Bit 2 - OF, bit 1 - SF, ZF, AF,PF, bit 0 - CF.

ROBFLDAT - FLAG RESULT - 6-bit - Received from the functional units for the updates flags. Use for writing back to the global status flag registers.

Signal List

RB0P0HIT1(3:0) - Input from ROBCMP indicates that the FIROB line 0 matches with the first operand of the instruction at position 0. There are a total of 24 RBxPxHIT1 (3:0) signals. These signals are used to mux the dependency tag and data to the functional units.

RB1P0HIT1(3:0)

RB2P0HIT1(3:0)

RB3P0HIT1(3:0) - Input from ROBCMP indicates that the FIROB line 1–3 matches with the first operand of the instruction at position 0.

RB0P1HIT1(3:0)

RB0P2HIT1(3:0)

RB0P3HIT1(3:0)

RB0P4HIT1(3:0)

RB0P5HIT1(3:0) - Input from ROBCMP indicates that the FIROB line 0 matches with the first operand of the instruction at position 1–5.

RB0P0HIT2(3:0) - Input from ROBCMP indicates that the FIROB line 0 matches with the second operand of the instruction at position 0. There are a total of 24 RBxPxHIT2 (3:0) signals.

RB1P0HIT2(3:0)

RB2P0HIT2(3:0)

RB3P0HIT2(3:0) - Input from ROBCMP indicates that the FIROB line 1–3 matches with the second operand of the instruction at position 0.

RB0P1HIT2(3:0)

RB0P2HIT2(3:0)

RB0P3HIT2(3:0)

RB0P4HIT2(3:0)

RB0P5HIT2(3:0) - Input from ROBCMP indicates that the FIROB line 0 matches with the second operand of the instruction at position 1–5.

WBENB(3:0) - Input from ROBCTL indicates that writing back is enable from the bottom of the FIROB.

RESx(31:0) - Input from FU indicates result data.

DTAGx(2:0) - Input from FU indicates FIROB line number of the result.

RFLAGx(31:0) - Input from FU indicates result flags.

LSTAG0(4:0) - Input from LSSEC indicates FIROB line number of the first access.

LSTAG1(4:0) - Input from LSSEC indicates FIROB line number of the second access.

LSRES0(31:0) - Input from LSSEC indicates result data of the first access.

LSRES1(31:0) - Input from LSSEC indicates result data of the second access.

WBxNC - Output indicates the invalid write-back data to the register file for retiring instructions.

WBxPTR(5:0) - Output indicates the write-back pointer to the register file for retiring instructions.

WBxD(31:0) - Output indicates the write-back data to the register file for retiring instructions.

WBxBYTE(3:0) - Output indicates the write-back selected bytes to the register file for retiring instructions.

RBxDAT1(31:0) - Output indicates the first source operand data for dispatching instructions.

RBxDAT2(31:0) - Output indicates the second source operand data for dispatching instructions.

FLGxDAT1(5:0) - Output indicates the status flags for dispatching instructions.

RBxTAG1(4:0) - Output indicates the first dependency tag for dispatching instructions.

RBxTAG2(4:0) - Output indicates the second dependency tag for dispatching instructions.

FCFxTAG(4:0) - Output indicates the CF flag dependency tag for dispatching instructions.

FOFxTAG(4:0) - Output indicates the CF flag dependency tag for dispatching instructions.

FXFxTAG(4:0) - Output indicates the CF flag dependency tag for dispatching instructions.

TARGET(31:0) - Output to Icache indicates the new PC for branch correction path and resynchronization. It is also used for special register updates in the FIROB.

RBxNC - Output to ROBCMP indicates the invalid entry for dependency checking.

RBxLIL - Output to ROBCMP indicates the last-in-line entry for dependency checking.

RBxFNC - Output to ROBCMP indicates the invalid entry for flag dependency checking.

RBxFLIL - Output to ROBCMP indicates the last-in-line entry for flag dependency checking.

ICPOSx(3:0) - ICLK7 Input from Icache to decode units indicates the PC's byte position of the next instruction.

IDxDAT(1:0) - Input from Idecode indicates the data size information. 01-byte, 10-half word, 11-word, 00-not use.

IDXADDR - Input from Idecode indicates the address size information. 1–32 bit, 0–16 bit.

DxUSEFL(2:0)

DxWRFL(2:0) - Input from Idecode indicates the type of flag uses/writes for this instruction of decode units:

xx1 CF-carry flag, x1x OF-overflow flag,

1xx SF-sign, ZF-zero, PF-parity, and AF-auxiliary carry

INSDISP(3:0) - Input from Idecode indicates that the instruction in decode unit is valid, if invalid, NOOP is passed to FIROB.

DxUSE1(1:0) - Input from Idecode indicates the type of operand being sent on operand 1 for decode units. Bit 1 indicates source operand, and bit 0 indicates destination operand.

DxUSE2 - Input from Idecode indicates indicates source operand.

RDxPTR1(5:0) - Input from Idecode indicates the register address for operand 1 of the instructions.

RDxPTR2(5:0) - Input from Idecode indicates the register address for operand 2 of the instructions.

INSLSxB(5:0) - Input from decode units indicates the prefix values. bit 5 - data size, bit 4 - address size, bit 3 - lock, bit 2:0 - segment registers.

The Entry's Status

Each entry of the FIROB has many status's.

ROBVAL - VALID RESULT - 1-bit - Set when functional units return valid results. The entry can be retired when this bit is set. A NOOP sets this bit during dispatching.

ROBTKN - TAKEN BRANCH - 1-bit - Set when functional units return valid results. Use to update the EIP with the taken branch target.

ROBJMP - BRANCH INFORMATION - 3-bit - Receive from the decode units, indicates CALL/RETURN (bit 0) or unconditional jump instruction (bit 1) and valid branch instruction (bit 2). The branch resets the branch tag in the global shift register and the return stack.

ROBGBTAG - GLOBAL BRANCH TAG - 4-bit - Receive from the decode units, indicates the global branch prediction tag. Use to recover the global branch prediction shift register, the counters, and the byte position of the mis-predicted branch instruction. This is to properly update the ICNXTBLK.

ROBCAN - CANCELED ENTRY - 1-bit - Set when branch mis-prediction is detected or SC-read_after_DC-write dependency is detected from load/store dependency checking. The entry is retired normally without updating the EIP.

ROBLSYNC - LOAD/STORE RESYNC - 1-bit - Set when functional units return valid results with resync status. The load/store hits in the Icache for self-modifying code. The next instruction should be re-fetched from the Icache.

ROBSBZ - SHIFT BY ZERO - 1-bit - Set when functional units return valid results with SBZ status. The scheduled flags updates are canceled. This status is used to qualify the ROBFUPD.

ROBEXIT - LAST MROM INSTRUCTION - 1-bit - Set for instructions except for MROM instructions and SIB-byte instructions. This status is used to update the EIP and flags registers when retiring instructions.

ROBNPC - NEXT PC - 1-bit - Set for instructions which use the second PC in the line - ROBLPC2. This status is used to update the EIP with ROBLPC2 when retiring instructions.

ROBEXC - EXCEPTION STATUS - 2-bit - Set when functional units return valid results with exception status. The exception code is:

000 - no exception

001 - load/store breakpoint

010 - software interrupt with error

011 - floating point exception with write-back/push/pop

100 - exception with vector (including TLB miss)

101 - exchange abort

110 - reserved

111 - floating point exception without write-back/push/pop

ROBFP - FLOATING POINT ENTRY - 1-bit - Set for floating point instruction during dispatching.

Signal List

DSTATx(3:0) - Input from FU indicates the status of the result data:
- 0000 - no result
- 0001 - valid result
- 0010 - valid result, shift by zero
- 0011 - exception with vector
- 0100 - software interrupt with vector
- 0101 - TLB miss with vector
- 0110 - load/store breakpoint
- 0111 - exchange result
- 1000 - exchange with underflow
- 1001 - exchange abort
- 1010 - branch taken, mis-prediction
- 1011 - branch not taken, mis-prediction
- 1100 - reserved for FPU
- 1101 - reserved for FPU
- 1110 - reserved for FPU
- 1111 - reserved for FPU

DSETALL(3:0)

DSETEXIT(3:0)

DSETINTR(3:0) - Input to set signals for dispatched instructions. The bits should be set in the cycle after the dependency checking.

RSETTKN(3:0)

RSETVAL(3:0)

RSETEXC(3:0)

RSETSBZ(3:0)

RSETLSYNC(3:0) - Input to set signals for result instructions. The bits are set in the same cycle as the results from functional units.

WBALL(3:0)

WBVAL(3:0)

WBCAN(3:0)

WBTKN(3:0)

WBSBZ (3:0)

WBEXC(23:0)

WBEXIT(3:0)

WBNPC(3:0)

WBLSYNC(3:0)

WBFP(3:0) - Output indicates the current status of the bottom line of the FIROB for retiring instructions.

The Line's Status

Each line in the FIROB has its own status and information for dispatching and retiring instructions. The FIROB is a set of FIFO registers to avoid the dependency checking for the top line. The virtual line tag which is routed to the functional units is rotated with the shifting of the line.

ROBPCL - LINE PC 1 - 28-bit - Receive from the decode units. This is the PC for the first instruction in the line. Use to update the current retired PC, branch mis-prediction, or re-fetch from Icache.

ROBPC2 - LINE PC 2 - 28-bit - Receive from the decode units. This is when the instruction cross the 16-byte line boundary in the Icache, and branch target of the instruction within the 4 entries in the ROB line. Use to update the current retired PC, branch mis-prediction, or re-fetch from Icache.

ROBPCB1 - PC1 BRANCH TARGETS - 2-bit - Receive from the decode units. This is information of the two branch targets in the ICNXTBLK for the line PC 1. For each bit, reset is non-taken or not valid, set is taken branch target. This information is for selecting a branch target for replacement in case of branch mis-prediction on the undetected branch in fetching.

ROBPCB2 - PC2 BRANCH TARGETS - 2-bit - Receive from the decode units. This is information of the two branch targets in the ICNXTBLK for the line PC 2. For each bit, reset is non-taken or not valid, set is taken branch target. This information is for selecting a branch target for replacement in case of branch mis-prediction on the undetected branch in fetching.

ROBLTAG - VIRTUAL LINE TAG - 3-bit - Reset for each line from 0 to 4. These virtual line tags are rotated with retiring instructions. The line write pointer points to the bottom of the FIROB and the line read pointer points to the next available line in the FIROB. The virtual line tags are sent to functional units.

ROBALL - ALLOCATE - 1-bit - Set during dispatching of a line of instructions. Clear on retiring instructions. This status qualifies all other status's.

Signal List

IDPC1(31:0) - Input from Idecode indicates the current line PC of the first instruction in the 4 dispatched instructions.

IDPC2(31:0) - Input from Idecode indicates the current line PC of a second instruction which cross the 16-byte boundary or branch target in the 4 dispatched instructions ROBPC(31:0) - Output indicates the current retire line PC.

ROBEMPTY - Output indicates the FIROB is empty.

ROBFULL - Output indicates the FIROB is full.

LINEPTR(2:0) - Output indicates the current line pointer in the FIROB for the dispatch line of instructions.

TOPPTR(2:0) - Pointer to the top of the FIROB. This pointer is used to enable the number of lines in the FIROB for dependency checking.

The Global Status & Registers

The FIROB includes some of the processor special registers. They are used for instruction execution. These registers can be accessed using move to/from protocol of the SRB. The special registers located in the FIROB are:

ROBEIP - PROCESSOR PC - 32-bit - The register is updated on-the-fly by retiring instructions. It tracks the real instruction execution, regardless of the current state of the processor i.e. there is no concept of freezing the PC. The EIP can be accessed using the standard move to/from protocol of the SRB.

RCVBASE - RECOVERY PC BASE - 32-bit - Update at the retirement of each taken branch instruction by the content of the ROBEIP(31:4) and the offset of the branch instruction within the line. It is used by microcode to recover the PC of a branch to an illegal address. This is necessary since the limit violation is not detected until the branch instruction is fetched.

EFLAGS - THE FLAG REGISTER - 19-bit - Update at the retire of the instructions. The six status bits are divided into three groups OF, {SF,ZF,AF,PF}, and CF. The RF bit is cleared during certain debug operations. EFLAGS bits are cleared by IRESET. The non-status bits can be accessed via the move to/from protocol of the SRB by 10 different pointers. These ten pointers provide independent software read/write access as:

read/write the entire EFLAG register - bits 18:0.
   read/write the lower word - bit 15:0.
   read/write the lower byte - bit 7:0.
   complement the carry flag - bit 0.
   set/clear the direction flag - bit 10.
   set/clear the interrupt flag - bit 9.
   set/clear the carry flag - bit 0.

FPIP - FLOATING POINT PC - 48-bit - Update at the retirement of floating point instructions. The FPIP can be accessed using the standard move to/from protocol of the SRB.

FPSR - FLOATING POINT STATUS REGISTER - 16-bit - Update at the retirement of floating point instructions. The FPSR can be accessed either by using the standard move to/from protocol of the SRB or by a unique pointer to clear the exception bits. A move to FPSR must be accompanied by a move to the look-ahead copy which is the responsibility of the microcode.

FPOPCODE - FLOATING POINT OPCODE REGISTER - 11-bit - Update at the retirement of floating point instructions. The FPOPCODE can be accessed using the standard move to/from protocol of the SRB.

DR6 - DEBUG STATUS REGISTER - 16-bit - Update the B bits at the retirement of the load/store breakpoints instruction and update the BS bits during single stepping. On instruction breakpoints, global debug traps, and task switch debug traps, DR6 must be set by microcode. The DR6 can be accessed using the standard move to/from protocol of the SRB.

Signal List

WRFPSR(1:0) - Input from ROBCTL indicates to write the two floating point flag groups, {C3,C2,C1,C0} and {SF,PE,UE,OE,ZE,DE,IE}. The updating of FPSR register is from FPSRIN.

FPSRIN(10:0) - Input data for FPSR register updates.

WRFPOPCD - Input from ROBCTL indicates to write the FPOPCODE register from FPOPCDIN.

FPOPCDIN(10:0) - Input data for FPOPCODE register updates.

PUSHPOP(2:0) - Input to increment or decrement the TOP field of the FPSR register. Bit 0 - push, decrement by 1. Bit1 - pop, increment by 1. Bit 2 - double pop, increment by 2.

WRxFLG(2:0) - Input from ROBCTL indicates to write the three flags of EFLAGS register.

EFTOFLGB(2:0) - Input from ROBCMP indicates to drive the flags to functional units on flag dependency checking.

CLRRF - Input from ROBCTL indicates to clear the RF bit of EFLAGS register.

UPDFPIP - Input from ROBCTL indicates to update FPIP from LSCSSEL and EIP.

SETBS - Input from ROBCTL indicates to update the B bit of DR6.

LSCSSEL(15:0) - Input from LSSEC indicates the current code segment used for updating FPIP.

WRPC(3:0) - Input from ROBCTL indicates which PC offset to use to update EIP.

RBLPC(31:4) - Input from the next to bottom line PC for updating of EIP.

MVTEIP - Input ROBCTL indicates EIP register updates from IAD bus.

MVFEIP - Input ROBCTL indicates EIP register move to IAD bus.

MVTCVB - Input ROBCTL indicates RCVBASE register updates from IAD bus.

MVFCVB - Input ROBCTL indicates RCVBASE register move to IAD bus.

MVTCVIO - Input ROBCTL indicates RCVIO register updates from IAD bus.

MVFCVIO - Input ROBCTL indicates RCVIO register move to IAD bus.

MVTIPCS - Input ROBCTL indicates the upper 16 bits of the FPIP register updates from IAD bus.

MVFIPCS - Input ROBCTL indicates the upper 16 bits of the FPIP register move to IAD bus.

MVTIPOFS - Input ROBCTL indicates the lower 32 bits of the FPIP register updates from IAD bus.

MVFIPOFS - Input ROBCTL indicates the lower 32 bits of the FPIP register move to IAD bus.

MVTDR6 - Input ROBCTL indicates DR6 register updates from IAD bus.

MVFDR6 - Input ROBCTL indicates DR6 register move to IAD bus.

MVTEFLAGS(2:0)- Input ROBCTL indicates EFLAGS register updates in three pieces (the upper half-word and the lower two bytes) from IAD bus.

MVFEFLAGS(2:0)- Input ROBCTL indicates EFLAGS register moves in three pieces (the upper half-word and the lower two bytes) to IAD bus.

MVTEFBIT(6:0)- Input ROBCTL indicates manipulation of individual bits in the EFLAGS register. The action performed for each of these bits is:

bit 6: complement the carry flag (bit 0)
   bit 5: set the direction flag (bit 10)
   bit 4: set the interrupt flag (bit 9)
   bit 3: set the carry flag (bit 0)
   bit 2: clear the direction flag (bit 10)
   bit 1: clear the interrupt flag (bit 9)
   bit 0: clear the carry flag (bit 0)

MVFDR6 - Input ROBCTL indicates DR6 register move to IAD bus.

EFLAGSAC
EFLAGSVM
EFLAGSRF
EFIOPL(13:12)
EFLAGSOF
EFLAGSDF
EFLAGSAF

EFLAGSCF - Output generates from the EFLAGS register, these bits are visible from the slave copy of the EFLAGS register. The RF bit is also used in the FIROB to handle instruction breakpoint.

EFLAGSIF

EFLAGSTF - Output generates from the EFLAGS register, the interrupt and trace flags are needed locally to control external interrupts and single step trapping.

XRDFLGB(3:0) - Output to flag operand bus, the bits are read by EFTOFLGB. The order of the bits is OF, SF,ZF,AF, PF,CF.

MVTFPSR - Input ROBCTL indicates FPSR register updates from IAD bus.

MVFFPSR - Input ROBCTL indicates FPSR register move to IAD bus.

CLRFPEXC - Input ROBCTL indicates to clear the stack fault and exception bits {SF,PE,UE,OE,ZE,DE,IE} in the FPSR register. Indirectly the ES and B bits are cleared.

FPTOP(2:0) - Output to register file indicates the current top-of-stack to identify the registers being popped to clear the full bits.

REQTRAP - Global output, one cycle after EXCEPTION, indicates to drive the XLASTKPTR.

XFERR_P - Output to BIU indicates the floating point error which is inverted of the ES bit from the slave of the FPSR. It is also used by the FIROB to generate the plunger traps.

XLASTKPTR(2:0) - Output to Idecode indicates the TOP bits for the FPSR for correct floating point stack pointer.

MVTFPOPCD - Input ROBCTL indicates FPOPCODE register updates from IAD bus.

MVFFPOPCD - Input ROBCTL indicates FPOPCODE register move to IAD bus.

Timing

Since the clock cycle is short, the comparators and detection of the hit for dependency can be done in a phase using CAM cells. The tag and decision to send data should be done in another cycle.

ICLK2: The operand linear address and register address is available at the end of this cycle.

ICLK3: Dependency checking. Generate dependency tag and read data to operand steering if hit.

ICLK4: Read and mux data to the operand data buses to the functional units. Update status bits.

For retiring instructions:

ICLK5: Results from the functional units. Compare tag to latch data. Update status and check for branch misprediction.

ICLK6: Retire a line if all entries have valid results. Update PC, flags. Drive new WRPTR and WRPTR1.

Layout

The layout of the FIROB is in three locations:

The operand addresses and comparators in the data path next to the decode units.

The result data in the data path next to the reservation stations and functional units.

The status and global controls on the left side of the data path.

Figure 36:
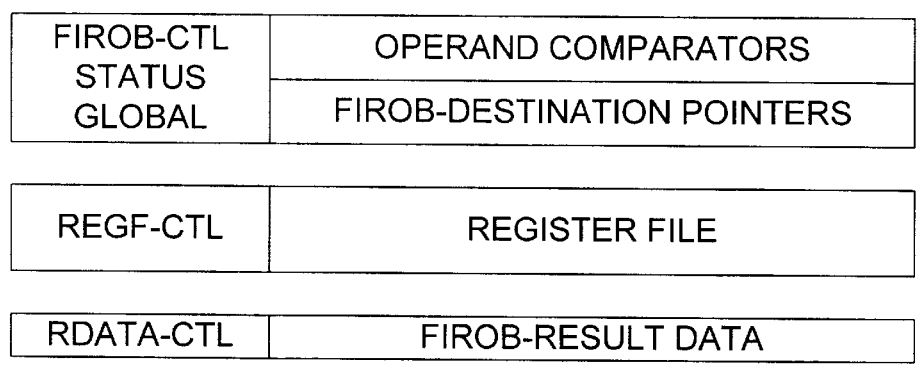

A block diagram of the layout is shown as FIG. 36.

Register File Overview

Processor 500 has the standard x86 register file (EAX to ESP) which is read from four dispatch positions and written to from the FIROB using four writeback positions. It is the FIROB's responsibility to make sure that no two writebacks go to the same register. There are also 16 scratch registers available to all 4 dispatch positions. Eight registers are currently in the design for microcode use. Only the real (non-speculative) states are stored in the register file. No floating point registers are stored in the integer register file. Each of the 8 visible registers and the 16 temporary registers have enables to selectively write/read to bits (31:16), (15:8), or (7:0). The FIROB send bytes enable bits and valid write bits to the register file. Read valid bits and read byte enables will be sent by the dispatch/decode unit. Constants are not handled in the register file but rather get sent on the BOPND bus using the decode unit.

| Registers: | |
|---|---|
| Address | Register Name |
| 00 | EAX |
| 01 | EDX |
| 02 | ECX |
| 03 | EBX |
| 04 | EBP |
| 05 | ESI |
| 06 | EDI |
| 07 | ESP |
| . | |
| . | |
| . | |
| 10 | TMPREG00 |
| 11 | TMPREG01 |
| 12 | TMPREG02 |
| 13 | TMPREG03 |
| . | |
| . | |
| . | |
| 1F | TMPREG0F |

Resister File Timing

Figure 37:
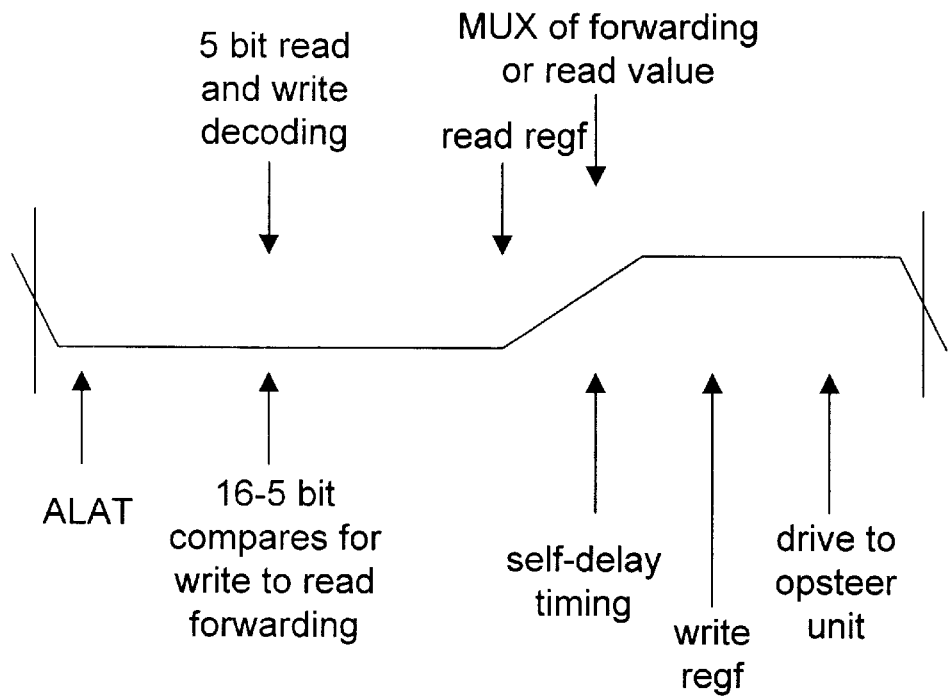

A register file timing diagram is illustrated in FIG. 37. Instead of the normal method of a write to the register file followed by a read from the register file, Processor 500 does a read first followed by a write. The early read allows sufficient time for multiplexing between the register value (the one actually read) and forwarding from the incoming writes. The end of the cycle is needed to drive the read value over to the operand steering unit. A self timing circuit is used to provide sufficient delay for the write and read decoding logic to complete before the read and write actually take place. Both the read and write decoding sections start decoding immediately after the ALAT's latch in the read and write pointer busses. There are sixteen 5 bit comparators which detect if forwarding is needed from a writeback port to a read port. The forwarding will bypass the delay through the register latch and help allow the read to complete within the cycle. The Read outputs from the register file will drive on a dedicated bus over to the operand steering unit. For maintaining fast logic, 3 input nand gates are used in the decode section. The 4 input nand gate is a large decrease in speed, and the 5 bit pointer bus along with an enable signal fit a two 3 input nand gate structure. There is not any reset logic for the register array.

Register File Sub Blocks

Figure 38:
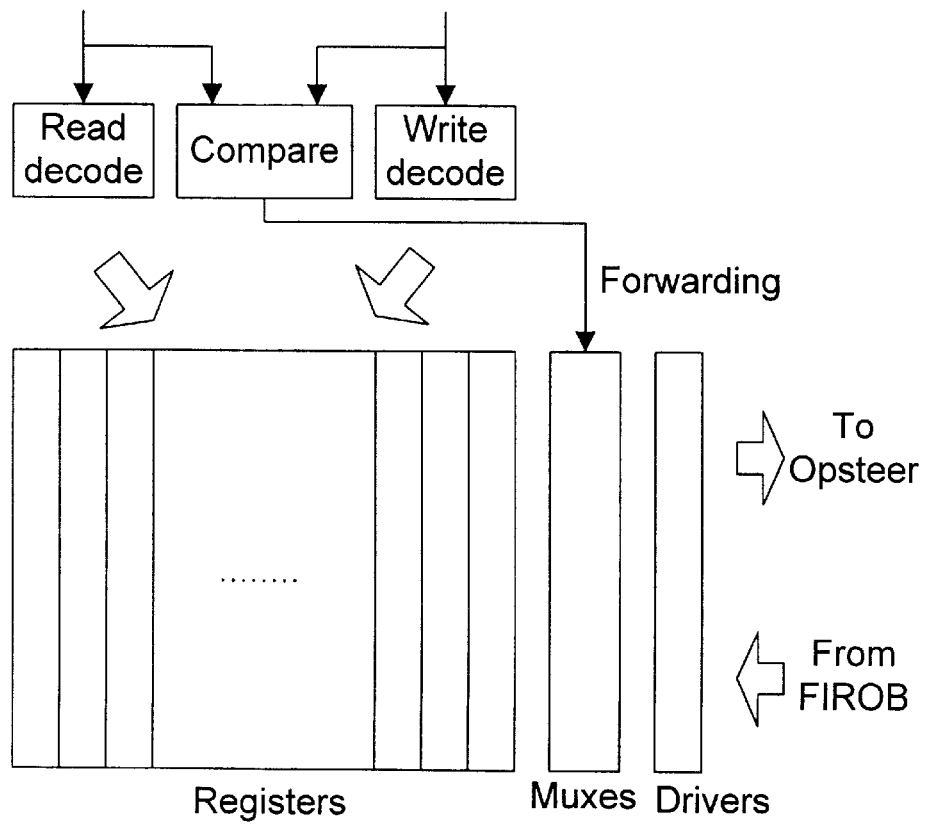

A block diagram of the register file sub blocks is given as FIG. 38. The register sub-blocks are the register cell array with four data inputs and eight data outputs, the compare array, the read decode array, the write array, the muxing section, and the output drivers. The ability to both read and write in during the same cycle is important to this block, and careful attention needs to be paid to the layout, capacitive loading and the bussing. Due to problems with fringing capacitance between adjacent metal lines, the register file does not contain precharge/discharge logic. It makes use of multiplexers, tristate gates, and static logic.

Signal List

RDnPTR1(4:0) - the first operand pointer for reading from the register file for positions 0 to 3.

RDnPTR2(4:0) - the second operand pointer for reading from the register file for positions 0 to 3.

USE1RD(3:0) -These signals are valid bits from IDE-CODE indicating which reads are valid for the 1st operand. Each bit in these busses correspond to a dispatch position.

USE2RD(3:0) -These signals are valid bits from IDE-CODE indicating which reads are valid for the 2nd operand. Each bit in these busses correspond to a dispatch position.

RDnENB1(2:0) - byte enables for position n and for the 1st operand. Bit 2 refers to the upper two bytes while bits 1 and 0 refer to the lower bytes (bits 15:8) and (bits 7:0).

RDnENB2(2:0) - byte enables for position n and for the 2nd operand. Bit 2 refers to the upper two bytes while bits 1 and 0 refer to the lower bytes (bits 15:8) and (bits 7:0).

WBnPTR(4:0) - the writeback pointer for position n. This must be qualified with the register write valid bits VRWB(3:0) - valid register writeback indication for each of six positions.

WBnENB1(2:0) - byte enables for position n and for the register writeback. Bit 2 refers to the upper two bytes while bits 1 and 0 refer to the lower bytes (bits 15:8) and (bits 7:0).

RDnREGA(31:0) - read data from the register file for position n and operand A.

RDnREGB(31:0) - read data from the register file for position n and operand B.

WBnD(31:0) - writeback data from the FIORB for position n.

LOAD/STORE SECTION Overview

Figure 39:
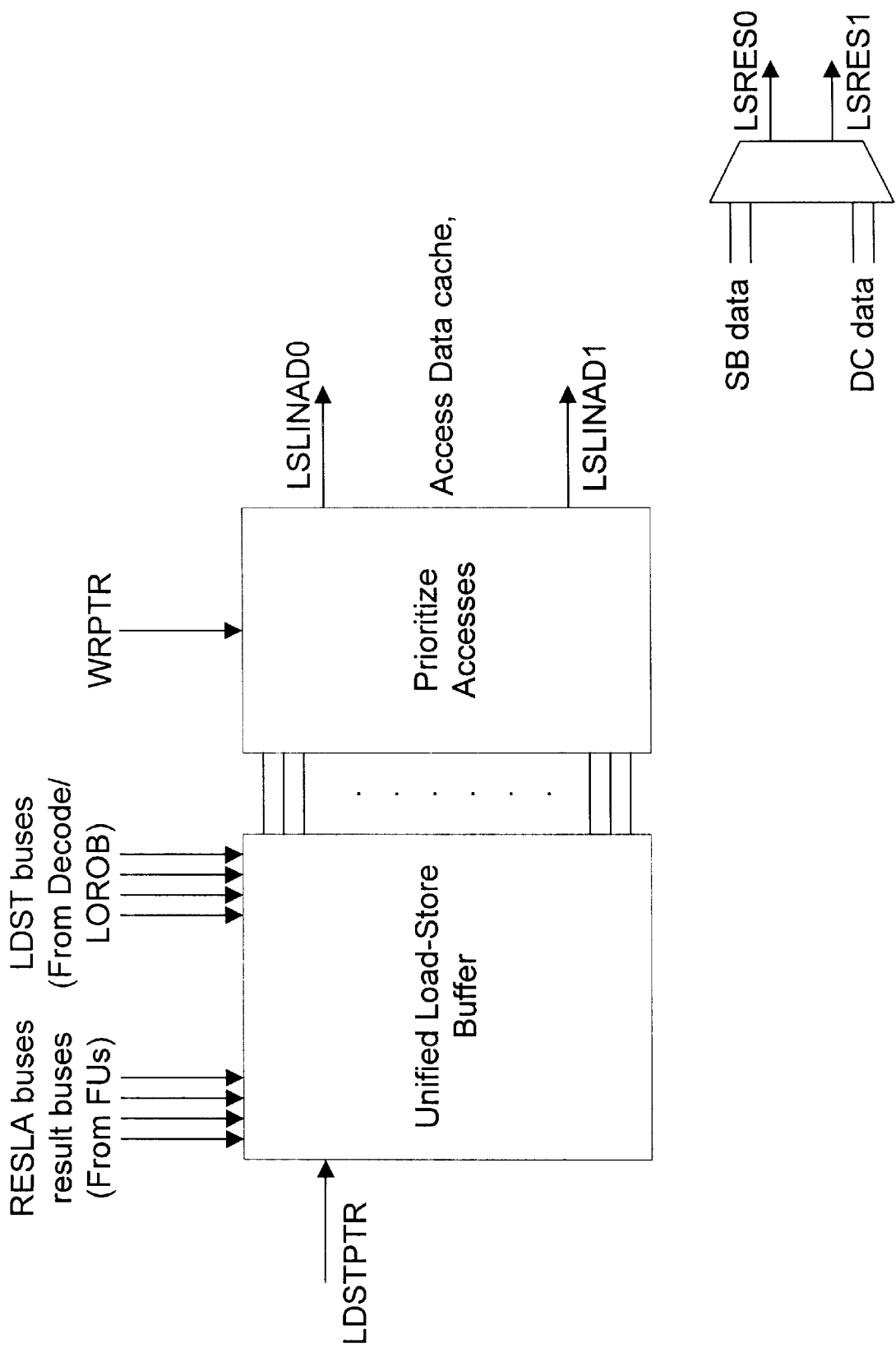

The load store section in Processor 500 can perform single-cycle access of two memory based operands (2 loads or 1 load and 1 store). It can also perform out-of-order loads requested by the functional units. The stores go in-order and are performed as pure writes. The data cache is a linear cache, dual ported for the two concurrent accesses, 16KB 8-way set associative with way prediction. FIG. 39 shows the basic organization of the load/store section. It is comprised of a special unified load-store buffer. The information on whether an instruction is a load or a store is sent to the LSSEC by the decode unit. The linear address and data are computed by the functional units and sent to the LSSEC on the RESLA and result buses. The load/store unit then performs two data cache accesses. The loads may be performed out-of-order, but the stores are always in order. The unified load-store buffer is 8-entries deep. It can accept up to four instructions per cycle.

Other Features are:

* Unaligned accesses have at least one cycle penalty (2-cycle latency).

* The current scheme supports non-blocking loads. Note: Unaligned accesses in this section means accesses crossing double word boundaries.

Unified Load-Store Buffer (LDSTBUF)

Figure 40:
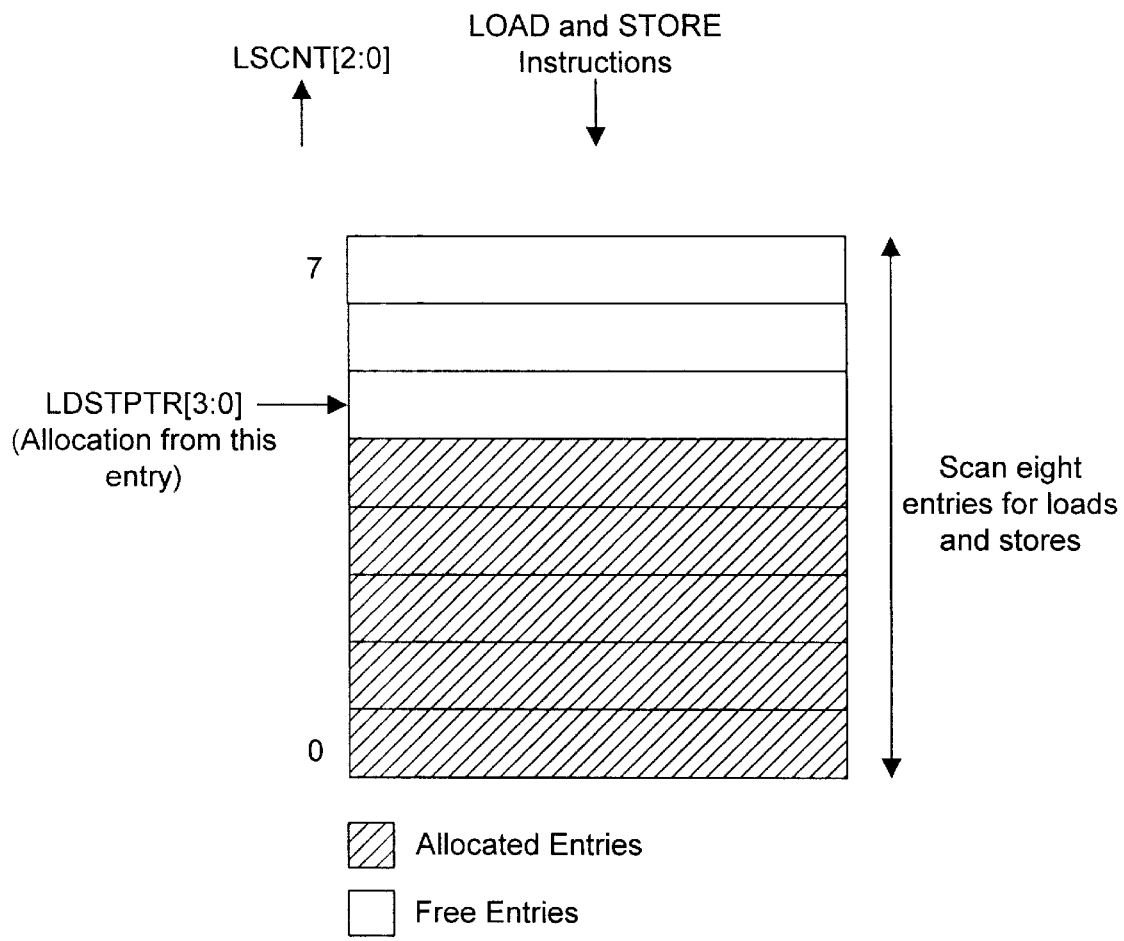

The loads and stores are buffered up in a common queue, called the unified load-store buffer. The load and store instructions are buffered up in this common queue in program order with the earliest instruction at the bottom and the latest instruction at the location pointed to by LDSTPTR-1, as shown in FIG. 40.

The advantages of this scheme over the conventional scheme where the loads and stores are buffered up in different queues are:

1. Efficient utilization of space due to which the dispatch would stall based on the total number of loads and stores as opposed to the number of loads or number of stores in the conventional method.

2. Also, since communication is between the decode unit and load-store section, the functional units would never stall. They can keep executing the instructions in their reservation stations.

3. The order of loads and stores are known since they are dispatched directly to the load-store section, instead of going through the functional units which could send requests out of order.

Each entry (as shown in FIG. 41) in the buffer is broken down into three fields. The first field is made up of the FIROB instruction tag and the instruction type (load, store or load-op-store). The source of updates for this field is the decode unit/FIROB. The second field has the linear address and store data and the associated valid bits, the update source being the functional units. The third field is made up of some control information (for e.g. M bit indicating that this entry missed in the data cache on a prior access, D bit indicating that the load in the entry is dependent on a store in the buffer), the update source being the load-store section itself.

LSCNT[2:0] indicates to the decode unit the number of free entries in the buffer so that decode can take the necessary action. It is the difference between 8 and LDSTPTR.

Updating the Entries

FIG. 42 illustrates a timing diagram of when the different fields of each entry in the buffer are updated. The instruction types (ITYPEnB[1:0]) and ROB tags (DTAGnB[2:0]) are sent in a given(i)th ICLK. The corresponding mux select lines are generated and the entries updated. Also the LDSTPTR is incremented/decremented and by the end of that cycle LSCNT[2:0] is generated. At the beginning of the (i+1)th ICLK, the functional units send the tags of the instructions they are currently processing. The LSSEC looks at the tag information from the functional units, compares against the DTAG information in the LDSTBUF and sets up the appropriate mux select lines to latch in the linear address and store data. Also, the corresponding valid bits (LV and DV) are set up at this point so that they can be latched when the address and data get latched on the rising edge of (i+2)th ICLK. The load-store section then accesses the data-cache.

Prioritizing the Accesses

The accesses to be performed sit in the unified load-store buffer with or without the linear addresses and store data. The load-store section is able to forward the linear addresses from the functional units for data cache accesses. In general, the processing of instructions is prioritized according to the following:

1. Misses and stores have the highest priority. They are processed as soon as they are known to be non-speculative. The reason that the stores have higher priority over loads is because of the line-oriented nature of the reorder buffer and we would want to retire instructions as quickly as possible.

2. Loads can go out of order. The linear address for a load can be in the buffer or can be forwarded directly from the functional units. The result can come back from the data cache or the unified load-store buffer from stores that have not been retired. The results are returned on the dedicated load-store result buses LSRES0 and LSRES1.

Forwarding the linear address from the functional units directly for data cache accesses is based on the assumption that there is no valid outstanding load in the buffer. If there is any load (even one) in the buffer, it is sent to access the data cache and the linear addresses from the functional units are latched in the LDSTBUF. This scheme is followed because of cycle time constraints.

Data-Cache Accesses

The data-cache accesses are performed through the LSLINAD0 and LSLINAD1 buses. LSLINAD0 is connected to port A and LSLINAD1 is connected to port B of the data cache. The results are returned on LSRES0 and LSRES1 buses. The data for store accesses is driven on SBADAT and SBBDAT buses.

Hits

Bits 13:0 of the linear address are presented to the data cache just before a given clock edge, so that the DCACHE has enough time to latch it. The array is accessed and the tag is compared with the upper 17-bits of the linear address to generate the hit signal. The data is driven to the functional units prior to the hit being generated. A cancel signal is sent in the next cycle based on whether the access hits/hits in unpredicted way/misses.

Misses

If there is a miss, the M bit (Miss) for that entry is set. The load/store section based on the WRPTR information determines whether the instruction is non-speculative in order to go external to fetch the data. There is no handshaking between LSSEC and FIROB. Once the data is written to the data cache, the LSSEC performs the access again.

Handling Branch Mispredictions

Whenever a branch misprediction is encountered, the FIROB asserts the BRNMISP signal. The load-store section then sets a latch based on this signal. When a new load or store instruction gets dispatched, the load-store section sets the NF bit for all stores in the buffer and clears the latch. Setting the NF bit for a store indicates that the data from that store should not be forwarded. If there is a load that is dependent on a store with the NF bit set, it is serialized by setting the S bit. The loads keep returning results as they would normally. The stores and load misses are canceled when the FIROB asserts CANENTRY for that instruction.

Handling Misses

After a data cache miss, the load-store section performs speculative MMU/PT accesses for possible alias. If an alias exists, the data cache tag is updated and the access performed again. If cache master reports a miss in the physical tags, the load-store section marks the M bit in the entry. The miss is processed after the instruction becomes non-speculative. This is similar to stores based on the WRPTR information.

If the CMASTER reports that the line is in the ICACHE (self-modifying code) and if the access happens to be a store, the LSSEC sends a "store-with-resync" status to the ROB to flush out the instructions after the store.

Unaligned Accesses

Unaligned loads are performed as 2-cycle single port accesses. When a load access is unaligned, the LSSEC splits that access into 2 single port accesses and issues them in two separate cycles to the data cache. Another aligned load or store can accompany the access on the other port. In the first cycle as the first half of the access is occurring, the address is incremented by 4 and in the second cycle, the other half of the access is performed. The merging is done by the LSSEC.

Unaligned stores as single port accesses have a problem if they cross a line boundary. If one access hits and the other misses, and if a fault occurs while processing the miss, it could leave the processor in an undesirable state. The safest and probably the easiest approach is to let the LSSEC perform a dual port access so that if any of the two accesses misses, the other is canceled and is performed only after the appropriate line is brought in.

Checking for Unaligned Accesses

To determine whether an access is unaligned or not, the LSSEC detects the least significant two bits of LSLINAD0 and LSLINAD1 and the corresponding data operand sizes. An access is unaligned if the operand size is 32-bits and any one of the two least significant address bits is set or if the operand size is 16 bits and both the least significant bits of the linear address are set.

Aliasing Problem and Solution

The data cache is a linear cache with two ports. There is a potential that two or more linear addresses map to the same physical address (aliasing). There can never be more than one location in the data cache for a physical address. The problem is with the loads going out-of-order. A load with linear address LA1 has the potential of going out-of-order and if that location exists in the data cache, it hits and returns the result. A store with linear address LA2 ahead of the load might be mapped to the same physical address. Then, the result that the load returned is wrong since the load was not able to see the dependency. The solution to the problem is the way load-store dependency checking is performed (described later).

Non-Blocking Loads

The gap between microprocessor and memory speeds is widening with every new generation of microprocessors. This speed discrepancy can impact performance if the load-store section of the processor stalls whenever a data cache miss occurs. To prevent stalling of the load-store section, loads in the buffer can access the data cache as any miss is being processed. The following describes, in brief, the method that Processor 500 uses to perform non-blocking loads.

Load and store instructions in Processor 500 are sent to a unified load-store buffer. Each entry in this buffer has a bit M that indicates if the load or store in the entry missed on a prior access. Whenever a data cache access misses, the M bit (miss) is set in the entry. Since the processor allows speculative execution, the miss cannot be processed immediately. It can be processed only when the instruction is no longer speculative. In conventional implementations, when a miss is being processed, loads or stores in the queue are held up till the miss gets resolved. The load-store section requests the Cache Master (CMASTER) to perform an external access to process a miss. The CMASTER goes external and takes a long time before it can fetch the line of interest. The fetched line comes in packets of 64 bits over the data bus to CMASTER which in turn sends the packet over to the data cache. The data cache latches the packets in a local buffer (BUFS). In the mean time, the load-store section can keep sending load accesses to the data cache. If the accesses hit in the cache, the results are returned. If an access misses, the M bit for that entry is set and the remaining loads in the buffer can be sent to the data cache. Once the data cache receives the entire line from CMASTER, it initiates the reload sequence. This reload sequence involves reading the line to be replaced into another local buffer (BUF2) and then updating the line and tag with the contents of BUFF. When it performs the line write, the load-store section clears the M bit for all the entries in the LDSTBUF, so that if any of the accesses missed on the line that was being brought in, it need not go external again. If the line in BUF2 is dirty, the load-store section initiates an external write cycle through the CMASTER.

Possible Data Cache Access Scenarios

Port A:

Reloads from Physical Tags (PT)

Accesses from LSLINAD0

Drives result on LSRES0

Port B:

Reload invalidations

Accesses from LSLINAD1

Drives result on LSRES1

Before accessing the data cache, the load-store section will check for bank conflicts and unaligned accesses. If there is a bank conflict, the load-store section will issue only one access. This is transparent to the data cache.

Port A - load, Port B - load
Port A hit, port B hit - Complete both accesses
Port A miss, port B hit - Complete Port B access, mark entry as miss
Port A hit, port B miss - Complete Port A access, mark entry as miss
Port A miss, port B miss - Mark entries as misses
Port A access unaligned - Perform access. Take penalty.
Port B access unaligned - Perform access. Take penalty.
Port A - store, Port B - load
Port A hit, port B hit - Complete both accesses
Port A miss, port B hit - Complete Port B access, mark entry as miss
Port A hit, port B miss - Complete Port A access, mark entry as miss
Port A miss, port B miss - Serialize
Port B access unaligned - Perform access. Take penalty.
Port A - load, Port B - store Same as the previous case.
Port A - store, Port B - store The ROB provides two signals: WRPTR - the current instruction (store) to be retired and WRPTR1 - the next store in the current line that can be retired. By looking at this information, the LSSEC should be able to perform two simultaneous stores to the DCACHE.

Figure 43:
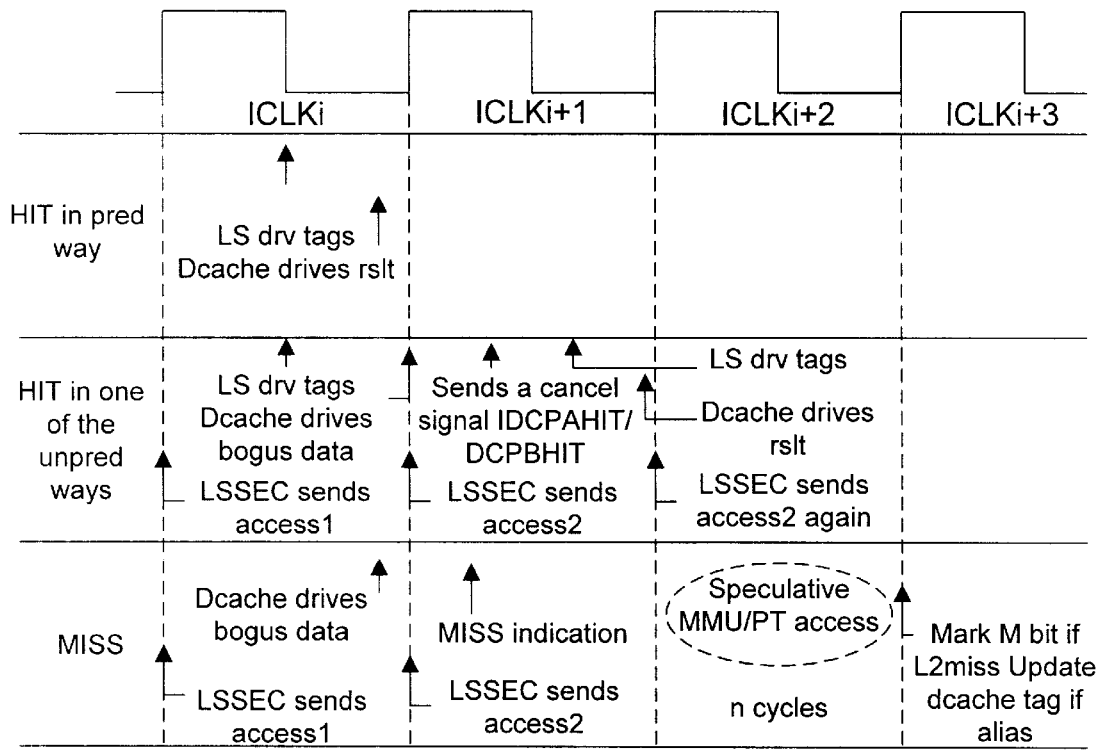

Port A hit, port B hit - Complete accesses
Port A miss, Port B hit - Complete Port B access
Port A hit, port B miss - Complete Port A access
Port A miss, Port B miss - Serialize
Port B access unaligned - do not perform access FIG. 43 gives the timing of aligned data cache accesses. As can be seen, there are three different cases - hit, hit in unpredicted way and miss. The data cache uses a way prediction scheme to access its data and tag arrays. If the prediction is wrong and the data happens to reside in the cache, a 1-cycle penalty is taken. The result is returned in the next cycle. It is also important to cancel the previous result.

Unaligned accesses are more complicated. The following flow charts give the details. Note that cycles for speculative MMU/PT accesses are not taken into consideration in the flow charts.

Unaligned Load:
Single Port access

| Cycle 1: | Perform MA1 access, increment address |
| Cycle 2: | Hit / Hit in unpred way / Miss indication for MA1<br>Perform MA2 access |
| Cycle 3: | Hit / Hit in unpred way / Miss indication for MA2<br>If MA1_hit,<br>  Perform next access<br>If MA1_hit_in_unpred_way,<br>  Perform MA2 again<br>If MA1_miss,<br>  Mark M bit |
| Cycle 4: | If MA2_hit,<br>  Instruction out of buffer<br>If MA2_hit_in_unpred_way,<br>  Perform next access again<br>  Instruction out of buffer<br>If MA2_miss,<br>  Mark M2 bit. |

Unaligned Store
2-port access

| Cycle 1: | Unmerge data, increment address |
| Cycle 2: | Perform dual port access |
| Cycle 3: | Hit / Hit in unpred way / Miss indication for MA1 and MA2. Perform next access |
| Cycle 4: | If MA1 hit and MA2_hit,<br>  Instruction out of buffer<br>If MA1_hit and MA2_hit_in_unpred_way,<br>  Perform next B access again<br>  Instruction out of buffer<br>If MA1_hit_in_unpred_way and MA2_hit,<br>  Perform next A access again<br>  Instruction out of buffer<br>If MA1_miss,<br>  Mark M bit<br>If MA2_miss,<br>  Mark M2 bit |

Checking for Bank and Index Conflicts

For circuit reasons, two concurrent accesses to the data cache cannot be to the same bank. Therefore, the LSSEC must determine if there is a bank conflict and cancel the port B access and issue it in the next cycle. Since the tag array is also dual ported, the data cache needs information if two concurrent accesses are to the same index.

Bank Conflict: LSBNKCT is driven high if LSLINAD1 [4:2] = = = LSLINAD0[4:2] Index Conflict: LSINDXCT is driven high if LSLINAD1[10:5] = = = LSLINAD0[10:5] Also for the way prediction array, which is also dual ported, another signal LSPRWYCT is driven if LSLINAD1[13:5] = = = LSLINAD0[13:5].

Dependency Checking Against Stores in the Buffer

When the load-store section performs data cache accesses, it also performs dependency checking against the stores in the store buffer. Bits 11:2 of the linear addresses are compared against the corresponding bits of the linear addresses of the stores ahead of the load [Also, the operand sizes and other misaligned address information are used in the equation to figure out dependency]. If the addresses match, the data of the latest store to that address is forwarded on to the result bus. To perform dependency checking and forward the store data, the load-store section has one whole cycle. In the following cycle, the rest of the bits (31:12) are compared. If this compare fails, the LSSEC signals FIROB and the functional units to cancel that result just the way the data cache does and the LSSEC serializes that load.

The advantage of using 10/12-bit comparators instead of 32-bit comparators is the reduction in hardware and increase in speed. By comparing bits 11:2, and serializing loads that have partial address matches, the the aliasing problem may be solved.

Figure 44:
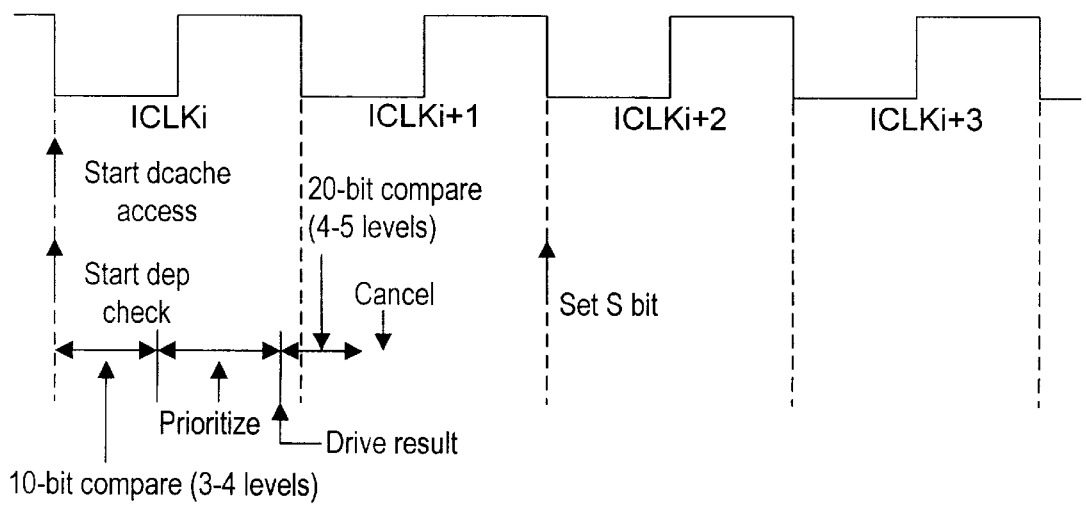
Figure 45:
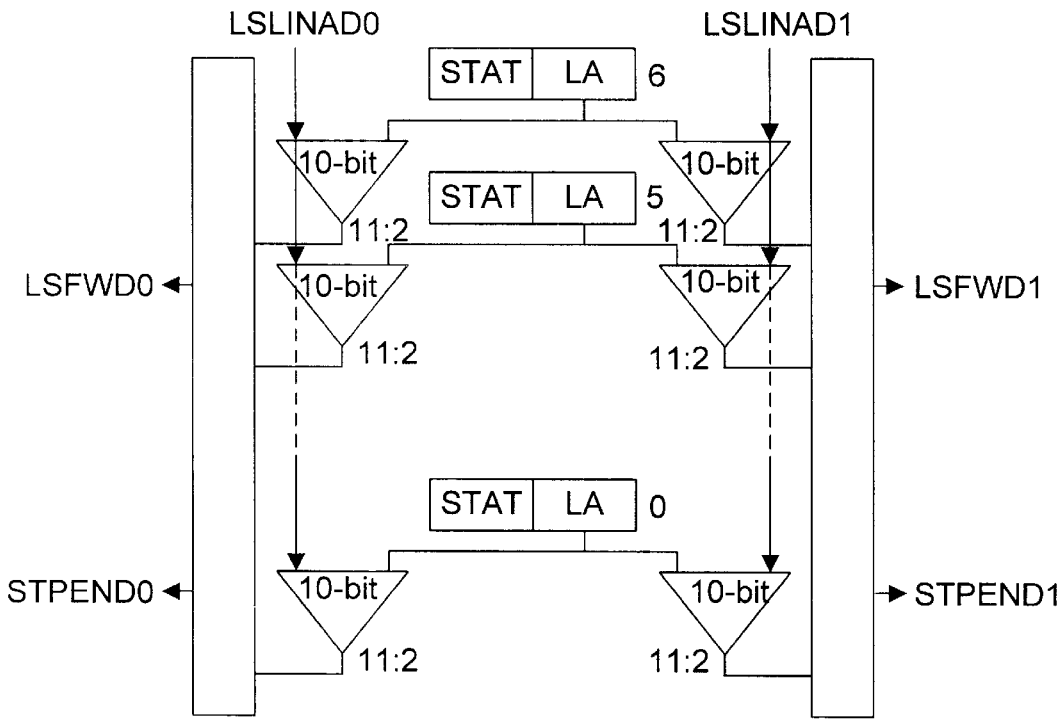

On the condition that the addresses match and the operand sizes are different, the load is serialized. A timing diagram of dependency checking is given as FIG. 44. A hardware block diagram is given as FIG. 45.

Summary of dependency checking/store forwarding:

1. Forward data operand from a store if:
   the load and store addresses match completely, store data is valid and the operand sizes are equal.
   ** This is true if both the load and store accesses are misaligned.
2. Set 'D' bit for the load if:
   the store address is not computed yet or
   the addresses match, opsizes match and data is not valid.
   ** The D bit is cleared on any store data or address update from the functional units.
3. Set 'S' bit if:
   the addresses match and opsizes are different or
   the load access is to the same bank as the store and not to the same byte (partial dependency) or
   the load access is to the adjacent bank as a misaligned store (partial dependency—tricky case)
   ** S → this load is serialized—wait till load is at the bottom of the load-store buffer.

Snooping the Load-Store Buffer

During prefetch, the CMASTER snoops the LDSTBUF entries to check if there are valid pending stores to that line. If there is a pending load to the line, then the prefetch holds till the store is done. To limit hardware supporting this feature, eight dedicated 8-bit comparators are provided for partial comparison of the line address. This structure can be used for the general snooping issues.

No snooping structures are required in the load-store buffer. The reasoning goes as follows:

In previous processors, a store sitting in the store buffer is retired as far as the ROB and the execution core of the machine are concerned. The ROB can retire instructions that are past the store even before the store is written to the data cache.

During prefetch of a cacheable line, the store buffer entries need to be snooped make sure that a store in the store buffer is not to the same prefetched line. If it is (self-modifying code case), the prefetch stalls till the store is written.

The reservation stations need not be snooped in this case since the store has not performed the data cache lookup yet. When the store does the lookup (a speculative read), it is going to miss in the data cache and the Physical Tags (PT) will assert IC_CACHED signal indicating the LSSEC to return with the "store with resync" status. The ROB will then flush all instructions after the store and instructions are redispatched.

If the prefetched line is non-cacheable, prefetch stalls if there are stores in the store buffer to the same line or if there is a store in the reservation stations. The reason for making sure that the reservation stations do not have stores is that Physical Tags (PT) will not assert IC_CACHED since the prefetched line is not cached and might not be in the prefetch buffer.

Serialization Conditions a) Miss—Any entry that misses has to wait for WRPTR from FIROB to compare against its tag before it can go external.

b) Store—Wait for WRPTR from FIROB.

c) Store address match, data not ready—Wait for store data.

d) Store address match, data ready but of different size—wait till the store is done.

e) Store linear address not ready—wait for store linear address.

f) Store address match, NF bit set.

g) Bits 11:0 match and 31:12 don't—possible alias.

Handling non-zero segment bases

The discussion above assumes that the linear addresses are sent over to the load store section by the functional units. This is true if the corresponding segment base is zero. If the segment base is non-zero, the functional units send the logical address. This logical address when added to the segment base in the corresponding segment register generates the linear address. The buffer stores linear addresses and therefore, the following scheme where an extra cycle is taken to compute the linear address is proposed.

Figure 46:
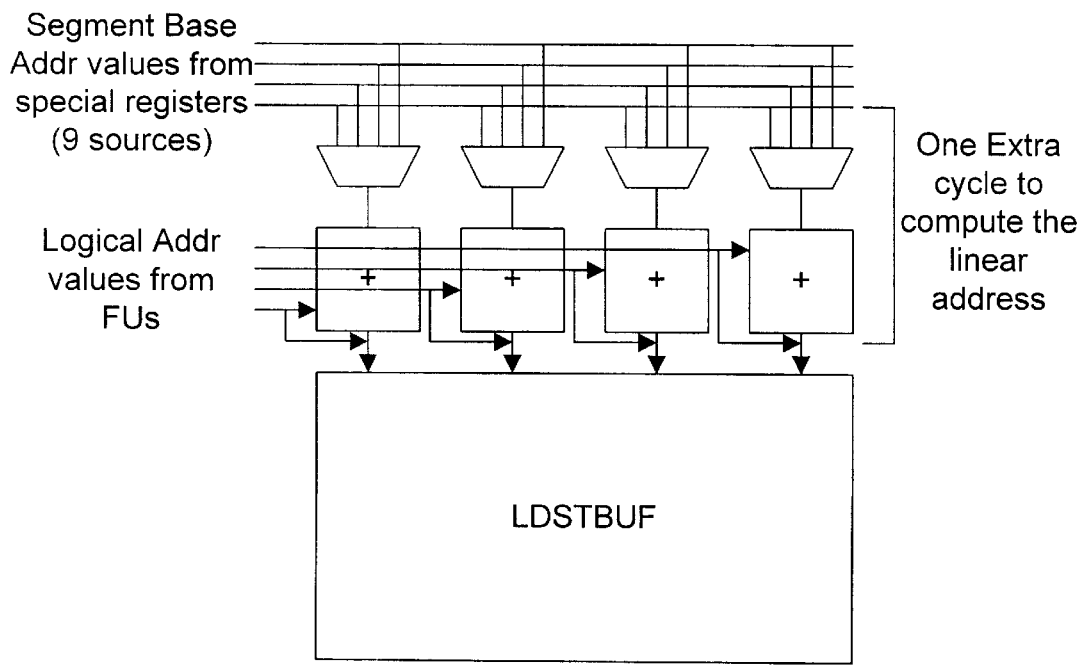

For null segment indications from microcode and when all the segment bases are zero, there is a bypass path to the load-store buffer from the functional units. This is shown in FIG. 46.

Floating Point Loads and Stores

The floating point instructions are done in microcode. Thus the load-store section handles the FP loads and stores as normal loads and stores. The unit load/store does not know that it is performing an FP load or store.

Special Registers (LSSPREG)

Special Registers in the load store section include the segment registers and the debug registers. The addresses that are generated by the functional units do not account for the segment base. If the appropriate segment base is not zero, it has to be added to the result generated by the functional units. In the case of non-zero segment base, an extra clock cycle is taken to compute the linear address. The LSSEC maintains all the segment registers and their invisible portion—the 8-byte descriptor. The segment registers can be loaded using a load instruction with the selector value as the operand. The special registers are summarized below:

| CS   | Selector, CSDES.HI,   | CSDES.LO   |
|------|-----------------------|------------|
| SS   | Selector, SSDES.HI,   | SSDES.LO   |
| DS   | Selector, DSDES.HI,   | DSDES.LO   |
| ES   | Selector, ESDES.HI,   | ESDES.LO   |
| FS   | Selector, FSDES.HI,   | FSDES.LO   |
| GS   | Selector, GSDES.HI,   | GSDES.LO   |
| LDTR | Selector, LDTRDES.HI, | LDTRDES.LO |
| TR   | Selector, TRDES.HI,   | TRDES.LO   |
| TEMP | Selector, TEMPDES.HI, | TEMPDES.LO |

All of the above have BASE, LIMIT and ATTR fields within their descriptor HI and LO fields and can be read independently.

| GDTR | BASE,    | LIMIT   |
|------|----------|---------|
| IDTR | BASE,    | LIMIT   |
| FPDP | FPDP.HI, | FPDP.LO |
| CAR  |          |         |
| DR0  |          |         |
| DR1  |          |         |
| DR2  |          |         |
| DR3  |          |         |
| DR7  |          |         |

The SRB can access all the following fields: DESC.HI, DESC.LO, LIMIT, ATTR, BASE, SELECTOR.

Limit Checking

The limit checking is done in the LSSPREG section. The following information is needed to perform limit checking.

Data size—byte, word, dword.

PE, VM bits.

D, G, ED from the descriptor.

Figure 47:
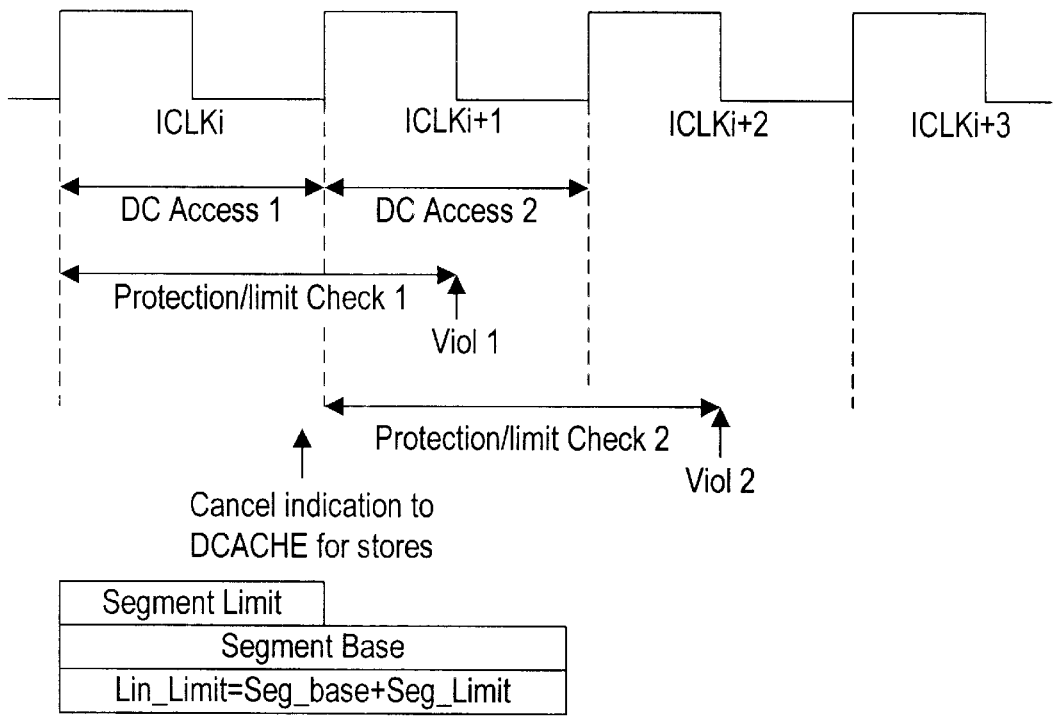

The load-store buffer has the linear address, and the limit obtained from the segment descriptor is a logical limit. In order to perform limit checking with these two quantities, the segment base is added to the limit to obtain the linear limit. The linear limit is computed when performing the segment load and a copy of it stored for use during limit checking. Protection checking logic is also in this block. The limit/protection check logicis pipelined, as shown in FIG. 47.

Handling Special Register moves

It has been found that serialization in microcode of several instructions limits performance. To improve performance, some instructions are not serialized in Processor 500. This requires hardware support in the respective units.

Figure 48:
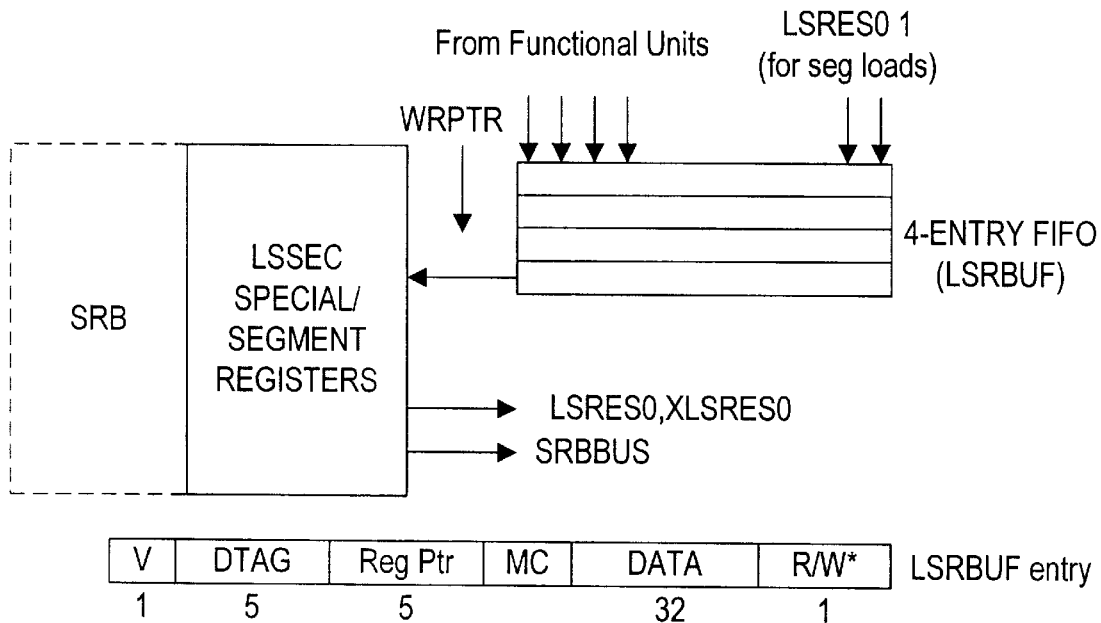

All moves to and from GS, ES and FS are not serialized in dispatch. These moves will be dispatched to the LSSEC similar to a load or a store, but they sit in a special four-entry FIFO. This FIFO is physically located in the LSSPREG block. The move-to's in this buffer are performed when they are non-speculative. This is very much similar to the store operation. FIG. 48 illustrates the details of each entry of this LSRBUF.

Segment Loads

A segment load instruction will be dispatched both to the LDSTBUF and the special registers FIFO. These instructions are interpreted by the LDSTBUF as loads and as writes (or move to's) by the special register FIFO. The results from the loads are forwarded into the FIFO which writes the appropriate segment registers after the FIROB indicates that the instruction is non-speculative.

In addition to the instruction type information, the decode/microcode unit sends additional control bits to the load-store section directly as summarized below. The information is to inform the LSSEC which segment is being accessed, the type of protection checks that need to be performed, etc. That there are four buses INSLSnB[10:0] that supply this information.

Also, the LSSEC needs three bits of information communicated by the microcode about types of segment loads, types of protection checking, reporting of error codes, etc. INSLSnB[10:8]

CS loads

000 Normal segment load for a far jump, call, move, etc.

001 due to selector from call gate when executing jmp instruction.

010 due to selector call from call gate when executing call instruction.

011 due to selector from task gate. Should not result in another gate. Should be type TSS 100 Selector from RET instruction.

101 Selector from IRET instruction.

110 Selector from INT instruction.

111 This is used when loading selectors from TSS on a task switch.

SS loads

001 Selector from TSS. This is used when performing SS load on a privilege level change using a selector that has been read out of TSS.

111 Report errors as TSS faults as selector came from TSS. DS, ES, FS, GS, LDTR, TR 111 Report errors as TSS faults as selector came from TSS.

TR loads

001 All busy checks are done by microcode when performing task switches. However, when loading TR using LTR instruction, the busy check has to be done by LSSEC.

000 This is the normal TR load. No busy checks. When performing task switches.

General loads and stores

010 When these operations are performed, report CPL as zero to DCACHE and TLB so that they can do page level protection checking using CPL of 0 instead of CURCPL.

001 All pushes and pops of copying parameters, when switching stacks, will report errors as TSS faults.

011 Ignore alignment checking.

110 Used in CMPXCHG8B routine.

IDT loads

001 This switch indicates that the IDT lookup was initiated by a software interrupt and the DPL and CPL checks should be done.

010 When these operations are performed, report CPL as zero to DCACHE and TLB so that they can do page level protection checking using CPL of 0 instead of CURCPL.

Figure 49:
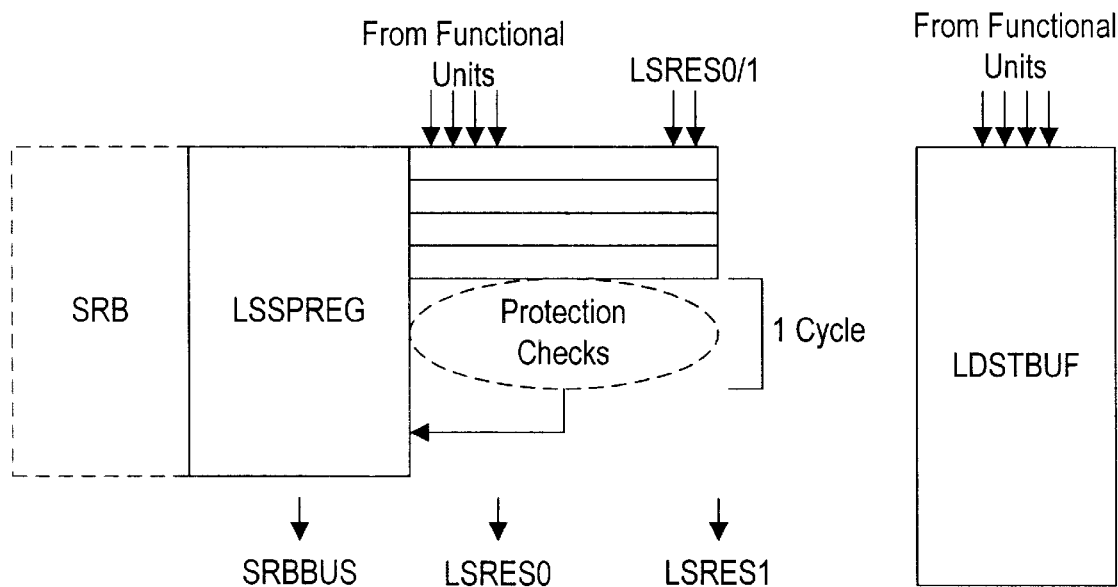

A diagram of protection checking hardware is illustrates in FIG. 49.

LSSEC—Cache master interface:

This section covers the following topics:

1. Protocol for handling data cache misses
2. Protocol for handling non-cacheable accesses
3. Protocol for handling locked accesses Misses:

Load Miss [Paging on, DCACHE on]

When a load access to the data cache misses, the LSSEC does a speculative lookup of the TLB/PT to check if there is an alias. It does this by asserting LS_MMU_RD signal with the linear address on the DADDR[31:0] bus. The CMASTER can respond with the following signals TLB_MISS—The look up in the TLB missed. Therefore, a true miss.

PT_MISS—The lookup hit in the TLB but missed in the PT. Therefore, a true miss.

CM_DC_ALIAS—There is an alias in the data cache.

IC_CACHED—The line requested is in the instruction cache.

Load Miss—Data cache on, paging off

When paging is off, the linear address and the physical address are the same. If a load accesses misses in the data cache, it is also going to miss in the TLB. So, in this case, as soon as there is a data cache miss, LSSEC goes external to get the data of interest. The M bit for the load is set when a dcache miss is encountered.

As soon as the instruction becomes non-speculative, the address is sent on the DADDR bus and the signals LS_MMU_RD and LS_NOT_SP are asserted. At this point in time, the CMASTER and the DCACHE go through the reload sequence. After reload is done, the data cache asserts the DCDATRDY signal and in the next cycle the dcache drives the result on the LSRES bus while the lssec drives the LSTAG bus.

Load Miss—Data cache on, paging on

In this case, when the load-store section encounters a data cache miss, it does a speculative TLB/PT access. It does so by asserting LS_MMU_RD and driving the DADDR bus with the load linear address. [It is noted that LS_NOT_SP signal is not asserted during speculative lookups. During speculative look up, the CMASTER can assert one of the following three signals—TLB_LS_MISS (access missed in the TLB], CM_DC_ALIAS [access hit in the TLB and the physical tags reported an alias], PT_MISS [access hit in the TLB but missed in the physical tags], MMULSPGFLT [encountered a protection violation in the TLB]. For the case of CM_DC_ALIAS, the CMASTER sends the column information to the data cache and the LSSEC drives the address and LSUPDATERD signal to the data cache which will then update its tag and drive the result. For TLB_LS_MISS and PT_MISS cases, the M bit in the entry is set. When the instruction becomes non-speculative, the address is sent on the DADDR bus and the signals LS_MMU_RD and LS_NOT_SP are asserted. It is now the responsibility of the CMASTER to resolve TLB miss and get the line of interest from memory. For the case of page fault, the LSSEC sends a page fault status to the FIROB with a page fault vector on the result bus. If the instruction is non-speculative, the FIROB then asserts EXCEPTION and drives the entry point of the page fault routine.

Handling Physical Addresses from Microcode:

The microcode can send physical addresses for HDT mode, microcode patch, etc. The LSSEC and the cache master handles this. There is an indication on the INSLS bus if an address from the functional unit is a physical address. The LSSEC latches this information in the unified load-store buffer. It treats this access as a non-cacheable access. The address is driven on the DADDR bus to the CMASTER and the signal LS_PHYSICAL is asserted. The cache master, when it sees this signal, disables translation and performs a physical tags look up. If there is an alias, the CMASTER asserts CM_DC_ALIAS signal and drives the column information over to the data cache. After the data cache signals that it is ready to receive the access, the LSSEC drives the index without LSUPDATERD being asserted. The data cache then drives the data and presents the hit status to the functional units and FIROB.

If there is no alias, the access is treated as a non-cacheable access.

There is a problem with this approach—load-store dependency checking is disabled when there is a combination of physical and linear addresses. But, this may be handled if only linear addresses and only physical addresses are used. The best solution is if microcode introduces serialization when switching between HDT (patch) and non-HDT (non-patch) modes. Dependency checking can now be handled in the same way for all the modes.

SIGNAL LIST

INPUTS:

BIU_NC[2:0]     Input from CMASTER
When this signal is asserted, the reload data should not be placed in the data cache.
CANENTRY1     Input from FIROB     ICLK7
When this bit is asserted, the instruction pointed to by WRPTR is invalidated.
CANENTRY1     Input from FIROB     ICLK8
When this bit is asserted, the instruction pointed to by WRPTR1 is invalidated.
CMSTRBUSY     Input from CMASTER
This signal indicates that the cache master is busy.
CM_DC_ALIAS     Input from CMASTER
This signal indicates that there is an alias in the data cache for the request sent.
CR0WP
CR0AM
CR0PE     Inputs from SRB
Bits from the CR0 register. WP bit is used in preventing supervisory accesses to read-only pages. The AM flag if set means that all unaligned accesses will generate exceptions. The PE bit is used to change the mode of processor to protected mode from real mode.
DCCNCLA     Input from DCACHE     ICLK7
This signal indicates that the port A access must be canceled and reissued in the next clock cycle.
DCCNCLB     Input from DCACHE     ICLK7
This signal indicates that the port B access must be canceled and reissued in the next clock cycle.
DCDATARDY     Input from DCACHE     ICLK13
DCBUSY     Input from DCACHE     ICLK12
The data cache asserts this signal to inform that it is busy either doing a snoop read, snoop invalidation, reload or a cache line read that is done prior to a reload. The LSSEC does not send any access as long as this is asserted.
DCFINRLD     Input from DCACHE     ICLK13
Indication from the data cache that a reload has been completed. The LSSEC can now request for DCACHE loads and stores.
DCLSD[1:0]     Input from DCACHE     ICLK5
DCLSD[0] and DCLSD[1] are the dirty bits corresponding to port A and port B respectively. The are used by the LSSEC during stores to determine if the corresponding dirty bit in the page table entry is set correctly in the TLB.
DCLSPROK[1:0]     Input from DCACHE     ICLK5
Indicates that a protection violation occurred during a DCACHE access. Bit 0 corresponds to port A while bit 1 corresponds to port B.
DCPAPRHIT     Input from DCACHE     ICLK3
Indication that the port A access hit in the predicted way.
DCPBPRHIT     Input from DCACHE     ICLK3
Indication that the port B access hit in the predicted way.
DCUNPAHIT     Input from DCACHE     ICLK3
Indication that the port A access hit in one of the unpredicted ways.
DCUNPBHIT     Input from DCACHE     ICLK3
Indication that the port B access hit in one of the unpredicted ways.
EFIOPL[1:0]
EFLAGSAC
EFLAGSVM
EFLAGSRF     Inputs from FIROB [EFLAGS]     ICLK5
Various bits from the EFLAGS register that are needed elsewhere in the processor. AC is the alignment check bit used in preventing unaligned memory accesses if AM is set in CR0. The VM bit is for virtual mode of operation. The RF flag is looked up by the break point detection hardware before reporting any breakpoint matches. If RF is set, breakpoint matches are not reported. IOPL bits are used for input/output protection checking.
EXCEPTION     Input from FIROB     ICLK5
Global exception indication from ROB to cancel all pending instructions and to not return any more results.
IC_CACHED     Input from CMASTER
Indication that the line the LSSEC/DCACHE requested is in the ICACHE.
INSLS0B[10:0]     Input from FU
INSLS1B[10:0]     Input from FU
INSLS2B[10:0]     Input from FU
INSLS3B[10:0]     Input from FU     ICLK3
These buses give the load-store section information as to which segment is currently being accessed and types of protection checking that need to be performed. The information is sent to the FU by decode/microcode and the FU sends the information while computing the linear address.
IRESET     Input from CLOCKS
Global reset signal. Clears all LDSTBUF entries. Puts the control state machine to idle/reset state.
ITYPE0B[1:0]     Input from IDECODE
ITYPE1B[1:0]     Input from IDECODE
ITYPE2B[1:0]     Input from IDECODE
ITYFE3B[1:0]     Input from IDECODE     ICLK3
These buses give the type of instructions dispatched.
00     NULL
01     LOAD
10     STORE
11     LOAD-OP-STORE
LINEPTR[2:0]     Input from FIROB     ICLK3
These buses give the FIROB line number associated with the instructions dispatched.
RES0B[31:0]     Input from FU
RES1B[31:0]     Input from FU
RES2B[31:0]     Input from FU
RES3B[31:0]     Input from FU     ICLK12
The store data is driven on the result buses by the functional units.
RESLA0B[14:0]     Input from FU
RESLA1B[14:0]     Input from FU -continued

| | | |
|---|---|---|
| RESLA2B[14:0] | Input from FU | |
| RESLA3B[14:0] | Input from FU | ICLK10 |

Linear addresses from the functional units. The result buses are slow. The linear addresses need to come to the LSSEC faster so that it can perform two accesses at the end of the cycle. If needed, the bus width can be reduced to 14 bits - so that the cache indexing can be done. The rest of the bits can be grabbed from the result buses.

| | | |
|---|---|---|
| RSTAT0LS[2:0] | Input from FU | |
| RSTAT1LS[2:0] | Input from FU | |
| RSTAT2LS[2:0] | Input from FU | |
| RSTAT3LS[2:0] | Input from FU | ICLK3 |
| 00 | Null | |
| 01 | Address is driven by the functional unit on the RESLA bus | |
| 10 | Data is driven on the result bus by the functional unit | |

Bit 2 = 1 indicates that the linear address generated is for a load instruction. This is used by the LSSEC to forward linear addresses to the data cache directly to the functional units.

| | | |
|---|---|---|
| RTAG0B[2:0] | Input from FU | |
| RTAG0B[2:0] | Input from FU | |
| RTAG0B[2:0] | Input from FU | |
| RTAG0B[2:0] | Input from FU | ICLK3 |

This gives the ROB line number of the instruction that the FU is processing.

TLB_LS_MISS    Input from CMASTER
This is the TL hit/miss indication from MMU.

WRPTR[5:0]     Input from FIROB           ICLK5
This gives the line and entry numbers of the instruction that is ready to get retired.

WRPTR1[5:0]    Input from FIROB           ICLK6
This gives the line and entry numbers of the next store in a FIROB line that can be retired with another store. This aids in sending out two store accesses.

OUTPUTS:

CURCPL[1:0]    Output to DCACHE           ICLK10
This indicates the current privilege level. The data cache uses the D, R/W and U/S bits in conjunction with the CURCPL information to determine the protection violations.

LDORST[1:0]    Output to DCACHE           ICLK12
Indication whether an access is a load or a store.

LSBNKCT        Output to DCACHE           ICLK13
This indicates if there is a bank conflict for the two concurrent data cache accesses to be performed.

LSBREAK[1:0]   Output to FIROB            ICLK13
Load/Store breakpoint identification from LSSEC. When a load or store breakpoint status is returned, this 2-bit code indicates which of the four debug address registers had the match.

LSCNT[2:0]     Output to IDECODE          ICLK11
Number of free entries in the LDSTBUF. Decode can make use of this information and dispatch instructions accordingly.

LSDCEXC[1:0]   Output to DCACHE           ICLK13
This signal indicates the data cache that limit check or protection violation has occurred on the current port A [bit0] or port B [bit1] access. If the access is a store, the data cache has to restore the data back into the data cache.

LS_FAKE_LOAD   Output to CMASTER          ICLK5
LS_FAKE_LOCK   Output to CMASTER          ICLK5
LSINDXCT       Output to DCACHE           ICLK14
This indicates if there is an index conflict for the two concurrent data cache accesses to be performed.

LS_IO_CYCLE    Output to CMASTER          ICLK5
LSLINAD0[31:2] Output to DCACHE           ICLK14
The linear address which would be sent as the port A access to the data cache.

LSLINAD1[31:2] Output to DCACHE           ICLK14
The linear address which would be sent as the port B access to the data cache.

LS_LOCK        Output to CMASTER          ICLK5
LS_MMU_RD      Output to CMASTER          ICLK5
This signal is asserted when the load-store section is performing a data cache read. The read is done speculatively.

LS_UNLOCK      Output to CMASTER          ICLK5
LS_MMU_WR      Output to CMASTER          ICLK5

This signal is asserted when the load-store section is performing a data cache write. The look up is done speculatively.

LSPASHFT[1:0]  Output to DCACHE           ICLK14
This signal gives the shift count to the data cache when performing unaligned accesses within a double word on port A.
00    shft by 0
01    shft by 1 byte
10    shft by 2 bytes
11    shft by 3 bytes LSPBSHFT[1:0]  Output to DCACHE           ICLK14
This signal gives the shift count to the data cache when performing unaligned accesses within a double word on port B.

LSRES0B[31:0]/XLSRES0  Output to FNCU/FIROB   ICLK13
Result bus returning results for AC0. The intermediate results for load-op-store instructions are indicated by the LSSTAT0B bus.
XLSRES0B is the inverse of LSRES0B. The differential buses are used for speed.

LSRES1B[31:0]/ XLSRES1  Output to FNCU/FIROB  ICLK13
Result bus returning results for AC1 The intermediate results for load-op-store instructions are indicated by the LSSTAT1B bus.

LST_SRB
LST_LDOP
LST_LOAD

LSSTAT0B[3:0]  Output to FIROB/FNCU       ICLK10
Status of the result returned on LSRES0B. Bit 3 defines whether a result is intermediate.

LSSTAT1B[3:0]  Output to FIROB/FNCU       ICLK10
Status of the result returned on LSRES1B. Bit 3 defines whether a result is intermediate.

LSTAG0B[5:0]   Output to FNCU/FIROB       ICLK5
This gives the tag of the instruction returned on LSRES0B.

LSTAG1B[5:0]   Output to FNCU/FIROB       ICLK5
This gives the tag of the instruction returned on LSRES1B.

LSUNALGN[1:0]  Output to DCACHE           ICLK13
LSUNALGN[0] indicates that the load/store access to the data cache from port A is unaligned. LSUNALGN[1] indicates the same for port B. An unaligned load can be issued to either port A or port B whereas an unaligned store uses both ports simultaneously.

LSUPDATERD     Output to DCACHE           ICLK10
This signal indicates the data cache to update its tag with the new linear address. The data cache also needs to update its valid and status bits.

LSWYPRCT       Output to DCACHE           ICLK14
This indicates if there is an index conflict in the way prediction array for the two concurrent accesses to be performed.

PABYTEN[3:0]   Output to DCACHE           ICLK14
The byte enables saying which of the bytes in a bank are being accessed. [port A]

PBBYTEN[3:0]   Output to DCACHE           ICLK14
The byte enables saying which of the bytes in a bank are being accessed. [port B]

SBADAT[31:0]   Output to DCACHE           ICLK13
This bus is used to drive the store data for port A. This is a static bus.

SBBDAT[31:0]   Output to DCACHE           ICLK13
This bus is used to drive the store data for port B.

ST_NC          Output to CMASTER          ICLK5
This signal indicates the CMASTER that the store that just got retired is a non-cacheable store.

SUPERV
CS32X16
SS32X16        Outputs to IDECODE         ICLK10

BIDIRECTS:

DADDR[31:2]    Birdirect. Connects to     ICLK13
               DCACHE and CMASTER
This bus is used by the load-store section to send linear address to the cache master to check for aliases, initiate reloads and writebacks. The cache master sends the new tag on this bus to the data cache for the case of an alias.

DATB[63:0]     Birdirect. Connects to     ICLK13
               DCACHE and CMASTER
This shared bus is used to send data to the CMASTER for non-cacheable and write through stores. The data cache and the cache master use this bus for reloads and writebacks.

-continued

```
SRBB[31:0]        Bidirect - SRB                              ICLK14
This bi-directional bus is used by the SRB for moving to and
from special registers and accessing arrays.
```

Partitioning of LSSEC:

The load-store section is partitioned into the following blocks:

1. LDSTDAT—The store data array.
2. LDSTADR—The array having the address portion of the load-store buffer. It also contains the dependency checking logic for store data forwarding.
3. LDSTSTAT—Array holding the status information. The status information is looked at mostly by the control unit.
4. LDSTTAGS—Array containing the instruction tags. This array is updated by the decode unit and the information is needed to update LDSTDAT and LDSTADR blocks and to perform dependency checking.
5. LSSPREG—Array of segment registers. Furhter details of this block are provided above.
6. LSCTL—The load-store section control block.

Figure 50:
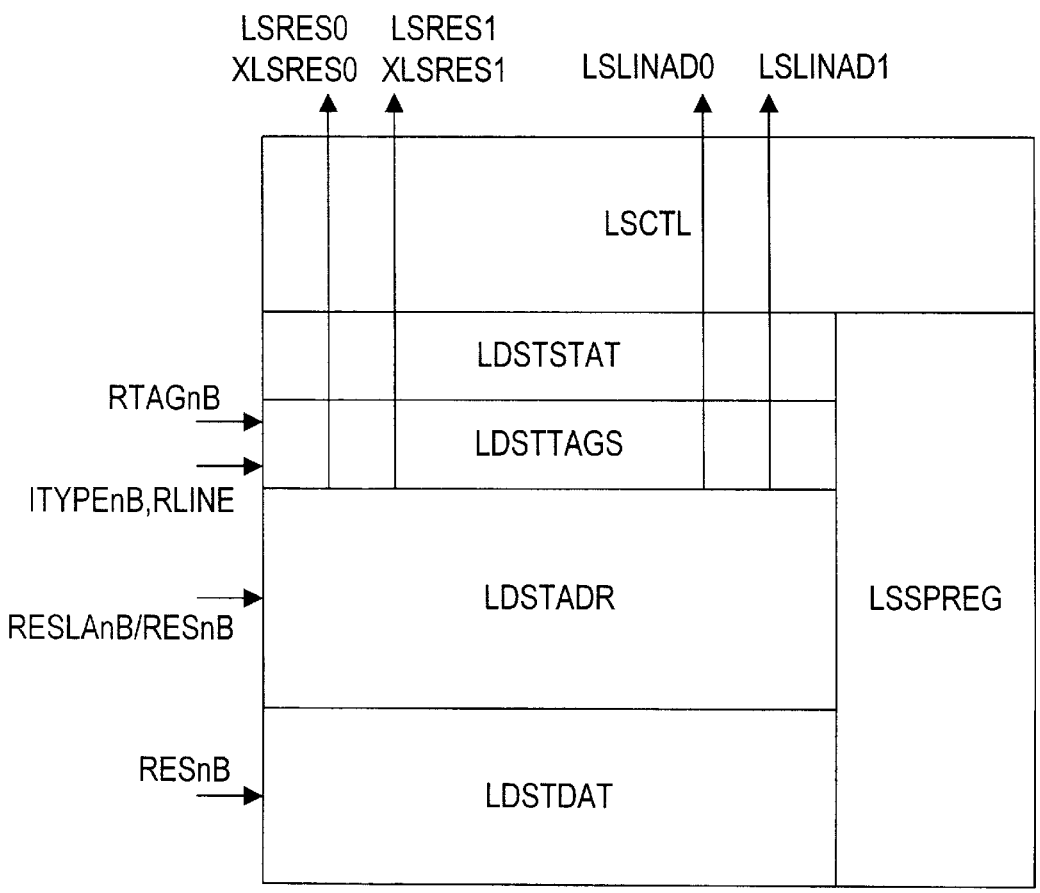

A block diagram of this partitioning is shown as FIG. 50

Layout of LSSEC

Figure 51:
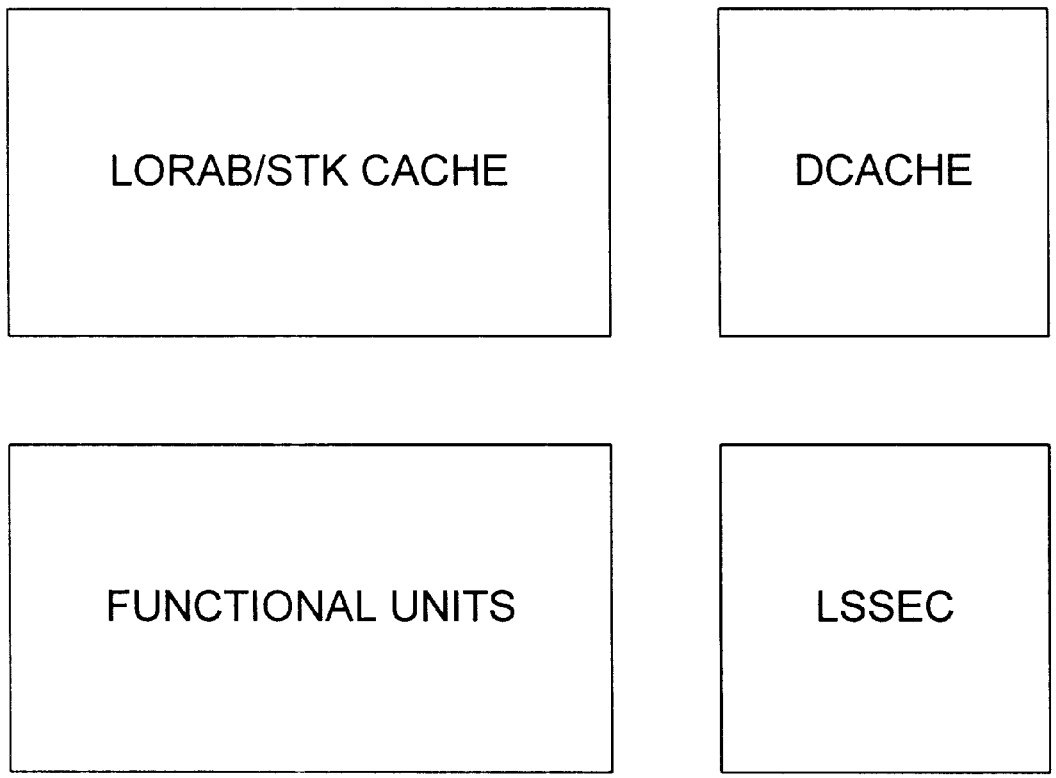

FIG. 51 shows a possible layout configuration of the LSSEC. LDSTDAT, LDSTADR, LDSTTAGS and LDST-STAT constitute the unified load-store buffer (LDSTBUF).

LDSTDAT (The array containing the store data)

This array contains the store data. There are eight entries of 32-bits each. The sources of updates to this array are the functional units. The array looks at the LATYPE signal which indicates whether address or data is driven on the result bus. The control section indicates which of the entries need to be updated (LSUPD[15:0]). LSRDDAT0[15:0] and LSRDDAT1[15:0] indicate which of the two entries go out as accesses for stores. LSFWD0[15:0] LSFWD1[15:0] indicate as to which entries need to get forwarded over to LSRES0 and LSRES1 buses.

Signal List

```
RES0B[31:0]
RES1B[31:0]
RES2B[31:0]
RES3B[31:0]       Inputs from Functional Units
The result buses from the functional units.
RSTAT0LS[2:0]     Input from FU
RSTAT1LS[2:0]     Input from FU
RSTAT2LS[2:0]     Input from FU
RSTAT3LS[2:0]     Input from FU                ICLK3
00    Null
01    Address is driven by the functional
      unit on the RESLA bus
10    Data is driven on the result bus by
      the functional unit
Bit 2 = 1 indicates that the linear address generated
is for a load instruction. This is used by the LSSEC to
forward linear addresses to the data cache directly to the
functional units.
LS0UPD[3:0]
LS1UPD[3:0]
LS2UPD[3:0]
LS3UPD[3:0]
LS4UPD[3:0]
LS5UPD[3:0]
LS6UPD[3:0]
LS7UPD[3:0]       Inputs from LDSTTAGS
The update signals after comparing the tags.
LS0RDDAT[7:0]     Input from LSCTL
Indicates which of the entries must go out as AC0 for
stores.
LS1RDDAT[7:0]     Input from LSCTL
Indicates which of the entries must go out as AC1 for
stores.
LS0FWD[7:0]       Input from LDSTADR
Indicates which of the entries need to be forwarded on to
LSRES0.
LS1FWD[7:0]       Input from LDSTADR
Indicates which of the entries need to be forwarded on to
LSRES1.
LSRES0[31:0], XLSRES0[31:0]  Output to FUn/FIROB
Load-store result bus.
LSRES1[31:0], XLSRES1[31:0]  Output to FUn/FIROB
Load-store result bus.
SHF1ENT[7:0]
SHF2ENT[7:0]      Inputs from LSCTL
Shift signals to shift the entries down.
shf1ent xor SHF2ENT = 1 - shift entry by 1
shf1ent and SHF2ENT = 1 - shift entry by 2
DATB[63:0]        Birdirect. Connects to
                  DCACHE and CMASTER
This shared bus is used to send data to the CMASTER for
non-cacheable and write through stores. The data cache and
the cache master use this bus for reloads and writebacks.
SBADAT[31:0]      Output to the data cache
This bus is used to drive the store data for port A. This is
a static bus.
SBBDAT[31:0]      Output to the data cache
This bus is used to drive the store data for port B.
```

LDSTADR (The array containing the load-store address)

This array of eight entries contains the address for the load-store accesses. The update sources for the array are the functional units. The functional units send the bits [14:0] on the RESLAn buses and the entire address on the RESnB buses. The array gets updated via the RESnB buses. The RESLA buses are much faster than the result buses and are used to send out the index for the data cache accesses as soon as possible. Also, the LSSEC needs to determine bank conflicts and unaligned accesses. This again needs the LSBs of the address available to the LSSEC early.

This block also contains the logic for dependency checking against stores in the buffer and sending the forwarding signals to LDSTDAT.

Signal List

```
RES0B[31:0]
RES1B[31:0]
RES2B[31:0]
RES3B[31:0]       Inputs from Functional Units
The result buses from the functional units.
RSTAT0LS[2:0]     Input from FU
RSTAT1LS[2:0]     Input from FU
RSTAT2LS[2:0]     Input from FU
RSTAT3LS[2:0]     Input from FU                ICLK3
00    Null
01    Address is driven by the functional
      unit on the RESLA bus
10    Data is driven on the result bus
      by the functional unit
Bit 2 = 1 indicates that the linear address generated
is for a load instruction. This is used by the LSSEC to
forward linear addresses to the data cache directly to the
functional units.
LS0UPD[3:0]
LS1UPD[3:0]
LS2UPD[3:0]
LS3UPD[3:0]
LS4UPD[3:0]
LS5UPD[3:0]
LS6UPD[3:0]
LS7UPD[3:0]       Inputs from LDSTTAGS
The update signals after comparing the tags.
LSLINAD0[31:0]    Output to DCACHE
The address for access AC0.
```

-continued

```
LSLINAD1[31:0]    Output to DCACHE
The address for access AC1.
SHF1ENT[7:0]
SHF2ENT[7:0]      Inputs from LSCTL
Shift signals to shift the entries down.
shf1ent xor SHF2ENT = 1 - shift entry by 1
shf1ent and SHF2ENT = 1 - shift entry by 1
LS0RDDAT[7:0]     Input from LSCTL
Indicates which of the entries must go out as AC0 for
stores
LS1RDDAT[7:0]     Input from LSCTL
Indicates which of the entries must go out as AC1 for
stores.
LS0FWD[7:0]       Input from LDSTADR
Indicates which of the entries need to be forwarded on to
LSRES0.
LS1FWD[7:0]       Input from LDSTADR
Indicates which of the entries need to be forwarded on to
LSRES1.
```

LDSTSTAT (The array containing the control/status information)

This array is also eight entries deep and contains the control/status information of the loads and stores in the LSSEC. The update source for this array is the load-store section itself.

Signal List:

```
ALL0ENT[2:0]
ALL1ENT[2:0]
ALL2ENT[2:0]
ALL3ENT[2:0]      Inputs from LSCTL
These indicate what entries can be allocated for the next
dispatch.
ALL0V[3:0]
ALL1V[3:0]
ALL2V[3:0]
ALL3V[3:0]        Inputs from LSCTL
These signals are associated with ALLnENT and indicate which
of the four dispatch positions they correspond to.
SET0MISS[2:0]     Input from LSCTL
Set the M bit for the entry indicated by SET0MISS if a port
A access missed.
SET1MISS[2:0]     Input from LSCTL
Set the M bit for the entry indicated by SET1MISS if a port
B access missed.
SETM2[2:0]        Input from LSCTL
Based on this, the M2 bit for an entry in the array is set.
SET0DEP[2:0]      Input from LSCTL
Set the D (dependent) bit.
SET1DEP[2:0]      Input from LSCTL
Set the D (dependent) bit.
SET0SER[2:0]      Input from LSCTL
Set the S (Serialize) bit.
SET1SER[2:0]      Input from LSCTL
Set the S (Serialize) bit.
LDAC[7:0]         Output to LSCTL
Indicates which of the entries have valid loads that can go
out as accesses.
LSAC[1:0]         Output to LSCTL
Indicates which of the entries have valid stores that can go
out as accesses.
CLRDEP            Input from LSCTL
Clear the D bit for all the entries.
CLRMISS1          Input from LSCTL
Clear the M bit for all the entries.
SETNF             Input from LSCTL
Set the NF bit for all the stores in the buffer. This will
prevent forwarding store data for dependent loads.
SHF1ENT[7:0]
SHF2ENT[7:0]      Inputs from LSCTL
Shift signals to shift the entries down.
shf1ent xor SHF2ENT = 1 - shift entry by 1
shf1ent and SHF2ENT = 1 - shift entry by 2
```

LDSTTAGS (Array containing the FIROB tags)

This 8-entry array contains the FIROB tags for the instructions in the LSSEC. The tags are looked up by the control unit during access prioritization. The tags in the entries are compared against the tags from the functional units when updating the address and data arrays. The tags information is also needed when performing dependency checking.

Signal List

```
RLINE[2:0]        Input from FIROB
These buses give the FIROB line number associated with the
instructions dispatched.
RTAG0B[2:0]       Input from FUn
RTAG0B[2:0]       Input from FUn
RTAG0B[2:0]       Input from FUn
RTAG0B[2:0]       Input from FUn
This gives the ROB line number of the instruction that the
FU is processing.
LS0UPD[3:0]
LS1UPD[3:0]
LS2UPD[3:0]
LS3UPD[3:0]
LS4UPD[3:0]
LS5UPD[3:0]
LS6UPD[3:0]
LS7UPD[3:0]       Output to LDSTDAT, LDSTADR and LDSTSTAT
The update signals after comparing the tags.
LSTAG0B[5:0]      Output to FNCU/FIROB
This gives the tag of the instruction returned on LSRES0B.
LSTAG1B[5:0]      Output to FNCU/FIROB
This gives the tag of the instruction returned on LSRES1B.
LS0RDDAT[7:0]     Input from LSCTL
Indicates which of the entries must go out as AC0 for
stores.
LS1RDDAT[7:0]     Input from LSCTL
Indicates which of the entries must go out as AC1 for
stores.
LS0FWD[7:0]       Input from LDSTADR
Indicates which of the entries need to be forwarded on to
LSRES0.
LS1FWD[7:0]       Input from LDSTADR
Indicates which of the entries need to be forwarded on to
LSRES1.
ALL0ENT[2:0]
ALL1ENT[2:0]
ALL2ENT[2:0]
ALL3ENT[2:0]      Inputs from LSCTL
These indicate what entries can be allocated for the next
dispatch.
ALL0V[3:0]
ALL1V[3:0]
ALL2V[3:0]
ALL3V[3:0]        Inputs from LSCTL
These signals are associated with ALLnENT and indicate which
of the four dispatch positions they correspond to.
WRPTR             Input from FIROB
This is the indication of head of the ROB.
WRPTR1            Input from FIROB
This indicates the ROB position of the next non-speculative
store instruction
```

LSCTL (The control block for LSSEC)

Signal List

```
LS0RDDAT[2:0]     Output to LDSTDAT/LDSTADDR/LDSTTAGS
Indicates which of the entries must go out as AC0 for
stores.
LS1RDDAT[2:0]     Output to LDSTDAT/LDSTADDR/LDSTTAGS
Indicates which of the entries must go out as AC1 for
stores.
ALL0ENT[2:0]
ALL1ENT[2:0]
ALL2ENT[2:0]
ALL3ENT[2:0]      Outputs to LDSTTAGS/LDSTSTAT
```

-continued

These indicate what entries can be allocated for the next dispatch.
ALL0V[3:0]
ALL1V[3:0]
ALL2V[3:0]
ALL3V[3:0]   Outputs to LDSTTAGS/LDSTSTAT
These signals are associated with ALLnENT and indicate which of the four dispatch positions they correspond to.
SET0MISS[2:0]   Output to LDSTSTAT
Set the M bit for the entry indicated by SET0MISS if a port A access missed.
SET1MISS[2:0]   Output to LDSTSTAT
Set the M bit for the entry indicated by SET1MISS if a port B access missed.
SETM2[2:0]   Output to LDSTSTAT
Based on this, the M2 bit for an entry in the array is set.
SET0DEP[2:0]   Output to LDSTSTAT
Set the D (dependent) bit.
SET1DEP[2:0]   Output to LDSTSTAT
Set the D (dependent) bit.
SET0SER[2:0]   Output to LDSTSTAT
Set the S (Serialize) bit.
SET1SER[2:0]   Output to LDSTSTAT
Set the S (Serialize) bit.
LDAC[7:0]   Input from LDSTSTAT
Indicates which of the entries have valid loads that can go out as accesses.
LSAC[1:0]   Input from LDSTSTAT
Indicates which of the entries have valid stores that can go out as accesses.
CLRDEP   Output to LDSTSTAT
Clear the D bit for all the entries.
CLRMISS1   Output to LDSTSTAT
Clear the M bit for all the entries.
SETNF   Output to LDSTSTAT
Set the NF bit for all the stores in the buffer. This will prevent forwarding store data for dependent loads.
SHF1ENT[7:0]
SHF2ENT[7:0]   Output to LDSTDAT/LDSTADDR/LDSTTAGS/LDSTSTAT
Shift signals to shift the entries down.
shf1ent xor SHF2ENT = 1 - shift entry by 1
shf1ent and SHF2ENT = 1 - shift entry by 2

LSSPREG (The Load-Store Special Registers)
Signal List

LSRES0[31:0], XLSRES0[31:0]   Input from LDSTDAT
Load-store result bus.
LSRES1[31:0], XLSRES1[31:0]   Input from LDSTDAT
Load-store result bus.
IRESET   Input from CLOCKS
Global reset signal. Clears all LDSTBUF entries. Puts the control state machine to idle/reset state.
INSLS0B[10:0]   Input from FU
INSLS1B[10:0]   Input from FU
INSLS2B[10:0]   Input from FU
INSLS3B[10:0]   Input from FU   ICLK3
These buses give the load-store section information as to which segment is currently being accessed and types of protection checking that need to be performed. The information is sent to the FU by decode/microcode and the FU sends the information while computing the linear address.
ITYPE0B[1:0]   Input from IDECODE
ITYPE1B[1:0]   Input from IDECODE
ITYPE2B[1:0]   Input from IDECODE
ITYPE3B[1:0]   Input from IDECODE   ICLK3
These buses give the type of instructions dispatched.
00   NULL
01   LOAD
10   STORE
11   LOAD-OP-STORE
LINEPTR[2:0]   Input from FIROB   ICLK3
These buses give the FIROB line number associated with the instructions dispatched.
LSRLMODE   Input from LSCTL   ICLK3
Indicates that the processor is in real mode.

-continued

LSPRMODE   Input from LSCTL   ICLK3
Indicates that the processor is in protected mode.
LSEFLAGSVM   Input from LSCTL   ICLK3
Indicates that the processor is in V86 mode.
RES0B[31:0]   Input from FU
RES1B[31:0]   Input from FU
RES2B[31:0]   Input from FU
RES3B[31:0]   Input from FU   ICLK12
The store data is driven on the result buses by the functional units.
RESLA0B[14:0]   Input from FU
RESLA1B[14:0]   Input from FU
RESLA2B[14:0]   Input from FU
RESLA3B[14:0]   Input from FU   ICLK10
Linear addresses from the functional units. The result buses are slow. The linear addresses need to come to the LSSEC faster so that it can perform two accesses at the end of the cycle. If needed, the bus width can be reduced to 14 bits - so that the cache indexing can be done. The rest of the bits can be grabbed from the result buses.
RSTAT0LS[2:0]   Input from FU
RSTAT1LS[2:0]   Input from FU
RSTAT2LS[2:0]   Input from FU
RSTAT3LS[2:0]   Input from FU   ICLK3
00   Null
01   Address is driven by the functional
      unit on the RESLA bus
10   Data is driven on the result bus by
      the functional unit
Bit 2 = 1 indicates that the linear address generated is for a load instruction. This is used by the LSSEC to forward linear addresses to the data cache directly to the functional units.
RTAG0B[2:0]   Input from FU
RTAG0B[2:0]   Input from FU
RTAG0B[2:0]   Input from FU
RTAG0B[2:0]   Input from FU   ICLK3
This gives the ROB line number of the instruction that the FU is processing.
WRPTR[5:0]   Input from FIROB   ICLK5
DTBRKPT   Output to LSCTL   ICLK5
DBGMTCH   Output to LSCTL   ICLK5
LSLMTCHK[1:0]   Output to LSCTL   ICLK5
LSRDAT[31:0]   Output to LDSTDAT   ICLK5

DCACHE

Overview

The data cache (henceforth referred to as dcache) on Processor 500 is a 16KB linearly addressed, 8-way set associative cache. In order to facilitate single cycle dcache access, a way prediction scheme is used. This section discusses a 16KB dcache.

Some of the other salient features of this dcache are 8-way interleaving, two concurrent accesses per cycle if they are not to the same bank, random replacement policy and one cycle penalty for unaligned loads and unaligned stores.

Dcache Organization

Figure 52:
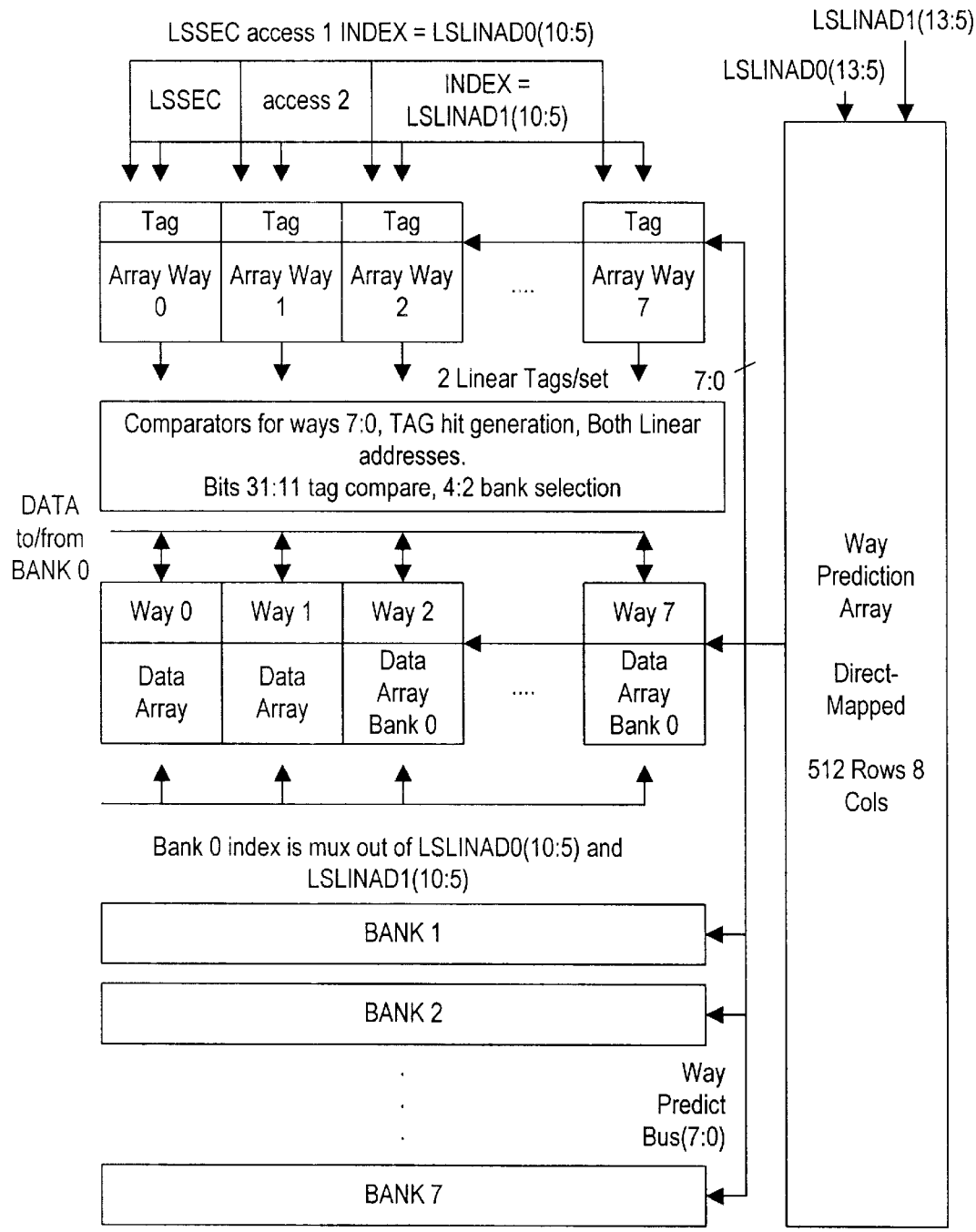

The dcache on Processor 500 is a 16KB linearly addressed cache implementing the MESI protocol. The line size is 32 bytes and the arrays are organized in a 8-way set associative structure with 8 banks. The 8 banks allow two concurrent accesses per cycle as long as the two accesses are not to the same bank. Bits 4:2 of the two linear addresses from the Processor 500 core are used for bank selection and identifying bank conflicts. Due to the interleaving, the data arrays are effectively dual ported and do not need to be implemented as actual dual ported structures. FIG. 52 shows a diagram of the dcache organization.

The dcache is partitioned into three functionally separate arrays. They are the tag array, data array and the way prediction array. The tag arrays are physically dual-ported. Since it is a 16KB dcache with a 32 byte line size, there are 64 tags per way. Bits 10:5 of the linear address are used to index the tag array with bits 31:11 used for comparison to determine hit or miss.

The data arrays are organized as 8 set arrays in each of the 8 banks. In order to facilitate 8/16 bit accesses as well as unaligned accesses, the LSSEC will generate byte enables for each of the two accesses. Bits 10:5 of the linear address are used to index the data arrays. The two ports that allow two concurrent accesses per clock cycle will henceforth be called Port A and Port B. The actions supported on Port A are: aligned loads/stores, unaligned loads/stores, reloads, SRB accesses, line reads (both snoop and non-snoop) and line invalidations. The actions supported on Port B are aligned/unaligned loads, unaligned stores (since a unaligned store uses both ports) and snoop invalidations.

Way prediction will allow the Processor 500 dcache to attain single cycle access at our targeted clock speeds while using a set-associative cache array. Single cycle dcache access is feasible only when the predicted way hits in the tag compare. If a hit occurs in any of the unpredicted ways then there is a one cycle penalty which would be equivalent to a replacement cache performance. However, unlike a replacement cache there will be no swap penalty. The way prediction array entry is updated with the new predicted value. Bits 13:5 of the linear address are used to index the way prediction array. Like the tag array, the way prediction array is also dual ported. The details of the way prediction scheme are described below.

Tag Array

Figure 53:
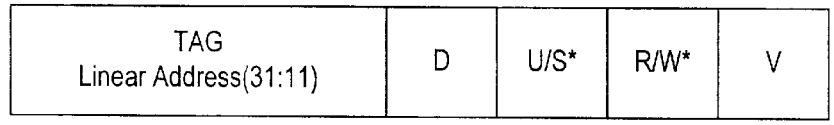

The tag array is organized into an 8-way set associative structure. It is dual ported so as to allow two concurrent accesses per cycle and is laid out as one 64 rows×200 column array. This is optimal since the speed target does not allow a contiguous array larger than 64 rows. Bits 10:5 of the port linear address will be used to index the array. This will be true for both port A and B accesses. A tag array entry per way consisting of 25 bits is as shown in FIG. 53.

A description of the various fields is as follows:

Tag is bits (31:11) of the linear address.

D is the dirty bit that indicates that the line has been previously modified. This information is used during a store by the LSSEC when the TLB is accessed to determine whether the corresponding dirty bit in the page table entry is correctly set. If the dirty bit in the page table entry is not set then an exception must occur to write the dirty bit in the external page table entries so that the page gets written back to external memory.

U/S* is the user/supervisor bit that indicates the access privilege of the dcache line. If this bit is 0 then user level programs cannot access this dcache entry. The supervisor can access any line regardless of this bit.

R/W* indicates the read/write privilege for user level programs. Supervisor level programs ignore this bit when the WP bit in CR0 register is 0. If the WP bit is set to 1 then supervisor level programs will use the R/W* bit. The dcache does the protection checking and sends an exception to the LSSEC if a violation occurs.

V is the linear valid bit. This bit is 0 on reset and is set to 1 when a new line gets loaded into the dcache. This bit is also reset to 0 on invalidation.

The tag and the protection bits (D, U/S* and R/W*) are always accessed together. The V bit can be accessed independently for invalidations and resets.

Data Array

The data array is effectively dual ported due to banking. Each bank is physically laid out as one 64 row×256 column array. This again is optimal since the speed target for Processor 500 does not allow a contiguous array larger than 64 rows. During a clock cycle (regular load/store accesses), at most two banks can be accessed. The banks are selected by the bank select bits 4:2 of the port addresses. Bits 10:5 of the port linear address will be used to index each selected bank. The data array is byte addressable. Two sets of byte enables are generated per clock corresponding to the two banks being accessed. The byte enables are generated using the operand size information as well as bits 1:0 of the linear address. The byte enables are critical to doing stores in a single cycle for aligned accesses since stores are done as pure writes. Unaligned accesses and 8/16 bit accesses use byte enable information in the same fashion as well. All 8 banks are accessed on port A only during a reload or during a writeback. At this time (i.e. during reload or writeback) port B is unused.

Way Prediction Array

Figure 54:

The way prediction array is a 512 rows×8 columns direct mapped cache that is physically organized into eight 64×8 arrays. Each column corresponds to one of the eight ways of the data and tag arrays as shown in FIG. 54. The way prediction array is implemented as a dual ported array to allow two concurrent accesses per cycle. It is indexed by bits 13:5 of the port A and B linear addresses. Note that unlike the data and tag array the index here is 9 bits wide. Therefore for each tag/data array index, there are 8 possible indexes in the way predict array (provided by extra index bits 13:11). It is noted here that greater the mapping (i.e. more index bits for way prediction array), the more accurate the way prediction. This mapping was determined to be optimal based on performance/implementation tradeoffs. Each of the eight arrays will be addressed by bits 10:5 of the linear address. Bits 13:11 will select the output of one of the eight arrays.

Aligned Loads

There are two cases to be considered here.

(a) 32 bit aligned loads and (b) 8/16 bit aligned loads.

Figure 56:
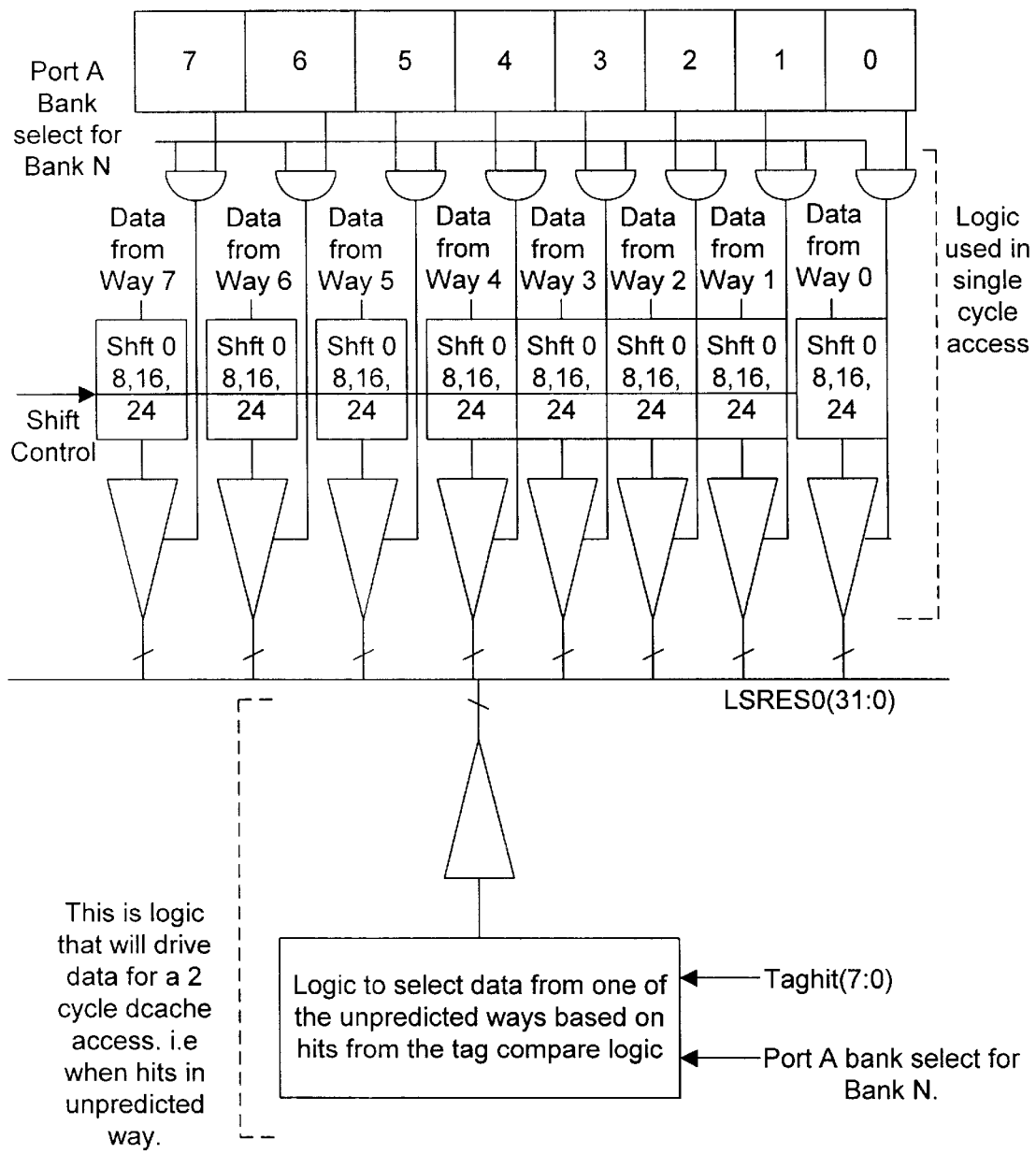

FIG. 56 shows a block diagram of the hardware to do aligned loads for both these cases.

Figure 55:
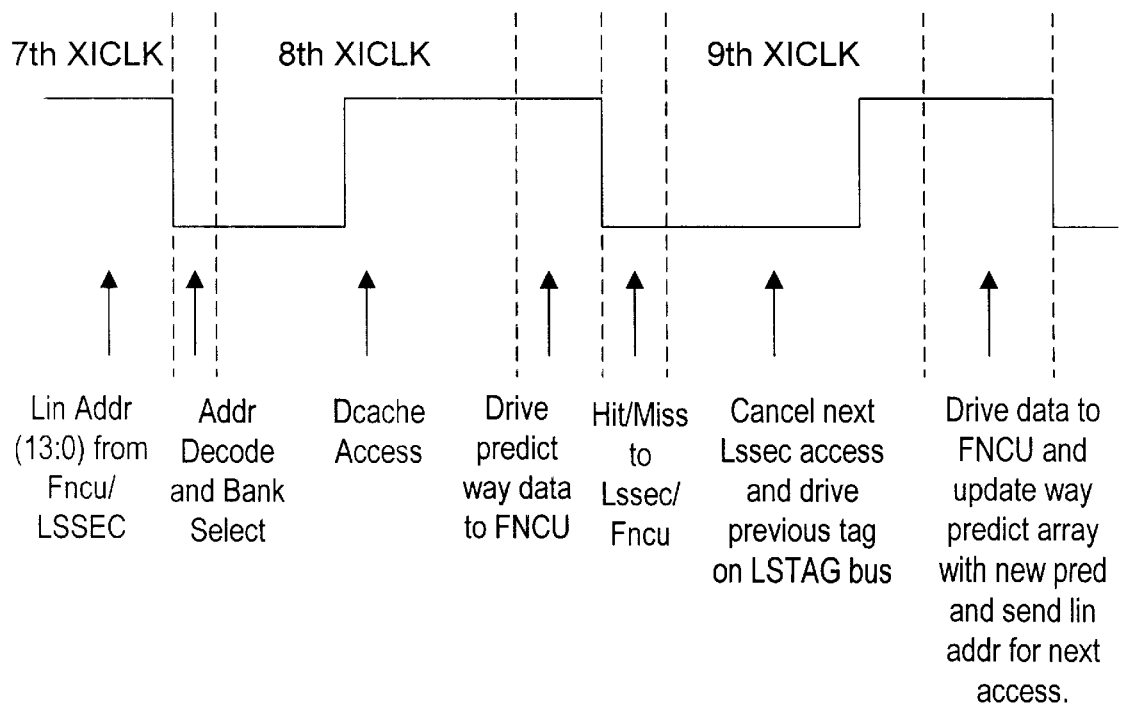

The dcache receives the linear address before the end of the 7th XICLK. The LSSEC also sends the index conflict and way conflict signals before the end of the 7th XICLK. At the beginning of the 8th XICLK, the dcache latches these signals, does the row decode and also the bank selection. The index conflict and way conflict signals are used to fire only one port of the dual ported tag and way prediction arrays. If a bank conflict occurs the LSSEC serializes the two accesses. Therefore, for that clock cycle, only one dcache access will be issued on port A. The LSSEC should also in the 8th XICLK send the shift code that is based on the operand size and bits 1:0 of the port linear address and also the byte enables. For the 32 bit load, the shift code is zero. The data from the predicted way will be driven on the LSRESn (n=0 or 1) and XLSRESn buses differentially towards the end of the 8th XICLK. The appropriate functional unit latches this data at the beginning of the 9th XICLK and uses it. The dcache meanwhile computes the hit/miss indication for the 8 ways and sends that indication to the functional unit and LSSEC. If there was a hit in the predicted way, then there is single cycle dcache access and the dcache can proceed with the next pending access. If there was a miss in the predicted way and a hit in one of the unpredicted ways, the LSSEC will cancel the next access that it had initiated on that port and drive the previous tag again on the LSTAGn bus. The functional unit will then cancel the operation and wait for data to be driven to it again in the 9th XICLK. The data from one of the unpredicted ways is driven to the functional unit during the 9th XICLK and is latched at the beginning of the 10th XICLK. Therefore, there is a one cycle penalty when there is a miss in the predicted way and a hit in one of the unpredicted ways. Also, the way prediction array will be updated with the new prediction in the 9th XICLK. FIG. 55 shows a timing diagram of the above stated actions.

For the 8/16 bit loads that are contained within one doubleword, the flow is the same except that the shift logic that is present before the bus driver is utilized. This logic is present for the 32 bit loads also, but it is a shift by 0. This shift logic can be implemented using transmission gate muxes. For the 8 bit data, we can have either a shift by 0,8,16 or 24. For 16 bit data, it is a shift by 0, 8 or 16. The shift will be determined by the operand size information and bits 1:0 of the port linear address. Both of these controls should be known at the beginning of the 8th XICLK and the muxes can be setup before the data is available.

If there is a miss on all the ways, the LSSEC marks that access as a miss and proceeds with the next dcache access if one is pending. The LSSEC also sends the address of the missed access to the CMASTER to check for an alias. If no aliasing has occurred, the LSSEC waits until the missed access is no longer speculative and then will initiate a reload sequence.

Aligned Stores

Figure 57:
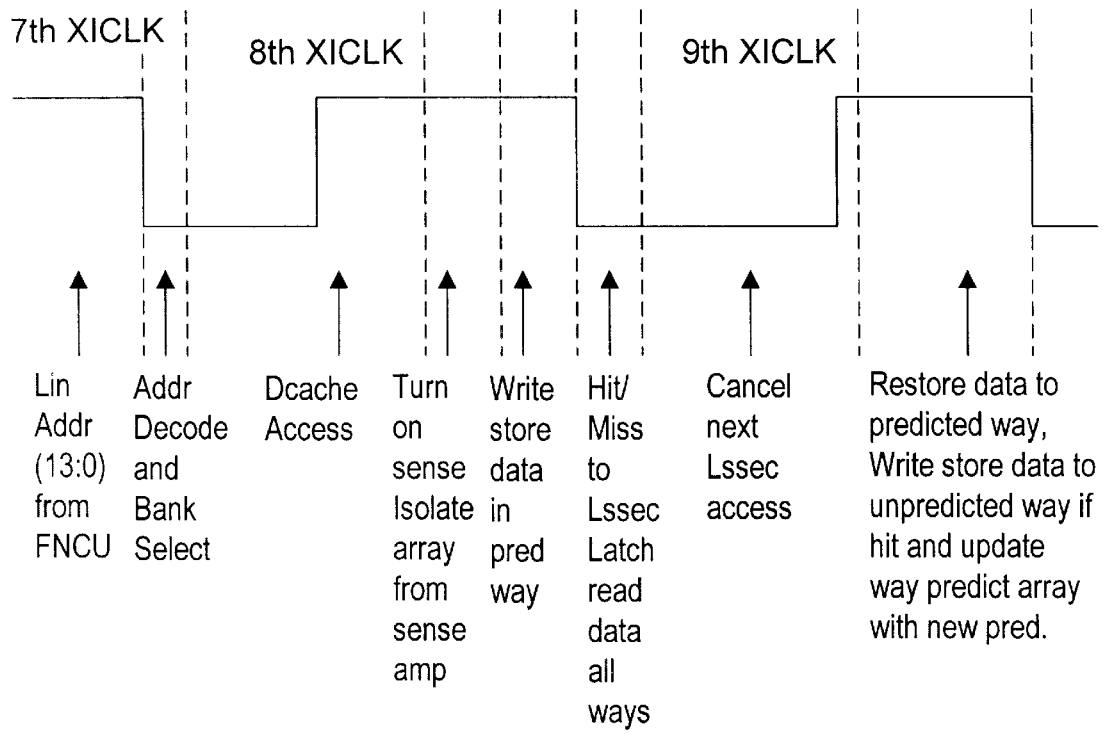

Stores on Processor 500 are done as pure writes. The dcache on Processor 500 supports byte write capability which allows pure writes. The byte enables used to do this are generated based on the operand size and bits 1:0 of the port linear address. Processor 500 dcache supports single cycle dcache access for stores if the store is to the predicted way. FIG. 57 is timing sequence of the actions that take place during the store.

The sequence of actions until the dcache access are similar for both the load and store accesses. When the senseamps are turned on, the arrays are isolated from the senseamp to prevent the bit lines from being pulled down. Thus, the senseamp provides an automatic latch structure to hold the read data. When the way prediction is available, the write strobe for the predicted way is turned on thereby writing the store data speculatively into the predicted way. At the beginning of the 9th XICLK, the hit/miss indications are generated and protection violations detected. If there was a hit to the predicted way and no protection violation, then a single cycle dcache store access has been performed. If there is a miss in the predicted way but a hit in one of the unpredicted ways and no protection violations, then in the 9th XICLK the store data is written into the way that hit and the predicted way is restored with the data that was read out in the 8th XICLK. Also the way prediction array is updated with the new prediction. If there is a protection violation, then the predicted way is restored with the data that was read out in the 8th XICLK. The protection violation information is sent to LSSEC to generate an exception. The access is thus terminated and the dcache can proceed with the next pending access on the following clock cycle.

For 8/16 bit stores, the above actions still hold except that depending on the byte enables that are active, only enabled bytes are updated with the new store data.

Unaligned Loads

Figure 58:
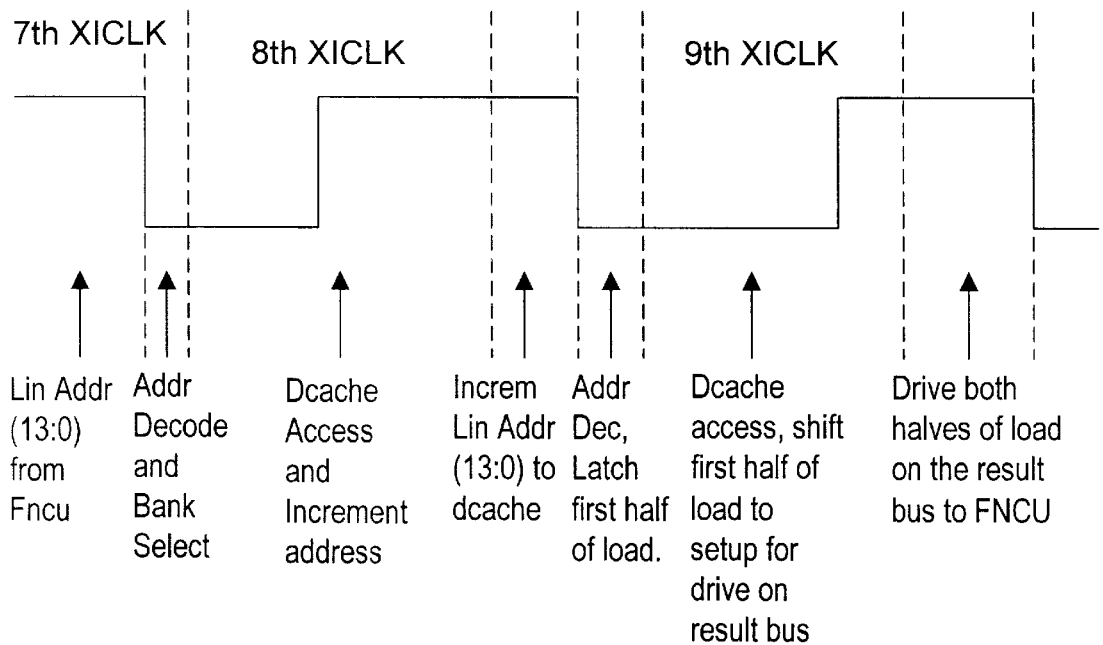

Unaligned loads on Processor 500 require at least a two cycle dcache access. FIG. 58 illustrates the sequence of actions for unaligned loads when both accesses hit in the predicted way.

In the 8th XICLK, the LSSEC will access the dcache with the current address. During this time, the LSSEC also increments the address by 4 to set up for the second half of the unaligned access. The dcache latches the first half of the unaligned load at the beginning of the 9th XICLK and does the shift necessary to set up the data to drive on the appropriate bits of the LSRESn and XLSRESn buses. During the 9th XICLK, the dcache reads the second half of the unaligned load. The actions taken are exactly the same as for a 8/16 bit aligned load. The two halves of the data will be driven on the LSRESn and XLSRESn buses at the end of the 9th XICLK. Note that in this process, the byte enables are used to select the appropriate bytes from the two doublewords that have been read out.

Figure 59:
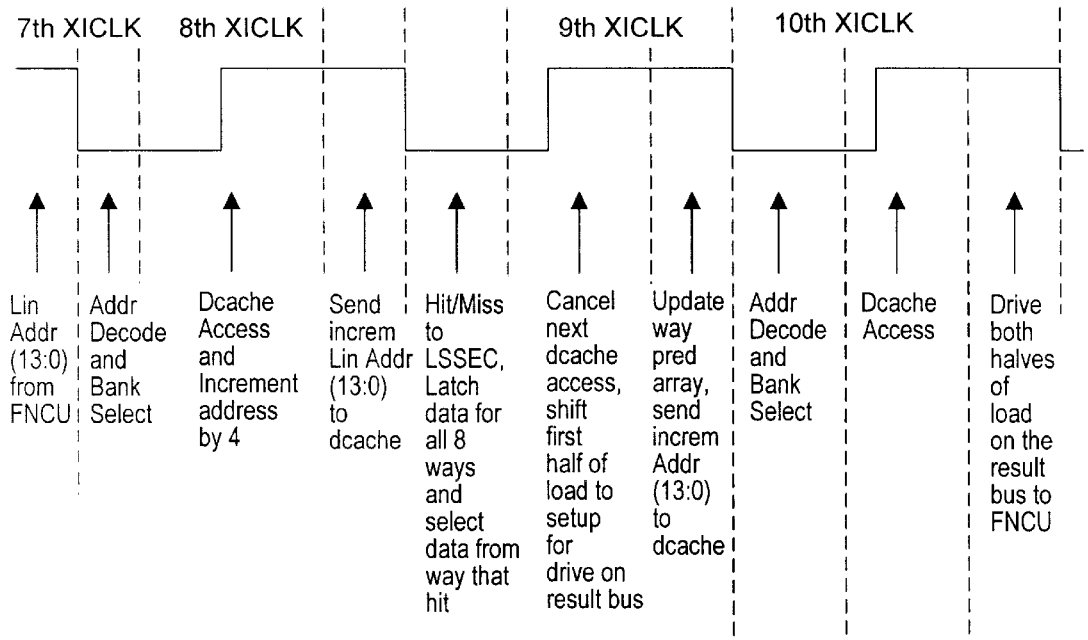

There are three more cases that are considered:

(a) Unpredicted way hit in first access—Predicted way hit in second access. FIG. 59 shows the timing diagram for handling this case. This case occurs both when the unaligned load is contained within a line and when the load crosses a line boundary. As can be seen from FIG. 59, this case requires 3 clock cycles.

Figure 60:
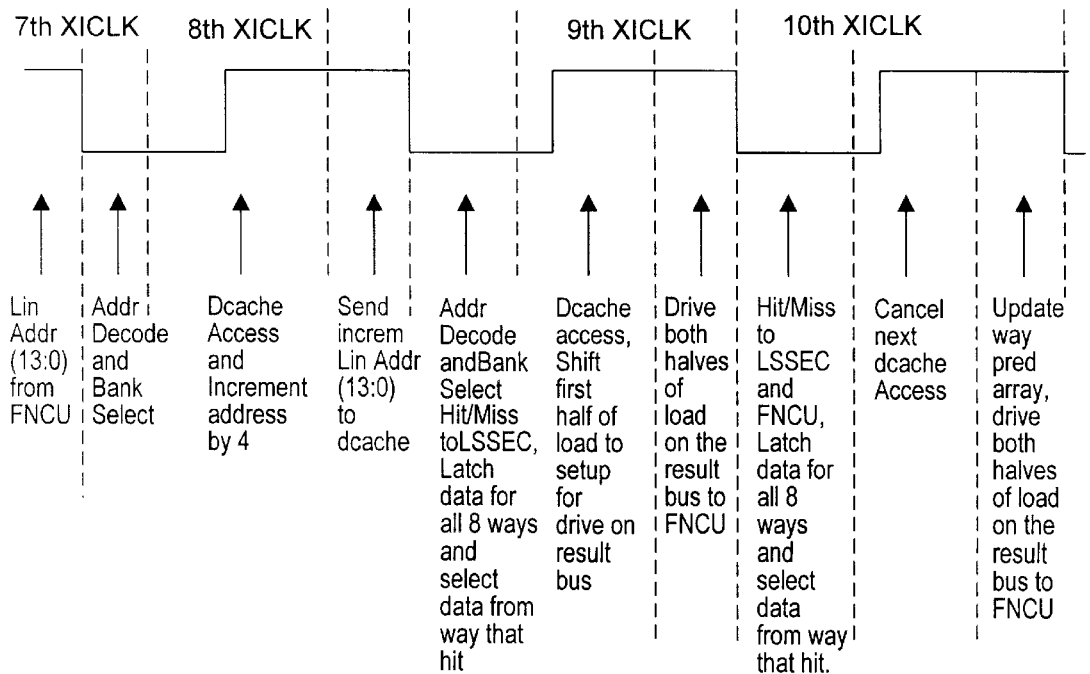

(b) Predicted way hit in first access—Unpredicted way hit in second access. FIG. 60 shows the timing diagram for handling this case. This case occurs when the unaligned load crosses a line boundary. This is because if the access were completely contained within the same line, there would not be a unpredicted way hit in the second access. This case also requires 3 clock cycles.

Figure 61:
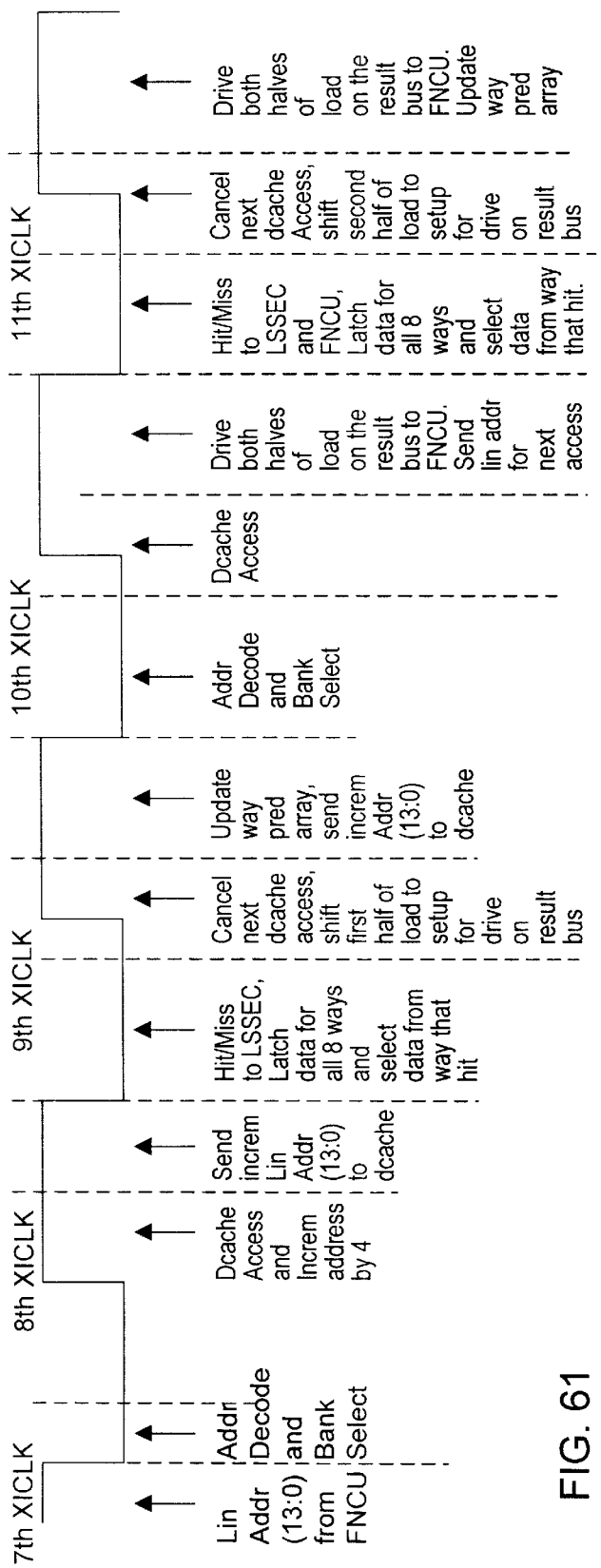

(c) Unpredicted way hit in first access—Unpredicted way hit in second access. This case will also occur when the unaligned load crosses the line boundary. This case will require 4 clock cycles to complete. FIG. 61 shows the timing diagram for this case.

The cases covered so far only involved hits in the dcache. There are two cases of misses: Miss in first access and miss in second access. When there is a miss during the first access, the LSSEC will mark that load as a miss. The LSSEC will then process the miss as described below. If there is a miss on the second half of the unaligned load, the first half of the unaligned load that has been read out will be discarded. This case would occur when the load crosses a line boundary. The LSSEC sets the M2 bit in the LSSEC buffer and then processes the miss as described below.

Unaligned Stores

Figure 62:
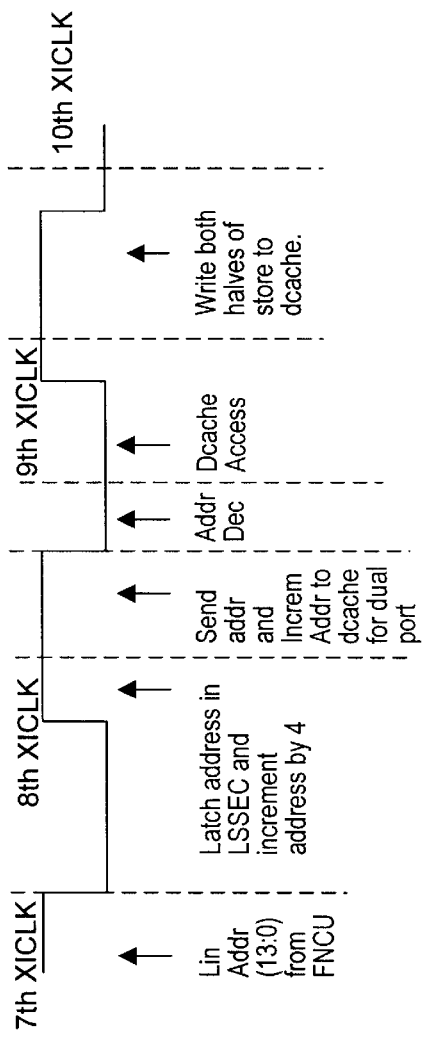

Unaligned stores are executed in a slightly different fashion from unaligned loads. For unaligned stores, the incremented address is generated in the 8th XICLK. In the 9th XICLK, port A is accessed with the original address and port B with the incremented address. The byte enables for both the ports are used to write the appropriate bytes of the two doublewords. If there is a miss on any one of the ports then the old data that is read out on the other port is restored in the next cycle. The LSSEC then processes the store miss as described below. FIG. 62 shows a timing diagram when both store accesses hit in the predicted way.

Figure 63:
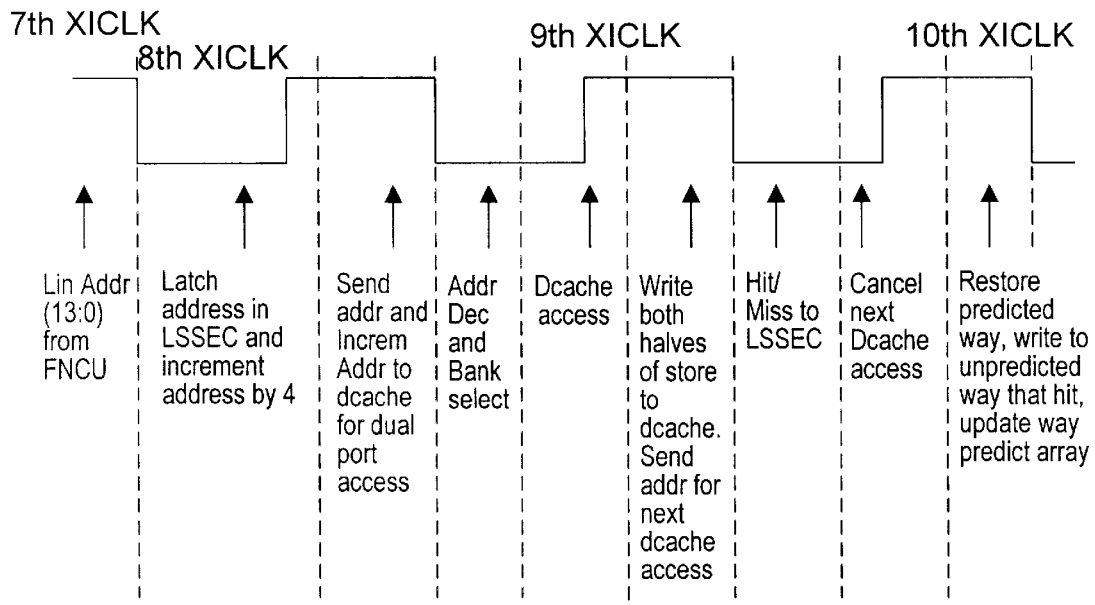
Figure 64:
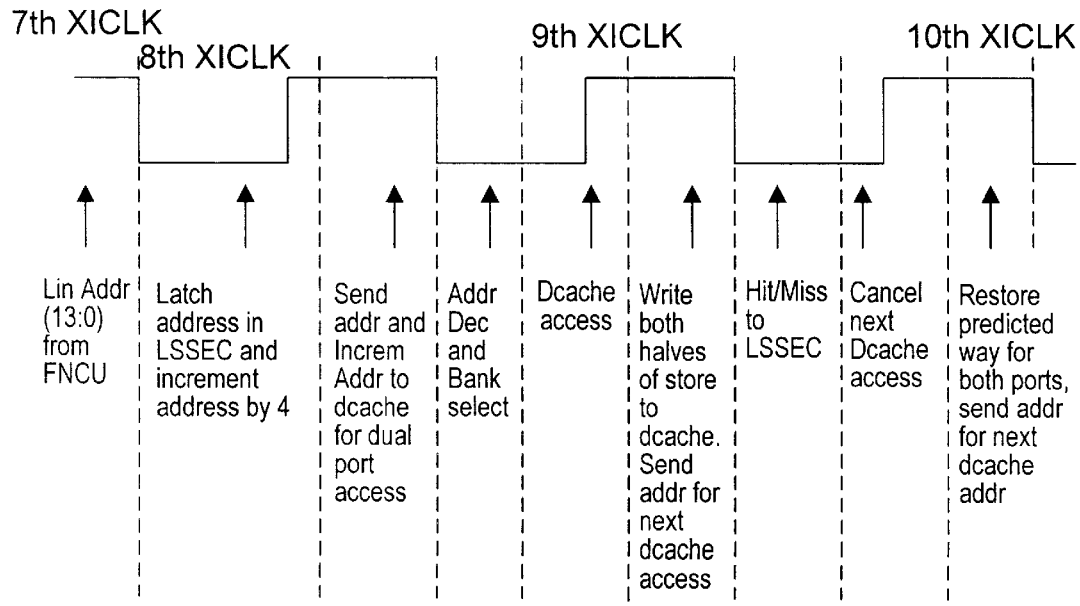

The other two cases that are considered are (a) At least one of the two accesses misses in the predicted way but hits in an unpredicted way. FIG. 63 shows the timing diagram for this case (b) There is a miss in all the ways for at least one access. FIG. 64 shows the timing diagram for each case.

Processing a Load Miss

Figure 65:
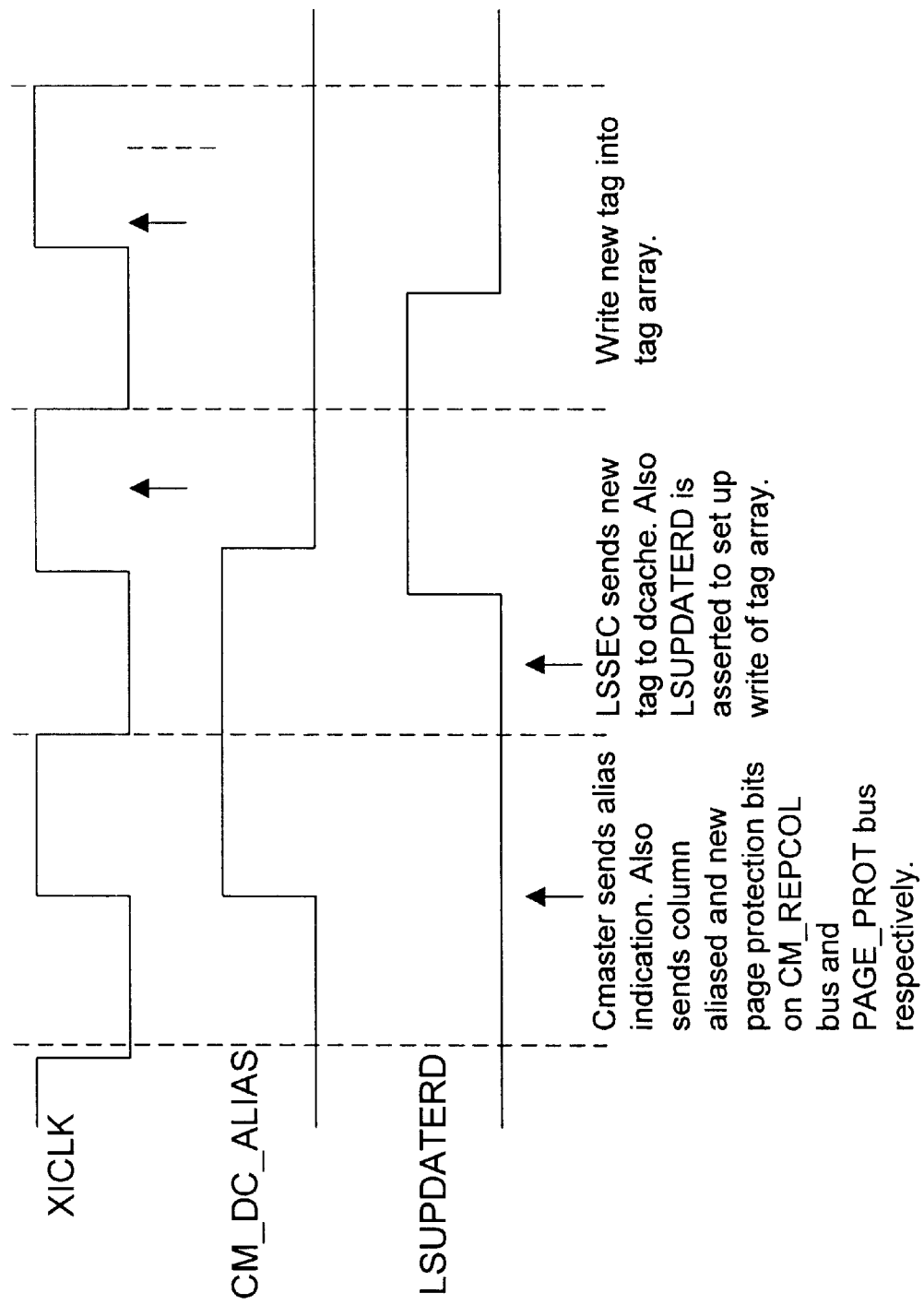

On a load miss, the LSSEC sends the address on the DADDR bus to the CMASTER to check for aliasing. If it is a speculative request, then LSSEC does not assert the ROB_REL signal. The CMASTER in this case checks for an alias. If aliasing has occurred, the CMASTER sends the CM_DC_ALIAS signal back to LSSEC and dcache and also drive the way to be replaced to the dcache on the CM_REPCOL bus and the protection information on PAGE_PROT(2:0). The LSSEC, upon receiving the aliasing indication, drives the LSLINAD0 bus with the tag and index on the following cycle and also assert the LSUPDAT-ERD signal. This causes the new tag and protection bits to be written in the selected way on the next cycle. The valid bit for that way also set. See FIG. 65 for timing diagram.

If there is a miss in the physical tags, the CM_MISS is asserted. The LSSEC then waits until the dcache request that caused the miss is no longer speculative and then again sends the address on DADDR bus. The ROB_REL signal is now asserted. The CMASTER latches the address and checks for aliasing again. If no aliasing has occurred, it will initiate the bus cycle and fetch the line in four packets of 64 bits each (external data bus=64 bits). The CMASTER can transfer each packet to the dcache on the DATB bus as soon as it is received. The dcache will latch each packet into the appropriate location in a 256 bit buffer (BUF1). The dcache on receiving the first packet asserts DCFSTPCK to the LSSEC. The LSSEC, on the next cycle, sends the reload address (tag and index) to dcache. After this point the LSSEC does not issue any more requests to dcache. The CMASTER also selects the way in the dcache to be replaced and sends that selection to the dcache along with the last packet on the CM_REPCOL(2:0) bus. The last packet will be flagged by the CMASTER by the assertion of CM2LS. The replacement policy is pseudo-random and is determined in the CMASTER.

After all 4 packets have been received, the dcache asserts the DCBUSY signal and then initiates the line swap. The dcache reads the line to be replaced into another 256 bit buffer (BUF2) and writes the line in BUF1 into that way. This swap can be done in one clock cycle. Note that this is a store to all eight banks and hence there is no port B access. The dcache will also update the tag and way prediction arrays. The way into which the new line was put will be the new way prediction for that index. See FIG. 66 for a timing diagram for reloads. If the line that was replaced was dirty, the CMASTER requests the dcache to send the line from BUF2. The dcache sends the line in four packets of 64 bits each on the DATB bus. The CMASTER then initiates an external write cycle to send each of these packets as they are received.

Processing a Store Miss

The Processor 500 dcache implements a no-write allocate policy for store misses. A no write allocate policy will still require the CMASTER to check for aliasing using the same protocol described for load misses. If no aliasing occurred, the LSSEC initiates a memory write cycle through the CMASTER. The data is sent to the CMASTER from the LSSEC on the DATB bus. The dcache is not involved in this transaction.

Non-cacheable accesses

Non-cacheable accesses are detected in three ways: The first is when the PCD bit is set. The second is through the sampling of KEN# inactive during the same clock that the first BRDY# is sampled active. The third is when the CD and NW bits in the CR0 register are programmed as follows CD=1, NW=0. The actions when a miss occurs are the same for all these three cases.

For a miss (load or store), the LSSEC still sends the address to the CMASTER to check for aliasing. If aliasing has occurred then the procedure for handling of non-cacheable accesses is the same as for cacheable accesses (see above). For a load miss, the LSSEC requests the CMASTER to initiate an external memory read cycle. The CMASTER reads the requested doubleword (or less if a byte or word is requested) and sends it to the dcache over the DATB bus. This data is latched in the dcache. The dcache will inform the LSSEC that the data has been transferred. The LSSEC then drives the tag for that load on the LSTAG0 bus and also commands the dcache to route/mux the data so as to drive the appropriate bits of the LSRES0 and XLSRES0 buses.

For a store miss (if no aliasing), the LSSEC initiates a memory write cycle through the CMASTER. The data is sent to the CMASTER from the LSSEC on the DATB bus. The dcache is not be involved in this transaction.

Dcache hooks to support Snooping

The dcache is involved when an inquire cycle hits a modified line since a writeback cycle is issued to update the modified line in external memory. The dcache is also involved during snoop invalidations.

Dcache/SRB Interface

The dcache interfaces to the SRB through one bi-directional bus—SRBB(31:0) and two unidirectional signals SRB_VAL and DCTARVAL. The functions that can be requested by the SRB of the dcache include array reads/writes, line invalidations and global invalidations.

An array read cycle is initiated by the SRB when it wishes to perform an array read. The array to be accessed (e.g. dcache, icache . . . ) and the action performed are specified in the first packet sent on the SRBB bus with the SRB_VAL signal in cycle N. The SRB will then send out the array locator doubleword on the SRBB bus in cycle N+2. The dcache will latch this array locator at end of cycle N+2 and read the appropriate word in cycle N+6. The dcache drives the requested data on the SRBB bus and also assert the DCTARVAL signal during cycle N+7. Note that the SRB/dcache interface is slow and hence, the data read from the array can be latched and driven out on a later clock cycle.

An array write cycle is initiated by the SRB when it wishes to write to an array. During cycle N, the SRB will specify the array to be accessed and the action to be performed. The SRB then sends out the array locator doubleword on the SRBB bus in cycle N+2. The dcache latches this array locator at end of cycle N+2. During cycle N+4 the SRB sends the data to be written into the dcache. The dcache writes this data in cycle N+6. The dcache will assert the DCTARVAL signal during cycle N+7 to indicate the end of the write operation.

For invalidations, the SRB initiates the array invalidate bus cycle on the SRBB bus in cycle N. The array locator is sent on the SRBB bus in cycle N+2. The type of invalidation (line/global) is based on the OP field in the array locator. During cycle N+6, the dcache executes the invalidation requested (line/global). In cycle N+7, the dcache asserts the DCTARVAL signal to indicate end of the requested operation.

Dcache Top level I/O Signal List

DATB(63:0): Input/Output Connects to LSSEC/CMASTER

This is a bi-directional bus between the CMASTER, LSSEC and the dcache. This bus has the following uses:

(a) to send data to the dcache from the CMASTER during reloads.

(b) to send data to the CMASTER from the dcache during writebacks.

(c) to send data to CMASTER from the LSSEC for non-cacheable stores (bits 31:0 only)

SRBB(31:0): Input/Output Connects to SRB/LSSEC/CMASTER/ICACHE

This bi-directional bus is used by the SRB to move data to/from arrays and special registers, to send the array locator and to send the command word.

SRB_VAL: Input/Output of SRB

This signal is asserted by the SRB whenever it sends the command word on the SRBB bus to initiate an access.

| | |
|---|---|
| LSLINAD0(31:2): Input. Connects to LSSEC/FIROB/CMASTER | ICLK14 |

This bus carries the dcache port A linear address. In addition to having the port A linear address for loads/stores, this bus will also carry the linear address when a reload from the CMASTER is ready to be done. i.e. the new line from CMASTER has been read into the 256 bit buffer (BUF1) that exists in the dcache and it is ready to be put in place of the replaced line.

| | |
|---|---|
| LSLINAD1(31:2): Input. Connects to LSSEC/FIROB/CMASTER | ICLK14 |

This bus carries the dcache port B linear address.

| | |
|---|---|
| SBADAT(31:0): Input/Output of LSSEC | ICLK13 |

This bus drives the store data for port A. This is a static bus. This bus can be driven from the beginning of the clock thereby ensuring that the data has enough time to propagate to the dcache and CMASTER blocks. This bus is required because the LSRES0 bus cannot be used for this purpose. The LSRES0 and XLSRES0 buses are differential buses that are evaluated by a senseamp on the falling edge of XICLK. Therefore the data would be available only in the next cycle which would prevent single cycle stores.

| | |
|---|---|
| SBBDAT(31:0): Input/Output of LSSEC | ICLK13 |

This bus drives the store data for port B. This is a static bus. This bus can be driven from the beginning of the clock thereby ensuring that the data has enough time to propagate to the dcache and CMASTER blocks. This bus is required because the LSRES1 bus cannot be used for this purpose. The LSRES1 and XLSRES1 buses are differential buses that are evaluated by a senseamp on the falling edge of XICLK. Therefore the data would be available only in the next cycle which would prevent single cycle stores.

| | |
|---|---|
| LSPASHFT(1:0): Input/Output of LSSEC | ICLK14 |

This bus determines how much the data that is read from the dcache on port A should be shifted. This shift code is determined based on the operand size as well as bits 1:0 of the linear address.

| LSPASHFT(1:0) | Shift Value |
|---|---|
| 00 | shift by 0 |
| 01 | shift by 8 |
| 10 | shift by 16 |
| 11 | shift by 24 |
| LSPBSHFT(1:0): Input/Output of LSSEC | ICLK14 |

This bus determines how much the data that is read from the dcache on port B should be shifted. This shift code is determined based on the operand size as well as bits 1:0 of the linear address.

| LSPBSHFT(1:0) | Shift Value |
|---|---|
| 00 | shift by 0 |
| 01 | shift by 8 |
| 10 | shift by 16 |
| 11 | shift by 24 |
| LSINDXCT: Input/Output from LSSEC | ICLK14 |

This signal indicates an index conflict for the two dcache accesses. An index conflict is generated if bits 11:5 of the two linear addresses match. This signal will be used to read only one port of the dual ported tag arrays. As long as there is no bank conflict, this signal will not cause any serialization of dcache accesses.

| | |
|---|---|
| LSWYPRCT: Input/Output from LSSEC | ICLK14 |

This signal indicates an index conflict for the way prediction array in dcache. Note that the index for this array is bits 14:5 of the linear address. This signal will be used to fire only one port of the way predict array.

CM2LS_CPBK(3:0): Input/Output from CMASTER

The CMASTER sends the information as to which 64 bit packet of the 32 byte line is to be sent by the dcache on the DATB bus during a writeback. The decoding of this bus is as follows:

| CM2LS_CPBK(3:0) | Actions taken |
|---|---|
| 0001 | bits 63:0 of writeback line driven on DATB(63:0) |
| 0010 | bits 127:64 of writeback line driven on DATB(63:0) |
| 0100 | bits 191:128 of writeback line driven on DATB(63:0) |
| 1000 | bits 255:192 of writeback line driven on DATB(63:0) |
| RD_SNP: Input | Output of CMASTER |

The CMASTER sends this signal to the dcache to start driving bits 63:0 of the line that has been read as part of a snoop writeback(initiated by CM_DC_SNP) on the DATB bus. On the next XICLK, the dcache will drive bits 127:64 of the line. The dcache will then drive bits 191:128 and 255:192 on the two following clocks.

LS_IDX(5:0): Input/Output of CMASTER

This is the index sent to the dcache from the CMASTER to be used for snoop read, snoop invalidates, writebacks and non-snoop invalidations.

CM2DC(3:0): Input/Output from CMASTER

This bus is part of the reload sequence. It indicates which 64 bit packet of the requested line is being sent to the dcache from the CMASTER on the DATB bus.

| CM2DC(3:0) | Actions taken |
|---|---|
| 0001 | bits 63:0 of requested lin driven on DATB(63:0) by CMASTER |
| 0010 | bits 127:64 of requested line driven on DATB(63:0) by CMASTER |

-continued

| CM2DC(3:0) | Actions taken |
|---|---|
| 0100 | bits 191:128 of requested line driven on DATB(63:0) by CMASTER |
| 1000 | bits 255:192 of requested line driven on DATB(63:0) by CMASTER |
| LSDCEXC: Input/Output of LSSEC | ICLK13 |

This signal informs the dcache that an exception has been detected by the LSSEC during its protection checking and limit checking actions. This signal is used only during stores. When this signal goes active during a store, we restore the cache location that was written.

| LDORST(1:0): Input/Output from LSSEC | ICLK12 |
|---|---|

LDORST(0) indicates whether the port A access when issued from the LSSEC is a load or a store. LDORST(0)=0 indicates a load and LDORST(0)=1 indicates a store. LDORST(1) does the same for port B.

| PABYTEN(3:0): Input/Output from LSSEC | ICLK14 |
|---|---|

These are the byte enables for the dcache port A access. They will be used in unaligned accesses and 8/16 bit accesses.

| PBBYTEN(3:0): Input/Output from LSSEC | ICLK14 |
|---|---|

These are the byte enables for the dcache port B access. They will be used in unaligned accesses and 8/16 bit accesses.

| LSUNALGN(1:0): Input/Output of LSSEC | ICLK13 |
|---|---|

LSUNALGN(0) indicates that the load/store access to the dcache from port A is unaligned. LSUNALGN(1) indicates the same for port B. An unaligned load can be issued to either port A or port B. An unaligned store uses both ports simultaneously.

BIU_NC: Input/Output of CMASTER
When there is a miss in the dcache, this signal when active indicates that the external data access caused by the miss is non-cacheable.

CM_REPCOL(2:0): Input/Output from CMASTER
This bus selects the way to be replaced during an external reload cycle. Note that the pseudo-random replacement strategy will be implemented in the CMASTER. It will also be used during writebacks and non-snoop invalidations.

IRESET: Input
This is the global internal reset signal. All entries in the dcache must be invalidated on assertion of IRESET.

PAGE_PROT(2:0): Input/Output of CMASTER
These are the page protection bits (D, U/S*,R/W*) that are sent by the TLB on dcache misses. They are written into the tag array. In the case of non-cacheable accesses, the PAGE_PROT bits should be used for page protection checks.

CM_DC_INV: Input/Output of CMASTER
This signal is used to (non-snoop)invalidate a dcache line.

CM_DC_RD: Input/Output of CMASTER
This signal is used by the CMASTER to initiate a dcache read as part of the reload or writeback sequence.

CM_DC_SNP: Input/Output of CMASTER
Used by the CMASTER to initiate a snoop related read of the dcache.

CM_DC_SINV:Input/Output of CMASTER
Used by the CMASTER to do a snoop invalidation of a dcache line.

CM2LS_RST: Input/Output of CMASTER
Used to restart the CMASTER—dcache line transfer if the transfer was halted. For example, if BOFF# was asserted in the middle of this transfer, Processor 500 would relinquish the external bus to another bus master. When BOFF# is de-asserted, the bus cycle that was interrupted has to be restarted. Therefore, the all four packets would be transferred regardless of how many had been transferred before the assertion of BOFF#.

CM2LS: Input/Output from CMASTER
This signal is a flag from the Cmaster to the dcache and the LSSEC that the last packet of a reload sequence is being sent.

CM2LS_CAN: Input/Output from CMASTER
This signal is used by the CMASTER handles a special case of invalidation. If during the reload sequence, we get a snoop invalidate for the new line that is to be loaded into the dcache. This signal is used to reset the valid bit for the new line when it is loaded into the cache when the line swap occurs during the reload.

CR0WP: Input/Output from SRB
This is the write protect (WP) bit in the CR0 special register. This bit is used with the page protection bits to determine protection violations.

| CURCPL(1:0): Input/Output of LSSEC | ICLK10 |
|---|---|

This is the Current Privilege level information. The dcache uses the D, R/W* and U/S* bits in conjunction with the CURCPL bits to determine protection violations.

CM_DC_ALIAS: Input/Output of CMASTER
This signal from the CMASTER indicates to the dcache and LSSEC that an alias was detected by the CMASTER. The CMASTER will also send the way information on the CM_REPCOL bus along with this signal. The dcache will use this to update the linear tag in the aliased way.

CR0PG: Input/Output from SRB
This is the paging enabled (PG) bit in the CR0 special register. Paging is enabled when CR0PG=1.

| LSUPDATERD: Input/Output from LSSEC | ICLK10 |
|---|---|

This signal is used to generate write signals to update the tag, status and valid bits in the tag array when aliasing has occurred.

LS_SNP_COL(2:0): Input/Output from CMASTER
This bus selects the way in the dcache to be used for the writeback cycle that follows an inquire cycle. This writeback cycle occurs only if the inquire cycle hits a M-state line. It is also used to select the way during snoop invalidations.

| LSRSLD(1:0) Input/Output from LSSEC | ICLK13 |
|---|---|

LSRSLD(0) indicates that there is a port A dcache access issued from the LSSEC. LSRSLD(1) does the same for port B.

| LSDCFWD(1:0):Input/Output from LSSEC | ICLK11 |
|---|---|

LSFWD(0) indicates to the dcache not to drive the LSRES0/XLSRES0 buses. LSFWD(1) indicates to the dcache not to drive the LSRES1/XLSRES1 buses.

LSCPLISZERO:Input/Output from LSSEC
The protection checking in the dcache uses the current CPL bits CURCPL(1:0). LSCPLISZERO being active will cause them to be overridden with zero.

LSCNMA(1:0): Input/Output from LSSEC
LSCNMA(0) when active, indicates to the dcache that it must cancel the misaligned load being executed on port A. This condition happens when the first half of the misaligned access is complete and the LSSEC finds out that it can forward the data from the store buffer. The LSSEC then will discard the data and will not drive the LSRES0 bus. LSCNMA(1) serves the same function for port B and the LSRES1 bus.

BSTRST:Input/Output from JTAG_BIST
This signal causes the address counter for the BIST logic in dcache to reset.

BSTRUN:Input/Output from JTAG_BIST
This signal causes BIST to start.

BSTRD:Input/Output from JTAG_BIST
This signal is asserted to read the dcache arrays and do the compare in the TAEC registers.

BSTWR:Input/Output from JTAG_BIST
This signal is asserted to write the dcache arrays when in BIST mode.

BSTINCR:Input/Output from JTAG_BIST
This signal is asserted to request an increment of the BIST address counter.

BSTDIN:Input/Output from JTAG_BIST
This is the data to be loaded into the TAEC input registers prior to being written into the arrays.

FLUSHON: Input—Connects to JTAG_BIST
This signal enables the shifting of the data on the BSTDIN input into the TAEC input registers.

UPDOWN:Input—Connects to JTAG_BIST
This signal control whether the BIST address counter will counter up or down. UPDOWN=1 is up and UPDOWN=0 is down.

BSTSHF1:Input—Connects to JTAG_BIST
This is the signal that clocks the master latch in the TAEC registers.

BSTSHF2:Input—Connects to JTAG_BIST
This is the signal that clocks the slave latch in the TAEC registers.

BSTFALSE:Input—Connects to JTAG_BIST
BSTFALSE when active will cause the test pattern to be inverted.

PORTSEL:Input—Connects to JTAG_BIST
This signal when active selects the second port of the tag and way predict arrays.

| DCTARVAL: Output - Connects to SRB | ICLK8 |
|---|---|

This signal is asserted by the dcache to indicate the end of the requested SRB operation. If the requested operation was a read, then the dcache will also drive the SRBB bus with the read data.

| LSRES0(31:0): Output. Connects to LSSEC/FNCU/FIROB. | ICLK14 |
|---|---|

This is the true portion of the LSSEC/dcache port A access result bus. On Processor 500, driving buses is a major task and it has been determined that for speed reasons this bus in conjunction with XLSRES0(31:0) will be a differential bus. Data is output from dcache on this bus during loads.

| XLSRES0(31:0): Output. Connects to LSSEC/FNCU/FIROB. This is the false portion of the LSSEC/dcache port A access result bus. As stated above, the XLSRES0 bus is part of a differential bus. | ICLK14 |
|---|---|
| LSRES1(31:0): Output. Connects to LSSEC/FNCU/FIROB. This is the true portion of the LSSEC/dcache port B access result bus. On Processor 500, driving buses is a major task and it has been determined that for speed reasons this bus in conjunction with XLSRES1(31:0) will be a differential bus. Data is output from dcache on this bus during loads. | ICLK14 |
| XLSRES1(31:0): Output. Connects to LSSEC/FNCU/FIROB. This is the false portion of the LSSEC/dcache port B access result bus. As stated above, the XLSRES1 bus is part of a differential bus. | ICLK14 |
| DCLSPROK(1:0): Output - Connects to LSSEC | ICLK5 |

Indicates a protection violation during a dcache access. DCLSPROK(0) corresponds to port A and DCLSPROK(1) corresponds to port B.

| DCLSD(1:0) : Output - Connects to LSSEC | ICLK5 |
|---|---|

DCLSD(0) and DCLSD(1) are the dirty bits corresponding to port A and port B respectively. They are used by the LSSEC during stores to determine if the corresponding dirty bit in the page table entry in the TLB is correctly set. If the store is released and we find that the page table entry thinks it is clean, then an exception must occur to write the dirty bit into the external page table entries so as to insure that this page gets written back to external memory.

| DCFINRLD: Output - Connects to LSSEC/CMASTER | ICLK13 |
|---|---|

This signal indicates to the LSSEC and CMASTER that the reload has been completed. The LSSEC may now issue load/store requests to the dcache. The CMASTER on receiving this signal may request a writeback cycle if the replaced line was dirty.

| DCDATRDY:Output - Connects to LSSEC | ICLK13 |
|---|---|

This signal informs the LSSEC that the data for a non-cacheable load is available to be driven on the LSRES0 bus. The LSSEC must then on the next clock, drive the tag on the LSTAG0 bus when the dcache drives the data on the LSRES0 bus.

| DCFSTPCK: Output - Connects to LSSEC | ICLK11 |
|---|---|

This signal informs the LSSEC that the first packet for a reload has arrived at the dcache. The LSSEC on the next cycle will cancel any access it had in progress and send the reload address (tag and index) on the LSLINAD0 bus.

| DCPAPRHIT: Output - Connects to LSSEC/FNCU | ICLK3 |
|---|---|

This signal indicates to the functional units and the LSSEC that there was a hit on the port A predicted way. Single cycle dcache access is achieved on port A when this signal is active.

| DCPBPRHIT: Output - Connects to LSSEC/FNCU | ICLK3 |
|---|---|

This signal indicates to the functional units and the LSSEC that there was a hit on the port B predicted way. Single cycle dcache access is achieved on port B when this signal is active.

| DCUNPAHIT: Output - Connects to LSSEC/FNCU | ICLK3 |
|---|---|

This signal indicates to the functional units and the LSSEC that there was a hit in one of the port A unpredicted ways. Two cycle dcache access is achieved on port A when this signal is active.

| DCUNPBHIT: Output - Connects to LSSEC/FNCU | ICLK3 |
|---|---|

This signal indicates to the functional units and the LSSEC that there was a hit in one of the port B unpredicted ways. Two cycle dcache access is achieved on port B when this signal is active.

| DCBUSY: Output - Connects to LSSEC | ICLK12 |
|---|---|

This signal is asserted to inform the LSSEC that the dcache is busy doing either a snoop read, snoop invalidation, non-snoop invalidation, reload or a cache line read that is done prior to a reload. The LSSEC must not send any dcache accesses as long as this signal is active.

| DCCNCLA:Output - Connects to LSSEC | ICLK7 |
|---|---|

This signal indicates to the LSSEC that it must cancel the port A access and reissue it on the next clock. This signal will be activated when the port B access hits in the unpredicted way in cycle N. During cycle N, port A has hit in the predicted way and achieved single cycle access. Now in cycle N+1, the LSSEC issues another access to port A. Now if there is a bank conflict between the new access on port A and the old access on port B, then we want to cancel the port A access. This signal will achieve this purpose.

| DCCNCLB:Output - Connects to LSSEC | ICLK7 |
|---|---|

This signal indicates to the LSSEC that it must cancel the port B access and reissue it on the next clock. This signal will be activated when the port A access hits in the unpredicted way in cycle N. During cycle N, port B has hit in the predicted way and achieved single cycle access. Now in cycle N+1, the LSSEC issues another access to port B. Now if there is a bank conflict between the new access on port B and the old access on port A, then we want to cancel the port B access. This signal will achieve this purpose.

| BSTDDOUT:Output - Connects to JTAG_BIST |
|---|

This signal is the output of the result register path of the TAEC chain for the data array.

BSTDTOUT:Output—Connects to JTAG_BIST
This signal is the output of the result register path of the TAEC chain for the tag and way prediction arrays.

MAXADDR:Output—Connects to JTAG_BIST
This signal indicates that the address counter for the arrays has reached its maximum count.

Dcache Hierarchy and Internal signal definition

The dcache at the first level of hierarchy is partitioned into two blocks: DCARRAYS and DCCTL. DCCTL will be the synthesized control block and DCARRAYS will have all the custom logic. DCARRAY is further partitioned into four blocks: DCTSVARRAY which is the tag, protection, valid bit array, DCDATARRAY which is the data array, DCWYPRARRAY which is the way prediction array and DCDCBUS which will provide a clean interface to the arrays from the LSSEC and CMASTER. The internal signals down 2 levels of hierarchy will be described in the following four sections. For each block, only output signals will be described since the outputs of one block will be inputs of another and repetition can be avoided. Also signals that are top level I/O for the dcache will also not be described here. See above for their description.

DCCTL Signal List

| | |
|---|---|
| DCDATWR(7:0): Output - Connects to DCDATARRAY | ICLK9 |
| This bus is the write strobe for each bank of the data array. | |
| DCDATARRD(7:0): Output - Connects to DCDATARRAY | ICLK6 |
| This bus is the evaluate strobe for each bank of the data array. This signal is asserted for any access of the data array (read or write). | |
| SRBVALP2: Output - Connects to DCDCBUS | ICLK3 |
| This signal is asserted two clocks after the SRB_VAL signal is received if the dcache is the target of the SRB access. SRBVALP2 is then used to latch the array locator. | |
| SRBVALP4: Output - Connects to all array blocks | ICLK3 |
| This signal is asserted four clocks after the SRB_VAL signal is received if the dcache is the target of the SRB access and the requested operation is a write. SRBVALP4 is then used to latch the write data. | |
| SRBDCACC: Output | ICLK5 |
| This signal is a decode of the SRB control word(CW(4:0) = 14h) that is sent out in the first packet. It indicates that the dcache is the target of the dcache access. | |
| SRBWYRD: Output - Connects to DCDCBUS | ICLK4 |
| This signal indicates that the requested operation is a read of the way predict array. | |
| DCTSWR: Output - Connects to DCTSVARRAY/DCDCBUS | ICLK3 |
| This is the write strobe for the tag and protection bits in the tag array. This signal is asserted during a reload or an SRB access or during an update when an alias has been detected by the CMASTER. Write to the tag and protection bits can occur only from port A. | |
| DCPAVALWR: Output - Connects to DCDCBUS/DCTSVARRAY | ICLK3 |
| This is the write signal corresponding to port A for the valid bit in the tag array. This signal is asserted for either reloads, line invalidations, SRB access or updates when an alias is detected by CMASTER. | |
| DCPBVALWR: Output - Connects to DCDCBUS/DCTSVARRAY | ICLK3 |
| This is the write signal corresponding to port B for the valid bit in the tag array. This signal is asserted for snoop invalidations. | |
| DCPAVALIN: Output - Connects to DCTSVARRAY | ICLK3 |
| This is the bit corresponding to port A that is to be written into the valid bit in the tag array. This bit will be 1 for reloads and updates when an alias has been detected. This bit will be 0 for line invalidations (through CMASTER and SRB). | |
| DCLTRLDAD: Output - Connects to DCDCBUS/DCTSVARRAY | ICLK3 |
| This signal when active indicates the presence of the reload/aliased address (tag and index) on the LSLINAD0 bus. The DCDCBUS block will latch the index and the DCTSVARRAY will latch the tag. | |
| DCUSERLDAD: Output - Connects to DCDCBUS | ICLK1 |
| This signal chooses the previously latched reload address for the next dcache access on port A. The index and the column to be written (PAWRITECOL) will be generated in the DCDCBUS block. No port B access will occur. | |
| DCENRLD: Output - Connects to DCTSVARRAY | ICLK2 |
| This signal goes active when the address and data are ready to do a reload. | |
| DCENNC: Output - Connects to DCTSVARRAY | ICLK5 |
| This signal goes active when the access on port A is a non-cacheable load. | |
| DCALLBNKS: Output - Connects to DCDATARRAY | ICLK2 |
| This signal is used to select all the banks of the data array in order to do either a writeback or a reload. The port A index will be used for all the banks. | |
| DCPABKEN: Output - Connects to DCDATARRAY | ICLK2 |
| This signal enables the choosing of the appropriate bank for the port A access. It is generated when either LSRSLD(0) = 1 or there is an SRB access. | |
| SELPAIDX: Output - Connects to DCDCBUS | ICLK2 |
| This signal selects the LS_IDX bus as the index for the port A dcache access. This signal is active when a writeback (snoop and non-snoop) or invalidation is being processed by the dcache. | |
| DCSNPLIN: Output - Connects to DCDATARRAY | ICLK9 |
| This signal when active will latch the line that is read out of the data array on a snoop read into a 32 byte buffer. The CMASTER will then assert RD_SNP to indicate to the dcache that it may start driving the DATB bus with 64 bit packets of the data in this buffer. | |
| SRBWYWR: Output - Connects to DCDCBUS | ICLK5 |
| This signal indicates that the requested operation is a write of the way predict array. | |
| SRBGLINV: Output - Connects to DCTSVARRAY | ICLK7 |
| This signal will cause a global invalidation of the tag array. | |
| SRBTAGRD: Output - Connects to DCDCBUS | ICLK5 |
| This signal indicates that the requested operation is a read of the dcache tag array. | |
| DRSRBDAT: Output - Connects to DCTSVARRAY/DCWYPRARRAY/DCDATARRAY | ICLK3 |
| This signal when active will drive the data from the chosen dcache array on the SRBB bus to the SRB. | |

DCDCBUS Signal List

| | |
|---|---|
| DCPATSVRD: Output - Connects to DCTSVARRAY | ICLK5 |
| This is the port A evaluate signal for the tag array. This signal is asserted for any port A access of the tag array (read or write). | |
| DCPBTSVRD: Output - Connects to DCTSVARRAY | ICLK5 |
| This is the port B evaluate signal for the tag array. This signal is asserted for any port B access of the tag array (read or write). | |
| DCPAINDX(5:0): Output - Connects to DCTSVARRAY/DCDATARRAY | ICLK3 |
| This is the index for the port A access to both the tag and data arrays. The index corresponds to either bits10:5 of LSLINAD0 or LS_IDX(5:0). | |
| DCPBINDX(5:0): Output - Connects to DCTSVARRAY/DCDATARRAY | ICLK3 |
| This is the index for the port B access to both the tag and data arrays. The index corresponds to either bits10:5 of LSLINAD1 or the LS_IDX(5:0) or the bits of the SRBB bus corresponding to index. | |
| WYAINDX(8:0): Output - Connects to DCWYPRARRAY | ICLK3 |
| This is the index for the way prediction array, port A access. Corresponds to bits 13:5 of the LSLINAD0 bus. | |
| WYBINDX(8:0): Output - Connects to DCWYPRARRAY | ICLK3 |
| This is the index for the way prediction array, port B access. Corresponds to bits 13:5 of the LSLINAD1 bus. | |
| WAYRDA: Output - Connects to DCWYPRARRAY | ICLK5 |
| This is the port A evaluate signal for the way predict array. This signal is asserted for any port A access of the way predict array (read or write). | |
| WAYRDB: Output - Connects to DCWYPRARRAY | ICLK5 |
| This is the port B evaluate signal for the way predict array. This signal is asserted for any port B access of the way predict array (read or write). | |
| WAYWRA: Output - Connects to DCWYPRARRAY | ICLK9 |
| This is the port A write signal for the way predict array. This signal is asserted when updating the array when a misprediction occurs or when a reload occurs. | |
| WAYWRB: Output - Connects to DCWYPRARRAY | ICLK9 |
| This is the port B evaluate signal for the way predict array. This signal is asserted when updating the array when a misprediction occurs. | |
| PABNKSEL(7:0): Output - Connects to DCDATARRAY | ICLK5 |
| This bus selects the bank in the data array for the port A access. | |
| PBBNKSEL(7:0): Output - Connects to DCDATARRAY | ICLK5 |
| This bus selects the bank in the data array for the port B access. | |
| DCPABNKSEL(2:0): Output - Connects to DCCTL | ICLK3 |
| This bus is the encoded version of PABNKSEL bus. It selects the bank in the data array for the port A access. | |
| DCPBBNKSEL(2:0): Output - Connects to DCCTL | ICLK3 |
| This bus is the encoded version of PBBNKSEL bus. It selects the bank in the data array for the port B access. | |
| DCWYXFER: Output - Connects to DCWYPRARRAY | ICLK7 |
| This signal is used for a very specific case. Consider the case as follows: There are two load accesses to the dcache on cycle I. The port A access hits in the predicted way while the port B access hits in unpredicted way. Now in cycle I+1, there can be a new access on port A while the data from unpredicted way will be driven out on port B. | |

-continued

Also, the way prediction array will be updated. Now if there is a way conflict between the new port A access and the old port B access, the way predict array need not be read since the port B update to way predict array is the prediction for port A. DCWYXFER will facilitate transfer of this update from one port to the other port in such a case. The direction of the transfer can be determined by looking at the HIT signals for both ports (DCPAPRHIT, DCPBPRHIT, DCUNPAHIT, DCUNPBHIT).
PAWRITECOL(2:0) :Output - Connects to          ICLK4
DCTSVARRAY/DCDATARRAY
This bus selects the way to be used for reloads, updates to fix aliases, SRB accesses and invalidations.
PBWRITECOL(2:0) :Output - Connects to          ICLK4
DCTSVARRAY/DCDATARRAY
This bus selects the way to be used for snoop invalidations.
ARRTYP(2:0): Output - Connects to DCCTL        ICLK4
This bus carries the type information of the array locator word. ARRTYP specifies the array in the dcache that the SRB wishes to access.
ARROP(1:0) :Output - Connects to DCCTL         ICLK4
This bus carries the OP field of the array locator word.
ARROP specifies the type of invalidation(line/global) to be done if the SRB requested action was a dcache invalidation.
DCTSVARRAY Signal List PATAGCOM: Output - Connects to                 ICLK14
DCDATARRAY/DCWYPRARRAY/DCCTL
This bus indicates the result of the tag compare for all 8 ways for port A. This bus will therefore provide the update to the way predict array if a misprediction occurs on port A.
PBTAGCOM: Output -Connects to                  ICLK14
DCDATARRAY/DCWYPRARRAY/DCCTL
This bus indicates the result of the tag compare for all 8 ways for port B. This bus will therefore provide the update to the way predict array if a misprediction occurs on port B.

Figure 67:
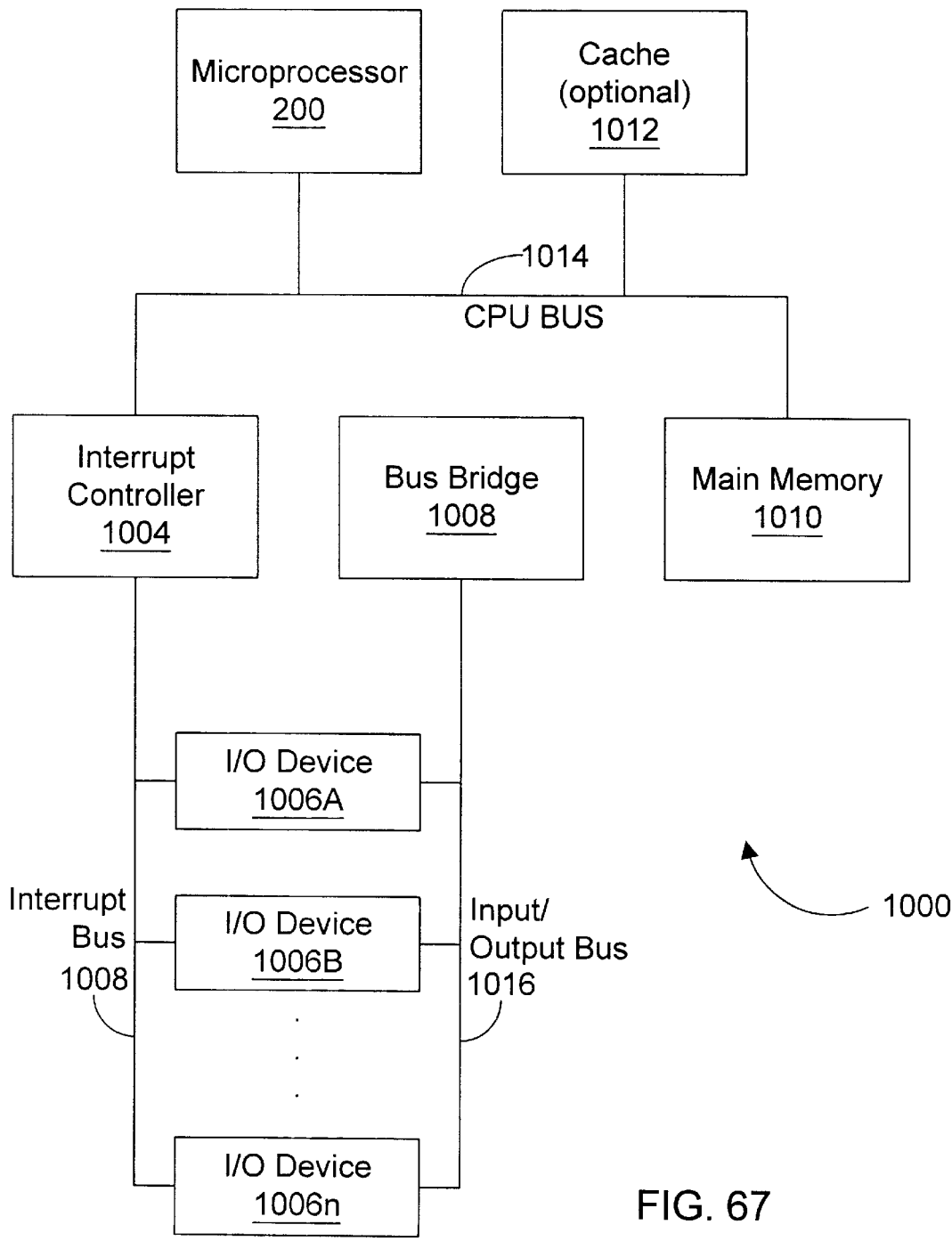

Turning now to FIG. 67, a computer system 1000 including microprocessor 200, an interrupt controller 1004, a plurality of input/output (I/O) devices 1006A–1006N (referred to collectively as I/O devices 1006), a bus bridge 1008, a main memory 1010, and a cache 1012 is shown. Microprocessor 200, interrupt controller 1004, bus bridge 1008, main memory 1010, and cache 1012 are coupled to a CPU bus 1014 which effects high speed, high bandwidth communication between the connected devices. Lower speed, lower bandwidth communication is provided for I/O devices 1006 via input/output bus 1016. I/O devices 1006 are coupled to interrupt controller 1004 via an interrupt bus 1018.

Interrupt bus 1018 may include at least one interrupt conductor per I/O device 1006A–1006N. An interrupt request signal conveyed on the associated interrupt conductor is indicative of a request for interrupt of microprocessor 200 by the associated I/O device 1006A–1006N. Interrupt controller 1004 is configured to receive the interrupt request signals and to convey an interrupt signal to microprocessor 200 upon CPU bus 1014 in response to the interrupt request signals. In one embodiment, interrupt controller 1004 is an 8259A interrupt controller used in IBM compatible personal computer systems. In another embodiment, interrupt controller 1004 includes multiple interrupt controllers similar to the 8259A cascaded to allow a larger number of I/O devices 1006 to be connected. Interrupt controller 1004 is programmable, and may be enabled to assert the interrupt signal individually for each interrupt request signal. In other words, interrupt controller may be enabled to assert the interrupt signal if the interrupt request signal from I/O device 1006A is asserted but not if the interrupt request signal from I/O device 1006B is asserted (or vice-versa). In another embodiment, interrupt controller 1004 may be programmed with a priority scheme for the interrupt request signals. The priority scheme is devised such that, if multiple interrupt request lines are asserted concurrently: the highest priority interrupt request is service first; followed by the next highest priority interrupt request; etc.

Bus bridge 1008 is provided to assist in communications (other than interrupt requests) between I/O devices 1006 and devices coupled to CPU bus 1014. I/O devices 1006 typically require longer bus clock cycles than microprocessor 200 and other devices coupled to CPU bus 1014. Therefore, bus bridge 1008 provides a buffer between CPU bus 1014 and input/output bus 1016. Additionally, bus bridge 1008 translates transactions from one bus protocol to another. In one embodiment, input/output bus 1016 is an Enhanced Industry Standard Architecture (EISA) bus and bus bridge 1008 translates from the CPU bus protocol to the EISA bus protocol. In another embodiment, input/output bus 1016 is a Peripheral Component Interconnect (PCI) bus and bus bridge 1008 translates from the CPU bus protocol to the PCI bus protocol. It is noted that many variations of CPU bus protocols exist. Microprocessor 200 may employ any suitable bus protocol.

I/O devices 1006 provide an interface between computer system 1000 and other devices external to the computer system. Exemplary I/O devices include a modem, a serial or parallel port, a sound card, etc. I/O devices 1006 may also be referred to as peripheral devices. Certain I/O devices 1006 may also be used to enhance the performance of computer system 1000 by performing certain tasks such that microprocessor 200 may perform other tasks. Exemplary devices include hardware accelerators. Additionally, mass storage devices such as hard disk drives may be included within I/O devices 1006. Main memory 1010 stores data and instructions for use by microprocessor 200. In one embodiment, main memory 1010 includes one or more dynamic random access memory (DRAM) cells and a DRAM memory controller. It is understood that main memory 1010 may be configured as multi-banked or interleaved memory. Cache 1012 is a small, high speed memory for temporarily storing data and instructions from main memory 1010. If microprocessor 200 requests an address from main memory 1010 and cache 1012 is storing data associated with the requested address, then cache 1012 provides the data. Cache 1012 is an optional component, and computer system 1000 is fully functional without it. However, cache 1012 may improve the performance of computer system 1000. It is noted that cache 1012 may also be inserted between microprocessor 200 and CPU bus 1014 in other embodiments. It is further noted that cache 1012 may employ a write-through or writeback protocol.

Although FIG. 67 shows a computer system 1000 including one microprocessor 200, computer system 1000 may include multiple microprocessors similar to microprocessor 200 coupled to CPU bus 1014. It is further noted that interrupt controller 1004, although shown in FIG. 67 to be connected to CPU bus 1014, may be coupled to I/O bus 1016 or yet another bus (not shown). When coupled in this manner, interrupt acknowledge bus transactions are conveyed through one or more bus bridges similar to bus bridge 1008 to interrupt controller 1004. Often, interrupt controller 1004 is coupled directly to an interrupt conductor upon microprocessor 200 for signalling interrupts in these embodiments.

It is noted that a superscalar microprocessor in accordance with the foregoing may further employ the latching structures as disclosed within the co-pending, commonly assigned patent application entitled "Conditional Latching Mechanism and Pipelined Microprocessor Employing the Same", Ser. No. 08/400,608 filed Mar. 8, 1995, by Pflum et al., now abandoned and continued in U.S. patent application Ser. No. 08/744,707, now U.S. Pat. No. 5,831,462. The disclosure of this patent application is incorporated herein by reference in its entirety.

It is further noted that aspects regarding array circuitry may be found in the co-pending, commonly assigned patent application entitled "High Performance Ram Array Circuit Employing Self-Time Clock Generator for Enabling Array Access", Ser. No. 08/473,103 filed Jun. 7, 1995 by Tran, now U.S. Pat. No. 5,619,464. The disclosure of this patent application is incorporated herein by reference in its entirety.

It is additionally noted that other aspects regarding superscalar microprocessors may be found in the co-pending, commonly assigned patent application entitled "Superscalar Microprocessor Including a High Performance Instruction Alignment Unit", Ser. No. 08/377,843, filed Jan. 25, 1995 by Witt, et al., abandoned and continued in application Ser. No. 08/884,818 filed Jun. 30, 1997, now U.S. Pat. No. 5,819,057. The disclosure of this patent application is incorporated herein by reference in its entirety.

In accordance with the above disclosure, a return prediction unit is shown which predicts the return address of return instructions when these instructions are fetched. Advantageously, instructions stored at the return address may be fetched immediately upon detecting the return instruction. Clock cycles may be saved in the fetching of instructions residing at the return address. Performance of a superscalar microprocessor including the return prediction unit may be advantageously increased by incorporating the return prediction unit described herein. The present return prediction unit recovers from mispredicted branches, allowing return addresses to be predicted correctly even subsequent to a mispredicted branch.

Numerous variations and modifications will become apparent to those skilled in the art once the above disclosure is fully appreciated. It is intended that the following claims be interpreted to embrace all such variations and modifications.

What is claimed is:

1. A microprocessor comprising:
    an instruction cache configured to store a plurality of instructions; and
    a return prediction unit coupled to said instruction cache, wherein said return prediction unit includes a return stack storage configured to store a plurality of return addresses, and wherein said return prediction unit is configured to select a selected one of said plurality of return addresses as a prediction for a particular return address corresponding to a return instruction fetched from said instruction cache, wherein said selected one of said plurality of return addresses is a nearest return address to a top of said return stack storage which has not been used as a predicted return address corresponding to a previously fetched return instruction, and wherein each of said plurality of return addresses between said top of said return stack storage and said selected one of said plurality of return addresses have been used as said predicted return address corresponding to a plurality of said previously fetched return instructions.

2. The microprocessor as recited in claim 1 wherein said return stack storage is configured to store a plurality of return valid indications, and wherein each one of said plurality of return valid indications corresponds to a different one of said plurality of return addresses, and wherein said each one of said plurality of return valid indications is indicative, in a first state, that a corresponding one of said plurality of return addresses has been used as said predicted return address, and wherein said each one of said plurality of return valid indications is indicative, in a second state, that said corresponding one of said plurality of return addresses has not been used as said predicted return address.

3. The microprocessor as recited in claim 2 wherein said return prediction unit is configured to select said selected one of said plurality of return addresses responsive to a corresponding one of said plurality of return valid indications being in said second state and further responsive to each one of said plurality of return valid indications corresponding to ones of said plurality of return addresses between said selected one of said plurality of return addresses and said top of said return stack storage being in said first state.

4. The microprocessor as recited in claim 3 wherein said return prediction unit is configured to change said corresponding one of said plurality of return valid indications to said first state responsive to selecting said selected one of said plurality of return addresses.

5. The microprocessor as recited in claim 1 wherein said return prediction unit is configured to delete a particular one of said plurality of return addresses from said return stack storage subsequent to: (i) retiring a particular call instruction which caused said particular one of said plurality of return addresses to be stored into said return stack storage; and (ii) retiring a particular return instruction for which said particular one of said plurality of return addresses is said predicted return address.

6. The microprocessor as recited in claim 5 wherein said return stack storage is configured to store a plurality of call-retire valid indications, and wherein each of said plurality of call-retire valid indications corresponds to a different one of said plurality of return addresses, and wherein each of said plurality of call-retire valid indications is indicative, in a first state, that a corresponding call instruction is retired, and wherein said each of said plurality of call-retire valid indications is indicative, in a second state, that said corresponding call instruction is not retired.

7. The microprocessor as recited in claim 6 wherein said return prediction unit is configured to change one of said plurality of call-retire valid indications corresponding to said particular one of said plurality of return addresses to said first state upon receiving an indication that said particular call instruction is retired.

8. The microprocessor as recited in claim 7 wherein said return prediction unit is configured to delete said particular one of said plurality of return addresses from said return stack storage upon receiving an indication that said particular return instruction is retired.

9. The microprocessor as recited in claim 1 wherein said return stack storage is further configured to store a plurality of interrupt indications, wherein each of said plurality of interrupt indications corresponds to a different one of said plurality of return addresses, and wherein said each of said plurality of interrupt indications is indicative, in a first state, that a corresponding one of said plurality of return addresses corresponds to an interrupt instruction, and wherein said each of said plurality of interrupt indications is indicative, in a second state, that said corresponding one of said plurality of return addresses corresponds to a call instruction.

10. The microprocessor as recited in claim 9 wherein said return prediction unit is configured to select said selected one of said plurality of return addresses which is said nearest return address to a top of said return stack storage: (i) which has not been used as said predicted return address corresponding to said previously fetched return instruction; and (ii) for which a corresponding one of said plurality of interrupt indications is in said second state.

11. The microprocessor as recited in claim 9 wherein said return prediction unit is configured to select a second selected one of said plurality of return addresses as a prediction for an interrupt return instruction, wherein said second selected one of said plurality of return addresses is a nearest return address to a top of said return stack storage: (i) which has not been used as said predicted return address corresponding to said previously fetched return instruction; and (ii) for which a corresponding one of said plurality of interrupt indications is in said first state.

12. A method for predicting return addresses in a microprocessor, comprising:

storing a particular return address in a return stack responsive to fetching a call instruction;

selecting said particular return address as a prediction for a return instruction if said particular return address is a nearest return address to a top of said return stack which has not been used as said prediction; and deleting said particular return address from said return stack subsequent to retiring both said call instruction and said return instruction.

13. The method as recited in claim 12 further comprising storing a return valid indication corresponding to each return address in said return stack, wherein said particular return address is said nearest return address if each return address between said particular return address and said top of said return stack has a corresponding return valid indication in a first state indicating that said each return address has been used as said prediction and said return valid indication corresponding to said particular return address is in a second state different from said first state.

14. The method as recited in claim 13 further comprising changing said return valid indication corresponding to said particular return address to said first state responsive to said selecting.

15. The method as recited in claim 12 further comprising:

storing a call-retire valid indication corresponding to said particular return address stored in said return stack, wherein said call-retire valid indication is indicative, in a first state, that said call instruction is retired, and wherein said call-retire valid indication is indicative, in a second state, that said call-retire valid indication is not retired; and changing said call-retire valid indication to said first state upon receiving an indication that said call instruction is retired.

16. The method as recited in claim 15 wherein said deleting said particular return address comprises deleting said particular return address upon receiving an indication that said return instruction is retired.

17. The method as recited in claim 12 further comprising storing an interrupt indication corresponding to said particular return address in said return stack, wherein said interrupt indication is indicative, in a first state, that said particular return address corresponds to an interrupt instruction, and wherein said interrupt indication is indicative, in a second state, that said particular return address corresponds to said call instruction, and wherein said selecting said particular return address is responsive to said interrupt indication being in said second state.

18. The method as recited in claim 17 further comprising selecting said particular return address as a prediction for an interrupt return instruction if said particular return address is a nearest return address to a top of said return stack which has not been used as said prediction and said interrupt indication is in said first state.

19. A computer system, comprising:

a microprocessor including:

an instruction cache configured to store a plurality of instructions; and a return prediction unit coupled to said instruction cache, wherein said return prediction unit includes a return stack storage configured to store a plurality of return addresses, and wherein said return prediction unit is configured to select a selected one of said plurality of return addresses as a prediction for a particular return address corresponding to a return instruction fetched from said instruction cache, wherein said selected one of said plurality of return addresses is a nearest return address to a top of said return stack storage which has not been used as a predicted return address corresponding to a previously fetched return instruction, and wherein each of said plurality of return addresses between said top of said return stack storage and said selected one of said plurality of return addresses have been used as said predicted return address corresponding to a plurality of said previously fetched return instructions; and an input/output (I/O) device coupled to said microprocessor, wherein said I/O device is configured to communicate between said computer system and another computer system to which said I/O device is coupled.

20. The computer system as recited in claim 19 wherein said I/O device comprises a modem.

21. The computer system as recited in claim 19 further comprising an audio I/O device.

22. The computer system as recited in claim 19 further comprising a second microprocessor coupled in parallel with said microprocessor.

* * * * *